(12) United States Patent
Abraham

(10) Patent No.: US 12,217,949 B2
(45) Date of Patent: *Feb. 4, 2025

(54) MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

(71) Applicant: IonQuest Corp., Milford, MA (US)

(72) Inventor: Bassam Hanna Abraham, Millis, MA (US)

(73) Assignee: IonQuest Corp., Milford, MA (US)

( * ) Notice: Subject to any disclaimer, the term of this patent is extended or adjusted under 35 U.S.C. 154(b) by 377 days.

This patent is subject to a terminal disclaimer.

(21) Appl. No.: 17/495,730

(22) Filed: Oct. 6, 2021

(65) Prior Publication Data

US 2022/0042168 A1 Feb. 10, 2022

Related U.S. Application Data

(63) Continuation-in-part of application No. 17/352,168, filed on Jun. 18, 2021, now abandoned, which is a
(Continued)

(51) Int. Cl.
*H01J 37/34* (2006.01)
*C23C 14/14* (2006.01)
(Continued)

(52) U.S. Cl.
CPC .......... *H01J 37/3444* (2013.01); *C23C 14/14* (2013.01); *C23C 14/345* (2013.01);
(Continued)

(58) Field of Classification Search
CPC ............... H01J 37/3405; H01J 37/3417; H01J 37/3426; H01J 37/3435; H01J 37/3444;
(Continued)

(56) References Cited

U.S. PATENT DOCUMENTS 3,767,551 A 10/1973 Lang, Jr. et al.
4,060,470 A 11/1977 Clarke
(Continued)

FOREIGN PATENT DOCUMENTS

WO 2014/053209 A1 4/2014
WO 2016/028640 A1 2/2016
(Continued)

OTHER PUBLICATIONS

Shindengen.com, "What are Fast Recovery Diodes (FRD)?" section. [https://www.shindengen.com/products/semi/column/basic/diodes/frd.html#:~: text=FRD%20stands%20for%20fast%20recovery,compared%20to%20general%20rectifying%20diodes.] (Year: 2002).*

(Continued)

*Primary Examiner* — Michael A Band
(74) *Attorney, Agent, or Firm* — FisherBroyles, LLP

(57) ABSTRACT

A method of sputtering a layer on a substrate includes positioning an HEDP magnetron in a vacuum with an anode, cathode target, magnet assembly, substrate, and feed gas; applying a plurality of unipolar negative direct current (DC) voltage pulses from a pulse power supply to a pulse converting network (PCN), wherein the PCN comprises at least one inductor and at least one capacitor; and adjusting an amplitude, pulse duration, and frequency associated with the plurality of unipolar negative DC voltage pulses and adjusting a value of at least one of the at least one inductor and the at least one capacitor, thereby causing a resonance mode associated with the PCN. The substrate is operatively coupled to ground by a first diode, thereby attracting positively charged ions sputtered from the cathode target and plasma to the substrate. A corresponding apparatus and computer-readable medium are also disclosed.

31 Claims, 73 Drawing Sheets

Related U.S. Application Data continuation of application No. 17/127,527, filed on Dec. 18, 2020, now Pat. No. 11,823,859, which is a continuation-in-part of application No. 16/261,514, filed on Jan. 29, 2019, now Pat. No. 10,913,998, and a continuation-in-part of application No. 16/025,928, filed on Jul. 2, 2018, now abandoned, said application No. 16/261,514 is a continuation of application No. 15/917,046, filed on Mar. 9, 2018, now Pat. No. 10,227,692, said application No. 16/025,928 is a continuation-in-part of application No. PCT/US2017/048438, filed on Aug. 24, 2017, said application No. 15/917,046 is a continuation of application No. 15/261,119, filed on Sep. 9, 2016, now Pat. No. 9,951,414.

(60) Provisional application No. 62/482,993, filed on Apr. 7, 2017, provisional application No. 62/270,356, filed on Dec. 21, 2015.

(51) Int. Cl.
*C23C 14/34* (2006.01)
*C23C 14/35* (2006.01)

(52) U.S. Cl.
CPC .......... *C23C 14/3485* (2013.01); *C23C 14/35* (2013.01); *C23C 14/354* (2013.01); *H01J 37/3405* (2013.01); *H01J 37/3417* (2013.01); *H01J 37/3426* (2013.01); *H01J 37/3435* (2013.01); *H01J 37/3455* (2013.01); *H01J 37/3464* (2013.01); *H01J 37/3467* (2013.01)

(58) Field of Classification Search
CPC ............... H01J 37/3455; H01J 37/3467; H01J 37/32715; H01J 37/3464; C23C 14/14; C23C 14/3485; C23C 14/35; C23C 14/345

See application file for complete search history.

(56) References Cited

U.S. PATENT DOCUMENTS

| | | | |
|---|---|---|---|
| 4,588,490 | A | 5/1986 | Cuomo et al. |
| 5,092,978 | A * | 3/1992 | Kojima ............... C23C 14/50 |
| | | | 204/192.18 |
| 5,178,739 | A | 1/1993 | Barnes et al. |
| 5,227,211 | A | 7/1993 | Eltoukhy et al. |
| 5,482,611 | A | 1/1996 | Helmer et al. |
| 5,651,865 | A | 7/1997 | Sellers |
| 6,024,843 | A | 2/2000 | Anderson et al. |
| 6,077,403 | A | 6/2000 | Kobayashi et al. |
| 6,216,632 | B1 | 4/2001 | Wickramanayaka |
| 6,903,511 | B2 | 6/2005 | Chistyakov |
| 7,095,179 | B2 | 8/2006 | Chistyakov |
| 7,179,350 | B2 | 2/2007 | Laptev et al. |
| 7,327,089 | B2 | 2/2008 | Madocks |
| 7,898,183 | B2 | 3/2011 | Chistyakov et al. |
| 8,535,494 | B2 | 9/2013 | Ohmi et al. |
| 8,696,875 | B2 | 4/2014 | Ding et al. |
| 9,267,200 | B2 | 2/2016 | Krassnitzer et al. |
| 9,624,571 | B2 | 4/2017 | Arndt et al. |
| 9,771,647 | B1 | 9/2017 | Scobey et al. |
| 9,951,414 | B2 | 4/2018 | Chistyakov et al. |
| 10,227,691 | B2 | 3/2019 | Abraham et al. |
| 10,227,692 | B2 | 3/2019 | Chistyakov et al. |
| 10,480,063 | B2 | 11/2019 | Chistyakov et al. |
| 10,900,118 | B2 | 1/2021 | Abraham et al. |
| 10,913,998 | B2 | 2/2021 | Chistyakov et al. |
| 10,957,519 | B2 | 3/2021 | Chistyakov et al. |
| 11,306,391 | B2 | 4/2022 | Abraham et al. |
| 11,359,274 | B2 * | 6/2022 | Abraham ............ H01J 37/3423 |
| 11,482,404 | B2 | 10/2022 | Abraham et al. |
| 11,823,859 | B2 * | 11/2023 | Abraham ............ H01J 37/3435 |
| 2001/0050220 | A1 | 12/2001 | Chiang et al. |
| 2004/0060813 | A1 * | 4/2004 | Chistyakov ....... H01J 37/32082 |
| | | | 204/192.12 |
| 2004/0089541 | A1 | 5/2004 | Matsumoto et al. |
| 2004/0095497 | A1 | 5/2004 | Compton et al. |
| 2004/0227470 | A1 | 11/2004 | Benveniste et al. |
| 2006/0066248 | A1 | 3/2006 | Chistyakov |
| 2006/0278521 | A1 | 12/2006 | Stowell |
| 2006/0290399 | A1 | 12/2006 | MacDougall et al. |
| 2008/0190760 | A1 | 8/2008 | Tang et al. |
| 2009/0321249 | A1 | 12/2009 | Chistyakov et al. |
| 2011/0011737 | A1 | 1/2011 | Wu et al. |
| 2014/0041800 | A1 | 2/2014 | Okuyama et al. |
| 2014/0305795 | A1 | 10/2014 | Bardos et al. |
| 2015/0348773 | A1 | 12/2015 | Zhu et al. |
| 2016/0215386 | A1 | 7/2016 | Stowell |
| 2017/0178878 | A1 | 6/2017 | Abraham et al. |
| 2017/0178912 | A1 | 6/2017 | Chistyakov et al. |
| 2018/0374688 | A1 | 12/2018 | Chistyakov et al. |
| 2018/0374689 | A1 | 12/2018 | Abraham et al. |
| 2019/0249293 | A1 | 8/2019 | Abraham et al. |
| 2019/0256969 | A1 | 8/2019 | Chistyakov et al. |
| 2019/0271070 | A1 | 9/2019 | Abraham et al. |
| 2019/0316249 | A1 | 10/2019 | Abraham et al. |
| 2020/0176234 | A1 | 6/2020 | Abraham et al. |
| 2021/0102284 | A1 | 4/2021 | Abraham et al. |
| 2021/0115552 | A1 | 4/2021 | Abraham et al. |
| 2021/0115553 | A1 | 4/2021 | Abraham |
| 2021/0317569 | A1 | 10/2021 | Abraham |

FOREIGN PATENT DOCUMENTS

| | | |
|---|---|---|
| WO | 2017/112696 A1 | 6/2017 |
| WO | 2017/112700 A1 | 6/2017 |
| WO | 2018/186901 A1 | 10/2018 |

OTHER PUBLICATIONS

ShinDengen.com (Year: 2002).*
Non-Final Office Action received for U.S. Appl. No. 17/127,527 dated Aug. 30, 2022, 45 pages.
Non-Final Office Action received for U.S. Appl. No. 17/352,168 dated Aug. 30, 2022, 39 pages.
Non-Final Office Action received for U.S. Appl. No. 16/261,514 dated Jun. 29, 2020, 26 pages.
Notice of Allowance received for U.S. Appl. No. 16/261,514 dated Oct. 9, 2020, 81 pages.
Non-Final Office Action received for U.S. Appl. No. 15/260,857 dated Mar. 9, 2018, 40 pages.
Final Office Action received for U.S. Appl. No. 15/260,857 dated Nov. 19, 2018, 16 pages.
Non-Final Office Action received for U.S. Appl. No. 15/260,841 dated Jan. 9, 2019, 8 pages.
Notice of Allowance received for U.S. Appl. No. 15/260,841 dated May 28, 2019, 16 pages.
Helmersson et al., "Ionized physical vapor deposition (IPVD): A review of technology and applications", URL:http://run.kb.se/resolve?um=um:nbn:se:liu:diva-10434, Postprint available: Linkoping University E-Press, Article in Thin SolidFilms, Aug. 14, 2006, 61 pages.
International Search Report and Written Opinion received for PCT Application Serial No. PCT/US2017/048438 Nov. 3, 2017, 10 pages.
Non-Final Office Action received for U.S. Appl. No. 15/261,119 dated Jun. 26, 2017, 14 pages.
Final Office Action received for U.S. Appl. No. 15/261,119 dated Oct. 30, 2017, 11 pages.
Notice of Allowance received for U.S. Appl. No. 15/261,119 dated Jan. 26, 2018, 16 pages.
Non-Final Office Action received for U.S. Appl. No. 15/917,046 dated Jun. 22, 2018, 17 pages.
Notice of Allowance received for U.S. Appl. No. 15/917,046 dated Oct. 29, 2018, 19 pages.
Non-Final Office Action received for U.S. Appl. No. 15/261,197 dated Jun. 18, 2018, 14 pages.

(56) References Cited

OTHER PUBLICATIONS

Notice of Allowance received for U.S. Appl. No. 15/261,197 dated Oct. 31, 2018, 18 pages.
International Search Report and Written Opinion received for PCT Application Serial No. PCT/US2016/067850 dated Mar. 9, 2017, 7 pages.
International Preliminary Report on Patentability received for PCT Application Serial No. PCT/US2016/067850 dated Jul. 5, 2018, 7 pages.
Wang et al., "Hollow cathode magnetron", Journal of Vacuum Science & Technology A, vol. 17, No. 1, 1999, pp. 77-82.
International Search Report and Written Opinion received for PCT Application Serial No. PCT/US2016/067838 dated Mar. 16, 2017, 7 pages.
International Preliminary Report on Patentability received for PCT Application Serial No. PCT/US2016/067838 dated Jul. 5, 2018, 6 pages.
Abraham et al., "Electrically and Magnetically Enhanced Ionized Physical Vapor Deposition Unbalanced Sputtering Source", U.S. Appl. No. 16/284,327 dated Feb. 25, 2019, 114 pages.
Abraham et al., "Electrically and Magnetically Enhanced Ionized Physical Vapor Deposition Unbalanced Sputtering Source", U.S. Appl. No. 16/400,539 dated May 1, 2019, 64 pages.
Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.
Abraham et al., "High-Power Resonance Pulse Ac Hedp Sputtering Source And Method For Material Processing", U.S. Appl. No. 16/025,928 dated Jul. 2, 2018, 76 pages.
Non-Final Office Action received for U.S. Appl. No. 16/063,283 dated Sep. 22, 2020, 35 pages.
Non-Final Office Action received for U.S. Appl. No. 16/025,928 dated Sep. 25, 2020, 24 pages.
Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 62 pages.
Non-Final Rejection received for U.S. Appl. No. 16/063,284 dated Jan. 30, 2020, 26 pages.
Non-Final Rejection received for U.S. Appl. No. 16/063,284 dated May 20, 2020, 12 pages.
Notice of Allowance received for U.S. Appl. No. 16/063,284 dated Dec. 17, 2020, 36 pages.
Non-Final Rejection received for U.S. Appl. No. 16/261,516 dated Jun. 29, 2020, 28 pages.
Notice of Allowance received for U.S. Appl. No. 16/261,516 dated Oct. 19, 2020, 24 pages.
International Preliminary Report on Patentability received for PCT Application Serial No. PCT/US2017/048438 dated Oct. 17, 2019, 8 pages.
Abraham et al., "Magnetically Enhanced High Density Plasma-Chemical Vapor Deposition Plasma Source For Depositing Diamond and Diamond-Like Films", U.S. Appl. No. 17/124,749, filed Dec. 17, 2020, 62 pages.
Abraham et al., "Magnetically Enhanced High Density Plasma-Chemical Vapor Deposition Plasma Source For Depositing Diamond and Diamond-Like Films", U.S. Appl. No. 17/124,691, filed Dec. 17, 2020, 63 pages.
Final Office Action received for U.S. Appl. No. 16/063,283 dated Mar. 18, 2021, 32 pages.
Abraham, Bassam Hanna, "Magnetically Enhanced High Density Plasma-Chemical Vapor Deposition Plasma Source For Depositing Diamond and Diamond-Like Films", U.S. Appl. No. 17/127,527, filed Dec. 18, 2020, 172 pages.
Non-Final Office Action received for U.S. Appl. No. 16/063,283 dated Aug. 19, 2021, 21 pages.
Non-Final Office Action received for U.S. Appl. No. 16/400,539 dated Sep. 23, 2021, 38 pages.
Non-Final Office Action received for U.S. Appl. No. 16/284,327 dated Sep. 15, 2021, 42 pages.
Non-Final Office Action received for U.S. Appl. No. 17/124,691 dated Nov. 1, 2021, 42 pages.
Notice of Allowance received for U.S. Appl. No. 16/400,539 dated Oct. 8, 2021, 13 pages.
Non-Final Office Action received for U.S. Appl. No. 17/124,749 dated Nov. 5, 2021, 44 pages.
Non-Final Office Action received for U.S. Appl. No. 17/946,139, dated Jul. 27, 2023, 14 pages.

* cited by examiner

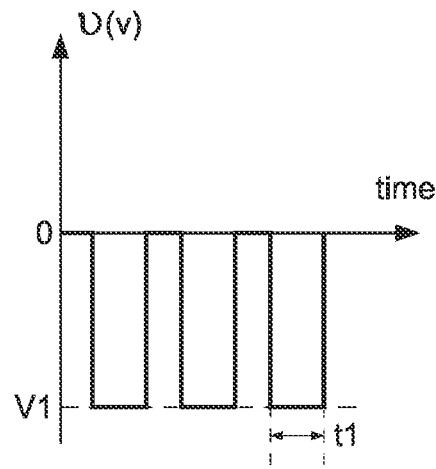
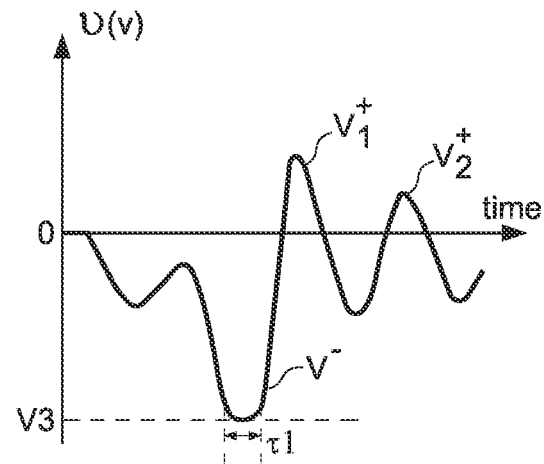
FIG. 1A
FIG. 1B
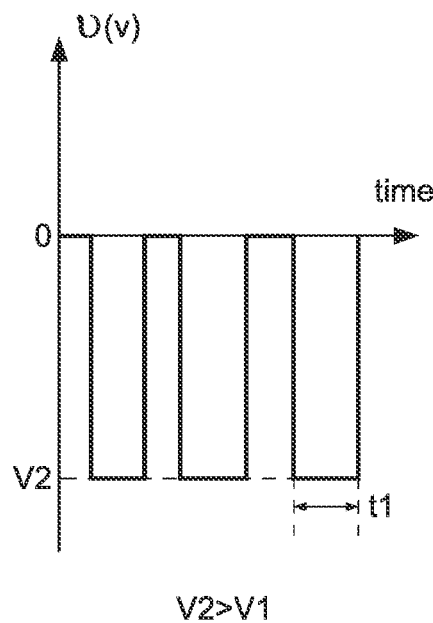
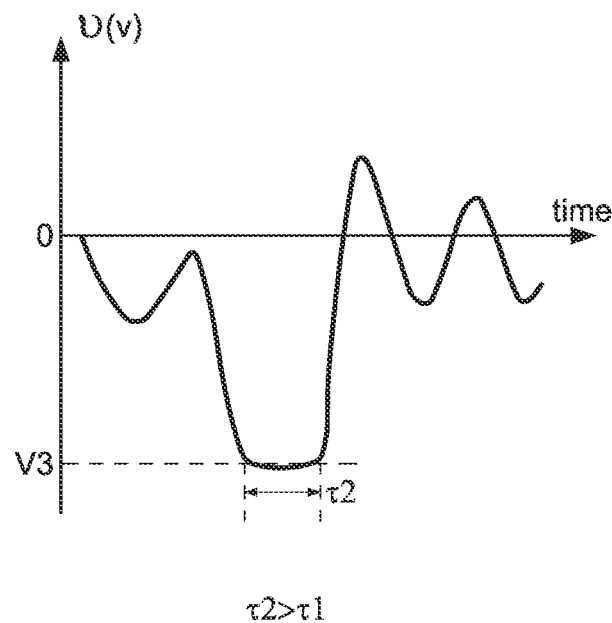
FIG. 1C
FIG. 1D

V8>V6, V9>V7

Output of PFN showing
resonance voltage

V8>V6,V9>V7

MAGNETICALLY ENHANCED HIGH DENSITY PLASMA-CHEMICAL VAPOR DEPOSITION PLASMA SOURCE FOR DEPOSITING DIAMOND AND DIAMOND-LIKE FILMS

CROSS-REFERENCE TO RELATED APPLICATIONS

This application is a continuation-in-part of U.S. application Ser. No. 17/352,168, filed Jun. 18, 2021, which is a continuation application of U.S. application Ser. No. 17/127,527, filed Dec. 18, 2020, which is a continuation-in-part application of U.S. application Ser. No. 16/261,514, filed Jan. 29, 2019, which is a continuation application of U.S. application Ser. No. 15/917,046, filed Mar. 9, 2018, which is a continuation application of U.S. application Ser. No. 15/261,119, filed Sep. 9, 2016, which claims the benefit of U.S. Provisional Application No. 62/270,356, filed Dec. 21, 2015, the disclosures of which are incorporated by reference herein in their entireties. U.S. application Ser. No. 15/260,841 entitled "Capacitive Coupled Plasma Source for Sputtering and Resputtering", U.S. application Ser. No. 15/260,857 entitled "Electrically and Magnetically Enhanced Ionized Physical Vapor Deposition Unbalanced Sputtering Source", and U.S. application Ser. No. 15/261,197 entitled "Magnetically Enhanced Low Temperature-High Density Plasma-Chemical Vapor Deposition Plasma Source for Depositing Diamond and Diamond-Like Films" are incorporated by reference herein in their entireties. U.S. application Ser. No. 17/127,527, filed Dec. 18, 2020, is a continuation-in-part application of U.S. application Ser. No. 16/025,928, filed Jul. 2, 2018, which is a continuation-in-part application of International Application No. PCT/US17/48438, filed Aug. 24, 2017, which claims the benefit of U.S. Provisional Application No. 62/482,993, filed Apr. 7, 2017, the disclosures of which are incorporated by reference herein in their entireties.

BACKGROUND

Field

The disclosed embodiments generally relate to a plasma-enhanced chemical vapor deposition (PE CVD) apparatus and method and, more particularly, relate to a pulse magnetically enhanced low-temperature high-density plasma chemical vapor deposition (LT HDP CVD) apparatus and method.

The disclosed embodiments relate to high-power resonance pulse technology for advanced thin film layer deposition on any substrate. The disclosed embodiments also relate to converting a unipolar negative direct current (DC) pulse to a high-power resonance asymmetric alternating current (AC) pulse on a magnetron for sputtering advanced thin films on any substrate. The disclosed embodiments generally relate to a high energy density plasma (HEDP) magnetically enhanced sputtering source and a method for sputtering hard, dense, and smooth thin films on a substrate surface.

Related Art

CVD plasma sources that deposit diamond and diamond-like coatings and films use hot filament chemical vapor deposition (HFCVD) and microwave-assisted chemical vapor deposition (CVD) techniques. Methods require a high temperature on a substrate and high bias voltage in order to form a carbon film with a high content of sp3 bonds. Accordingly, new CVD technologies are needed that will allow depositing diamond-like carbon (DLC) films at much lower temperatures and much lower bias.

SUMMARY

Various embodiments relate to an apparatus, method, and system for pulse magnetically enhanced high-density plasma chemical vapor deposition (HDP CVD) of thin-film coatings, and in particular, diamond and diamond-like coatings.

The magnetically enhanced HDP-CVD source includes (a) a hollow cathode target assembly connected to a power supply, which can include a pulsed power supply, variable power direct current (DC) power supply, variable power alternating current (AC) power supply, radio frequency (RF) power supply, pulsed RF power supply, high power impulse magnetron sputtering (HIPIMIS) power supply, HIPIMIS power supply with an additional pulse forming network (PFN) or pulse converting network (PCN) to generate a high-power resonance asymmetric pulsed AC discharge or a combination of any of these power supplies, (b) an anode that is connected to ground, (c) a gap between a hollow cathode target and an anode, (d) two rows of permanent magnets or electromagnets that are positioned on top of each other in order to generate a cusp magnetic field in the gap between the hollow cathode and the anode, (e) a cathode magnet assembly that can be configured to generates magnetic field lines perpendicular to a surface of the hollow cathode target, (f) a magnetic coupling between the cathode target magnet assembly and a cusp magnetic field in the gap, (g) a flowing liquid that cools and controls the temperature of the hollow cathode, (h) a cathode magnet assembly that can be configured to generates magnetic field lines perpendicular to a surface of the hollow cathode target and, concentric with the hollow cathode target, another magnet assembly forming a magnetron configuration on the surface of the hollow cathode target, (i) an accelerating grid positioned parallel to the surface of the hollow cathode target, (j) and a power supply connected to the accelerating grid providing voltage for ion acceleration.

The magnetically enhanced CVD source may include (a) a pole piece between the two rows of magnets that are exposed to the plasma through the gap between the hollow cathode and the anode, (b) a pole piece positioned on top of a top row of the magnets, (c) a gap in the anode that exposes a pole piece positioned on top of the top row of magnets to the plasma, (d) a gas distribution system, (e) an inductor connected between the cathode and ground to eliminate the DC bias generated by impingement of electrons on the powered cathode, (f) a motor that can rotate a cathode magnet assembly, (g) a power supply connected to a pole piece, and (e) an inductor connected between the pole piece and ground to eliminate the DC bias generated by impingement of electrons on the powered pole piece and, in some cases, the inductor is connected to the pole piece on one end and to a synchronized electronic switch on the other end and to ground.

The magnetically enhanced CVD source may include (a) a pole piece between the two rows of magnets that is not exposed to the plasma through the gap between the hollow cathode and the anode protected by a shield, (b) a pole piece positioned on top of a top row of the magnets, (c) a gap in the anode that exposes the shield piece positioned on top of the top row of magnets to the plasma, (d) a gas distribution system, (e) an inductor connected between the cathode and ground, (f) a cathode magnet assembly, (g) a power supply connected to shield piece, and (h) an inductor connected between the shield piece and ground to eliminate the DC bias generated by impingement of electrons on the powered shield.

The magnetically enhanced CVD source may include (a) a pole piece between the two rows of magnets that is not exposed to the plasma through the gap between the hollow cathode and the anode protected by a shield, (b) a pole piece positioned on top of a top row of the magnets, (c) a gap in the anode that exposes the shield piece positioned on top of the top row of magnets to the plasma, (d) a gas distribution system, (e) an inductor connected between the cathode and ground to eliminate the DC bias generated by the impinging of electrons on the powered cathode, (f) a cathode magnet assembly, (g) a power supply connected to shield piece, (h) an inductor connected between the shield piece and ground to eliminate the DC bias generated by impingement of electrons on the powered shield, (i) an accelerating grid positioned parallel to the surface of the hollow cathode target, and (j) a ground power supply connected to the accelerating grid providing voltage for ion acceleration.

The magnetically enhanced CVD apparatus includes (a) a magnetically enhanced CVD source, (b) a vacuum chamber, (c) a substrate holder, (d) a substrate, (e) a feed gas mass flow controller, and (f) a vacuum pump.

The magnetically enhanced HDP-CVD apparatus may include (a) a DC or RF substrate bias power supply, (b) a substrate heater, (c) more than one magnetically enhanced PVD sources, (d) a gas activation source, (a) an additional magnet assembly positioned between the magnetically enhanced HDP-CVD plasma source and the substrate holder or positioned below the substrate holder. The magnet assembly can be positioned inside or outside a vacuum chamber.

A method of providing magnetically enhanced HDP-CVD thin film deposition includes (a) forming a cusp magnetic field in a gap between a hollow cathode and an anode, (b) forming magnetic field lines perpendicular to a bottom surface of the hollow cathode, (c) providing feed gas, (d) applying negative voltage to the cathode target and igniting volume plasma discharge, (e) and positioning a substrate.

The method of providing magnetically enhanced CVD thin film deposition may include (a) heating the substrate, (b) applying a bias voltage to the substrate, (c) applying an RF voltage to the pole piece, (d) applying an RF voltage to the cathode target, and (e) synchronizing the RF voltage applied to the pole piece and RF voltage applied to the cathode target or using a common exciter (CEX) to prevent unwanted beat frequencies. Two RF generators can be phase-locked together to run at the same frequency and with a fixed phase relationship between their outputs. This locking ensures repeatable RF characteristics within the plasma.

The method of providing magnetically enhanced CVD thin film deposition may include (a) heating the substrate, (b) applying a bias voltage to the substrate, (c) applying an RF voltage to the pole piece, (d) applying an RF voltage to the cathode target, (e) synchronizing the RF voltage applied to the pole piece and RF voltage applied to the cathode target or using a common exciter (CEX) to prevent unwanted beat frequencies, (f) an accelerating grid positioned parallel to the surface of the hollow cathode target, and (g) a power supply connected to the accelerating grid providing voltage for ion acceleration. Two RF generators can be phase-locked together to run at the same frequency and with a fixed phase relationship between their outputs. This locking ensures repeatable RF characteristics within the plasma.

A magnetically enhanced chemical vapor deposition (CVD) apparatus includes a hollow cathode target assembly; an anode positioned on top of the hollow cathode target assembly, thereby forming a gap between the anode and the hollow cathode target assembly; a cathode magnet assembly; two rows of magnets facing each other with the same magnetic field direction that generate a cusp magnetic field in the gap and a magnetic field on the hollow cathode surface with the cathode magnet assembly, the magnetic field comprising magnetic field lines that are substantially perpendicular to the hollow cathode target assembly; and a pole piece positioned between the two rows of magnets and connected to a voltage power supply, the voltage power supply generating a train of negative voltage pulses that generates a pulsed electric field in the gap perpendicular to the cusp magnetic field, the electric field igniting and sustaining plasma during a pulse of the train of negative voltage pulses, a frequency, duration and amplitude of the train of negative voltage pulses being selected to increase a degree of ionization of feed gas atoms.

The magnetically enhanced CVD sputtering apparatus may include a second gap positioned inside the anode such that a portion of the magnetic field lines forming the cusp magnetic field cross the gap and terminate on top of a second row of magnets, and a radio frequency (RF) power supply connected to the hollow cathode target assembly, wherein the RF power supply generates output voltage with a frequency in a range of about 1 MHz to 100 MHz. The power supply may be connected to the hollow cathode target assembly and generate output current in a range of about 20 A to 200 A. The magnetically enhanced CVD sputtering apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

A method of magnetically enhanced chemical vapor deposition (CVD) sputtering includes providing a hollow cathode target assembly; forming a gap between the hollow cathode target assembly and an anode; positioning a cathode magnet assembly; generating a cusp magnetic field in the gap such that magnetic field lines are substantially perpendicular to the hollow cathode surface; positioning a pole piece in the gap connected to a voltage power supply; providing a pulsed DC power to the cathode target to ignite and sustain volume discharge; generating a train of negative voltage pulses using the voltage power supply; and selecting a frequency, duration, and amplitude of the train of negative voltage pulses to increase a degree of ionization of sputtered target material atoms.

The method may include positioning a second gap inside the anode such that the portion of the magnetic field lines forming the cusp magnetic field crosses the gap and terminate on top of a second row of magnets, and connecting a radio frequency (RF) power supply to the hollow cathode assembly and generating output voltage with a frequency in a range of about 1 MHz to 100 MHz. The voltage power supply can generate output voltage in a range of about −100 V to −3000 V. The method may include connecting a substrate bias power supply to a substrate holder and generating a bias voltage on a substrate in a range of about −10 V to −2000V. The magnetic field in the gap may be in a range of about 50 G to 10000 G, and the cathode target material may include carbon and/or aluminum.

A method of magnetically enhanced chemical vapor deposition (CVD) sputtering includes providing a hollow cathode target assembly; forming a gap between the hollow cathode target assembly and an anode; positioning a cathode magnet assembly; generating a cusp magnetic field in the gap such that magnetic field lines are substantially perpendicular to the hollow cathode surface; positioning a shield piece between the gap and the magnets forming the cusp field, connecting the shield piece to a voltage power supply; providing a pulsed DC power to the cathode target to ignite and sustain volume discharge; generating a train of negative voltage pulses using the voltage power supply; and selecting a frequency, duration, and amplitude of the train of negative voltage pulses to increase a degree of ionization of sputtered target material atoms.

A method of magnetically enhanced chemical vapor deposition (CVD) sputtering includes providing a hollow cathode target assembly; forming a gap between the hollow cathode target assembly and an anode; positioning a cathode magnet assembly, the cathode magnet assembly can be two parts including an outer-ring with a perpendicular field, wherein the cathode target closes the field with the cusp field through the gap and a concentric magnetic assembly forming a magnetron configuration on the cathode target, the cathode inner magnetic assembly can be stationary or rotating; positioning a shield piece between the gap and the magnets forming the cusp field, connecting the shield piece to a voltage power supply or grounded; providing a pulsed DC power to the cathode target to ignite and sustain volume discharge; generating a train of negative voltage pulses using the voltage power supply; and selecting a frequency, duration, and amplitude of the train of negative voltage pulses to increase a degree of ionization of sputtered target material atoms.

A method of magnetically enhanced chemical vapor deposition (CVD) sputtering includes providing a hollow cathode target assembly; forming a gap between the hollow cathode target assembly and an anode; positioning a cathode magnet assembly, the cathode magnet assembly can be two parts, including an outer-ring with a perpendicular field, the cathode target closing the field with the cusp field through the gap and concentric magnetic assembly forming a magnetron configuration on the cathode target, the cathode inner magnetic assembly can be stationary or rotating; positioning a shield piece between the gap and the magnets forming the cusp field, connecting the shield piece to a voltage power supply or grounded; providing a high-power pulsed resonance asymmetric AC power to the cathode target to ignite and sustain volume discharge; generating an inductively current-driven plasma; and selecting a frequency, duration, and amplitude to optimize the resonance asymmetric AC pulses to increase a degree of ionization of sputtered target material atoms.

A method of magnetically enhanced chemical vapor deposition (CVD) sputtering includes providing a hollow cathode target assembly; forming a gap between the hollow cathode target assembly and an anode; positioning a cathode magnet assembly; generating a cusp magnetic field in the gap such that magnetic field lines are substantially perpendicular to the hollow cathode surface; positioning a shield piece between the gap and the magnets forming the cusp field, connecting the shield piece to an RF power supply with an inductor to ground to eliminate the DC bias generated by impingement of electrons on the powered shield, a radio frequency (RF) power supply connected to the hollow cathode target assembly, wherein the RF power supply generates output voltage with a frequency in a range of about 1 MHz to 100 MHz. The power supply may be connected to the hollow cathode target assembly and generate output current in a range of about 20 A to 200 A. The two RF power supplies can be the same frequency or different frequencies If the same frequency is used, a common exciter (CEX) can be used to prevent unwanted beat frequencies. Two RF generators can be phase-locked together so that the generators run at the same frequency and with a fixed phase relationship between their outputs. This locking ensures repeatable RF characteristics within the plasma. The magnetically enhanced CVD sputtering apparatus may include a substrate holder and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

The magnetically enhanced CVD sputtering apparatus may include a second gap positioned inside the anode such that a portion of the magnetic field lines forming the cusp magnetic field cross the gap and terminate on top of a second row of magnets, a grounded shield piece positioned between the gaps and the magnets forming the cusp field, and a radio frequency (RF) power supply connected to the hollow cathode target assembly, wherein the RF power supply generates output voltage with a frequency in a range of about 1 MHz to 100 MHz. The power supply may be connected to the hollow cathode target assembly and generate output current in a range of about 20 A to 200 A. The magnetically enhanced CVD sputtering apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

The magnetically enhanced CVD sputtering apparatus may include a second gap positioned inside the anode such that a portion of the magnetic field lines forming the cusp magnetic field cross the gap and terminate on top of a second row of magnets, positioning a grounded shield piece between the gaps and the magnets forming the cusp field, and a radio frequency (RF) power supply connected to the hollow cathode target assembly, wherein the two different RF power supply generates output voltage with a frequency in a range of about 1 MHz to 100 MHz. The two RF power supplies may be connected to the hollow cathode target assembly by two different frequency matching network and generate output current in a range of about 20 A to 200 A. The magnetically enhanced CVD sputtering apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

A method of magnetically enhanced chemical vapor deposition (CVD) plasma-enhanced atomic layer deposition (PE-ALD) includes providing a hollow cathode target assembly; forming a gap between the hollow cathode target assembly and an anode; positioning a cathode magnet assembly; generating a cusp magnetic field in the gap such that magnetic field lines are substantially perpendicular to the hollow cathode surface; positioning a shield piece between the gap and the magnets forming the cusp field, connecting the shield piece to an RF power supply with an inductor to ground; and a radio frequency (RF) power supply connected to the hollow cathode target assembly, wherein the RF power supply generates output voltage with a frequency in a range of about 1 MHz to 100 MHz. The power supply may be connected to the hollow cathode target assembly and generate output current in a range of about 20 A to 200 A. The two RF power supplies can be the same frequency or different frequencies. If the same frequency is used, a common exciter (CEX) can be used to prevent unwanted beat frequencies, two RF generators can be phase-locked together so that the generators run at the same frequency and with a fixed phase relationship between their outputs. This locking ensures repeatable RF characteristics within the plasma The magnetically enhanced CVD plasma-enhanced atomic layer deposition (PE-ALD) apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

The magnetically enhanced chemical vapor deposition (CVD) plasma-enhanced atomic layer deposition (PE-ALD) apparatus may include a second gap positioned inside the anode such that a portion of the magnetic field lines forming the cusp magnetic field cross the gap and terminate on top of a second row of magnets, positioning a grounded shield piece between the gaps and the magnets forming the cusp field, and a radio frequency (RF) power supply connected to the hollow cathode target assembly, wherein the two different RF power supplies generate output voltage with a frequency in a range of about 1 MHz to 100 MHz. The two RF power supplies may be connected to the hollow cathode target assembly by two different frequency matching networks and generate output current in a range of about 20 A to 200 A. The magnetically enhanced CVD plasma-enhanced atomic layer deposition (PE-ALD) apparatus may include a substrate holder, and a substrate bias power supply, wherein the substrate bias power supply is connected to the substrate holder and generates a bias voltage on the substrate in a range of about −10 V to −2000 V. The magnetic field in the gap may be in a range of about 50 G to 10000 G. The cathode target material may include carbon and/or aluminum.

A method of magnetically enhanced chemical vapor deposition (CVD) plasma thruster includes providing a hollow cathode target assembly; forming a gap between the hollow cathode target assembly and an anode; positioning a cathode magnet assembly, the cathode magnet assembly having a perpendicular field to the cathode target closing the field with the cusp field through the gap; positioning a shield piece between the gap and the magnets forming the cusp field; connecting the shield piece to a voltage power supply or grounded; providing pulsed DC power to the cathode target to ignite and sustain volume discharge; generating a train of negative voltage pulses using the voltage power supply; and selecting a frequency, duration, and amplitude of the train of negative voltage pulses to increase a degree of ionization of the pulsed plasma thruster. The plasma thruster is used as a propulsion or steering device on satellites or spaceships in a low vacuum environment, such as space.

A method of magnetically enhanced chemical vapor deposition (CVD) plasma thruster includes providing a hollow cathode target assembly; forming a gap between the hollow cathode target assembly and an anode; positioning a cathode magnet assembly, the cathode magnet assembly having a perpendicular field to the cathode target; closing the field with the cusp field through the gap; positioning a shield piece between the gap and the magnets forming the cusp field; connecting the shield piece to a voltage power supply or grounded; providing pulsed DC power to the cathode target to ignite and sustain volume discharge; generating a train of negative voltage pulses using the voltage power supply; and selecting a frequency, duration, and amplitude of the train of negative voltage pulses to increase a degree of ionization of the pulsed plasma thruster, an accelerating grid positioned parallel to the surface of the hollow cathode target, and a power supply connected to the accelerating grid providing voltage for ion acceleration.

A method of magnetically enhanced chemical vapor deposition (CVD) pulsed ARC source includes providing a hollow cathode target assembly; forming a gap between the hollow cathode target assembly and an anode; positioning a cathode magnet assembly, the cathode magnet assembly having a perpendicular field to the cathode target; closing the field with the cusp field through the gap; positioning a shield piece between the gap and the magnets forming the cusp field; connecting the shield piece to a voltage power supply or grounded; providing a DC power supply to ignite and sustain and arc spot on the hollow cathode target and superimposing it with a pulsed DC power to the cathode target to increase the pulsed current in the arc spot discharge; generating a train of negative voltage pulses using the voltage power supply; and selecting a frequency, duration, and amplitude of the train of negative voltage pulses to increase a degree of ionization of the evaporated material from the hollow cathode target. The arc source produces dense and smooth thin films on a substrate with tiny microparticles and, in some cases, with no micro-particles.

The disclosed embodiments relate to a high energy density plasma (HEDP) magnetically enhanced sputtering source, apparatus, and method for sputtering hard coatings and dense, smooth, low-stress, thin films in the presence of high-power pulse asymmetrical alternating current (AC) voltage waveforms. The high-power pulse asymmetric AC voltage waveform is generated by having a regulated voltage source with variable power feeding a regulated voltage to the high-power pulse direct current (DC) supply with a built-in first pulse forming network (PFN) with programmable pulse voltage duration and pulse voltage frequency producing at its output a train of regulated amplitude unipolar negative voltage DC pulses with programmed pulse frequency and duration and supplying these pulses to a second tunable pulse forming network (PFN) or pulse converting network (PCN) including a plurality of inductors and capacitors for pulse applications connected in a specific format coupled to a magnetically enhanced sputtering source. By adjusting the pulse voltage amplitude, duration, and frequency of the unipolar negative voltage DC pulses and tuning the values of the inductors and capacitors in the second PFN or PCN coupled to a magnetically enhanced sputtering source, a resonance pulsed asymmetric AC discharge is achieved.

Another method to produce a resonance pulsed asymmetric AC discharge is to have fixed unipolar pulse power supply parameters (amplitude, frequency, and duration) feeding a second pulse forming network or pulse converting network (PCN), in which the numerical values of the inductors and capacitors, as well as the configuration, can be tuned to achieve the desired resonance values on the HEDP source to form a layer on the substrate. The tuning of the second PFN or PCN can be done manually with test equipment, such as an oscilloscope, voltmeter and current meter or other analytical equipment; or electronically with a built-in software algorithm, variable inductors, variable capacitors, and data acquisition circuitry. The negative voltage from the pulse asymmetric AC voltage waveform generates high-density plasma from feed gas atoms and sputtered target material atoms between the cathode sputtering target and the anode of the magnetically enhanced sputtering source. The positive voltage from the pulse asymmetrical AC voltage waveform attracts plasma electrons to the cathode sputtering area and generates positive plasma potential. The positive plasma potential accelerates gas and sputtered target material ions from the cathode sputtering target area towards the substrate that improves deposition rate and increases ion bombardment on the substrate. The reverse electron current during positive voltage can be up to 50% from the discharge current during negative voltage.

In some embodiments, the magnetically enhanced sputtering source is a hollow cathode magnetron. The hollow cathode magnetron includes a hollow cathode sputtering target and a second tunable PFN or PCN, which has a plurality of capacitors and inductors. The resonance mode associated with the second tunable PFN or PCN is a function of the input unipolar voltage pulse amplitude, duration, and frequency generated by the high-power pulse power supply, inductance, resistance and capacitance of the hollow cathode magnetron or any other magnetically enhanced device, the inductance, capacitance, and resistance of the cables between the second tunable PFN or PCN and hollow cathode magnetron, and a plasma impedance of the hollow cathode magnetron sputtering source itself as well as the sputtered target material.

In some embodiments, rather than the hollow cathode magnetron, a cylindrical magnetron is connected to an output of the tunable PFN or PCN. In some embodiments, rather than the hollow cathode magnetron, a magnetron with flat target is connected to the output of the second tunable PFN or PCN. In the resonance mode, the output negative voltage amplitude of the high-power pulse voltage mode asymmetrical AC waveform on the magnetically enhanced device exceeds the negative voltage amplitude of the input unipolar voltage pulses into the second tunable PFN or PCN by 1.1-5 times. The unipolar negative high-power voltage output can be in the range of 400V-5000V. In the resonance mode, the absolute value of the negative voltage amplitude of the asymmetrical AC waveform can be in the range of 750-10000 V. In the resonance mode, the output positive voltage amplitude of the asymmetrical AC waveform can be in the range of 100-5000 V. In some cases, the resonance mode of the negative voltage amplitude of the output AC voltage waveform can reach a maximum absolute value while holding all other component parameters (such as the pulse generator output, PFN or PCN values, cables and HEDP source) constant, wherein a further increase of the input voltage to the second tunable PFN or PCN does not result in a voltage amplitude increase on the HEDP source, but rather an increase in the duration of the negative pulse in the asymmetric AC voltage waveform on the HEDP source.

Sputtering processes are performed with a magnetically and electrically enhanced HEDP plasma source positioned in a vacuum chamber. As mentioned above, the plasma source can be any magnetically enhanced sputtering source with a different shape of sputtering cathode target. Magnetic enhancement can be performed with electromagnets, permanent magnets, stationary magnets, moveable magnets, and/or rotatable magnets. In the case of a magnetron sputtering source, the magnetic field can be balanced or unbalanced. A typical pulse power density of the HEDP sputtering process during a negative portion of the high voltage AC waveform is in the range of 0.1-20 kW/cm$^2$. A typical pulse discharge current density of the HEDP sputtering process during a negative portion of the high voltage AC waveform is in the range of 0.1-20 A/cm$^2$. In the case of the hollow cathode magnetron sputtering source, the magnetic field lines form a magnetron configuration on a bottom surface of the hollow cathode target from the hollow cathode magnetron. Magnetic field lines are substantially parallel to the bottom surface of the hollow cathode target and partially terminate on the bottom surface and side walls of the hollow cathode target. The height of the side walls can be in the range of 5-100 mm. Due to the presence of side walls on the hollow cathode target, electron confinement is significantly improved when compared with a flat target in accordance with the disclosed embodiments. In some embodiments, an additional magnet assembly is positioned around the walls of the hollow cathode target. In some embodiments, there is a magnetic coupling between additional magnets and a magnetic field forms a magnetron configuration.

Since the high-power resonance asymmetric AC voltage waveform can generate HEDP plasma and, therefore, significant power on the magnetically enhanced sputtering source, the high-power resonance asymmetric AC voltage waveform is pulsed in programmable bursts to prevent damage to the magnetically enhanced sputtering source from excess average power. The programmable duration of the high-power resonance asymmetric AC voltage waveforms pulse bursts can be in the range of 0.1-100 ms. The frequency of the programmable high-power resonance asymmetric AC voltage waveforms pulse bursts can be in the range of 1 Hz-10000 Hz. In some embodiments, the high-power resonance asymmetric AC voltage waveform is continuous or has a 100% duty cycle assuming the HEDP plasma source can handle the average power. The frequency of the pulsed high-power resonance asymmetric AC voltage waveform inside the programmable pulse bursts can be programmed in the range of 100 Hz-400 kHz with a single frequency or mixed frequency.

The magnetically enhanced HEDP sputtering source includes a magnetron with a sputtering cathode target, an anode, a magnet assembly, a regulated voltage source connected to a high-power pulsed DC power supply with a built in first pulse forming network to control voltage rise-time and or fall time of the unipolar negative pulse with programmable output pulse voltage amplitude, frequency, and duration. The pulsed power supply is connected to the input of the second tunable PFN or PCN, and the output of the second tunable PFN or PCN is connected to the sputtering cathode target on the magnetically enhanced sputtering source. The second tunable PFN or PCN, in resonance mode, generates the high-power resonance asymmetrical AC voltage waveforms and provides HEDP discharge on the magnetically enhanced sputtering source.

The magnetically enhanced high-power pulse resonance asymmetric AC HEDP sputtering source may include a hollow cathode magnetron with a hollow cathode sputtering target, a second magnet assembly positioned around the side walls of the hollow cathode target, an electrical switch positioned between the second tunable PFN or PCN and hollow cathode magnetron with a flat sputtering target rather than a hollow cathode shape, and a magnetic array with permanent magnets, electromagnets, or a combination thereof.

The magnetically enhanced high-power pulse resonance asymmetric AC HEDP sputtering apparatus includes a magnetically enhanced HEDP sputtering source, a vacuum chamber, a substrate holder, a substrate, a feed gas mass flow controller, and a vacuum pump.

The magnetically enhanced high-power pulse resonance asymmetric AC HEDP sputtering apparatus may include one or more electrically and magnetically enhanced HEDP sputtering sources, substrate heater, controller, computer, high-density plasma radio frequency (RF) gas activation source mounted remotely or as a ring source between the HEDP source and the substrate or around the substrate, substrate bias power supply, matching network, electrical switch positioned between the second tunable PFN or PCN and magnetically enhanced HEDP sputtering source, and a plurality of electrical switches connected with a plurality of magnetically enhanced high-power pulse resonance asymmetric AC HEDP sputtering sources and output of the second tunable PFN or PCN.

A method of providing high-power pulse resonance asymmetric AC HEDP film sputtering includes positioning a magnetically enhanced sputtering source inside a vacuum chamber, connecting the cathode target to the output of the second tunable PFN or PCN that, in resonance mode, generating the high-power asymmetrical AC waveform, positioning a substrate on a substrate holder, providing feed gas, programing voltage pulses frequency and duration, adjusting pulse voltage amplitude of the programmed voltage pulses with fixed frequency and duration feeding the second tunable PFN or PCN, generating the output high voltage asymmetrical AC waveform with a negative voltage amplitude that exceeds the negative voltage amplitude of the negative unipolar voltage pulses in the resonance mode, thereby resulting in a high-power pulse resonance asymmetric AC HEDP discharge.

The method of magnetically enhanced high-power pulse resonance asymmetric AC HEDP film sputtering may include positioning an electrical switch between the hollow cathode magnetron and the second tunable PFN or PCN that, in resonance mode, generates the high voltage asymmetrical AC waveform, applying heat to the substrate or cooling down the substrate, applying direct current (DC) or radio frequency (RF) continuously and/or using a pulse bias voltage to the substrate holder to generate a substrate bias, connecting the second tunable PFN or PCN that, in resonance mode, generates the high voltage asymmetrical AC waveform simultaneously to the plurality of hollow cathode magnetrons or magnetrons with flat targets, and igniting and sustaining simultaneously HEDP in the plurality of the hollow cathode magnetron.

The disclosed embodiments include a method of sputtering a layer on a substrate using a high-power pulse resonance asymmetric AC HEDP magnetron. The method includes configuring an anode and a cathode target magnet assembly to be positioned in a vacuum chamber with a sputtering cathode target and the substrate, applying high-power negative unipolar voltage pulses with regulated amplitude and programmable duration and frequency to a second tunable PFN or PCN, wherein the second tunable PFN or PCN includes a plurality of inductors and capacitors, and adjusting an amplitude associated with the unipolar voltage pulses with programmed duration and frequency to cause a resonance mode associated with the second tunable pulse forming network to produce an output high-power pulse resonance asymmetric AC on the HEDP sputtering source. The output high-power pulse resonance asymmetric AC voltage waveform from the second tunable PFN or PCN is operatively coupled to the HEDP sputtering cathode target, and the output high-power pulse resonance asymmetric AC voltage waveform includes a negative voltage exceeding or equal to the amplitude of the input unipolar voltage pulses coming to the second tunable PFN or PCN during the resonance mode and sputtering discharge of the HEDP magnetron. In some cases, with all conditions fixed, any further increase of the amplitude of the unipolar voltage pulses causes only an increase in the duration of the maximum value of the negative voltage amplitude of the output high-power asymmetric AC voltage waveform in response to the pulse forming network being in the resonance mode, thereby causing the HEDP magnetron sputtering discharge to form the layer on the substrate.

The disclosed embodiments further include an apparatus that sputters a layer on a substrate using a high-power pulse resonance asymmetric AC HEDP magnetron. The apparatus includes an anode, cathode target magnet assembly, regulated high voltage source with variable power, high-power pulse power supply with programmable voltage pulse duration and frequency power supply, and a second tunable PFN or PCN. The anode and cathode target magnet assembly are configured to be positioned in a vacuum chamber with a sputtering cathode target and the substrate. The high-power pulse power supply with a built-in first PFN generates programmable unipolar negative voltage DC pulses with defined amplitude, frequency, and duration. The second tunable PFN or PCN includes a plurality of inductors and capacitors, and the amplitude of the voltage pulses are adjusted to be in the resonance mode associated with the second tunable PFN or PCN and magnetically enhanced sputtering source for specific programmed pulse parameters, such as amplitude, frequency and duration of the unipolar voltage pulses. The output of the second tunable PFN or PCN is operatively coupled to the sputtering cathode target, and the output of the second tunable PFN or PCN in the resonance mode generates a high-power resonance asymmetric AC voltage waveform that includes a negative voltage exceeding the amplitude of the input to second tunable PFN or PCN unipolar voltage pulses. An AC voltage waveform sustains plasma and forms high-power pulse resonance asymmetric AC HEDP magnetron sputtering discharge, thereby causing the HEDP magnetron sputtering discharge to form the layer of the sputtered target material on the substrate.

The disclosed embodiments also include a computer-readable medium storing instructions that, when executed by a processing device, perform a method of sputtering a layer on a substrate using a high energy density plasma (HEDP) magnetron, wherein the operations include configuring an anode and a cathode target magnet assembly to be positioned in a vacuum chamber with a sputtering cathode target and the substrate, applying regulated amplitude unipolar voltage pulses with programmed frequency and duration to the second tunable PFN or PCN, wherein the pulse forming network includes a plurality of inductors and capacitors, and adjusting a pulse voltage for programmed voltage pulses frequency and duration to cause a resonance mode associated with the second tunable PFN or PCN. The output asymmetric AC voltage waveform is operatively coupled to the sputtering cathode target, and the output asymmetric AC voltage waveform includes a negative voltage exceeding the amplitude of the regulated unipolar voltage pulses amplitude with programmed frequency and duration during sputtering discharge of the HEDP magnetron. A further increase in the amplitude of the regulated unipolar voltage pulses with programmed frequency and duration causes a constant amplitude of the negative voltage of the output AC waveform in response to the pulse forming network being in the resonance mode, thereby causing the HEDP magnetron sputtering discharge to form the layer on the substrate.

The disclosed embodiments further include a method of sputtering a layer on a substrate using a high-energy density plasma (HEDP) magnetron, which includes positioning the HEDP magnetron in a vacuum with an anode, a cathode target, a magnet assembly, the substrate, and a feed gas; applying a plurality of unipolar negative direct current (DC) voltage pulses from a pulse power supply to a pulse converting network (PCN), the PCN comprising at least one inductor and at least one capacitor; and adjusting an amplitude, pulse duration, and frequency associated with the plurality of unipolar negative DC voltage pulses and adjusting a value of at least one of the at least one inductor and the at least one capacitor, thereby causing a resonance mode associated with the PCN. The PCN converting the unipolar negative DC voltage pulses to an asymmetric alternating current (AC) signal that generates a high-density plasma discharge on the HEDP magnetron with pulse current densities in a range of about 0.1 to 20 A/cm2. The asymmetric AC signal operatively coupled to the cathode target, and the asymmetric AC signal comprising a first negative voltage and a first positive voltage followed by a second negative voltage. The second negative voltage generating plasma for use during a subsequent negative voltage, and an increase in amplitude or pulse duration of the plurality of unipolar negative DC voltage pulses causing an increase in amplitude of at least one of the negative voltage pulses of the asymmetric AC signal in response to the PCN being in the resonance mode, thereby causing sputtering discharge associated with the HEDP magnetron to form the layer from the cathode target on the substrate. The substrate being operatively coupled to ground by a first diode, thereby attracting positively charged ions sputtered from the cathode target and the plasma to the substrate.

The disclosed embodiments also include an apparatus that sputters a layer on a substrate using a high-energy density plasma (HEDP) magnetron, which includes a HEDP magnetron configured to be positioned in a vacuum with an anode, a cathode target, a magnet assembly, the substrate, and a feed gas; a pulse power supply, wherein the pulse power supply provides a plurality of unipolar negative direct current (DC) voltage pulses; and a pulse converting network (PCN) comprising at least one inductor and at least one capacitor. The PCN converting the unipolar negative DC voltage pulses to an asymmetric alternating current (AC) signal that generates a high-density plasma discharge on the HEDP magnetron with pulse current densities in a range of about 0.1 to 20 A/cm2. An amplitude, pulse duration, and frequency of a plurality of unipolar negative DC voltage pulses and a value of at least one of the at least one inductor and the at least one capacitor being adjusted, thereby causing a resonance mode associated with the PCN. The asymmetric AC signal operatively coupled to the cathode target, and the asymmetric AC signal comprising a first negative voltage and a first positive voltage followed by a second negative voltage. The second negative voltage generating plasma for use during a subsequent negative voltage, and an increase in amplitude or pulse duration of the plurality of unipolar negative DC voltage pulses causing an increase in amplitude of at least one of the negative voltage pules of the asymmetric AC signal in response to the PCN being in the resonance mode, thereby causing sputtering discharge associated with the HEDP magnetron to form the layer from the cathode target on the substrate. The substrate holder being connected to ground by a diode, thereby attracting positively charged ions sputtered from the cathode target and the plasma to the substrate.

The disclosed embodiments yet further include a computer-readable medium storing instructions that, when executed by a processing device, perform a method of sputtering a layer on a substrate using a high-energy density plasma (HEDP) magnetron comprising: positioning the HEDP magnetron in a vacuum with an anode, a cathode target, a magnet assembly, the substrate, and a feed gas; applying a plurality of unipolar negative direct current (DC) voltage pulses from a pulse power supply to a pulse converting network (PCN), wherein the PCN comprises at least one inductor and at least one capacitor; and adjusting an amplitude, pulse duration, and frequency associated with the plurality of unipolar negative DC voltage pulses and adjusting a value of at least one of the at least one inductor and the at least one capacitor associated with the PCN, thereby causing a resonance mode associated with the PCN. The PCN converting the unipolar negative DC voltage pulses to an asymmetric alternating current (AC) signal that generates a high-density plasma discharge on the HEDP magnetron with pulse current densities in a range of about 0.1 to 20 A/cm2, and the asymmetric AC signal operatively coupled to the cathode target. The asymmetric AC signal comprising a first negative voltage and a first positive voltage followed by a second negative voltage, and the second negative voltage generating plasma for use during a subsequent negative voltage. An increase in amplitude or pulse duration of the plurality of unipolar negative DC voltage pulses causing an increase in amplitude of at least one of the negative voltage pulses of the asymmetric AC signal in response to the PCN being in the resonance mode, thereby causing sputtering discharge associated with the HEDP magnetron to form the layer from the cathode target on the substrate. The substrate being operatively coupled to ground by a first diode, thereby attracting positively charged ions sputtered from the cathode target to the substrate.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein:

FIG. 1 (*b*) shows an illustrative view of an output resonance asymmetrical AC voltage waveform with a duration of negative voltage τ1 from a second tunable pulse forming network (PFN) or pulse converting network (PCN);

FIG. 1 (*c*) shows an illustrative view of a train of output negative unipolar voltage pulses with amplitude V2 and frequency f1 from a high-power pulse supply with programmable pulse voltage duration and pulse voltage frequency;

FIG. 1 (*d*) shows an illustrative view of the output resonance asymmetrical AC voltage waveform with a duration of negative voltage τ2 from the second tunable PFN or PCN;

FIG. 1 (*e*) shows an illustrative view of the output resonance asymmetrical AC voltage waveform with three oscillations from the second tunable PFN or PCN;

FIG. 1 (*f*) shows an illustrative view of the output resonance asymmetrical AC current waveform with three oscillations from the second tunable PFN or PCN;

FIG. 1 (*g*) shows an illustrative cross-sectional view of components and magnetic field lines of a magnetically enhanced HEDP sputtering source with a stationary cathode target magnetic array;

FIG. 1 (*h*) shows an illustrative cross-sectional view of a hollow cathode target;

FIG. 2 (*b*) shows an illustrative view of a train of unipolar voltage pulses with frequency f1 and amplitude V1 applied to the second tunable PFN or PCN, and an output voltage waveform from the second tunable PFN or PCN in-non-resonance mode in the second tunable PFN or PCN;

FIG. 2 (*c*) shows an illustrative view of a train of unipolar voltage pulses with frequency f2 and amplitude V2 applied to the second tunable PFN or PCN, and an output voltage waveform from the second tunable PFN or PCN in a partial pulsed DC modulated non-resonance mode;

FIG. 2 (*d*) shows an illustrative view of a train of unipolar voltage pulses with frequency f3 and amplitude V4 applied to the second tunable PFN or PCN, and an output resonance asymmetrical AC voltage waveform from the second tunable PFN or PCN in the resonance mode.

FIG. 2 (*e*) shows an illustrative circuit diagram of the second tunable PFN or PCN when the plurality of inductors and capacitors are connected in series;

FIG. 2 (*f*) shows an illustrative circuit diagram of the second tunable PFN or PCN when inductors and capacitors are connected in parallel;

FIG. 3 (*b*) shows an illustrative view of output resonance asymmetrical AC voltage waveform pulses with two different voltage amplitudes generated at resonance conditions in the second tunable PFN or PCN;

FIG. 4 (*b*) shows a train of resonance asymmetrical AC waveforms applied to different magnetically enhanced sputtering sources;

FIG. 5 (*b*) shows different voltage pulse shapes that can be generated by a substrate bias power supply;

FIG. 5 (*c*) shows an illustrative view of a via in the semiconductor wafer;

FIG. 6 (*b*) shows a plurality of unipolar voltage pulses generated by a pulse DC power supply;

FIG. 6 (*c*) shows a plurality of unipolar RF voltage pulses generated by a pulse RF power supply;

FIG. 8 (*b*) shows illustrative views of trains of oscillatory unipolar voltage pulses applied to the second tunable PFN or PCN, and an output voltage waveform from the second tunable PFN or PCN without a resonance mode in the second tunable PFN or PCN;

FIGS. 8 (*c, d*) show illustrative views of trains of oscillatory unipolar voltage pulses applied to the second tunable PFN or PCN, and an output voltage waveform from the second tunable PFN or PCN with a resonance mode in the second tunable PFN or PCN;

FIG. 10 (*b*) shows the voltage output from two high-power pulse resonance AC power supplies;

FIG. 15 (*b*) shows an illustrative view of a train of input unipolar negative voltage pulses with two different voltage amplitudes applied to the tunable PCN;

FIG. 15 (*c*) shows an illustrative view of output resonance asymmetrical AC voltage waveform pulses with two different voltage amplitudes generated at resonance conditions in the tunable PCN;

FIG. 15 (*d*) shows an illustrative view of a train of input oscillatory unipolar negative voltage pulses with two different voltage amplitudes and controlled voltage rise-time and fall-time applied to the tunable PCN;

FIG. 15 (*e*) shows an illustrative view of output resonance asymmetrical AC voltage waveform pulses with two different voltage amplitudes generated at resonance conditions in the tunable PCN;

FIG. 15 (*f*) shows an illustrative view of a train of unipolar voltage pulses with frequency B5 and amplitude V1 applied to the tunable PCN, and an output voltage waveform from the tunable PCN in non-resonance mode in the tunable PCN;

FIG. 15 (*g*) shows an illustrative view of a train of unipolar voltage pulses with frequency B6 and amplitude V2 applied to the tunable PCN, and an output voltage waveform from the tunable PCN in a modulated non-resonance mode;

FIG. 15 (*h*) shows an illustrative view of a train of unipolar voltage pulses with frequency B7 and amplitude V4 applied to the tunable PCN, and an output resonance asymmetrical AC voltage waveform from the tunable PCN in the resonance mode;

Figure 16A:
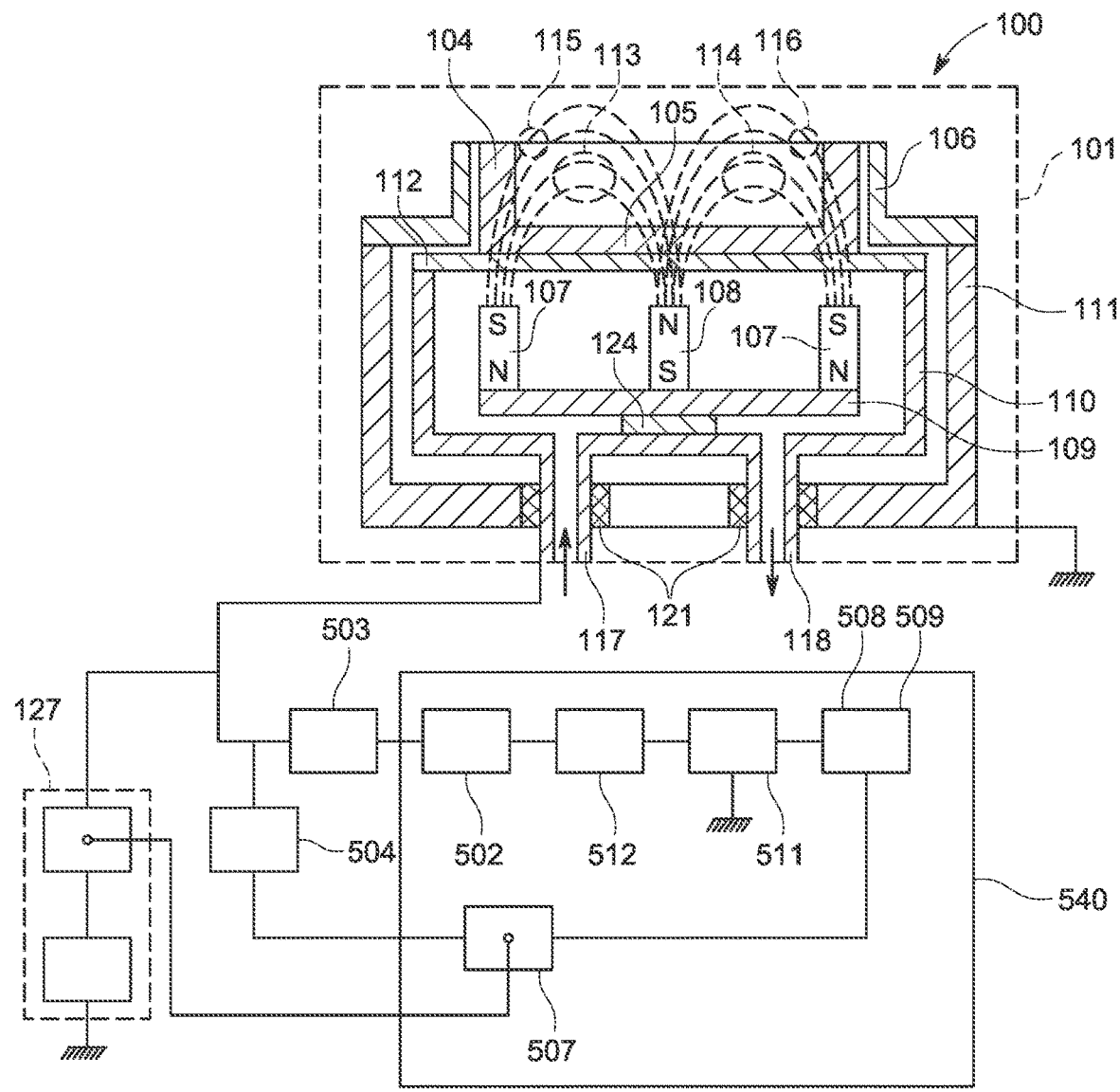
Figure 16B:
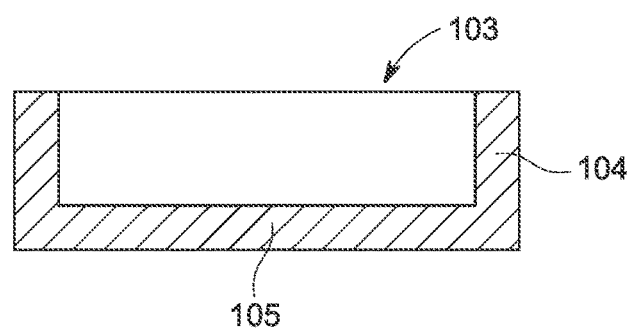
Figure 17A:
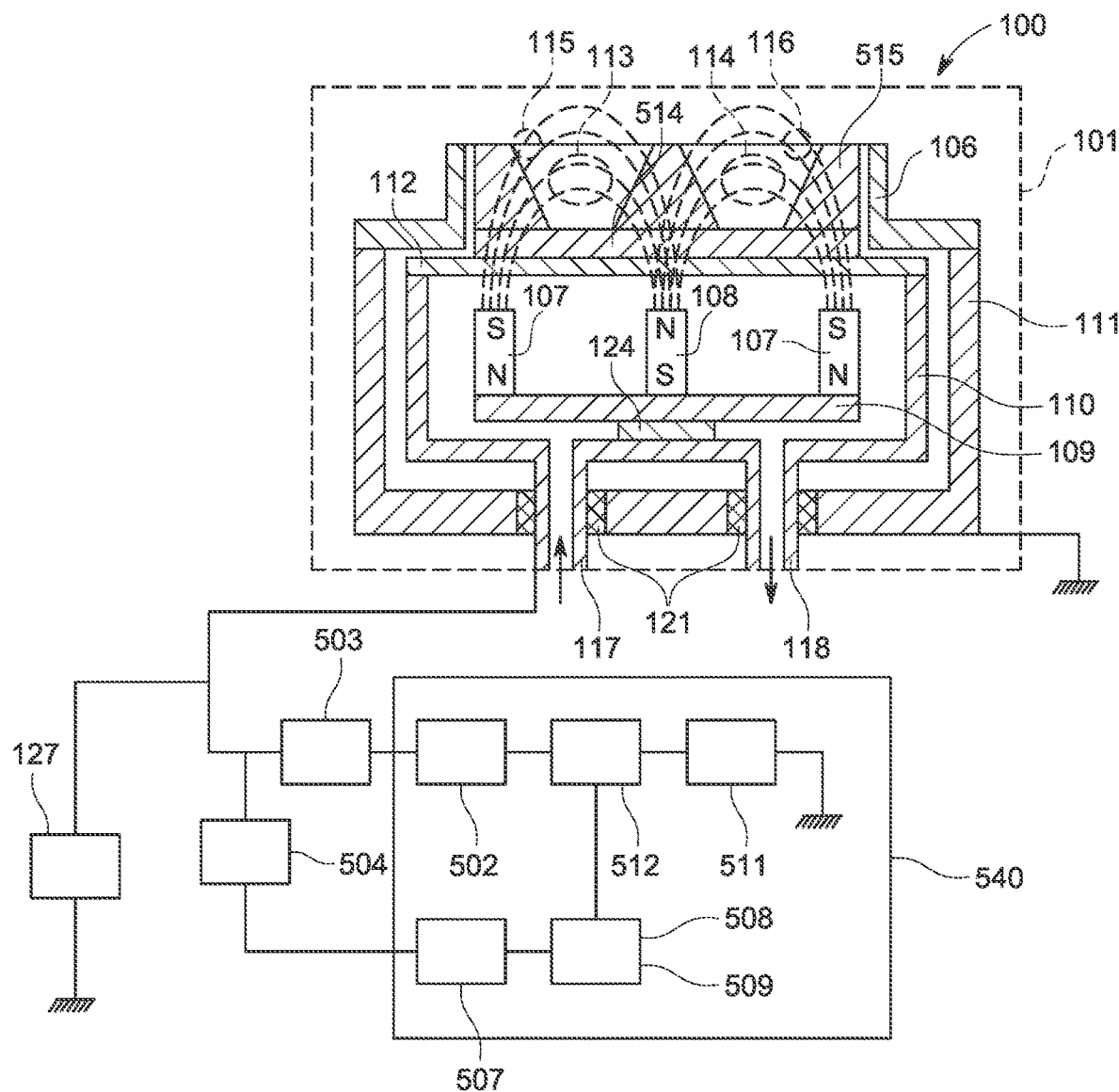
Figure 17B:
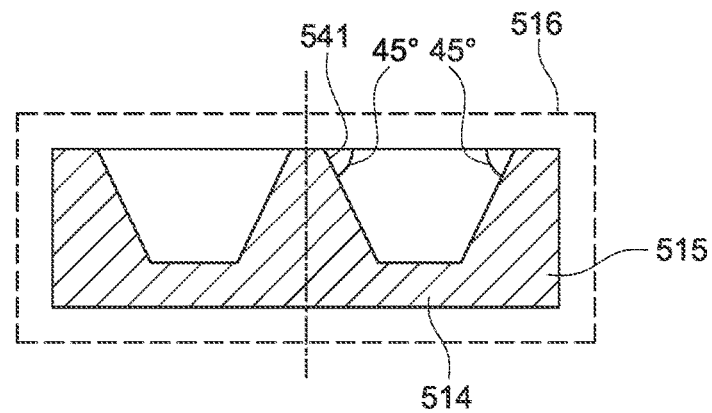
Figure 18A:
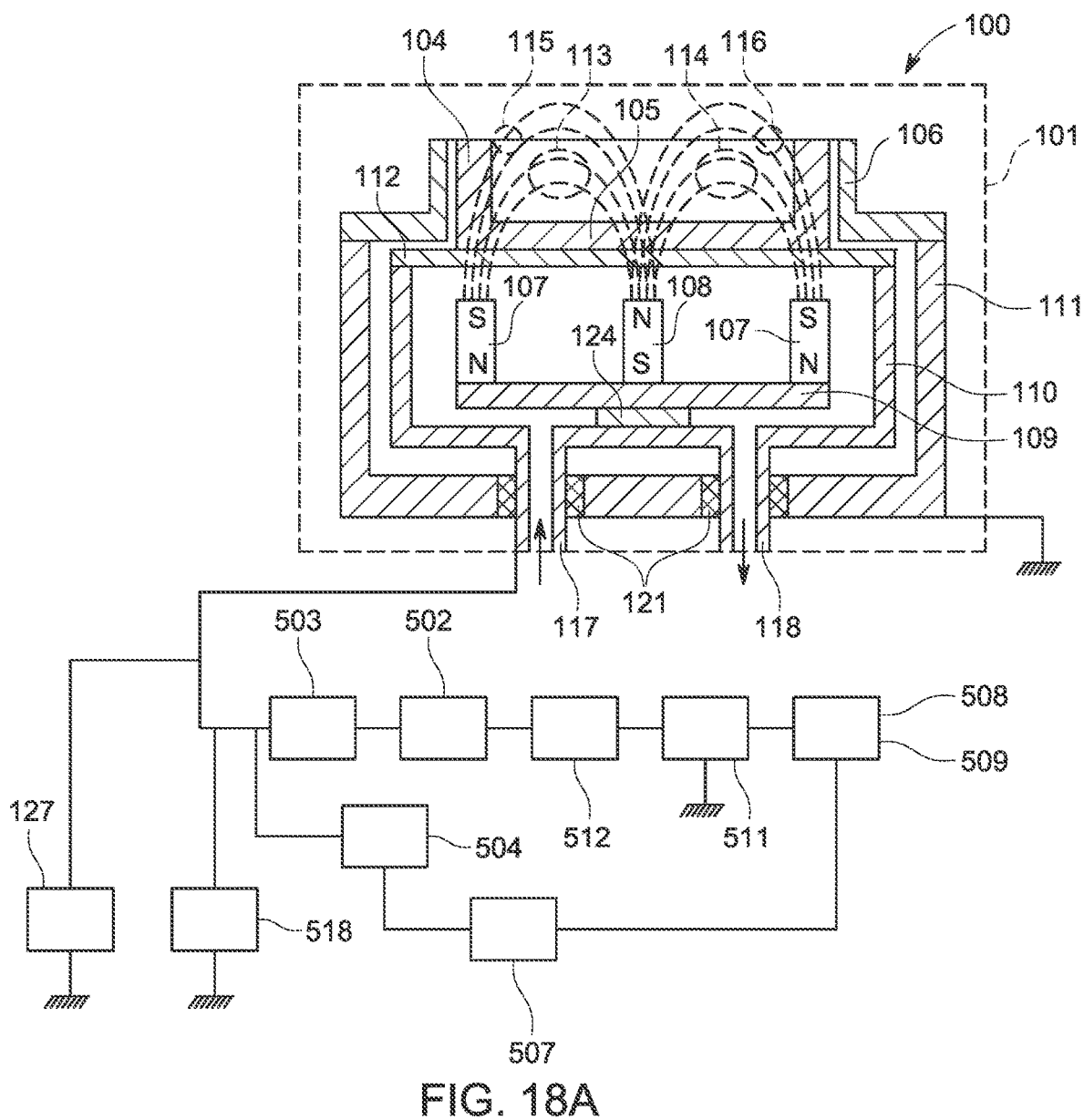
Figure 18B:
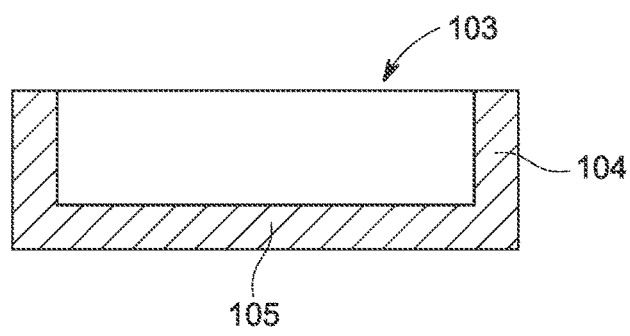
Figure 19A:
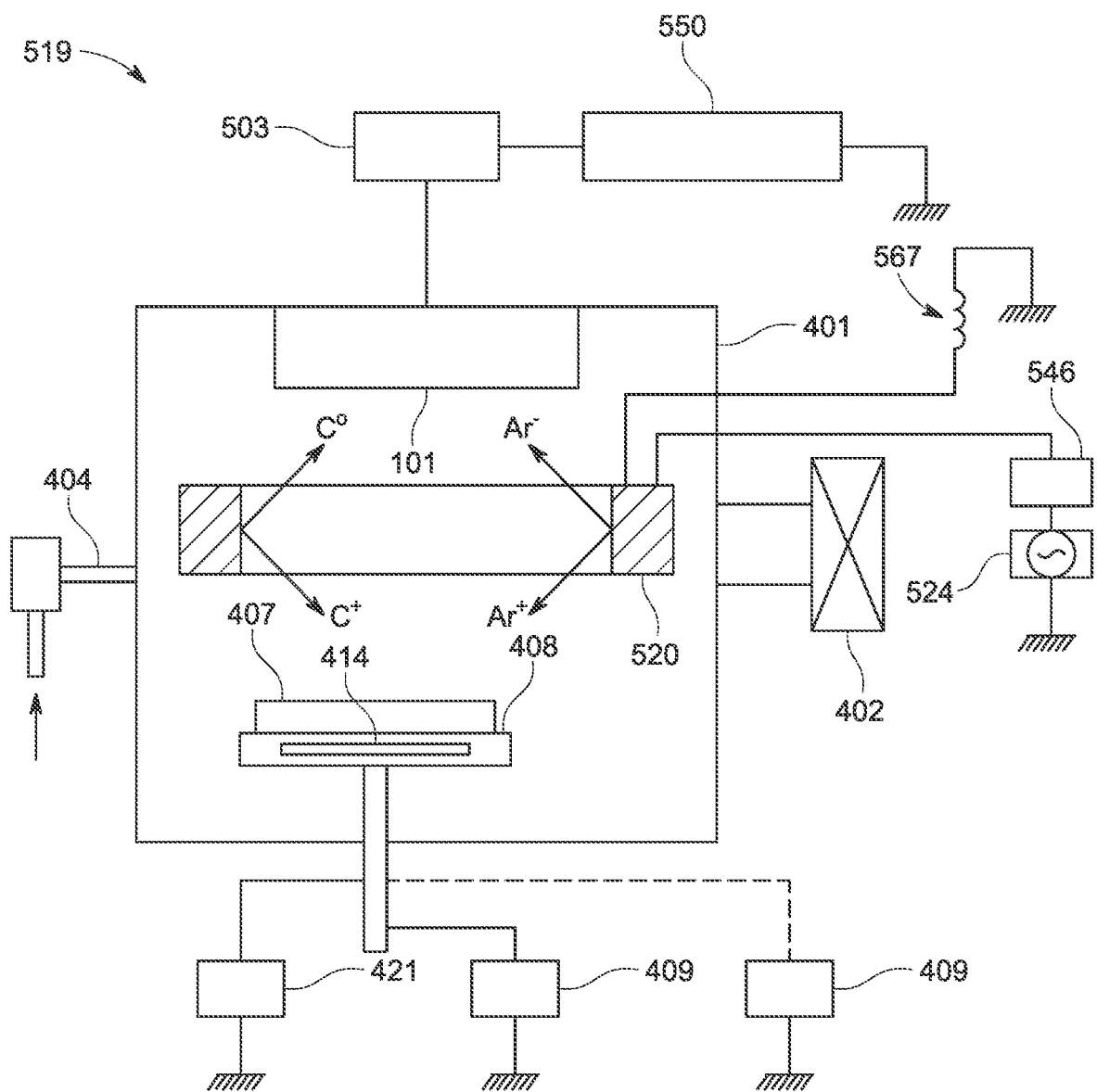
Figure 19B:
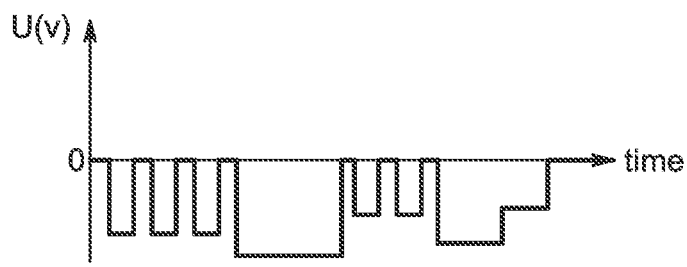
Figure 20A:
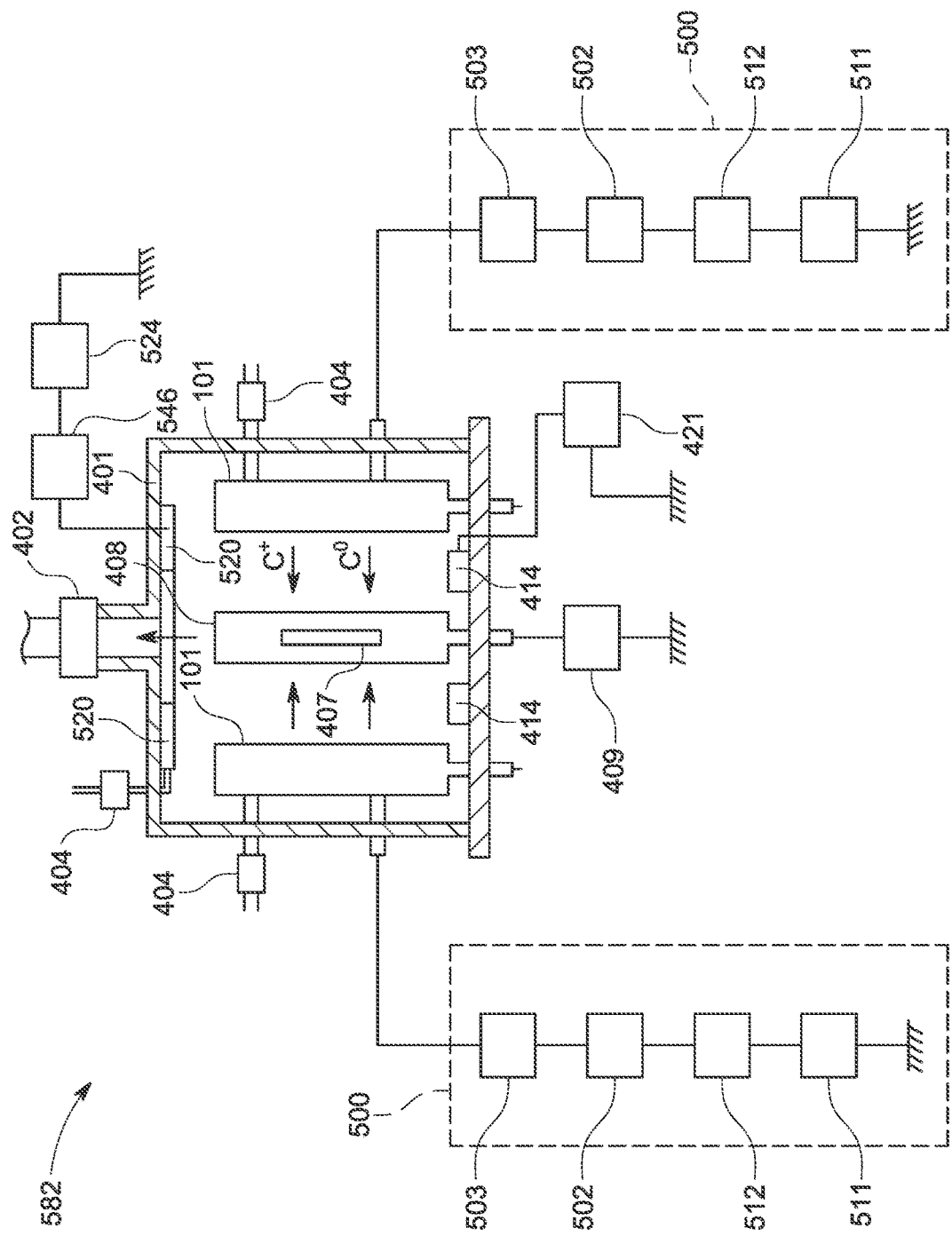
Figure 21A:
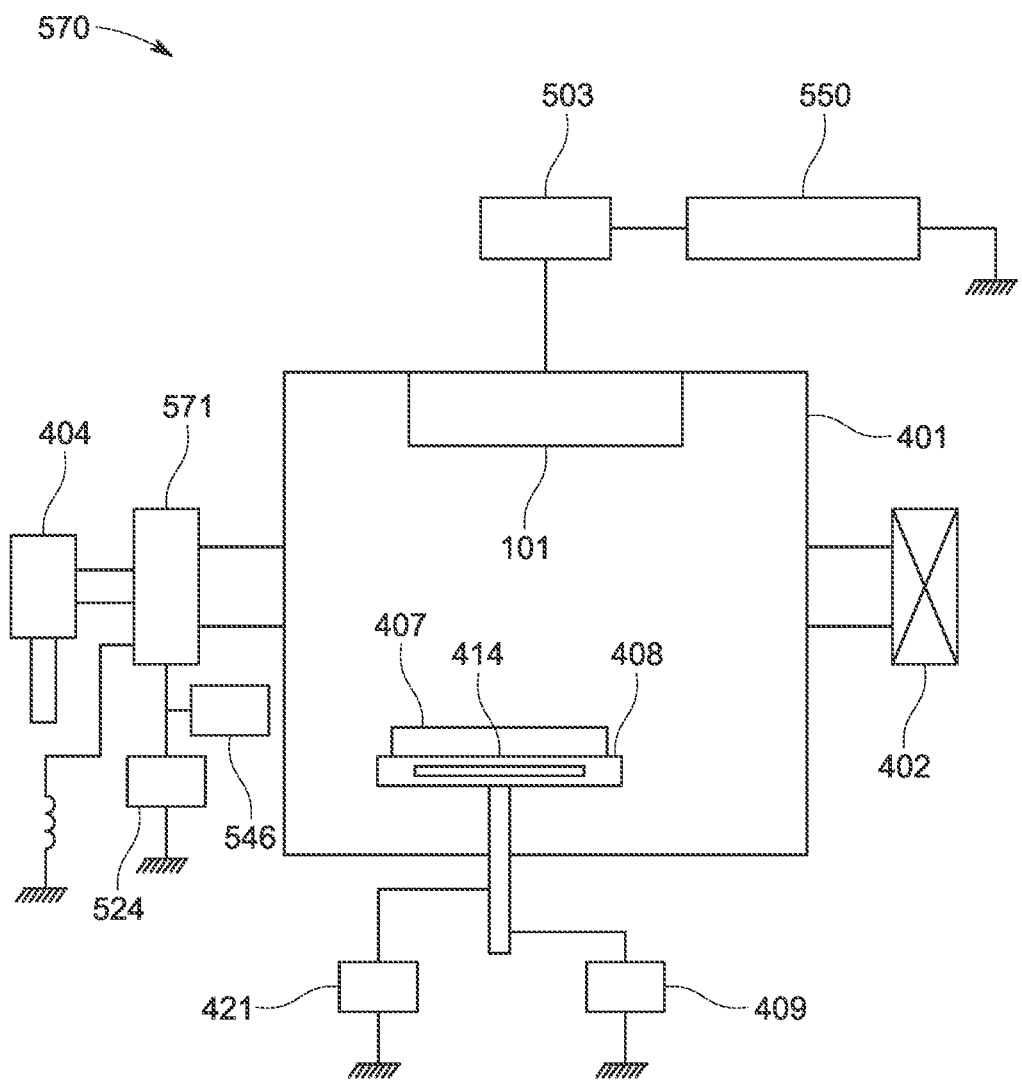
Figure 21B:
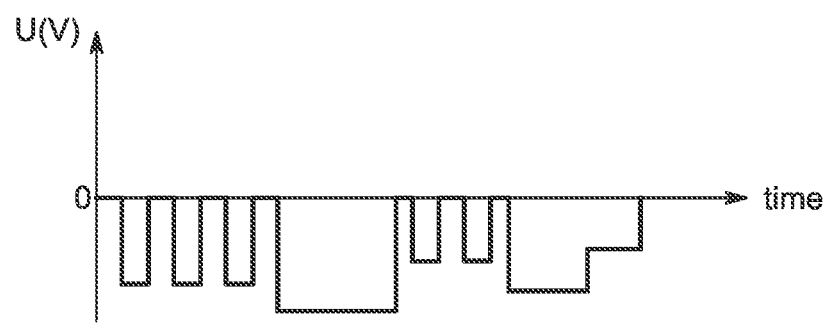
Figure 22A:
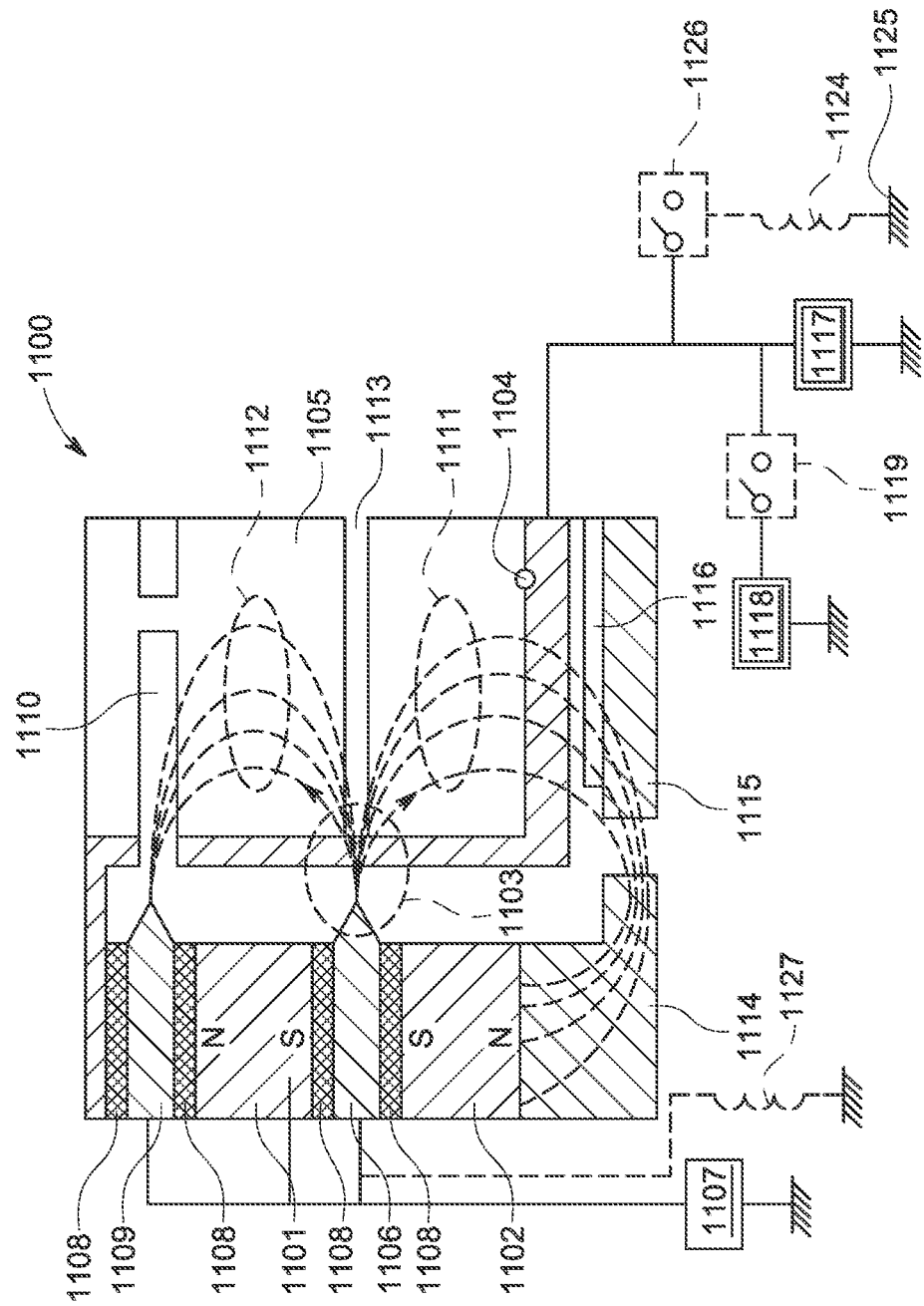
Figure 22B:
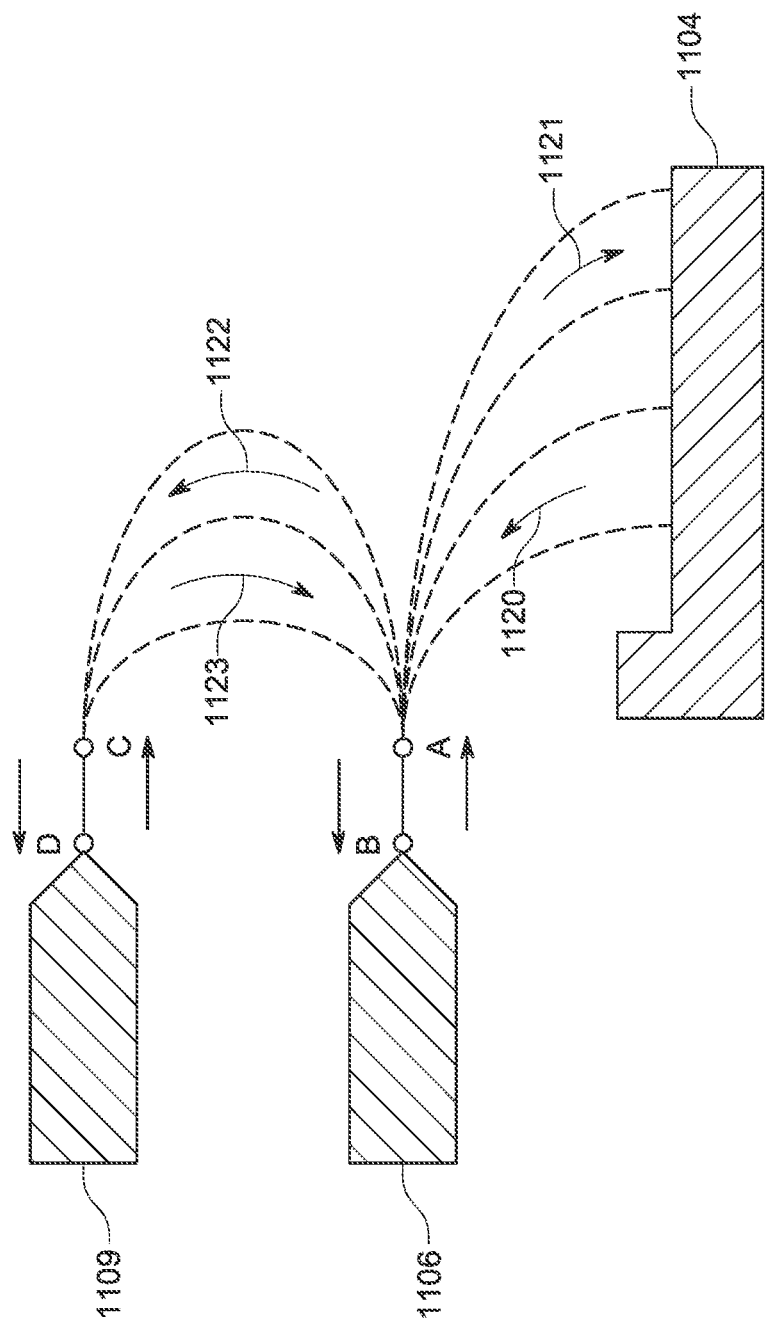
Figure 22C:
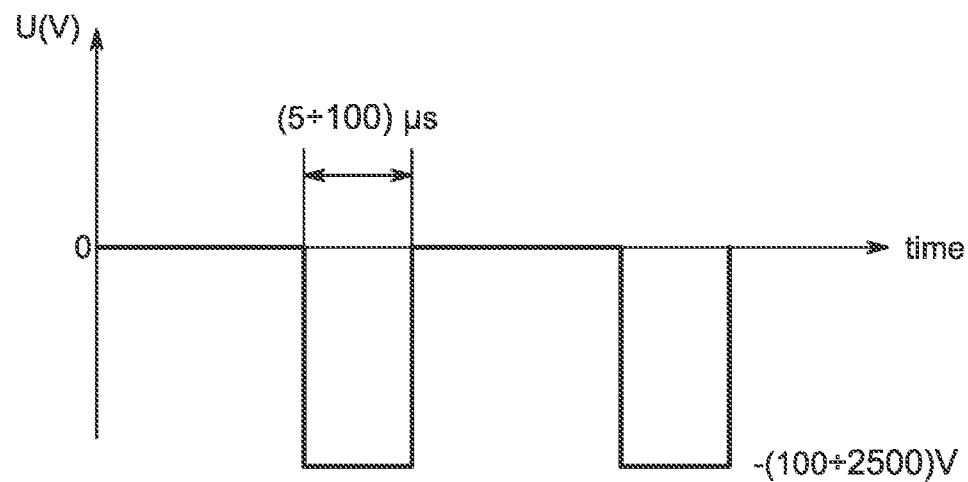
Figure 22D:
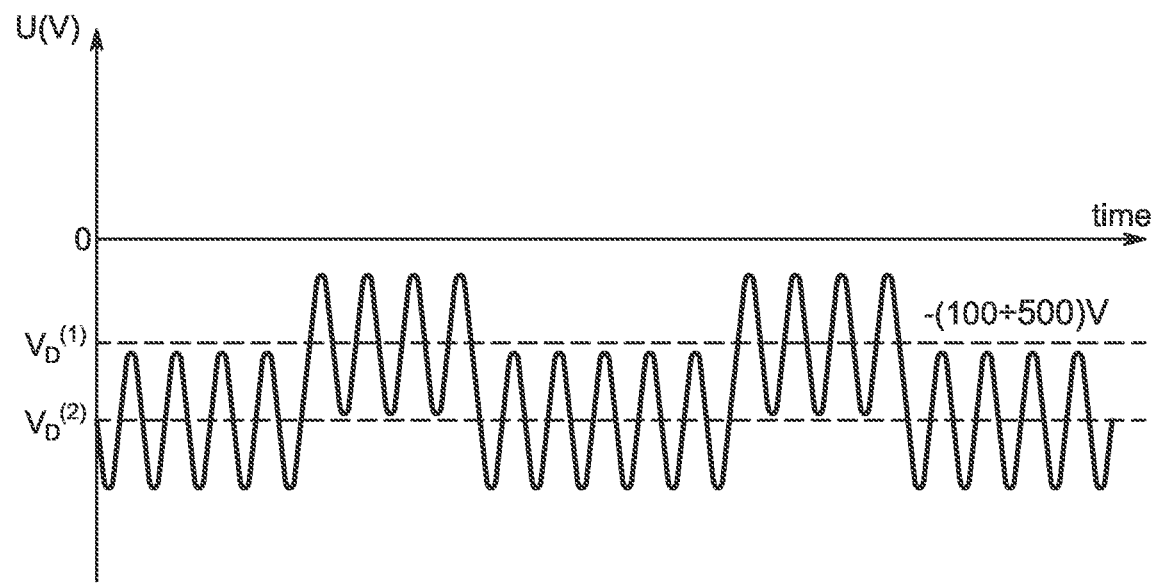
Figure 22E:
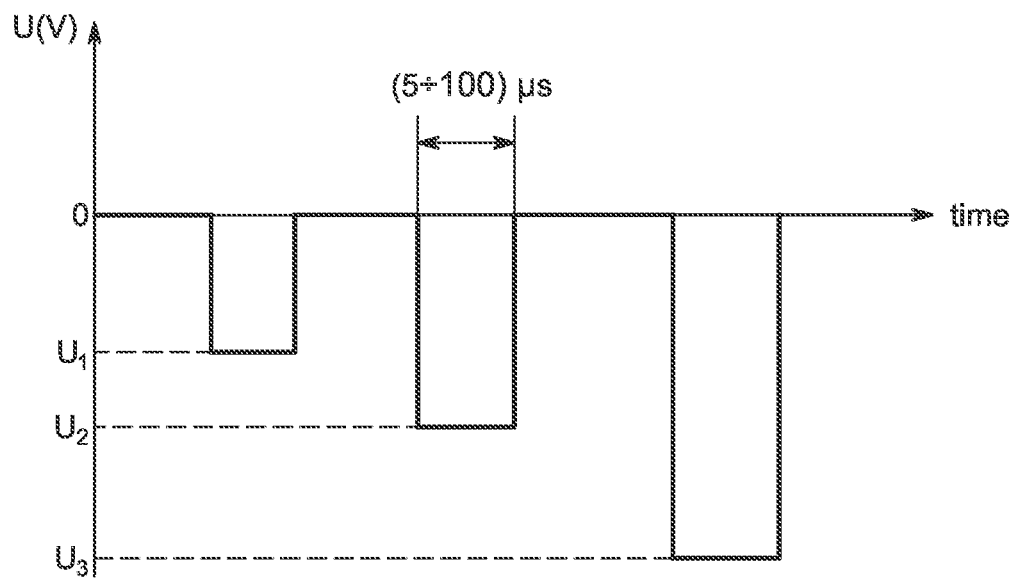
Figure 22F:
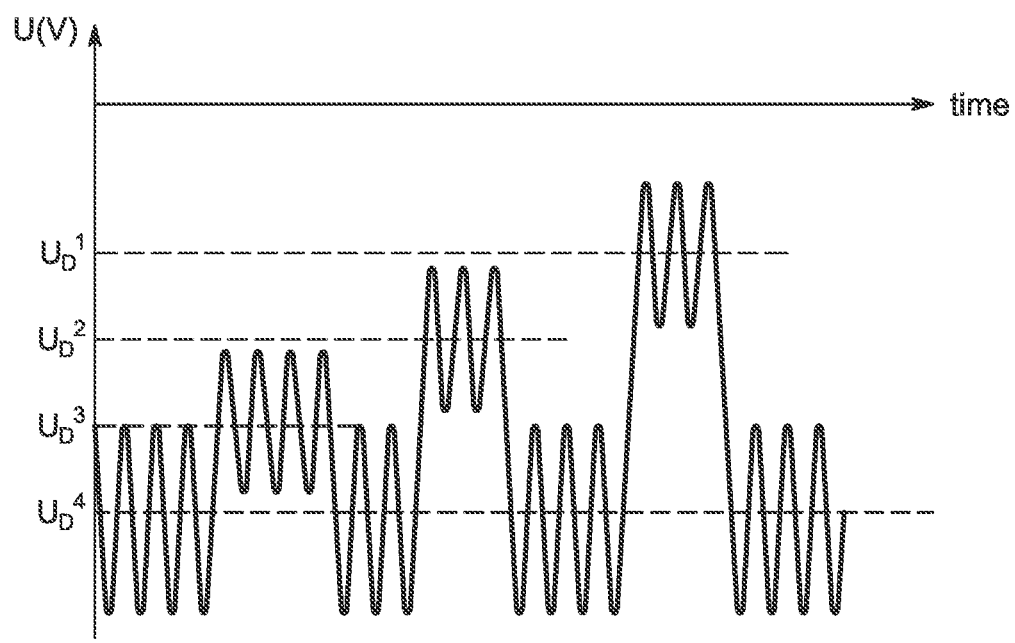
Figure 22G:
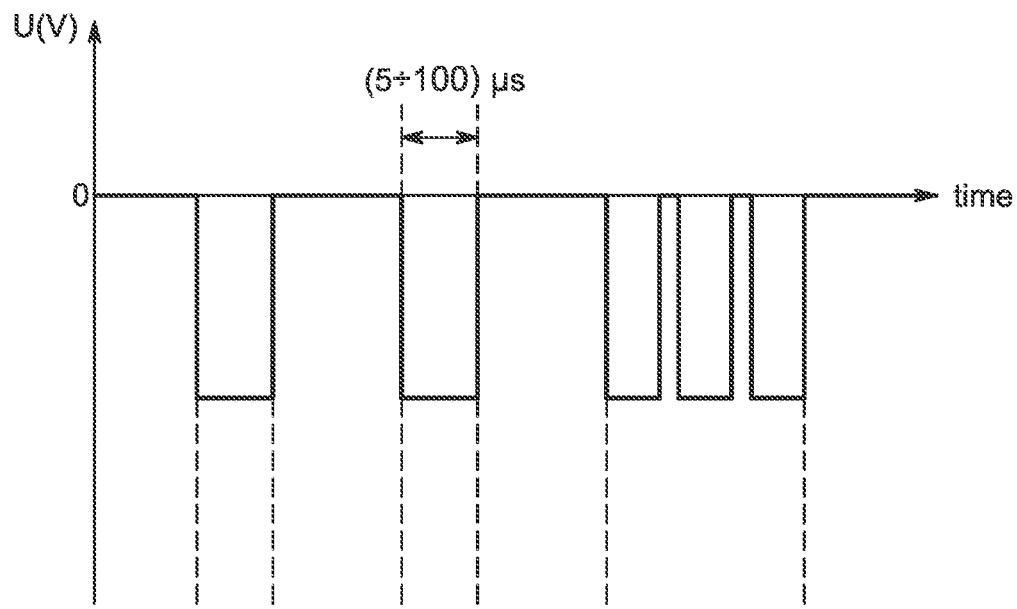
Figure 22H:
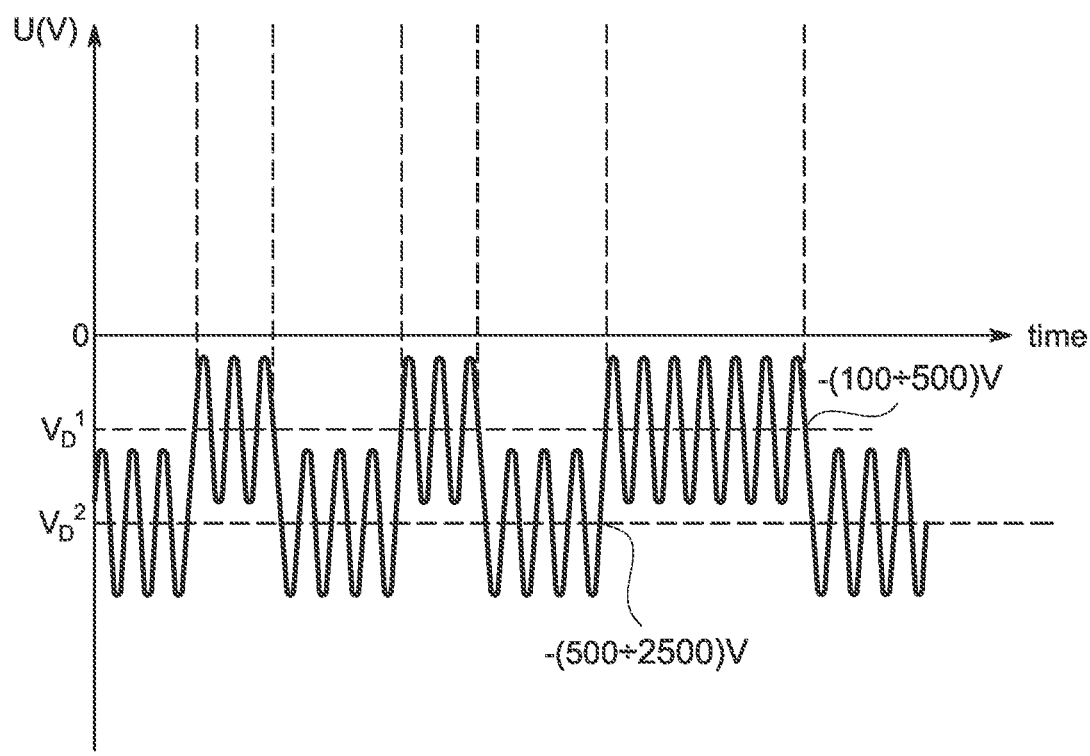
Figure 22I:
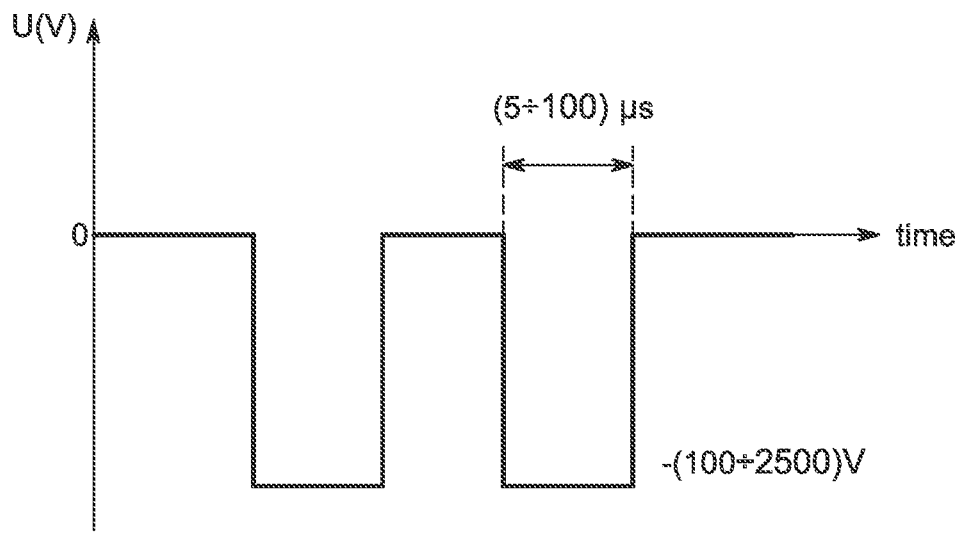
Figure 22J:
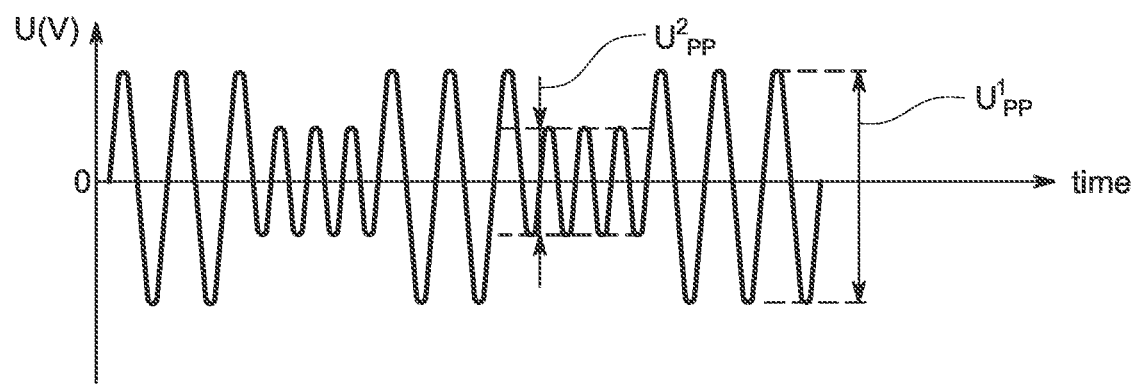

FIG. 15 (i) shows an illustrative view of a train of oscillatory unipolar voltage pulses with frequency B8 and amplitude V1 and controlled voltage rise-time and fall-time applied to the tunable PCN, and an output voltage waveform from the tunable PCN in non-resonance mode in the tunable PCN;

FIG. 15 (j) shows an illustrative view of a train of oscillatory unipolar voltage pulses with frequency B9 and amplitude V2 and controlled voltage rise-time and fall-time applied to the tunable PCN, and an output voltage waveform from the tunable PCN in a modulated non-resonance mode;

FIG. 15 (k) shows an illustrative view of a train of an oscillatory unipolar voltage pulses with frequency B10 and amplitude V4 and controlled voltage rise-time and fall-time applied to the tunable PCN, and an output resonance asymmetrical AC voltage waveform from the tunable PCN in the resonance mode;

FIG. 15 (l) shows an illustrative view of a train of input unipolar negative voltage pulses with two different voltage amplitudes applied to the tunable PCN with burst time of B11 and two different frequencies B12 and B13;

FIG. 15 (m) shows an illustrative view of mixed output unipolar voltage pulses and resonance asymmetrical AC voltage waveform pulses with two different voltage amplitudes generated in the tunable PCN;

FIG. 16 (a) shows an illustrative cross-sectional view of components and magnetic field lines of a magnetically enhanced HEDP sputtering source with a stationary cathode target magnetic array connected to the tunable PCN and high pulse power generator with built-in PFN;

FIG. 16 (b) shows an illustrative cross-sectional view of a hollow cathode target;

FIG. 17 (a) shows an illustrative cross-sectional view of components and magnetic field lines of a magnetically enhanced HEDP sputtering source with a stationary cathode target magnetic array connected to the tunable PCN and high pulse power generator with built-in PFN;

FIG. 17 (b) shows an illustrative cross-sectional view of a shaped geometry hollow cathode target that enhances the ionization process;

FIG. 18 (a) shows an illustrative cross-sectional view of components and magnetic field lines of a magnetically enhanced HEDP sputtering source with a stationary cathode target magnetic array connected to a high frequency generator, the tunable PCN, and high pulse power generator with built-in PFN;

FIG. 18 (b) shows an illustrative cross-sectional view of a hollow cathode target;

FIG. 19 (a) shows an illustrative view of the magnetically enhanced HEDP sputtering apparatus with a ring HDP radio frequency (RF) gas source positioned between the HEDP source and the substrate;

FIG. 19 (b) shows different voltage pulse shapes that can be generated by a substrate bias power supply;

FIG. 20 (a) shows an illustrative view of sputtering apparatus equipped with multiple magnetically enhanced HEDP sources;

FIG. 20 (b) shows different voltage pulse shapes that can be generated by a substrate bias power supply;

FIG. 20 (c) shows different voltage pulse shapes that can be generated by a substrate bias power supply;

FIG. 21 (a) shows an illustrative view of the magnetically enhanced HEDP sputtering apparatus with a remote HDP RF gas source positioned on a side of a chamber; and FIG. 21 (b) shows different voltage pulse shapes that can be generated by a substrate bias power supply.

Figure 23A:
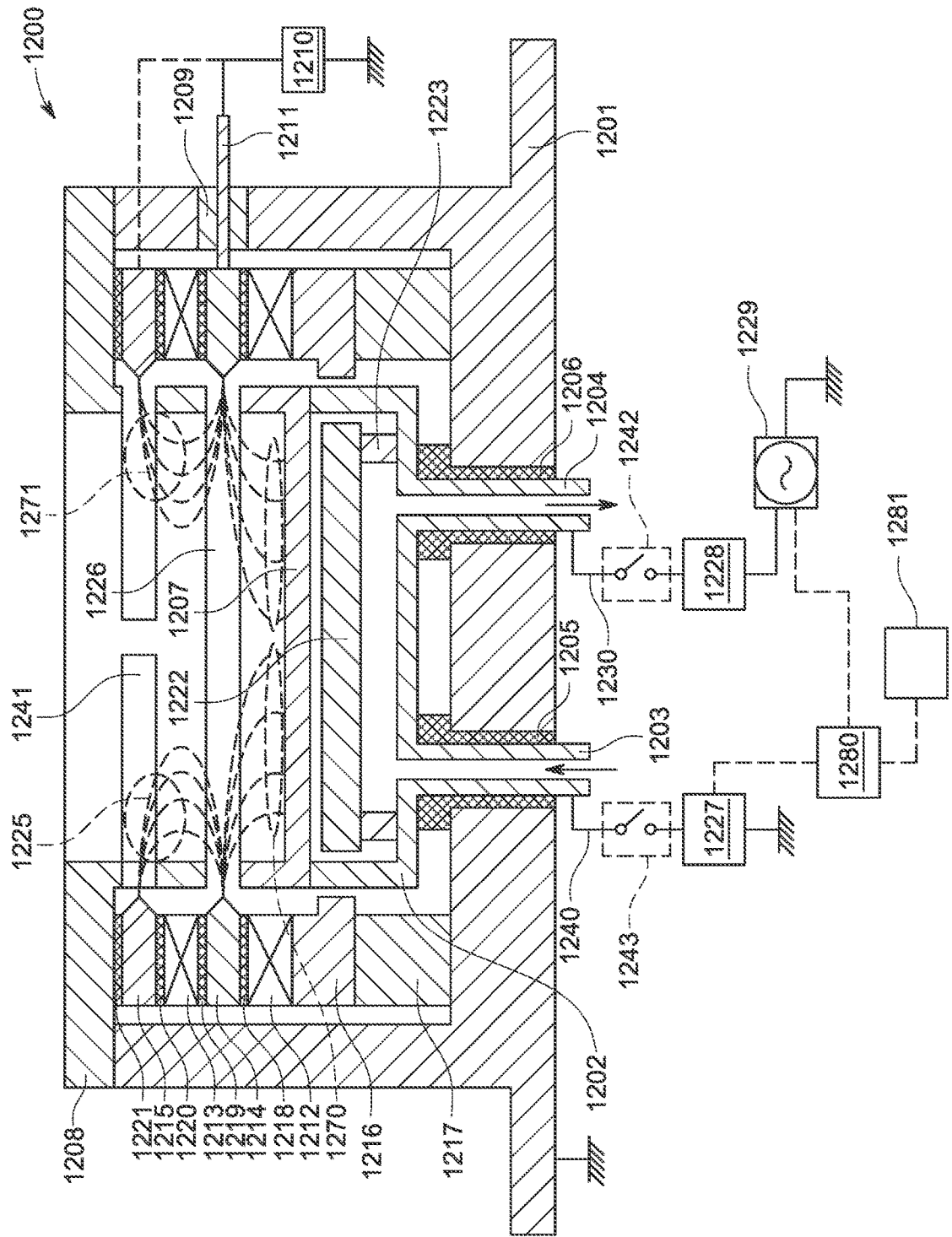
Figure 23B:
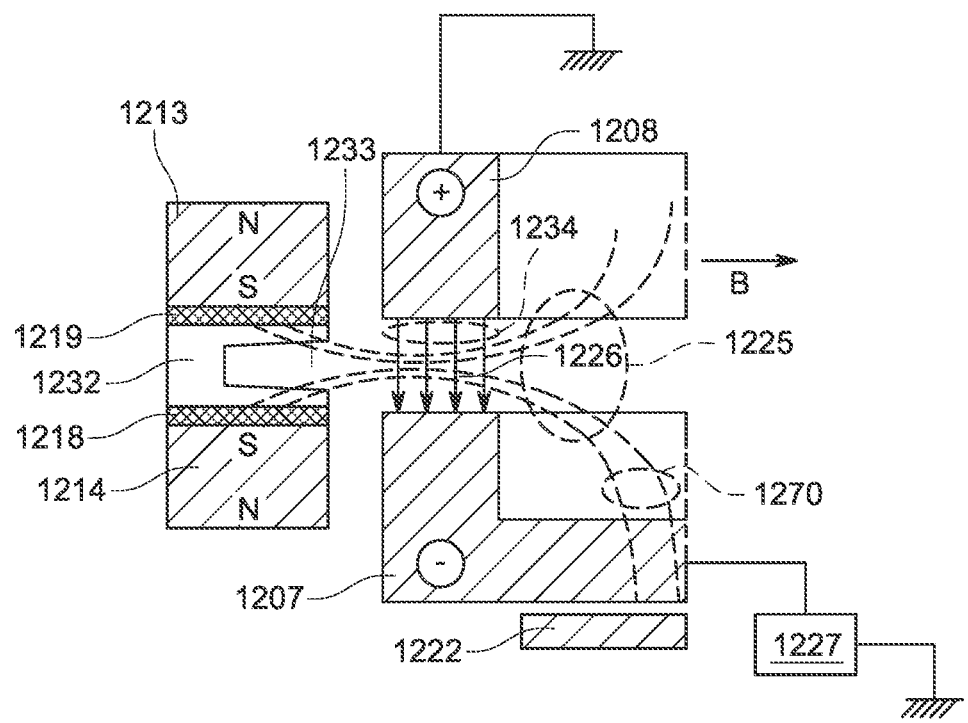
Figure 23C:
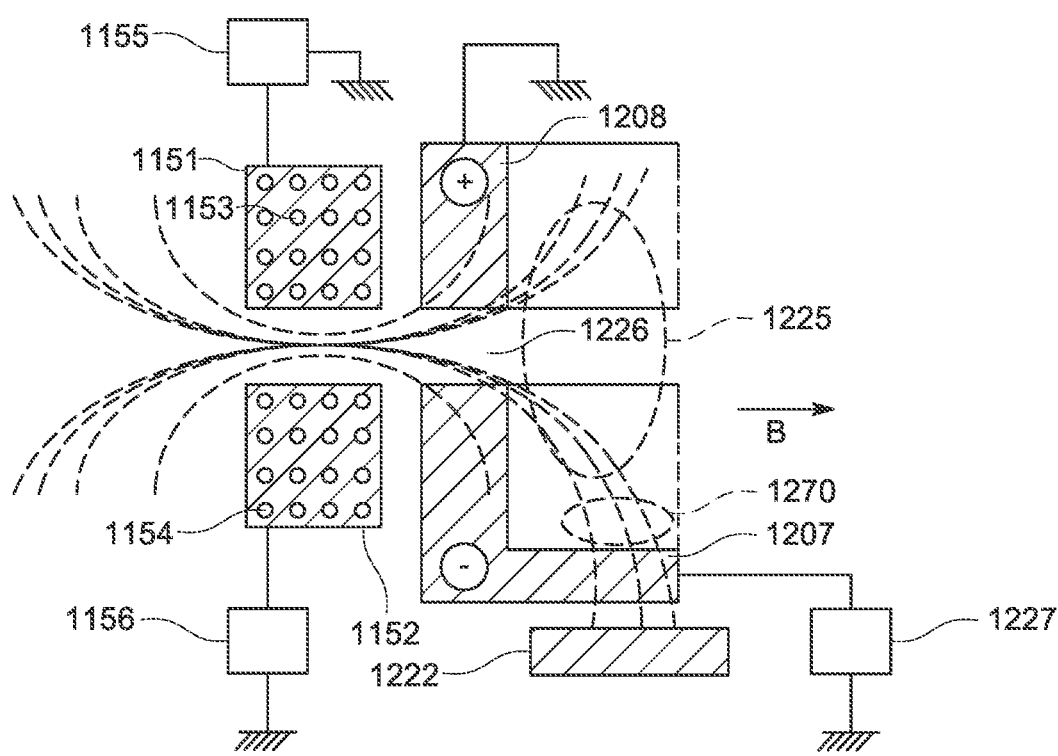

FIG. 22 (a) shows an illustrative cross-sectional view of an embodiment of a magnetically enhanced chemical vapor deposition (CVD) source;

FIG. 22 (b) shows an illustrative cross-sectional view of an embodiment of the magnetic field lines for the magnetically enhanced CVD source;

FIG. 22 (c) shows a timing diagram of negative voltage pulses that can be generated by a pulsed power supply and applied to the pole piece from the magnetically enhanced CVD source;

FIG. 22 (d) shows a timing diagram of negative RF voltage applied to the cathode target when negative pulses are applied to the pole piece from the magnetically enhanced CVD source;

FIG. 22 (e) shows a timing diagram of negative voltage pulses with different amplitudes that can be generated by a pulsed power supply and applied to the pole piece from the magnetically enhanced CVD source;

FIG. 22 (f) shows a timing diagram of negative RF voltage applied to the cathode target when negative voltage pulses with different amplitudes are applied to the pole piece from the magnetically enhanced CVD source;

FIG. 22 (g) shows a timing diagram of negative voltage pulses with different frequencies that can be generated by a pulsed power supply and applied to the pole piece from the magnetically enhanced CVD source;

FIG. 22 (h) shows a timing diagram of negative RF voltage applied to the cathode target when negative voltage pulses with different frequencies are applied to the pole piece from the magnetically enhanced CVD source;

FIG. 22 (i) shows a timing diagram of negative voltage pulses that can be generated by a pulsed power supply and applied to the pole piece from the magnetically enhanced CVD source;

FIG. 22 (j) shows a timing diagram of negative RF voltage applied to an inductively grounded cathode target when negative voltage pulses with different frequencies are applied to the pole piece from the magnetically enhanced CVD source;

FIG. 23 (a) shows an illustrative cross-sectional view of an embodiment of the magnetically enhanced CVD source.

Figure 24:
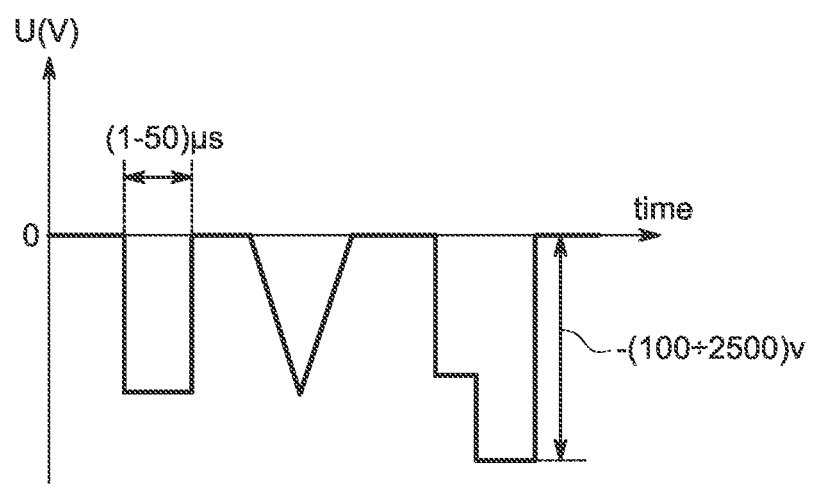
Figure 25A:
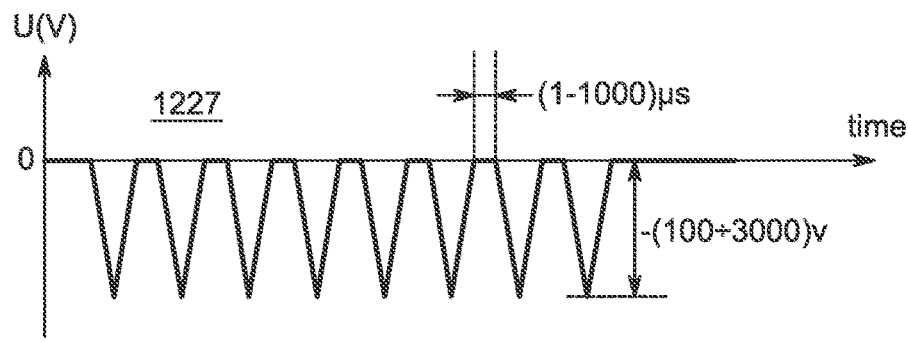
Figure 25B:
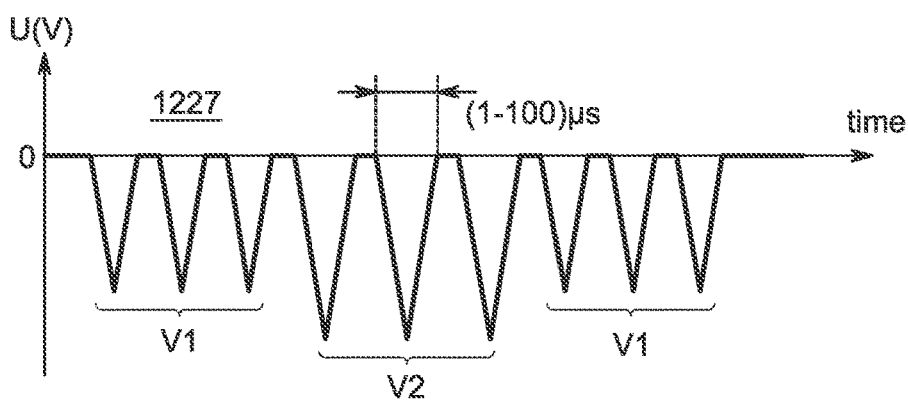
Figure 25C:
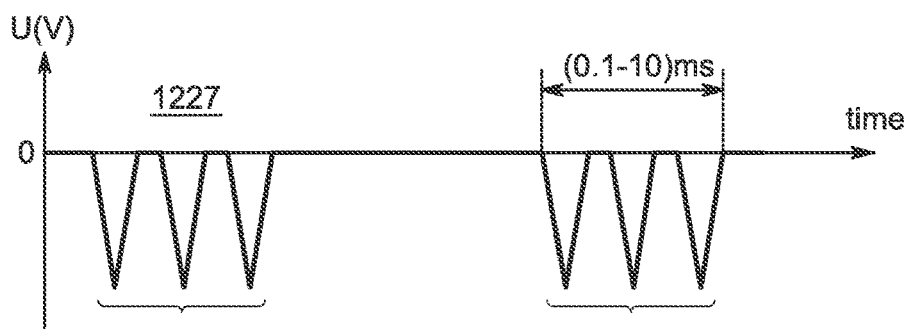
Figure 25D:
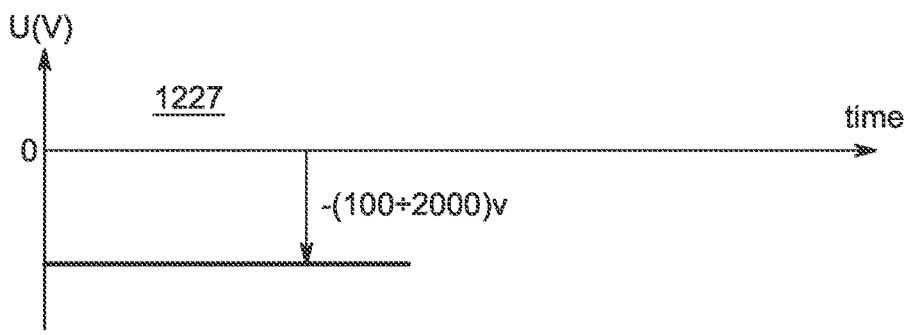
Figure 26A:
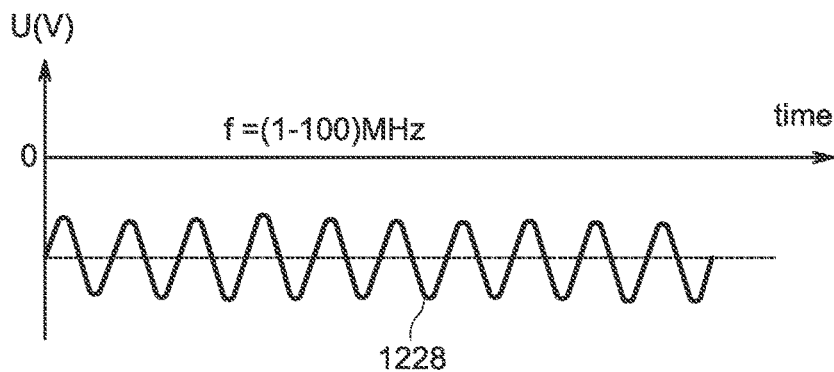
Figure 26B:
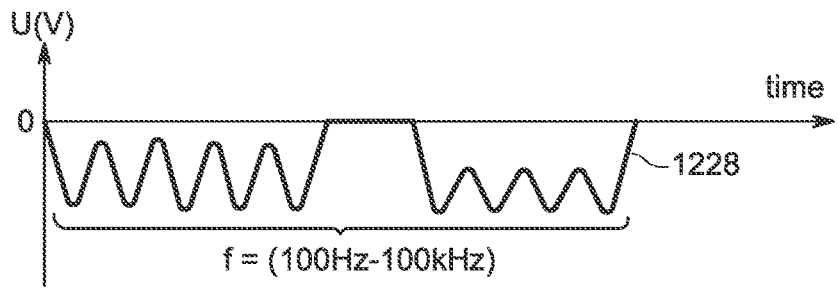
Figure 26C:
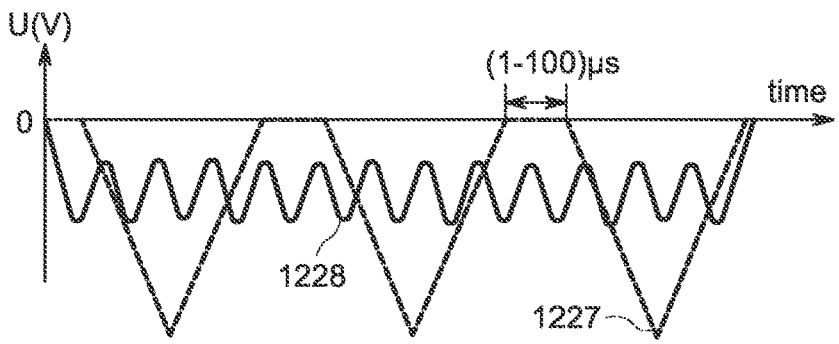
Figure 26D:
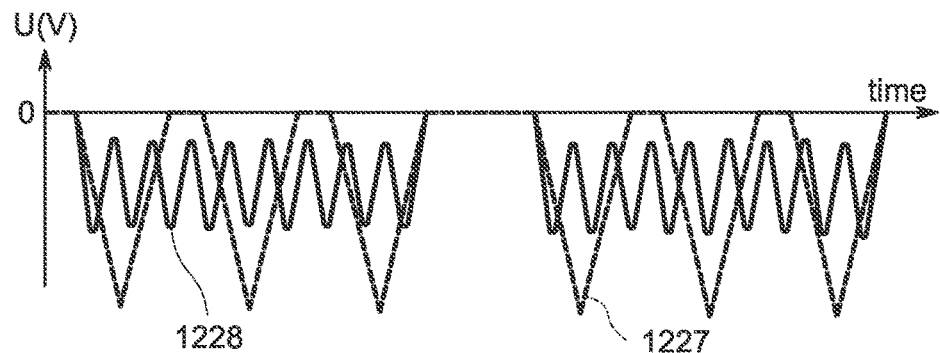
Figure 27A:
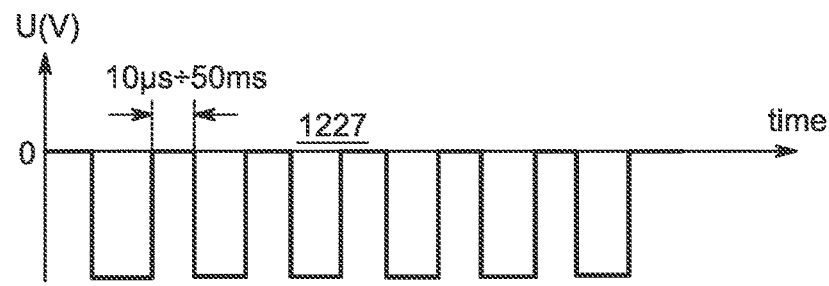
Figure 27B:
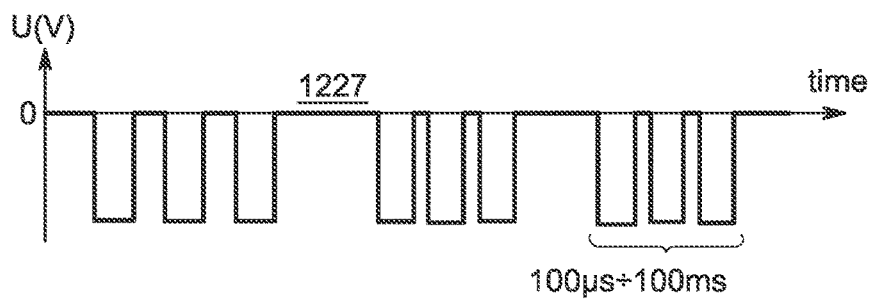
Figure 27C:
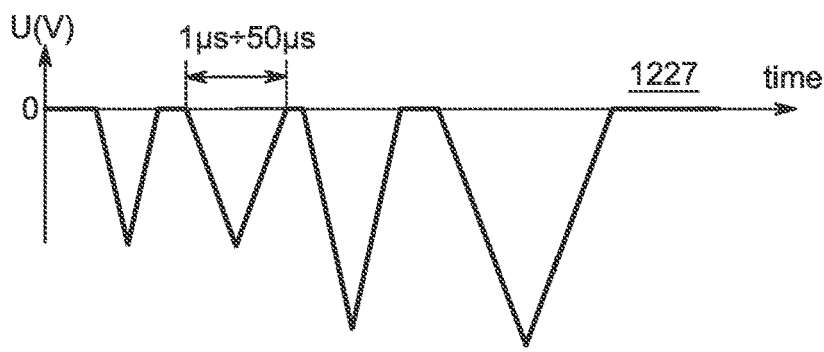
Figure 27D:
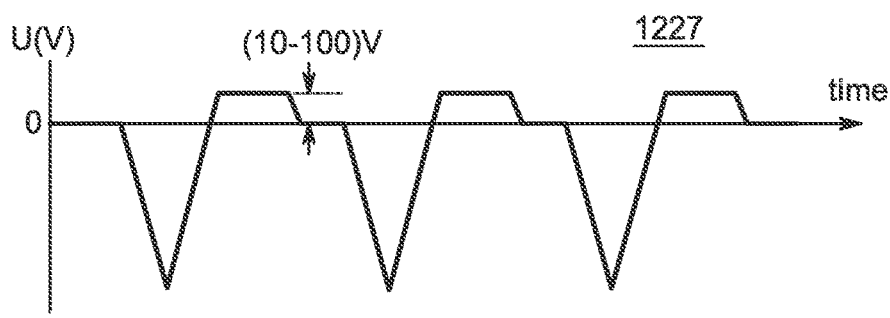
Figure 27E:
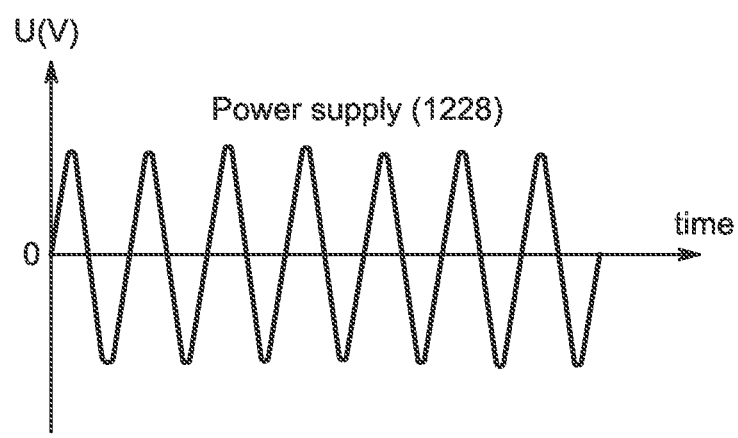
Figure 28:
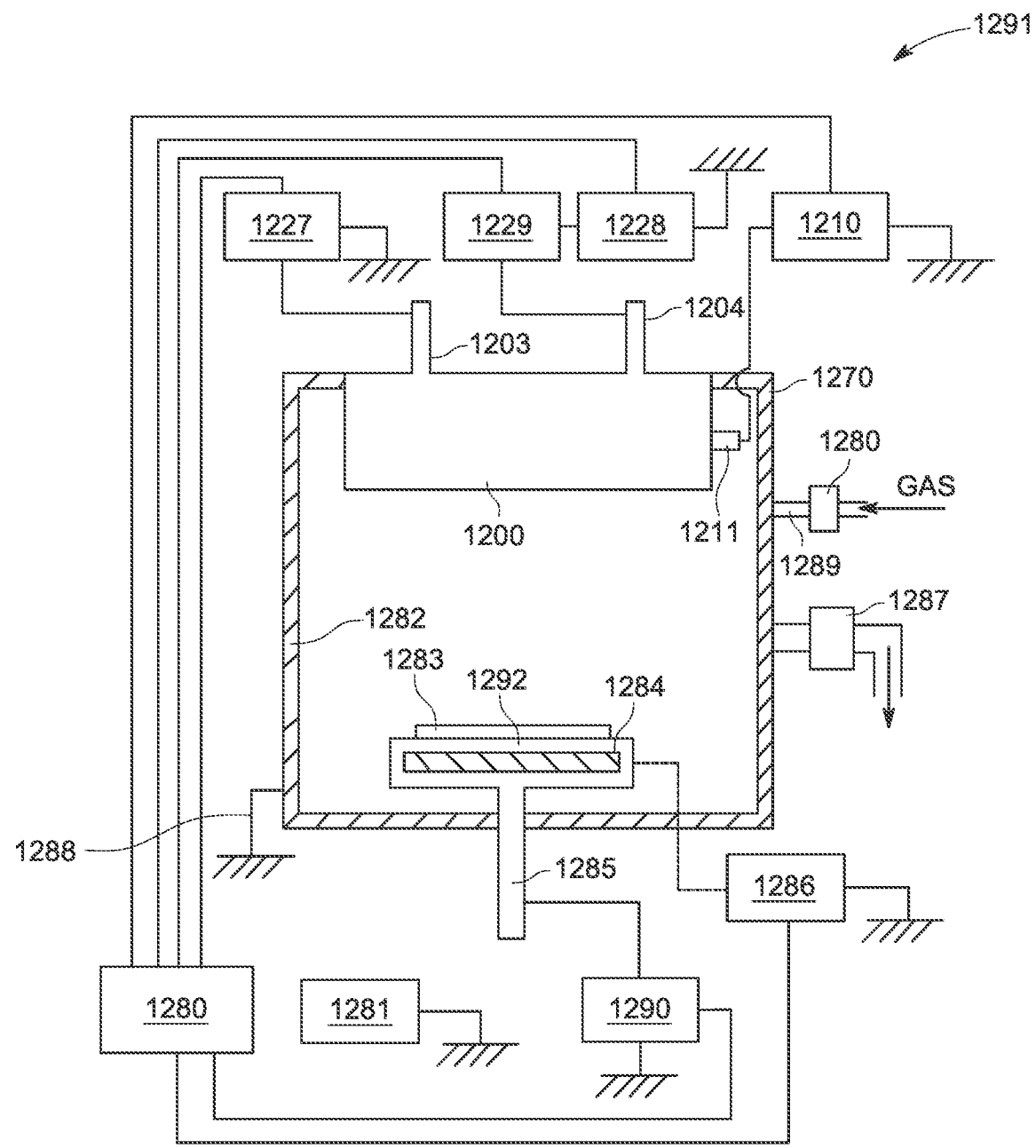
Figure 29:
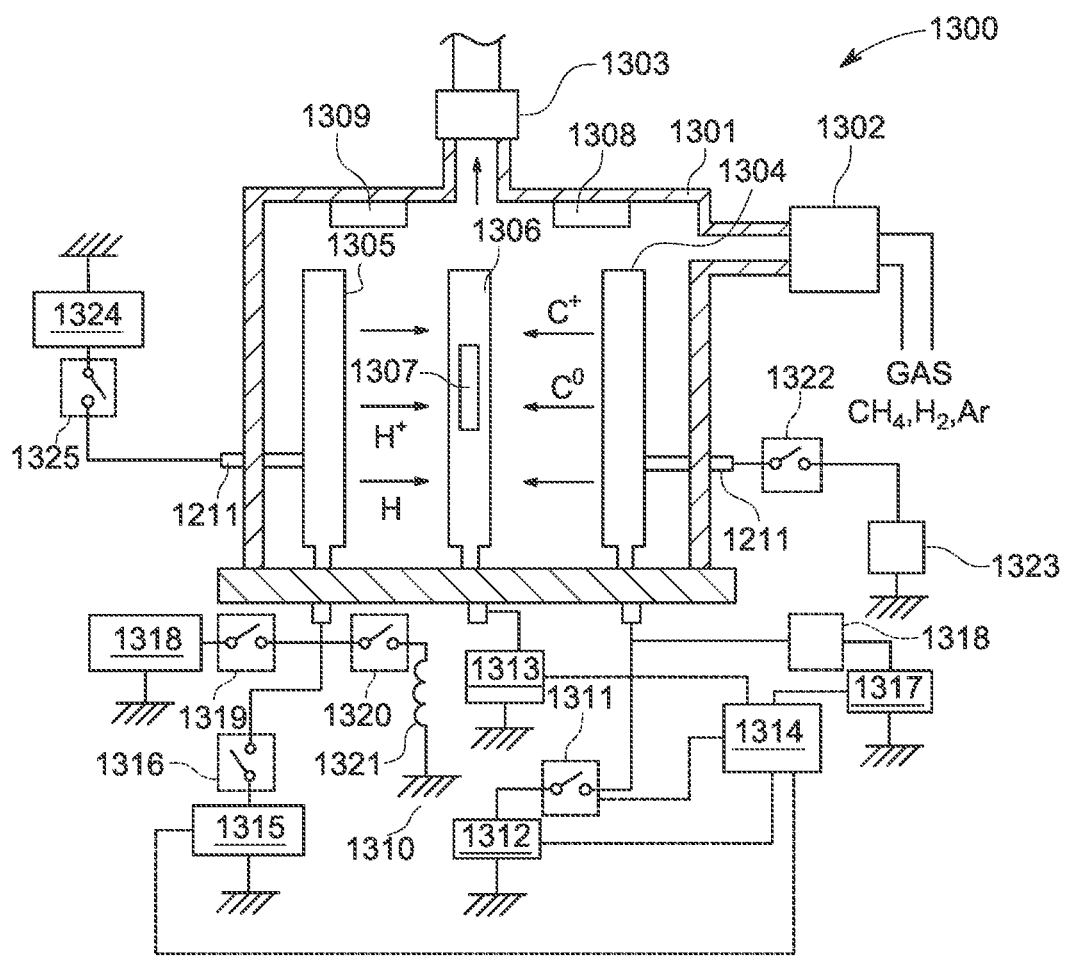
Figure 30:
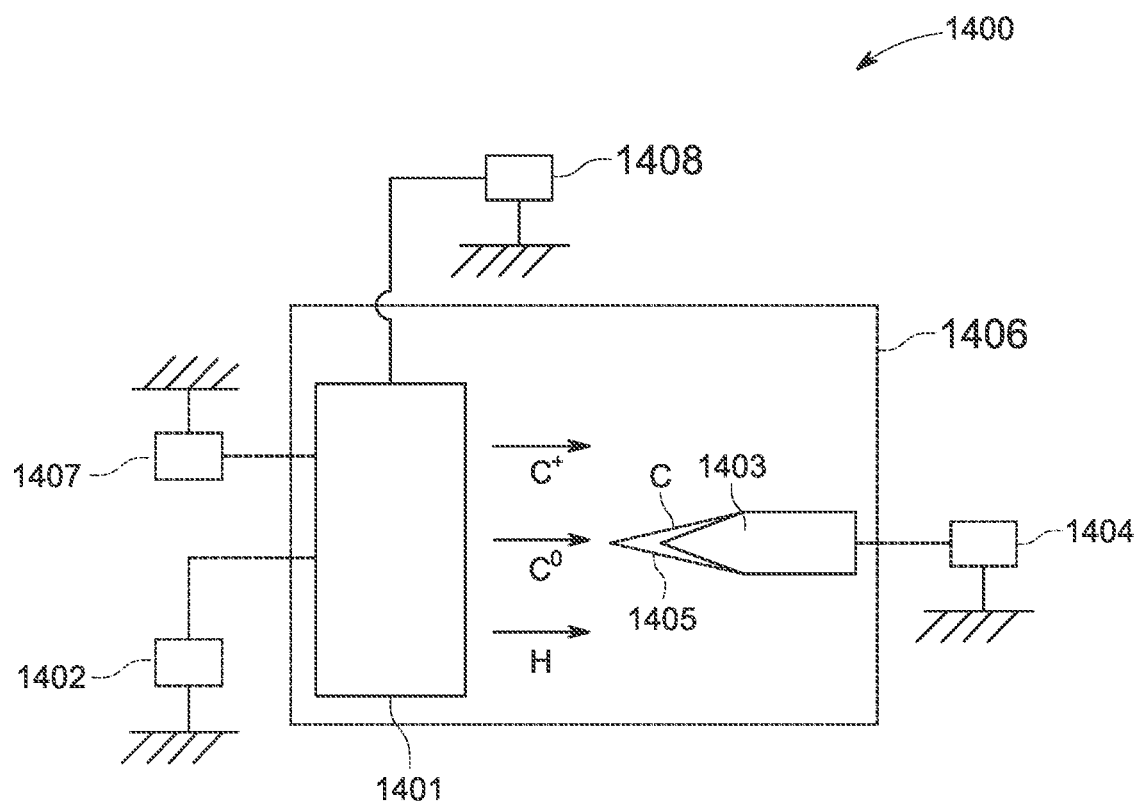
Figure 31:
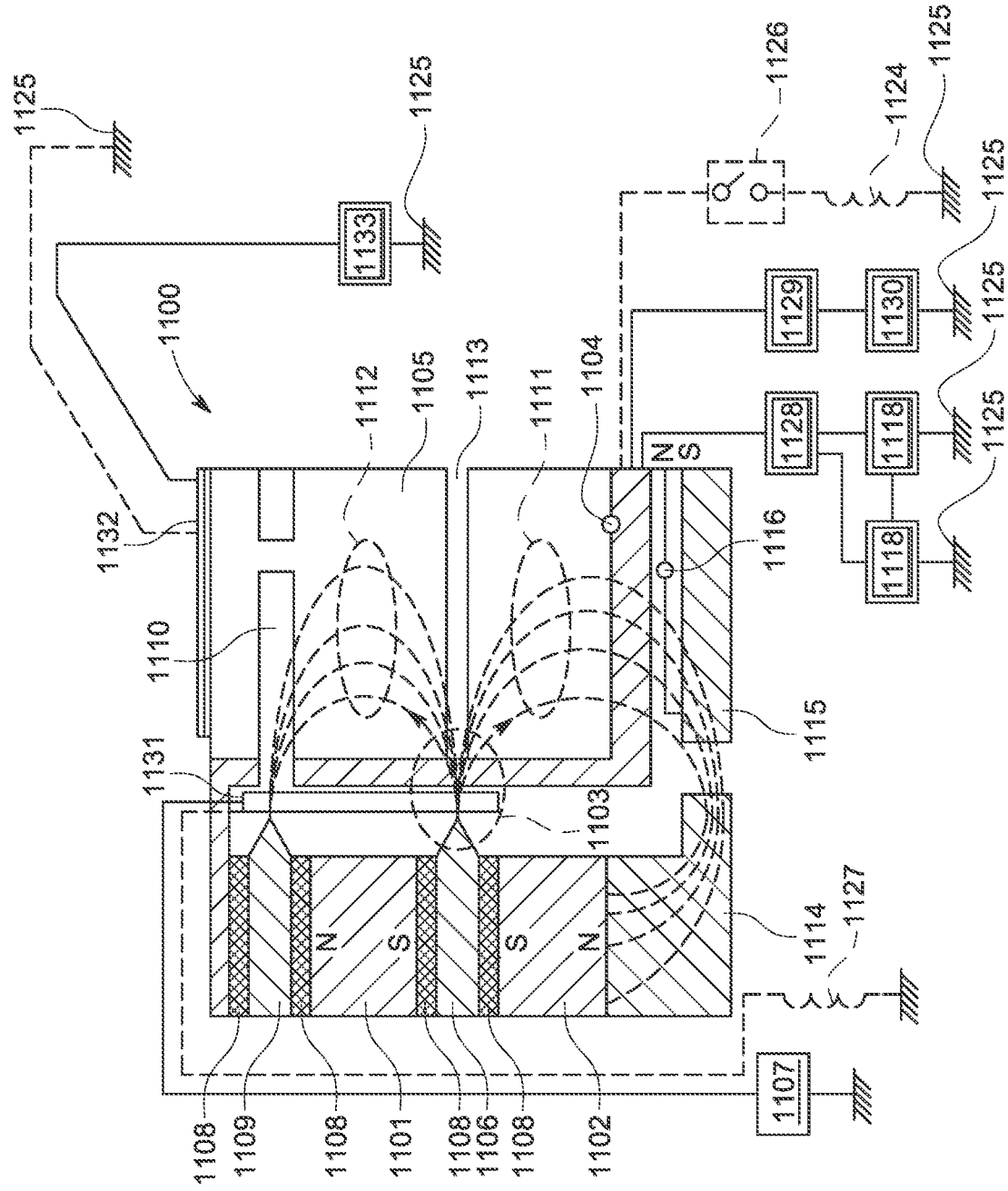
Figure 32:
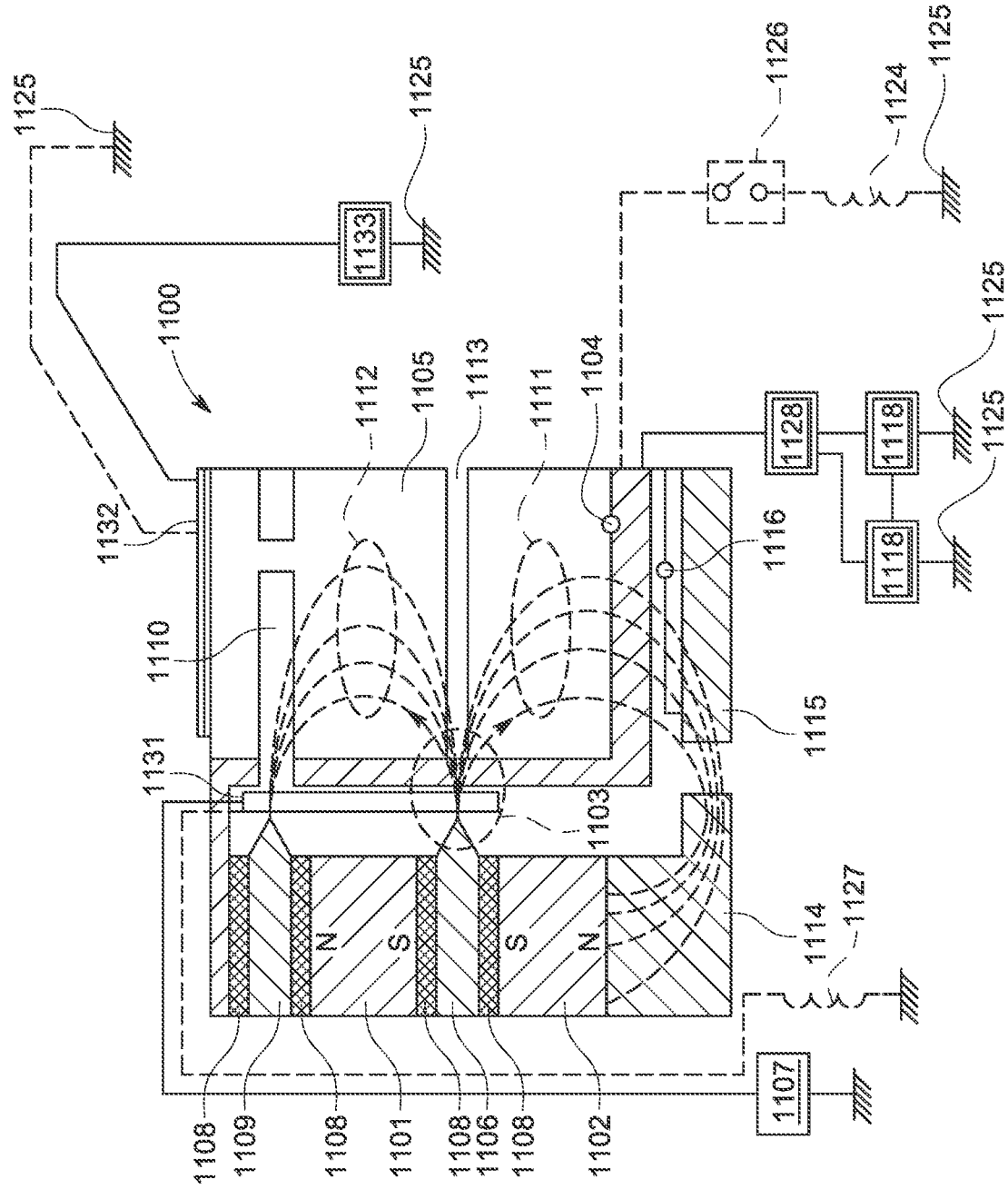
Figure 33:
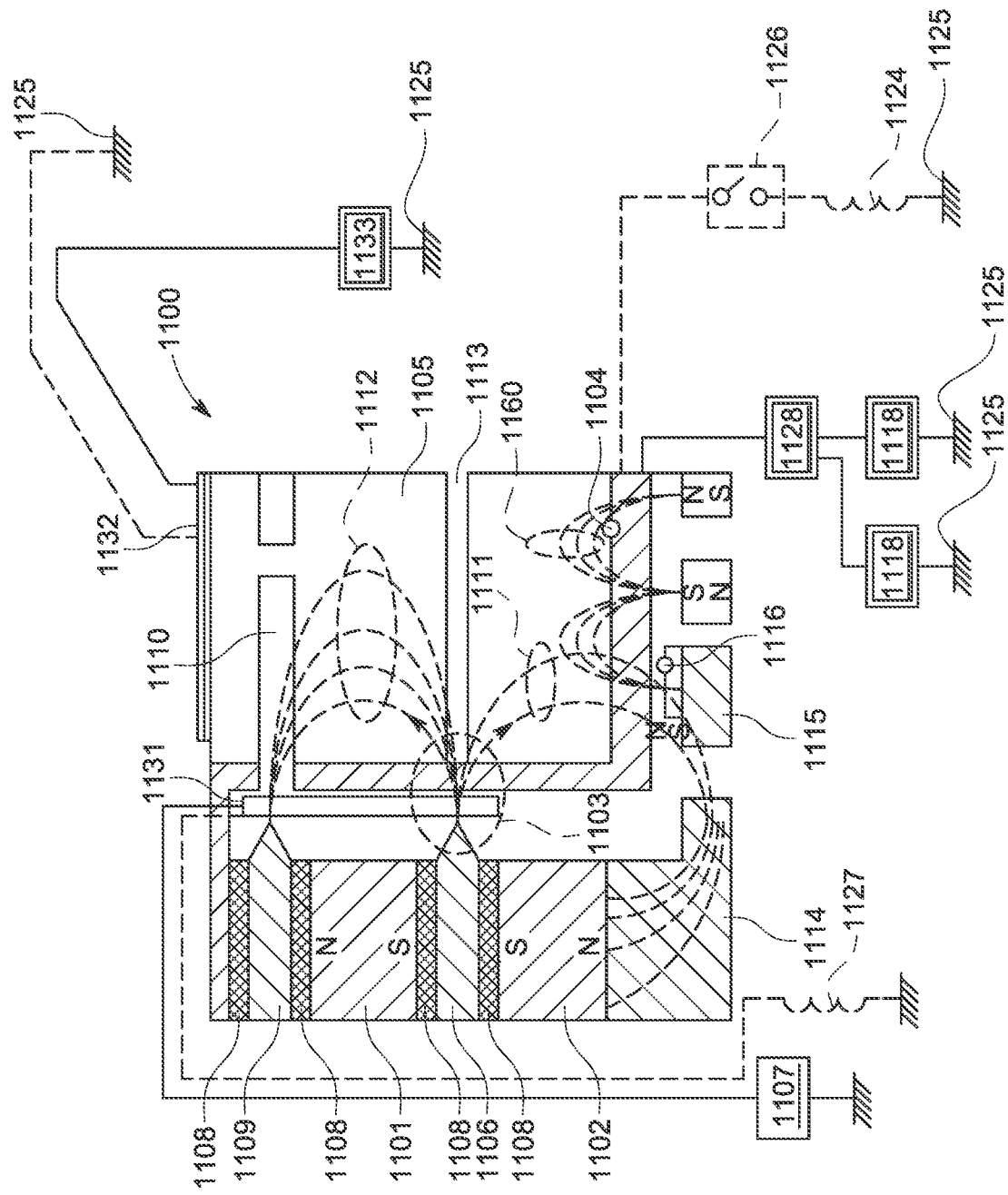
Figure 34:
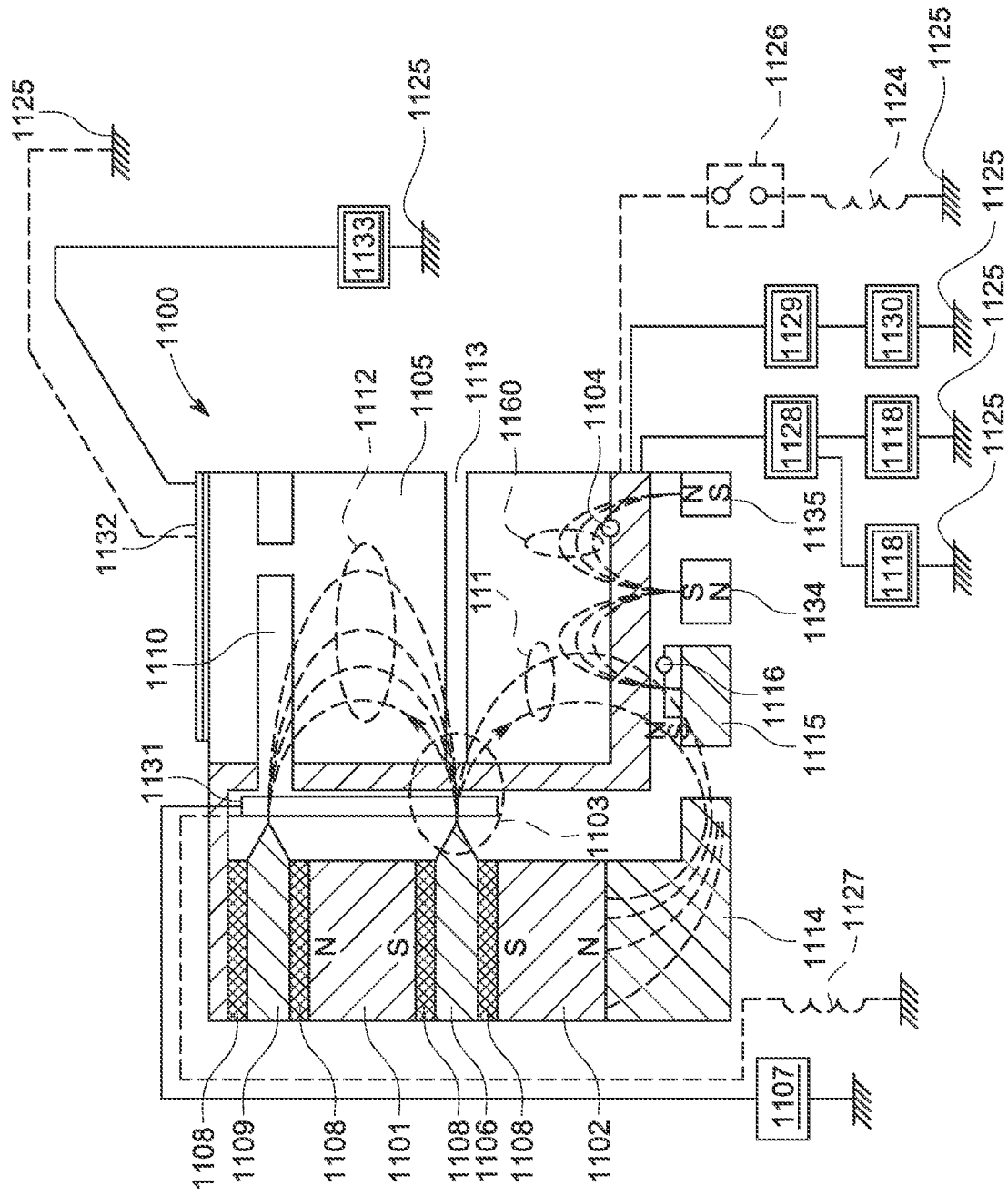
Figure 35:
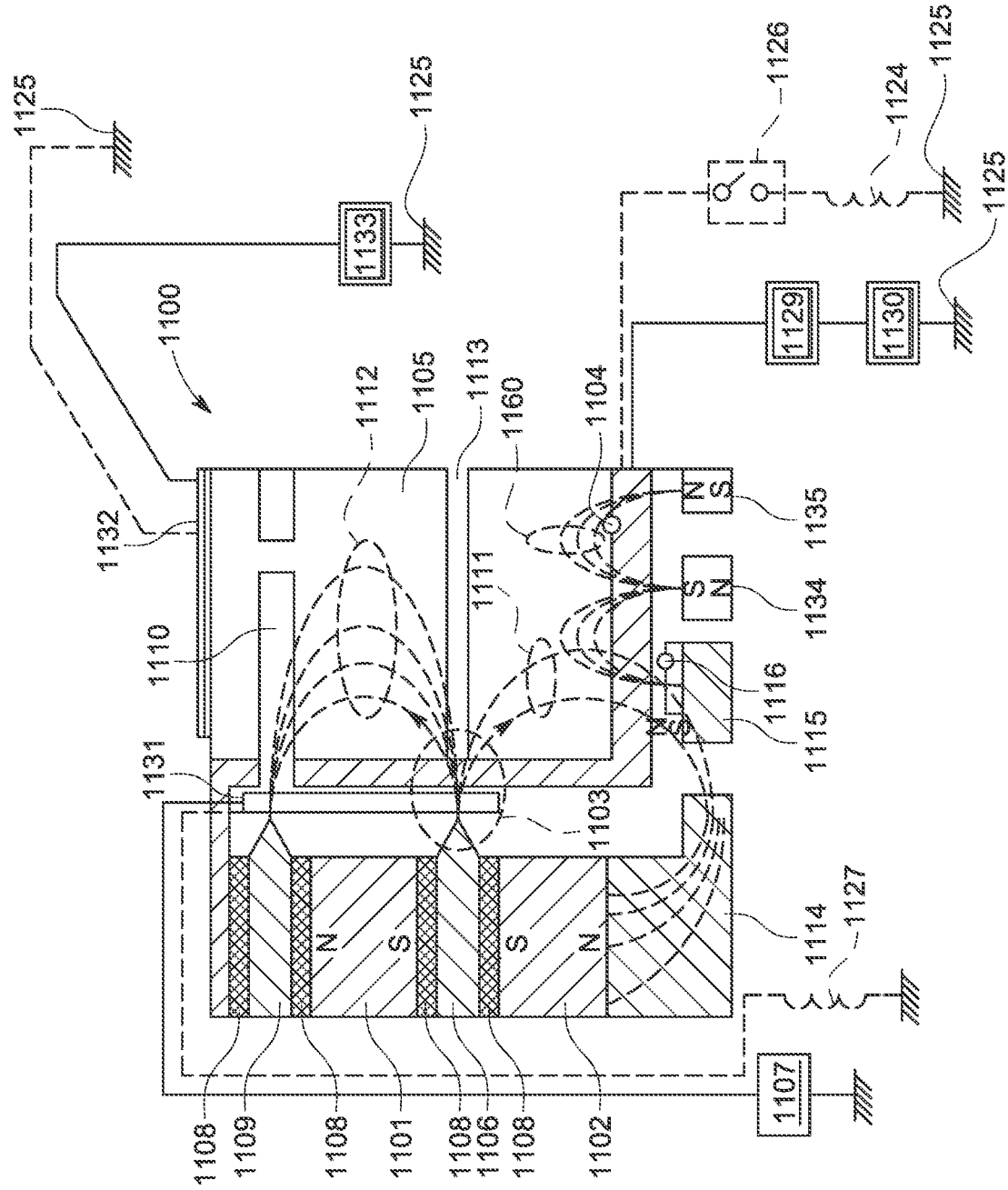
Figure 36:
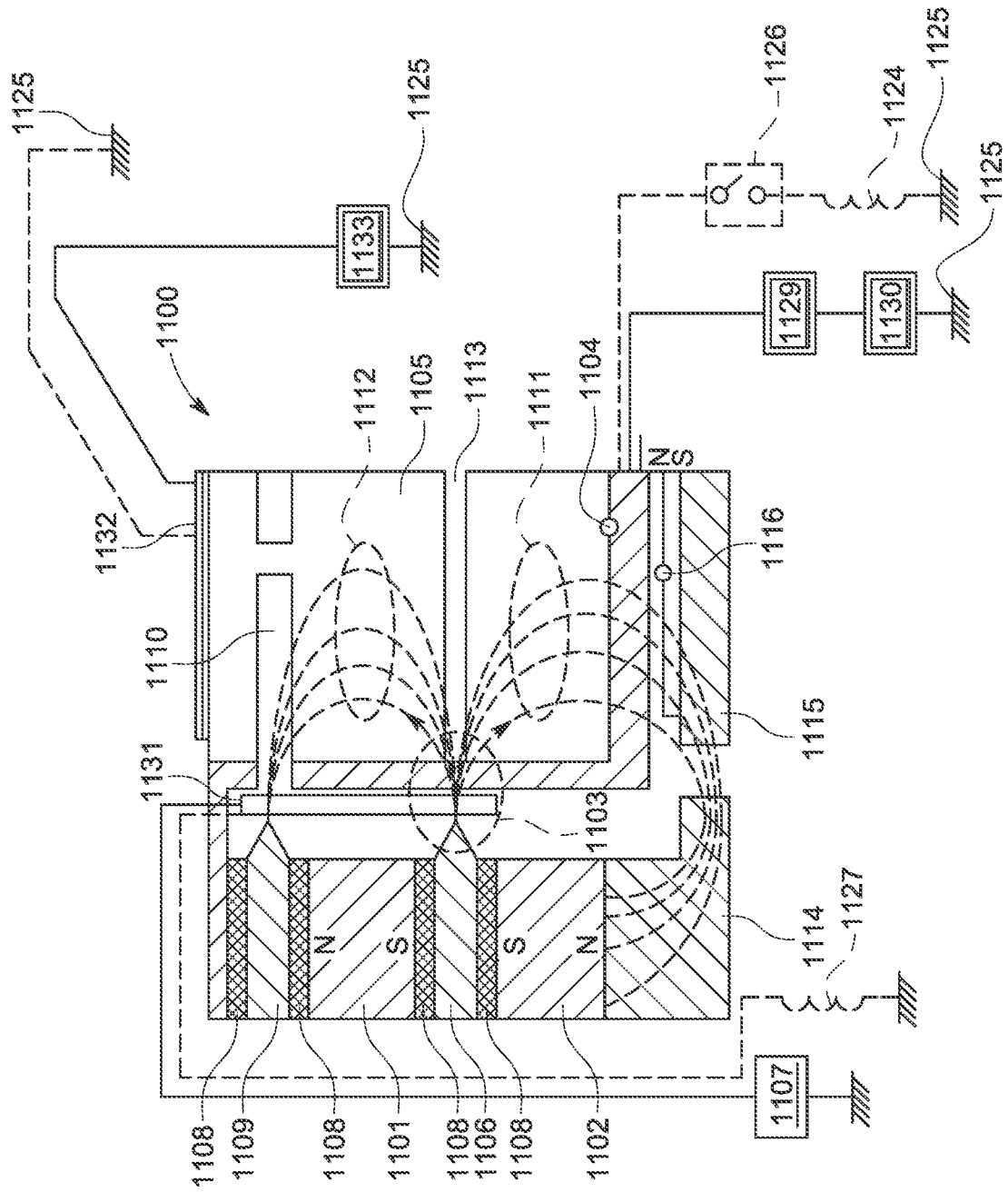
Figure 37:
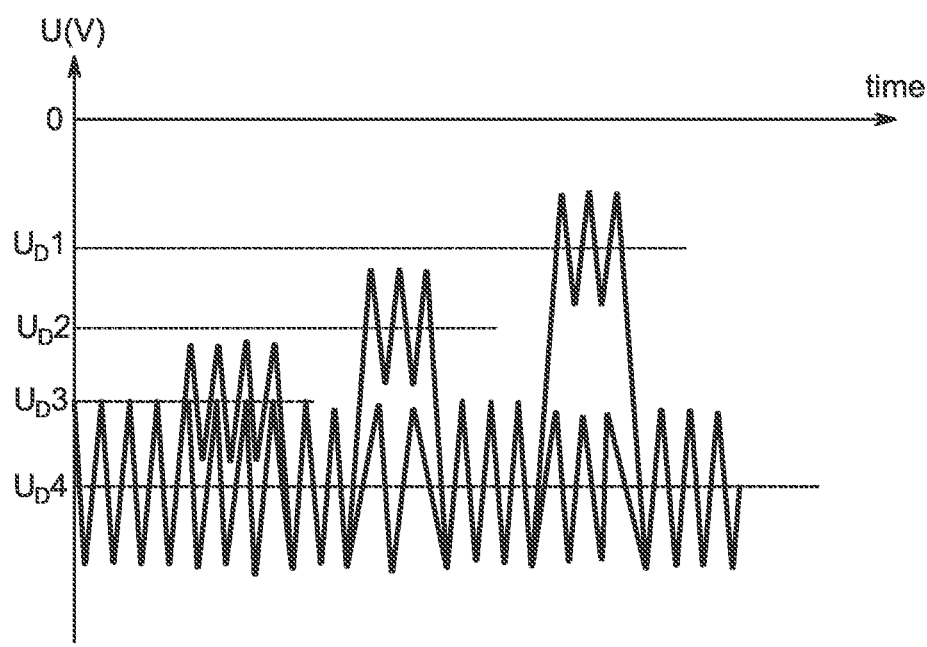
Figure 38:
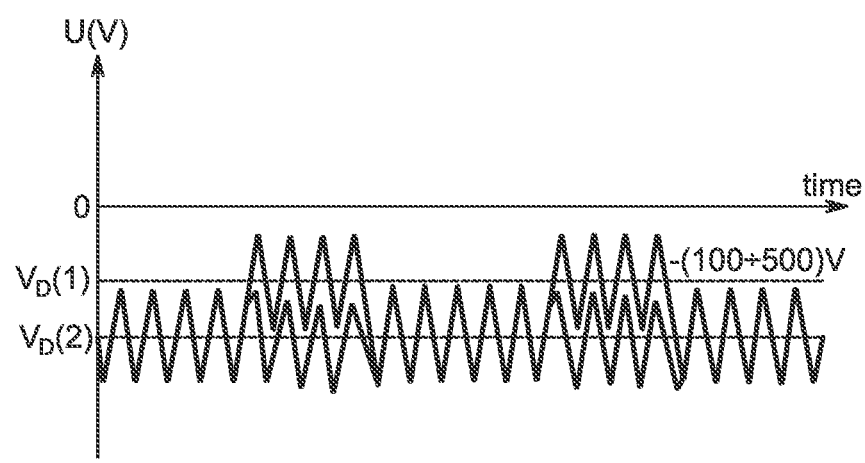
Figure 39:
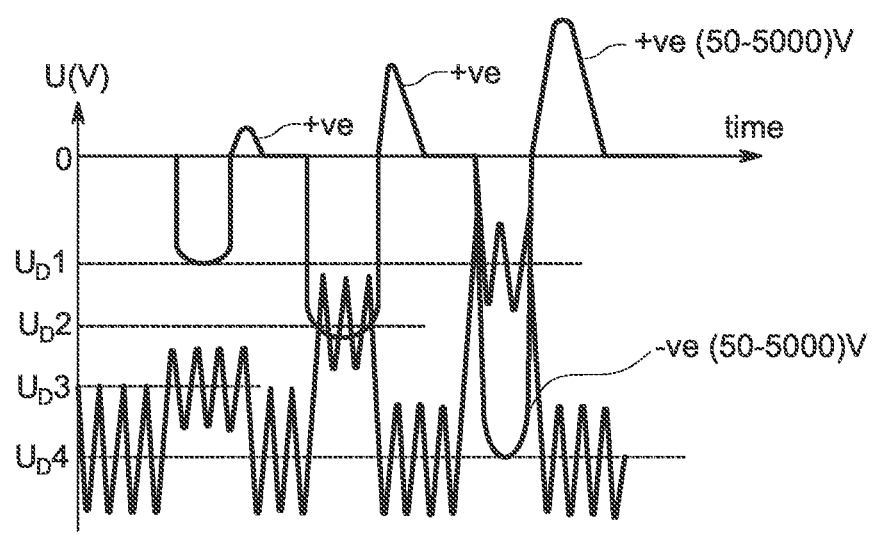
Figure 40:
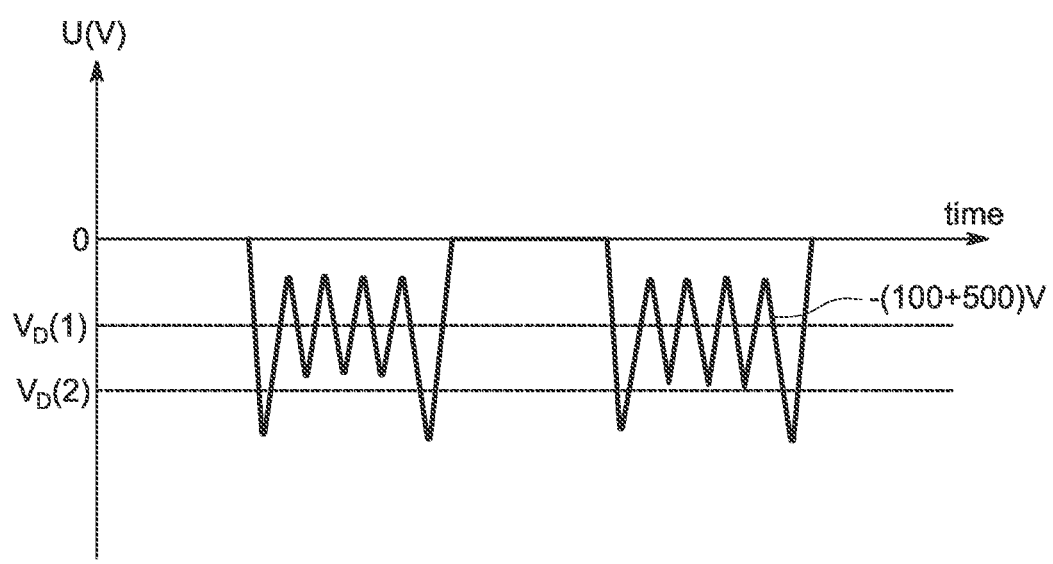
Figure 41:
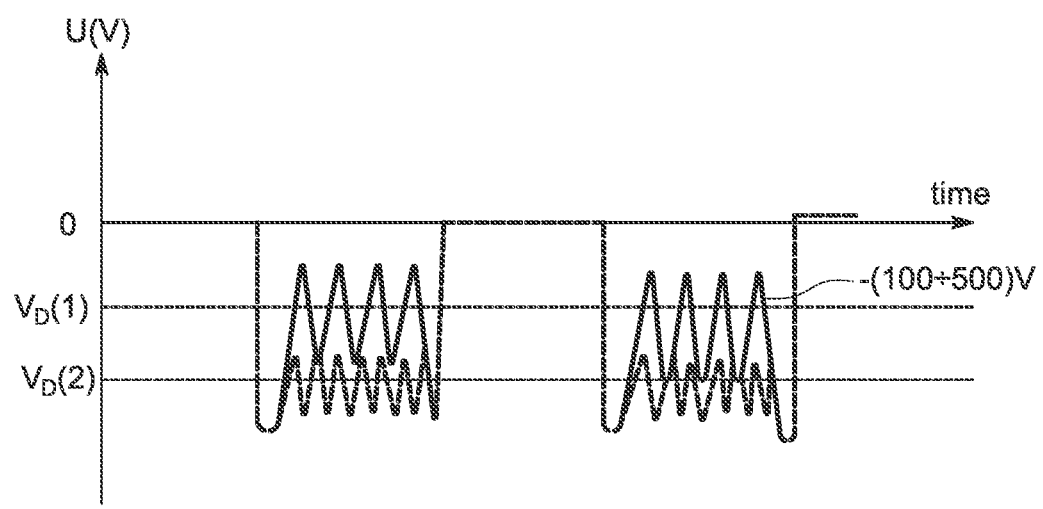
Figure 42:
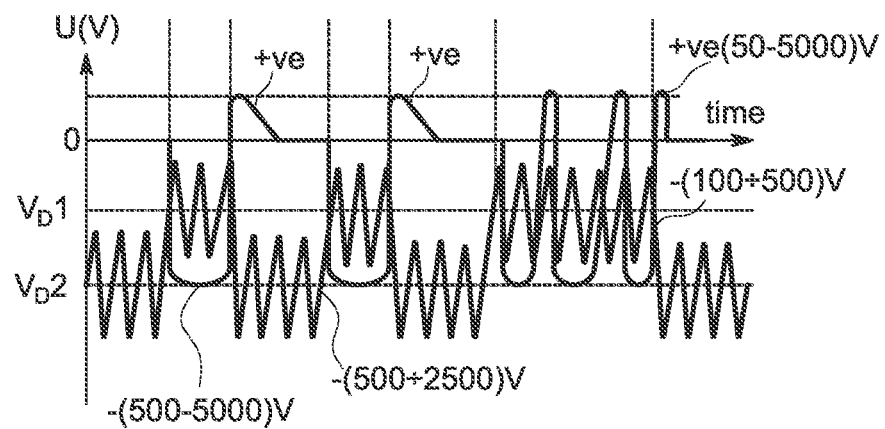

FIG. 23 (b) shows an illustrative cross-sectional view of a gap between the cathode and the anode of the magnetically enhanced CVD source with a pole piece made from non-magnetic material;

FIG. 23 (c) shows an illustrative cross-sectional view of a gap between the cathode and the anode of the magnetically enhanced CVD source when magnets that form cusp magnetic field are electromagnets;

FIG. 24 shows a timing diagram of negative voltage pulses that can be generated by a pulsed power supply and applied to the pole piece;

FIG. 25 (a, b, c, d) show timing diagrams of the negative voltage pulses that can be generated by a pulsed power supply and applied to the cathode assembly;

FIG. 26 (a, b, c, d) show timing diagrams of RF voltages that can be applied to the cathode assembly;

FIG. 27 (a, b, c, d, e) show timing diagrams of different shapes of voltage pulses that can be applied to the cathode assembly;

FIG. 28 shows an illustrative cross-sectional view of an embodiment of the magnetically enhanced CVD apparatus for thin film deposition on a round substrate, such as a Si substrate;

FIG. 29 shows an illustrative cross-sectional view of an embodiment of the magnetically enhanced CVD system including two rectangular CVD sources;

FIG. 30 shows an illustrative cross-sectional view of an embodiment of the magnetically enhanced CVD source and processes for applying a coating on a razor blade tip;

FIG. 31 shows an illustrative cross-sectional view of an embodiment of a magnetically enhanced chemical vapor deposition (CVD) source with a shield separating the gap from the magnetic pole pieces, an accelerating grid, a hollow cathode magnet assembly with a field perpendicular to the hollow cathode target and coupling with the cusp field, multiple RF power supplies, and a high-power pulsed power supply connected to the hollow cathode target, and inductor connected to a switch;

FIG. 32 shows an illustrative cross-sectional view of an embodiment of a magnetically enhanced chemical vapor deposition (CVD) source with a shield separating the gap from the magnetic pole pieces, an accelerating grid, multiple RF power supplies connected to the hollow cathode target, and an inductor connected to the switch;

FIG. 33 shows an illustrative cross-sectional view of an embodiment of a magnetically enhanced chemical vapor deposition (CVD) source with a shield separating the gap from the magnetic pole pieces, an accelerating grid, multiple RF power supplies connected to the hollow cathode target, an inductor connected to a switch, a hollow cathode with a specific magnet assembly forming an outer ring coupling to the cusp field through the gap and an inner magnet assembly forming a magnetron configuration on the hollow cathode target;

FIG. 34 shows an illustrative cross-sectional view of an embodiment of a magnetically enhanced chemical vapor deposition (CVD) source with a shield separating the gap from the magnetic pole pieces, an accelerating grid, multiple RF power supplies and a high power pulsed power supply connected to a hollow cathode target, an inductor connected to a switch, the hollow cathode including a specific magnet assembly forming an outer ring coupling to the cusp field through the gap and an inner magnet assembly forming a magnetron configuration on the hollow cathode target;

FIG. 35 shows an illustrative cross-sectional view of an embodiment of a magnetically enhanced chemical vapor deposition (CVD) source with a shield separating the gap from the magnetic pole pieces, an accelerating grid, a high power pulsed power supply connected to the hollow cathode target, an inductor connected to a switch, the hollow cathode including a specific magnet assembly forming an outer ring coupling to the cusp field through the gap and an inner magnet assembly forming a magnetron configuration on the hollow cathode target;

FIG. 36 shows an illustrative cross-sectional view of an embodiment of a magnetically enhanced chemical vapor deposition (CVD) source with a shield separating the gap from the magnetic pole pieces, an accelerating grid, a hollow cathode magnet assembly with a field perpendicular to the hollow cathode target and coupling with the cusp field, a high power pulsed power supply connected to the hollow cathode target, and an inductor connected to a switch;

FIG. 37 shows timing diagrams of two RF voltages running in two different modes, one being continuous, and the second RF voltage being pulsed with varying pulsed power that can be applied to the magnetically enhanced chemical vapor deposition (CVD) cathode assembly;

FIG. 38 shows timing diagrams of two RF voltages running in two different modes, one being continuous, and the second RF voltages being pulsed with the same pulsed power that can be applied to the magnetically enhanced chemical vapor deposition (CVD) cathode assembly;

FIG. 39 show timing diagrams of two RF voltages running in pulsed mode with two different voltage levels superimposed with a varying high-power asymmetric AC pulse that can be applied to the magnetically enhanced chemical vapor deposition (CVD) cathode assembly;

FIG. 40 shows a timing diagram of pulsed RF voltages that can be applied to the magnetically enhanced chemical vapor deposition (CVD) cathode assembly;

FIG. 41 shows a timing diagram of two synchronized pulsed RF voltages in two different power settings that can be applied to the magnetically enhanced chemical vapor deposition (CVD) cathode assembly;

FIG. 42 shows a timing diagram of two RF voltages running in pulsed mode with two different voltage levels, super-imposed with a high power asymmetric AC pulse that can be applied to the magnetically enhanced chemical vapor deposition (CVD) cathode assembly.

Figure 43:
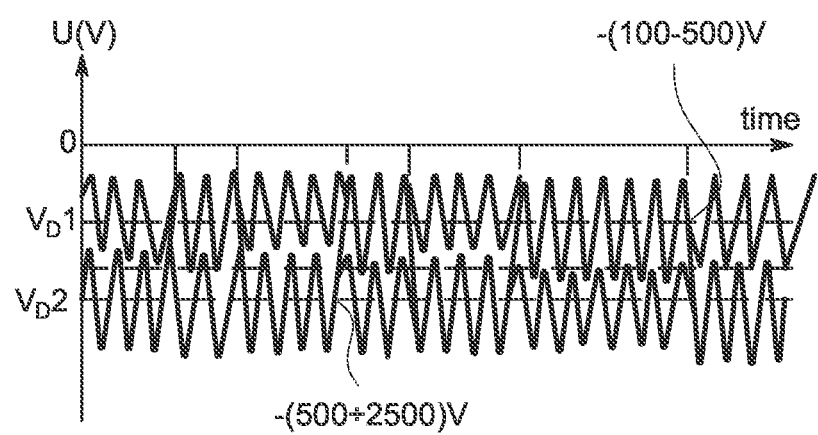
Figure 44:
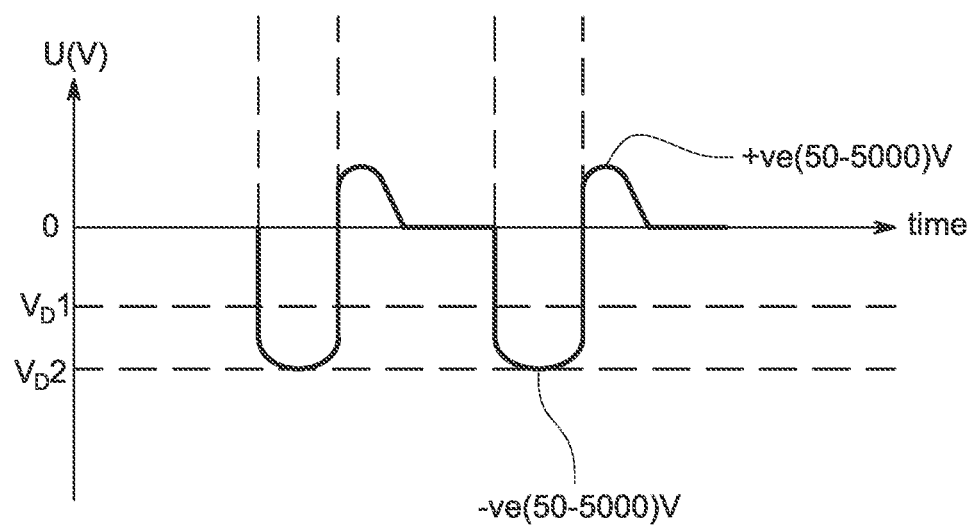
Figure 45:
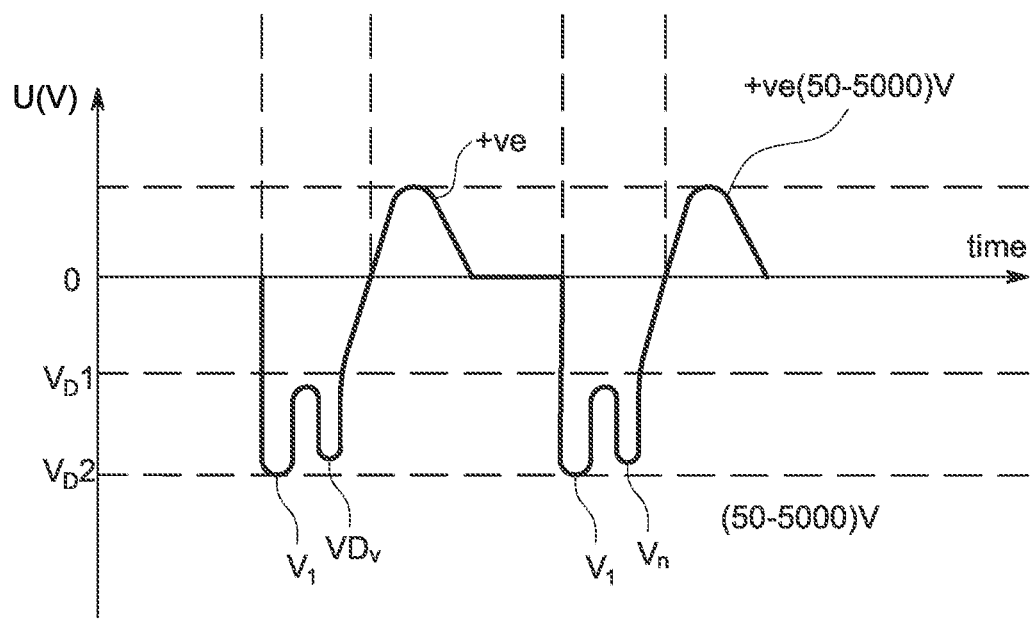
Figure 46:
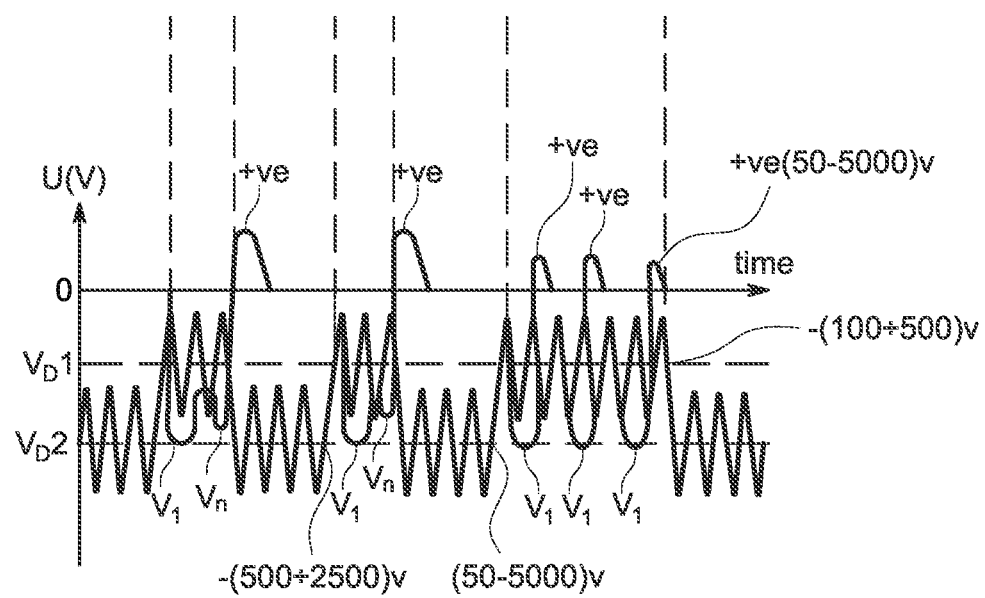
Figure 47A:
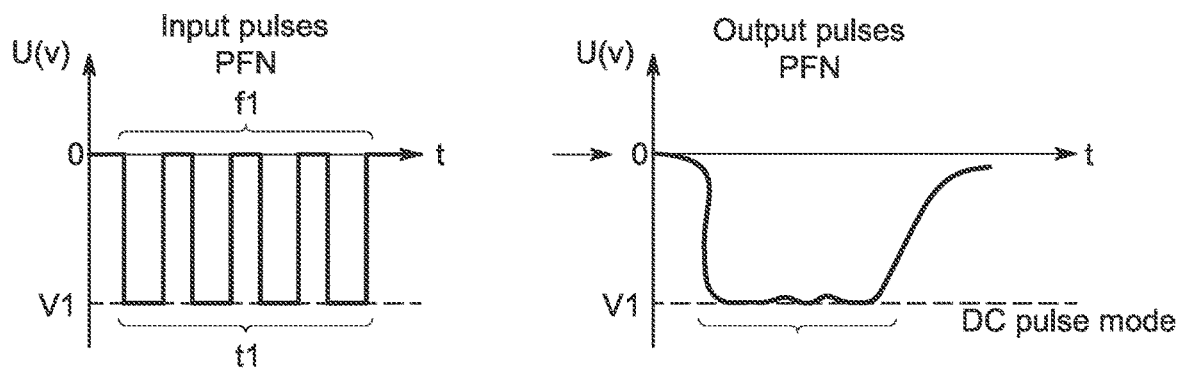
Figure 47B:
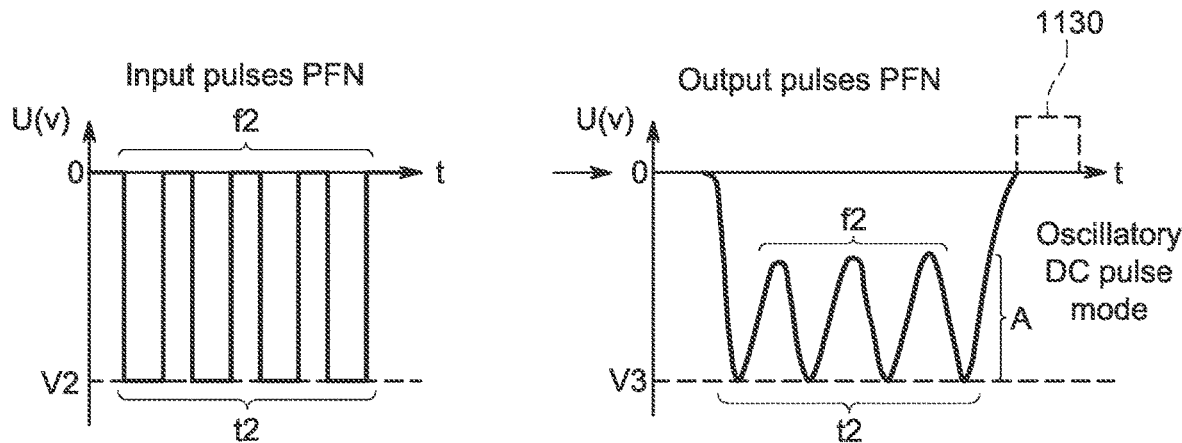
Figure 47C:
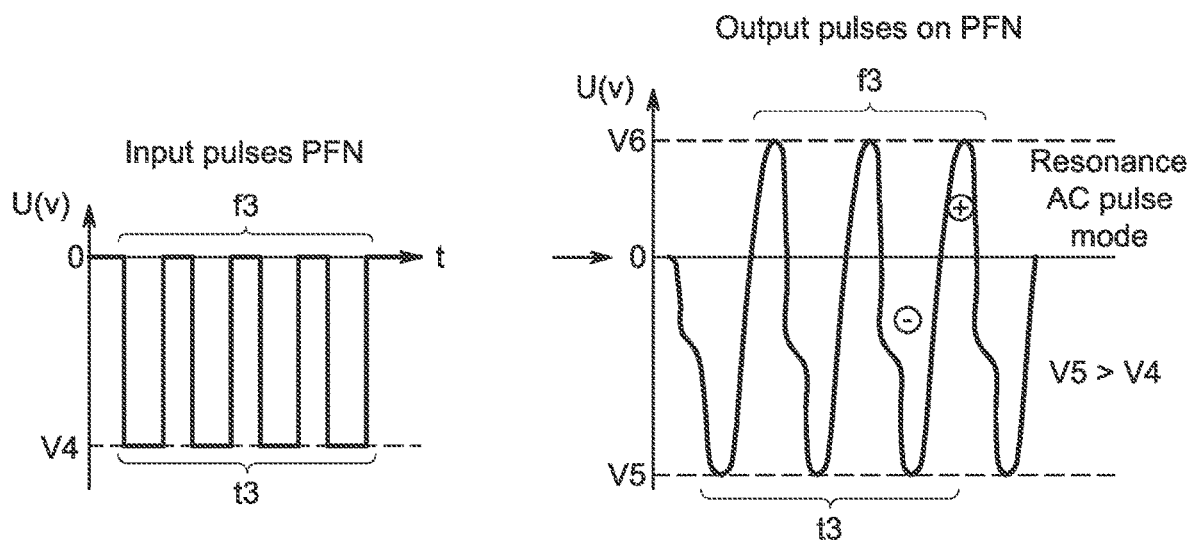
Figure 48A:
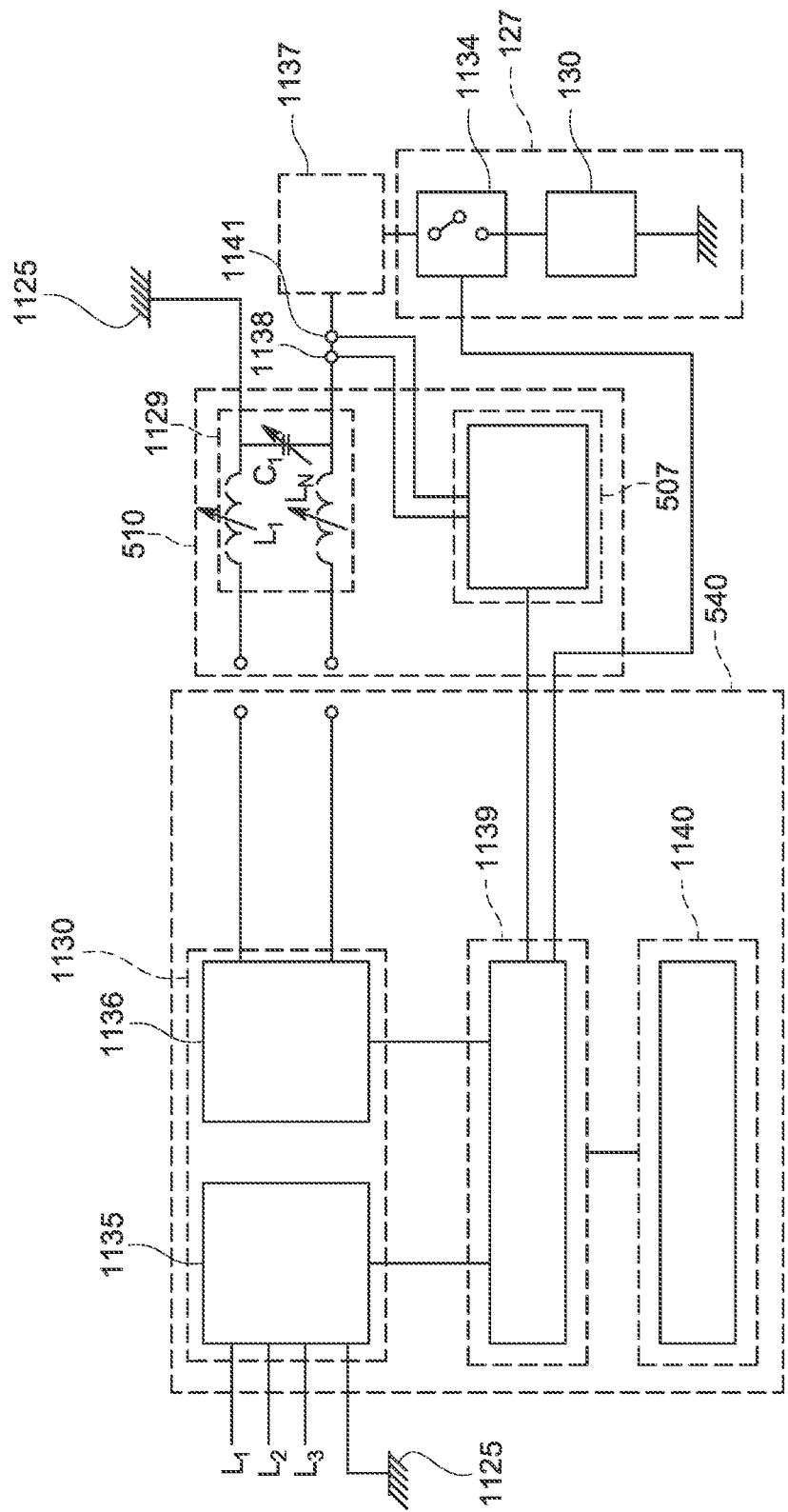
Figure 48B:
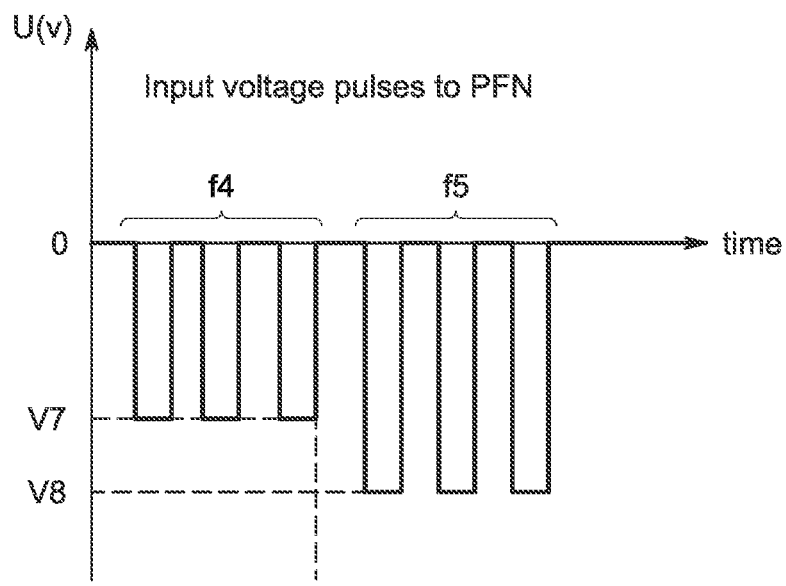
Figure 48C:
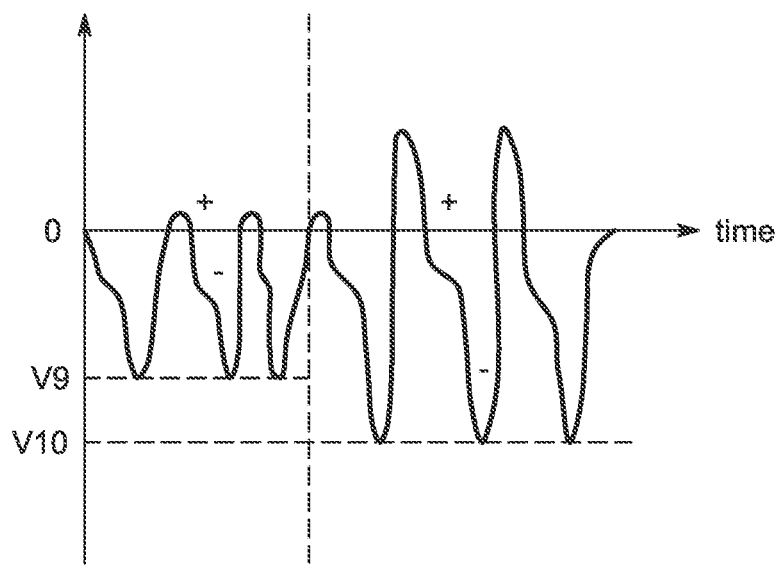
Figure 49:
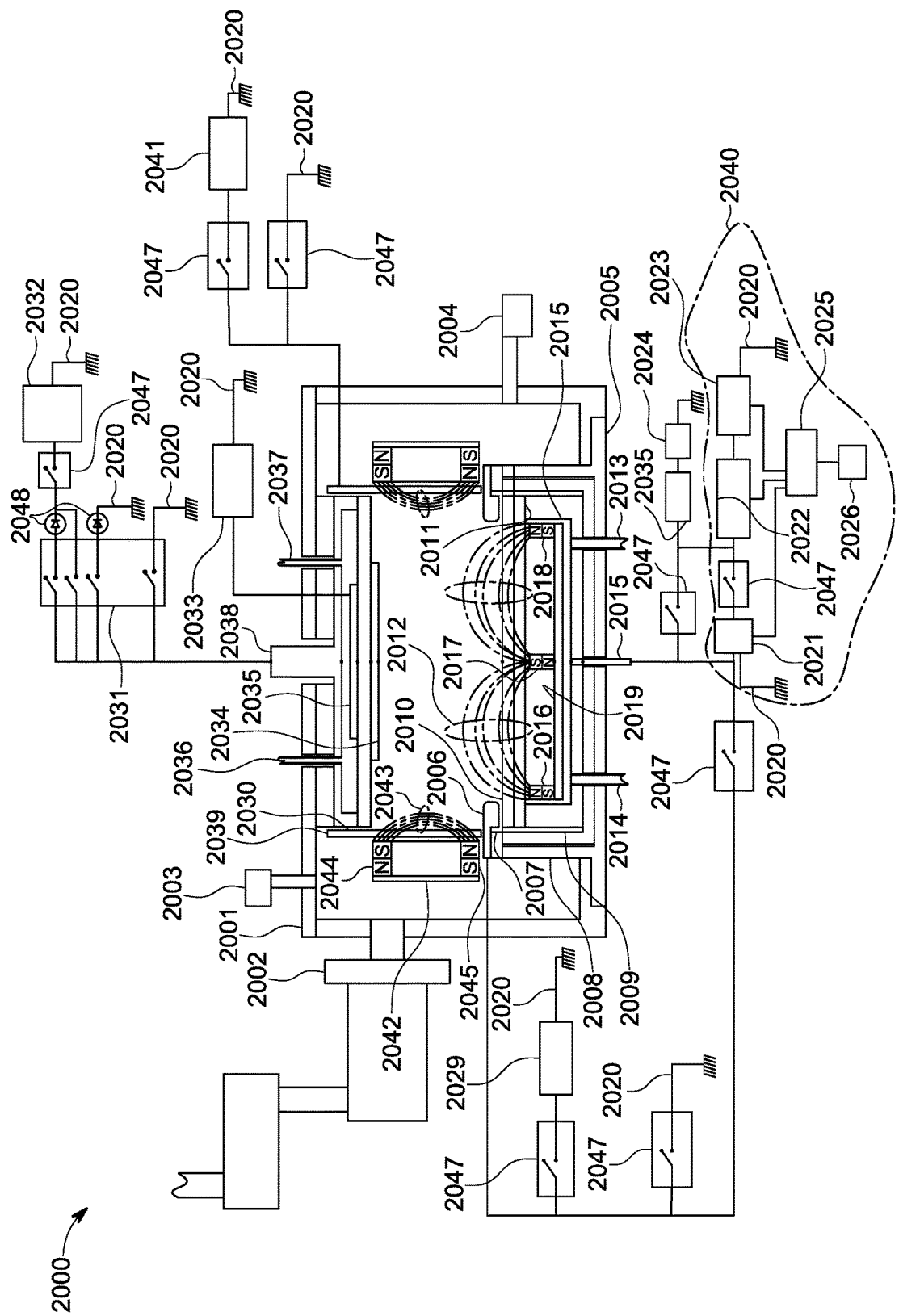
Figure 50:
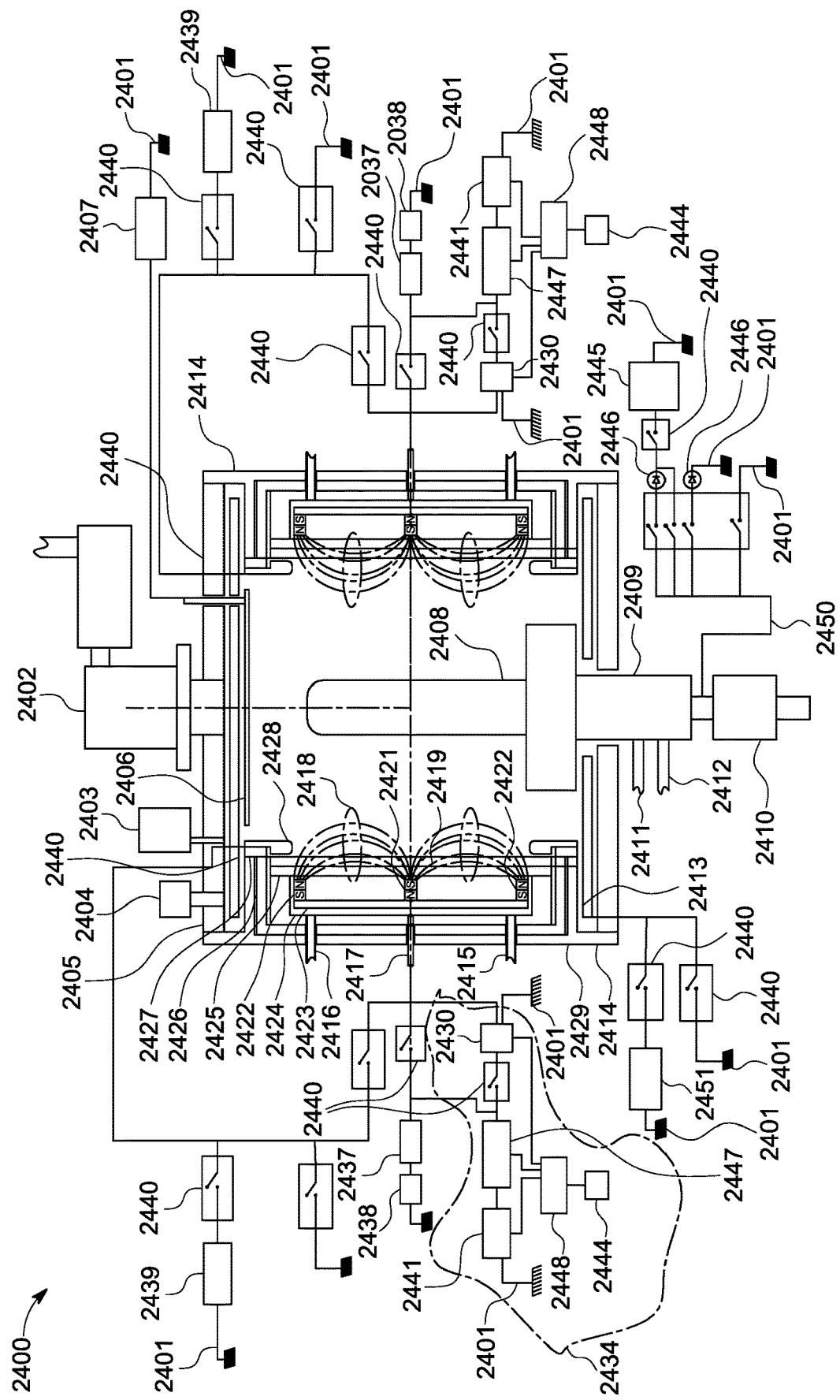
Figure 51:
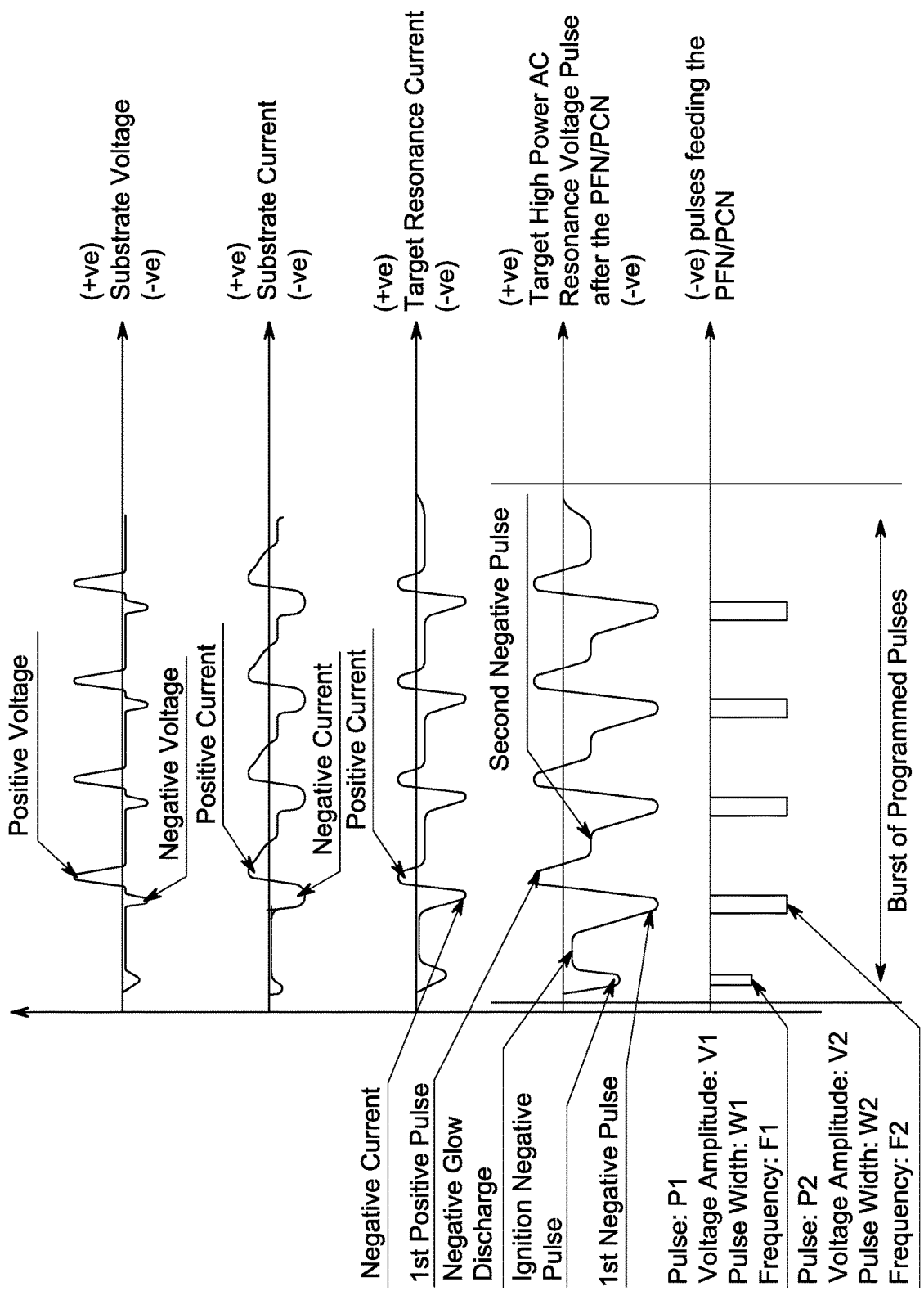
Figure 52:
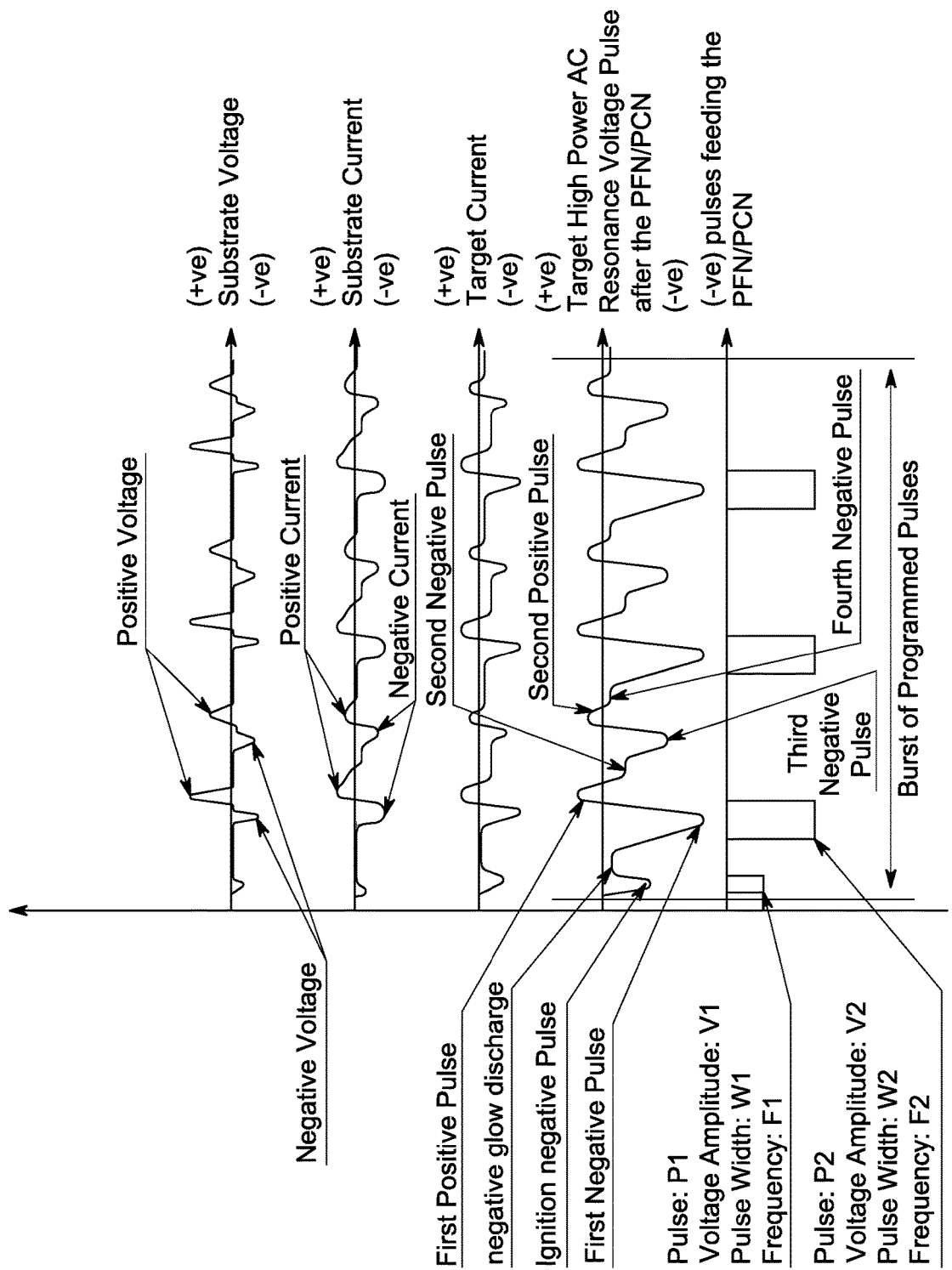
Figure 53:
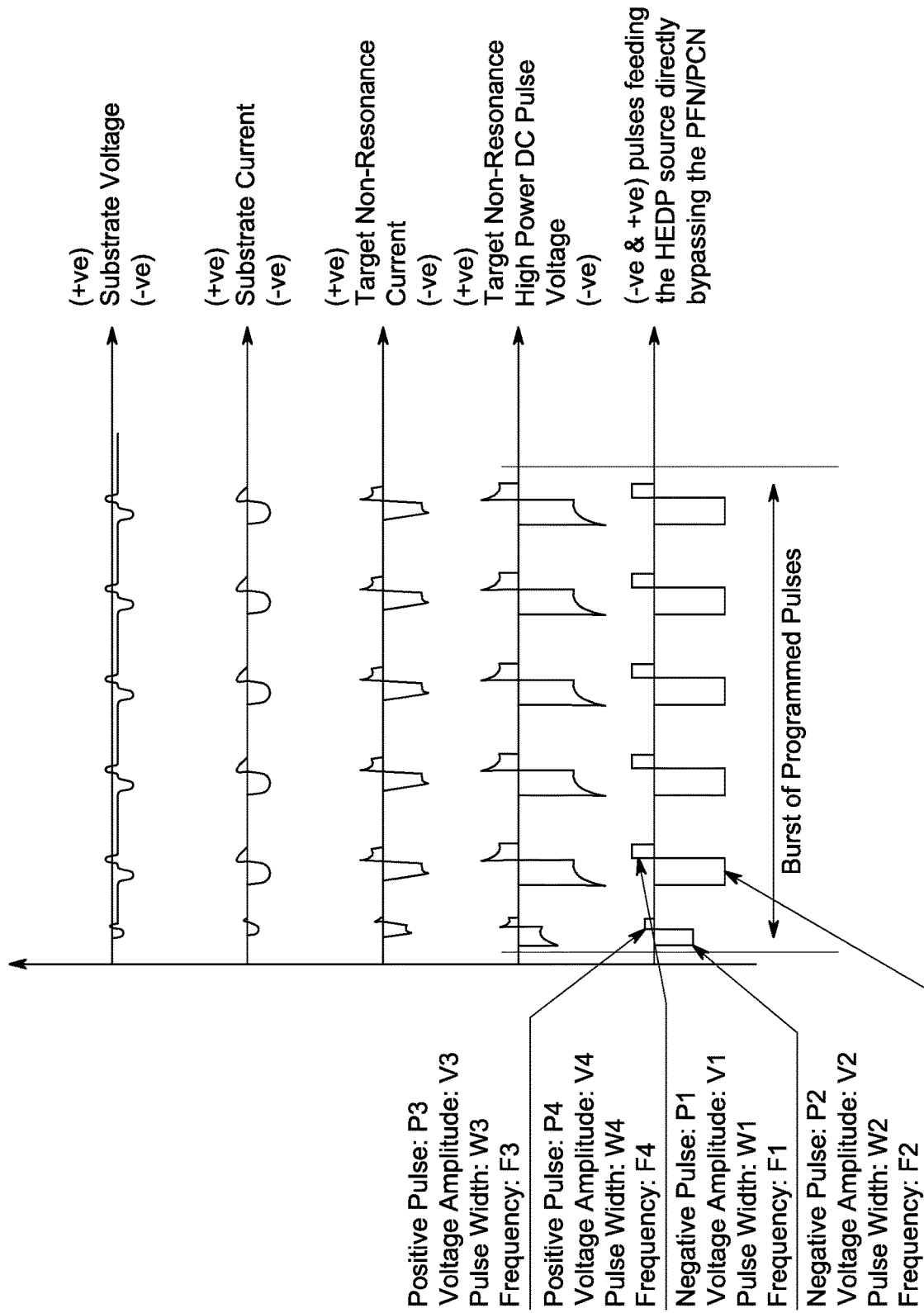

FIG. 43 shows timing diagrams of two RF phase locked voltages having the same frequency in continuous mode with two different power levels that can be applied to the magnetically enhanced chemical vapor deposition (CVD) cathode assembly;

FIG. 44 shows a timing diagram of a high power asymmetric AC pulse that can be applied to the magnetically enhanced chemical vapor deposition (CVD) cathode assembly;

FIG. 45 shows a timing diagram of a high power asymmetric AC pulse with voltage peaks that can be applied to the magnetically enhanced chemical vapor deposition (CVD) cathode assembly;

FIG. 46 shows timing diagrams of two RF voltages in pulsed mode with two different voltage levels superimposed with a varying high power asymmetric AC pulse single voltage peak and double peak that can be applied to the magnetically enhanced chemical vapor deposition (CVD) cathode assembly;

FIG. 47 (*a*) shows timing diagrams of unipolar voltage pulses provided to a tunable PCN connected to the magnetically enhanced chemical vapor deposition (CVD) cathode assembly producing a high-power DC pulse that can be applied to the magnetically enhanced chemical vapor deposition (CVD) cathode assembly;

FIG. 47 (*b*) shows timing diagrams of unipolar voltage pulses provided to a tunable PCN connected to the magnetically enhanced chemical vapor deposition (CVD) cathode assembly producing a high-power DC pulse with oscillations that can be applied to the magnetically enhanced chemical vapor deposition (CVD) cathode assembly;

FIG. 47 (*c*) shows timing diagrams of unipolar voltage pulses provided to a tunable PCN connected to the magnetically enhanced chemical vapor deposition (CVD) cathode assembly producing a high-power resonance asymmetric or symmetric AC pulse that can be applied to the magnetically enhanced chemical vapor deposition (CVD) cathode assembly;

FIG. 48(*a*) shows an illustrative diagram of a high-power pulsed voltage power supply connected to the tunable PCN converting the unipolar pulsed DC pulses to a resonance asymmetric pulsed AC discharge when connected to a magnetically enhanced chemical vapor deposition (CVD) source;

FIG. 48 (*b*) show a timing diagram of a two-voltage level high power unipolar pulsed DC pulses powering the tunable PCN;

FIG. 48 (c) shows a timing diagram at the output of the tunable PCN with two voltage levels and high-power resonance asymmetric AC pulses provided to a magnetically enhanced chemical vapor deposition (CVD) source;

FIG. 49 shows an illustrative view of a magnetically enhanced HEDP sputtering apparatus that includes a single magnetically and electrically enhanced HEDP source connected to a high-power pulse generator with multiple output options that provides an asymmetric resonance AC discharge on the target or non-resonance high-power pulse DC discharge coupled with a programmable positive pulse generator;

FIG. 50 shows an illustrative view of a magnetically enhanced HEDP sputtering apparatus with multiple magnetically and electrically enhanced HEDP sources connected to a high-power pulse generator with multiple output options that provide an asymmetric resonance AC discharge on the target or non-resonance high-power pulse DC discharge coupled with a programmable positive pulse generator;

FIG. 51 shows the timing diagram of output negative unipolar voltage pulses with different amplitude V1, pulse width W1, and frequency F1 for an ignition pulse P1, and amplitude V2, pulse width W2, and defined frequency F2 for a main high-power pulse P2 feeding a pulse forming network, which is connected to a magnetically and electrically enhanced HEDP source causing negative unipolar DC pulses to convert to AC asymmetric resonance discharge pulses on the target;

FIG. 52 shows a timing diagram of output negative unipolar voltage pulses with different amplitude V1, pulse width W1, and frequency F1 for an ignition pulse P1, and amplitude V2, pulse width W2, and defined frequency F2 for a main high-power pulse P2 feeding a pulse forming network, which is connected to a magnetically and electrically enhanced HEDP source causing the negative unipolar DC pulses to convert to AC asymmetric resonance discharge pulses on the target with multiple negative and positive peaks; and FIG. 53 shows a timing diagram of output negative unipolar voltage pulses with different amplitude V1, pulse width W1, and frequency F1 for an ignition pulse P1 followed by a positive unipolar pulse P3 at the end of the pulse duration of the ignition pulse P1 with amplitude V3, pulse width W3, and frequency F3, and main high-power pulses P2 with amplitude V2, pulse width W2, and defined frequency F2; followed by positive unipolar pulses P4 at the end of the pulse duration of main high-power pulses P2 with amplitude V4, pulse width W4, and frequency F4 feeding a pulse forming network, which is connected to a magnetically and electrically enhanced HEDP source causing the negative unipolar DC pulses to generate high-power pulsed DC discharge pulses on the target with negative and positive peaks.

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

A high energy density plasma (HEDP) magnetically enhanced sputtering source includes a hollow cathode magnetron, pulse power supply, and second tunable pulse forming network (PFN) or pulse converting network (PCN). The second tunable PFN or PCN, in resonance mode, generates a high voltage asymmetrical alternating current (AC) waveform with a frequency in the range of 400 Hz to 400 kHz. The resonance mode of the second tunable PFN or PCN, as used herein, is a mode in which input negative unipolar voltage pulses with adjusted amplitude, and programmed duration, and frequency generate an output high-power resonance pulse asymmetric AC voltage waveform with a negative amplitude that exceeds or is equal to the negative amplitude of the input negative unipolar voltage pulses. In some cases, further increase of the amplitude of the input negative unipolar voltage pulses from the high-power pulse power supply does not increases the negative amplitude of the output high resonance asymmetric AC voltage waveform, but increases the duration of the maximum value of the negative resonance AC voltage waveform as shown in FIGS. 1 (a, b, c, d). In some, a further increase of the amplitude of the input negative unipolar voltage pulses from the high-power pulse power supply increases the negative amplitude of the output high resonance asymmetric AC voltage waveform. When the amplitude of the input unipolar negative DC voltage pulses equals V1 as shown in FIG. 1 (a) at the output of the second tunable PFN or PCN during the HEDP discharge, there is an asymmetrical resonance AC voltage waveform as shown in FIG. 1 (b). The resonance asymmetrical AC voltage waveform has a negative portion $V^-$ with a duration $\tau 1$, and positive portions $V_1^+$ and $V_2^+$. When the amplitude voltage becomes V2 and V2>V1, the amplitude of the resonance negative AC voltage waveform is the same as V3, but the duration is $\tau 2$ and $\tau 2 > \tau 1$. A negative portion of the resonance asymmetrical AC voltage waveform generates AC discharge current $I_1$, and positive voltage generates a discharge current $I_2$ as shown in FIGS. 1 (e, f). A negative portion of the high-power asymmetrical resonance AC voltage waveform generates HEDP magnetron discharge from feed gas and sputtering target material atoms inside a hollow cathode target due to high discharge voltage and improved electron confinement. During the sputtering process, the hollow cathode target power density is in the range of 0.1 to 20 kW/cm². A positive portion of the high voltage asymmetrical AC voltage waveform provides absorption of electrons from the HEDP by the hollow cathode magnetron surface and, therefore, generates a positive plasma potential that causes ions to accelerate towards the hollow cathode target walls and a substrate. The ion energy is a function of the amplitude and duration of the positive voltage. The duration of the maximum absolute value of the negative voltage from the high voltage asymmetrical AC voltage waveform is in the range of 0.001- to 100 ms. The discharge current during the positive voltage of the asymmetrical resonance AC voltage waveform can be in the range of 5-50% of the discharge current during the negative voltage from the AC voltage waveform.

The high-power pulse resonance asymmetric AC HEDP magnetron sputtering process is substantially different from high-power impulse magnetron sputtering (HIPIMIS) due to the resonance AC nature of the discharge generated by the second tunable PFN or PCN and HEDP magnetron discharge. The high-power impulse magnetron power supply (HIPMIS, HPPMS, or MPP) generates a unipolar negative pulsed voltage DC output on the magnetron with defined pulse parameters, such as amplitude, width, and frequency to form a layer on a substrate. Adding a second pulse forming or converting network in between the high-power pulse generator and the magnetron converts the unipolar negative pulsed DC to a high-power pulsed resonance asymmetric AC discharge to form a layer on a substrate. The resonance asymmetrical high-power AC discharge is substantially more stable when compared with HIPIMS discharge. In the resonance mode, the high-power AC voltage waveform can be symmetrical or asymmetrical. For example, for a carbon hollow cathode magnetron, a sputtering process with a stable, high-power asymmetric AC discharge current density of about 6 A/cm$^2$ is obtained, thereby forming a dense, smooth, and hard, low-stress diamond-like carbon (DLC) layer on the substrate at low temperature. The disclosed embodiments relate to ionized physical vapor deposition (I-PVD) with an HEDP sputtering apparatus and method.

A sputtering process can be performed with a hollow cathode magnetron sputtering source and direct current (DC) power supply. An example of such an apparatus and sputtering process is described in Zhehui Wang and Samuel A. Cohen, *Hollow cathode magnetron*, J. Vac. Sci. Technol., Vol. 17, January/February 1999, which is incorporated herein by reference in its entirety. However, these techniques do not address the operation of a hollow cathode magnetron sputtering source with a high voltage resonance asymmetrical AC voltage waveform, a method of accelerating ions from the feed gas and sputtering target material atoms by controlling a positive voltage portion of a high-power asymmetrical resonance AC voltage waveform applied to an entirely hollow cathode magnetron, or operation of a pulse power supply and second tunable PFN or PCN when the second tunable PFN or PCN is in a resonant mode and generating a high-power resonance asymmetrical AC voltage waveform on a hollow cathode magnetron sputtering source with power pulse densities of about 1-20 kW/cm2.

A magnetically and electrically enhanced HEDP sputtering source 100 shown in FIG. 1(*g*) includes a hollow cathode magnetron 101 and a high-power pulse resonance AC power supply 102, which includes a high-power voltage source 119, a high-power pulsed power supply with programmable voltage pulse frequency and amplitude 120, and second tunable PFN or PCN 124. This second tunable PFN or PCN, in resonance mode, generates a high-power resonance asymmetrical AC waveform. The hollow cathode magnetron 101 includes a hollow cathode target 103. The hollow cathode target 103 has side walls 104 and a bottom part 105 as shown in FIGS. 1 (*g*), (*h*). An anode 106 is positioned around the side walls 104. Magnets 107, 108, and magnetic pole piece 109 are positioned inside a water jacket 110. The water jacket 110 is positioned inside a housing 111. The hollow cathode target 103 is bonded to a copper backing plate 112. Magnets 107, 108 and magnetic pole piece 109 generate magnetic field lines 113, 114 that terminate on the bottom part 105 and form a magnetron configuration. Magnetic pole piece 109 is positioned on a supporter 190. Magnetic field lines 115, 116 terminate on the side walls 104. Water jacket 110 has a water inlet 117 and a water outlet 118. The water inlet 117 and water outlet 118 are isolated from housing 111 by isolators 121. Water jacket 110 and, therefore, hollow cathode target 101 are connected to a high-power pulse resonance AC power supply 102. The following chemical elements, or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases $O_2$, $N_2$, F, Cl, and/or $H_2$ can also be used as the cathode material.

The hollow cathode target magnetic array may have electromagnets rather than permanent magnets. In some embodiments, the electromagnets are positioned around the side walls 104 of the hollow cathode target. These side electromagnets can balance and unbalance the hollow cathode target magnetic array.

In some embodiments, the hollow cathode target, during the sputtering process, has a temperature between 20 C and 1000 C. A high target temperature in the range of 0.5-0.7 of the melting target temperature increases the deposition rate since the sputtering yield is a function of the temperature in this temperature range. In some embodiments, a portion of the target material atoms arriving on the substrate is evaporated from the target surface. In some embodiments, the sputtering yield is increased due to high target temperature during the pulsed power.

The high-power pulse resonance AC power supply 102 includes a regulated voltage source with variable power feeding 119, a high-power pulsed power supply with programmable voltage pulse frequency and amplitude 120 and a second tunable PFN or PCN 124 as shown in FIG. 2 (*a*). A high-power pulsed power supply with programmable voltage pulse frequency and amplitude 120 has a computer 123 and controller 122. A regulated voltage source with variable power feeding 119 supplies voltage in the range of 400-5000 V to the high-power pulsed power supply with programmable voltage pulse frequency and amplitude 120. The high-power pulsed power supply with programmable voltage pulse frequency and amplitude 120 generates a train of unipolar negative voltage DC pulses to the second tunable PFN or PCN 124. The amplitude of the unipolar negative voltage pulses is in the range of 400 to 5000 V, the duration of each of the voltage pulses is in the range of 1 to 100 μs. The distance between voltages pulses can be in the range of 0.4 to 1000 μs, thus controlling the frequency to be between 0.1 to 400 kHz. In some embodiments, there is a step-up transformer between the high-power pulsed power supply with programmable voltage pulse frequency and amplitude 120 and the second tunable PFN or PCN 124. In this case, the high-power pulsed power supply with programmable voltage pulse frequency and amplitude 120 generates a train of AC voltage waveforms coming to the step-up transformer. In some embodiments, there is a diode bridge between the step-up transformer and second tunable PFN or PCN. The second tunable PFN or PCN includes a plurality of specialized variable inductors L1-L4 and a plurality of specialized variable capacitors C1-C2 for high-power pulse applications. The value of the inductors and capacitors can be controlled by computer 123 and/or controller 122. In some embodiments, at least one inductor and/or one capacitor are variable and their values can be computer controlled. The inductors L1, L2, L3, L4 values can be in the range of 0 to 1000 μH each. Capacitors C1, C2, C3, and C4 have values in the range of 0 to 1000 μF each. The high-power pulse programmable power supply 120 is connected to controller 122 and/or computer 123. Controller 122 and/or computer 123 control output values and timing of the power supply 102. Power supply 102 can operate as a standalone unit without connection to the controller 122 and/or computer 123.

A high-power pulse resonance AC power supply 102 shown in FIG. 2(*a*) includes output current and voltage monitors 125, 126, respectively. The current and voltage monitors 125, 126 are connected to an arc suppression circuit 127. If the current monitor 125 detects a high current and the voltage monitor 126 detects a low voltage, the arc suppression circuit 127 is activated. It is to be noted that the voltage monitor 126 is connected to an output of the second tunable PFN or PCN. The arc suppression circuit sends a signal to stop generating incoming voltage pulses to the second tunable PFN or PCN124 and connects the output of the second tunable PFN or PCN through switch 131 to the positive electrical potential generated by power supply 130 in order to eliminate arcing as shown in FIG. 2 (*a*). The hollow cathode is shown as a C-shaped structure coupled to the output of the second tunable PFN or PCN124.

The train of unipolar negative voltage DC pulses from the high-power pulse programmable power supply 120 is provided to the second tunable PFN or PCN 124. Depending on the amplitude, duration, and frequency of the input unipolar negative voltage DC pulses in the train, the output train from the second tunable PFN or PCN 124 of the unipolar negative voltage DC pulses can have a different shape and amplitude when compared with input unipolar negative voltage DC pulses. In non-resonant mode, in the second tunable PFN or PCN 124, the input train of unipolar negative voltage DC pulses forms one negative voltage pulse with an amplitude equivalent to the amplitude of the negative unipolar voltage DC pulses and a duration equivalent to the duration of the input train of unipolar negative voltage DC pulses. When connected with the magnetically enhanced sputtering source, this voltage pulse can generate a quasi-static pulse DC discharge as shown in FIG. 2 (*b*). In partial resonance mode as shown in FIG. 2 (*c*), in the second tunable PFN or PCN 124, the input train of negative unipolar DC pulses forms one negative pulse with an amplitude and duration, but with voltage oscillations. The amplitude of these oscillations can be 30-80% of the total voltage amplitude. The frequency of the voltage oscillations or modulations is substantially equivalent to the frequency of the input unipolar negative voltage DC pulses. This mode of operation is beneficial to maintaining a high deposition rate, which is greater than that obtained in full resonance mode, and a high ionization of sputtered target material atoms. In resonance mode as shown in FIG. 2 (*d*), the input train of unipolar negative voltage DC pulses forms asymmetrical AC voltage waveforms with a maximum negative voltage amplitude that can significantly exceed the voltage amplitude of the input unipolar negative voltage DC pulses. In some embodiments, in non-optimized resonance mode, the input train of unipolar negative voltage DC pulses forms an asymmetrical AC voltage waveform with a maximum negative voltage amplitude that does not exceed negative voltage DC pulses. The positive amplitude of the AC voltage waveform can reach the absolute value of the negative amplitude and form a symmetrical AC voltage waveform. In FIG. 2 (*b*), the pulsing unit generates, during time t1, a train of unipolar negative voltage DC pulses with a frequency f1 and amplitude V1.

In FIG. 2 (*c*), the high-power pulse programmable power supply 119 generates, during time t2, a train of unipolar negative voltage DC pulses with a frequency f2 and amplitude V2. In this case, the partial pulsed DC non-resonance mode exists. The amplitude A of the voltage oscillations is about 30-80% of the voltage amplitude V2. At the end of the pulse, the positive voltage pulse 130 can be added by activating a positive voltage power supply connected to the output of the second tunable PFN or PCN. If the high-power pulse programmable power supply 120 generates unipolar voltage pulses with a frequency f3 and amplitude V4 during time t3, the resonance mode exists in the PFN 124 or PCN. The resonance mode generates an asymmetrical AC voltage waveform. The negative voltage amplitude V5 exceeds the amplitude of the input voltage pulses V4 as shown in FIG. 2 (*d*). In some embodiments, the amplitude of the voltage pulses V4 is −1200 V, the amplitude of the negative voltage V5 is −1720 V. and the amplitude of the positive voltage V6 is +280 V. In some embodiments, the amplitude of the voltage pulses V4 is −1500 V, and amplitude of the negative voltage V5 is −1720 V. The amplitude of the output positive voltage V6 is +780 V. Different configurations of the second tunable PFN or PCN that can be used to generate asymmetrical AC voltage waveforms are shown in FIGS. 2 (*e, f*).

Figure 3A:
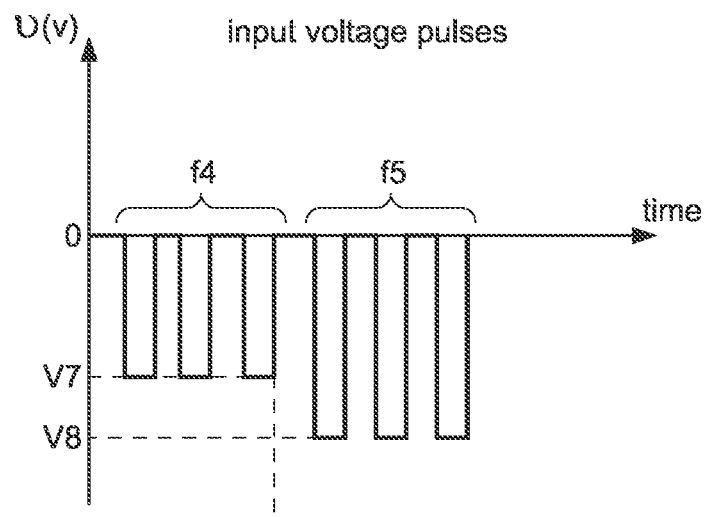
FIG. 3 (*a*) shows an illustrative view of a train of input unipolar negative voltage pulses with two different voltage amplitudes applied to the second tunable PFN or PCN.
Figure 3B:
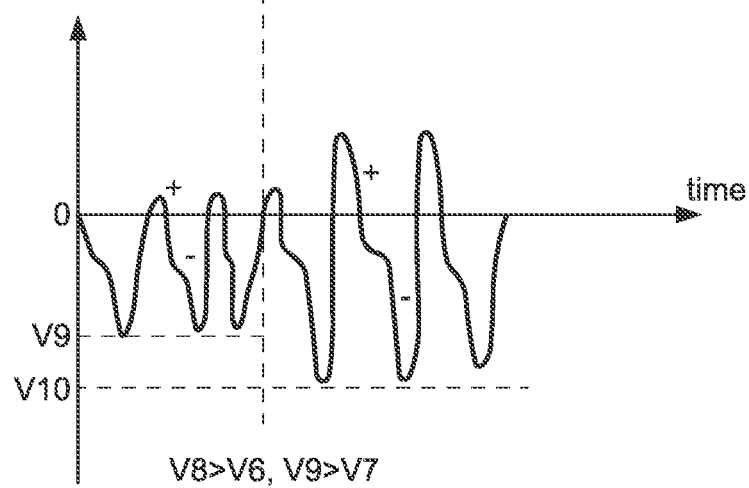

In some embodiments, the high-power pulse programmable power supply pulsing 120 can generate a train of unipolar negative voltage DC pulses with different amplitudes V7, V8, and frequencies f4, f5 as shown in FIG. 3 (*a*). There is a resonance mode in the second tunable PFN or PCN 124 when the output negative voltage amplitudes V9, V10 exceed the amplitude of the input voltage pulses V7, V8 as shown in FIG. 3 (*b*). During a negative portion of the asymmetrical AC discharge, a surface of the hollow cathode target 103 emits secondary electrons due to ion bombardment, and during the positive portion of the asymmetrical AC discharge, the hollow cathode 103 absorbs electrons. The reduced amount of electrons in the plasma generates a positive plasma potential. This plasma potential accelerates ions towards the substrate.

During a reactive sputtering process, a positive electrical charge is formed on the hollow cathode target surface 107 due to reactive feed gas interaction with the hollow cathode target surface 107. The positive voltage of the asymmetrical high voltage AC waveform attracts electrons to the hollow cathode target surface. These electrons discharge a positive charge on top of the cathode target surface 107 and significantly reduce or completely eliminate the probability of arcing. Since the electrons are absorbed by the hollow cathode target surface 107, it is possible to generate a positive space charge in the plasma. The positive space charge provides additional energy to the ions in the plasma and leads the ions toward the substrate and hollow cathode target walls. The positive voltage applied to the cathode target surface can attract negative ions that were formed when the negative voltage was applied to the target surface and, therefore, reduce substrate ion bombardment.

Figure 4A:
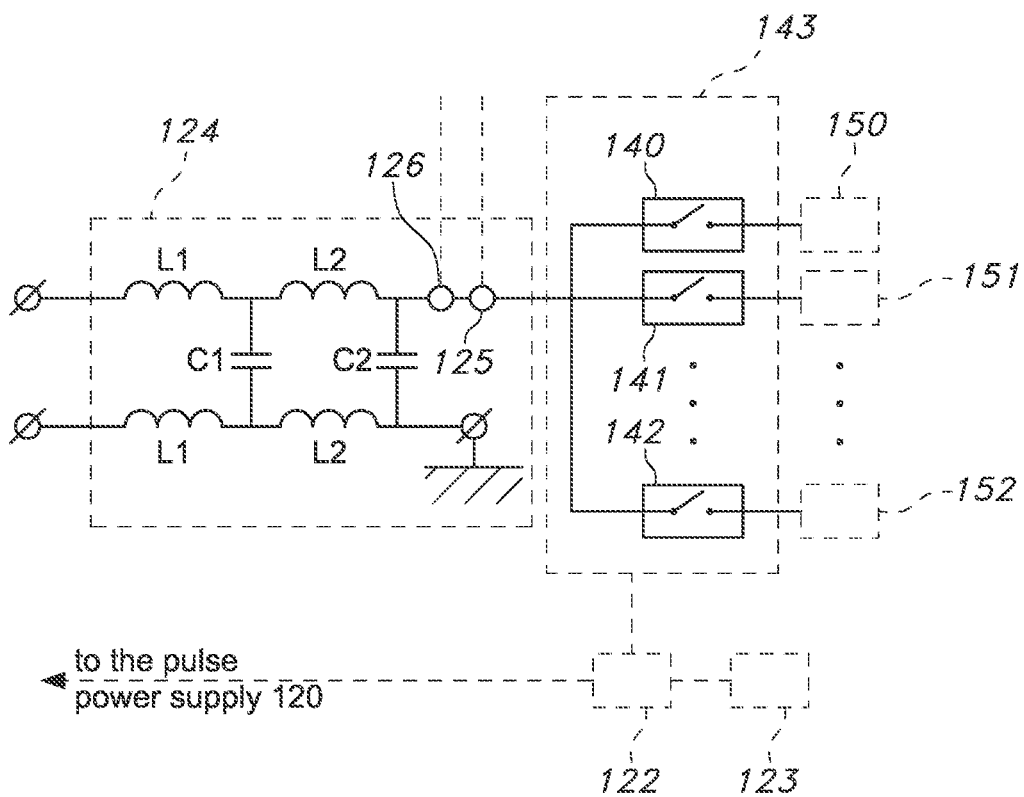
FIG. 4(*a*) shows an illustrative circuit diagram of the second tunable PFN or PCN and a plurality of electrical switches.
Figure 4B:
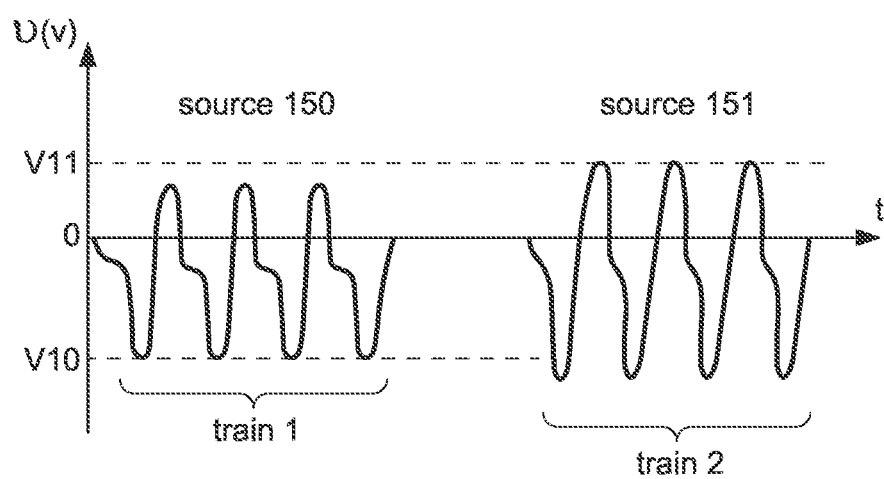

The second tunable PFN or PCN 124 can be connected with a plurality of electrical switches 140-142. The switches 140, 141, 142 are connected to separate magnetron sputtering sources 150, 151, 152 as shown in FIG. 4 (*a*). For example, during operation, the train 1 of pulses of high voltage AC waveform is directed to the sputtering source 150, and the train 2 of pulses of high voltage AC waveform is directed to the sputtering source 151 as shown in FIG. 4 (*b*). In this approach, small size sputtering sources can provide large area sputtering.

Figure 5A:
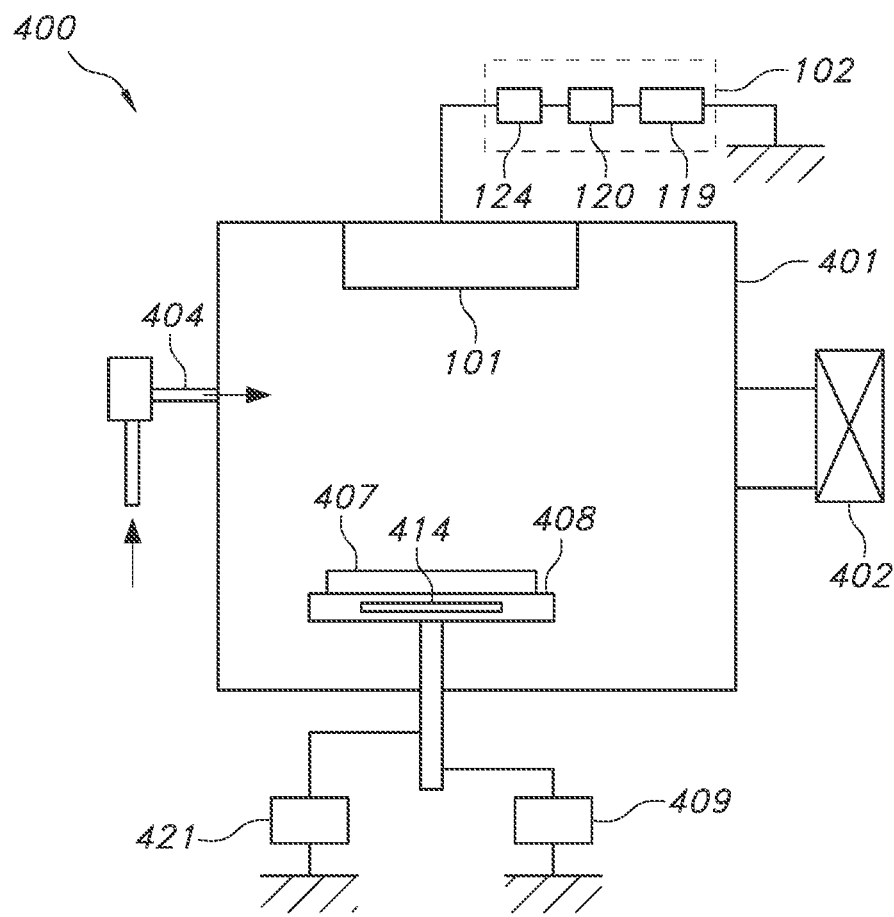
FIG. 5 (*a*) shows an illustrative view of the magnetically enhanced HEDP sputtering apparatus.
Figure 5B:
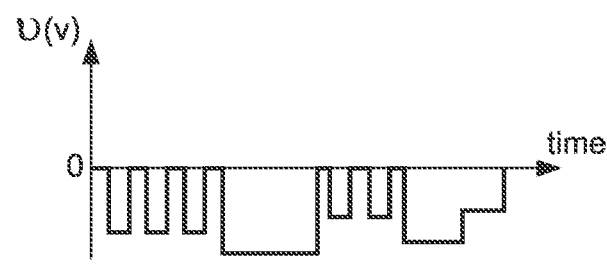
Figure 5C:
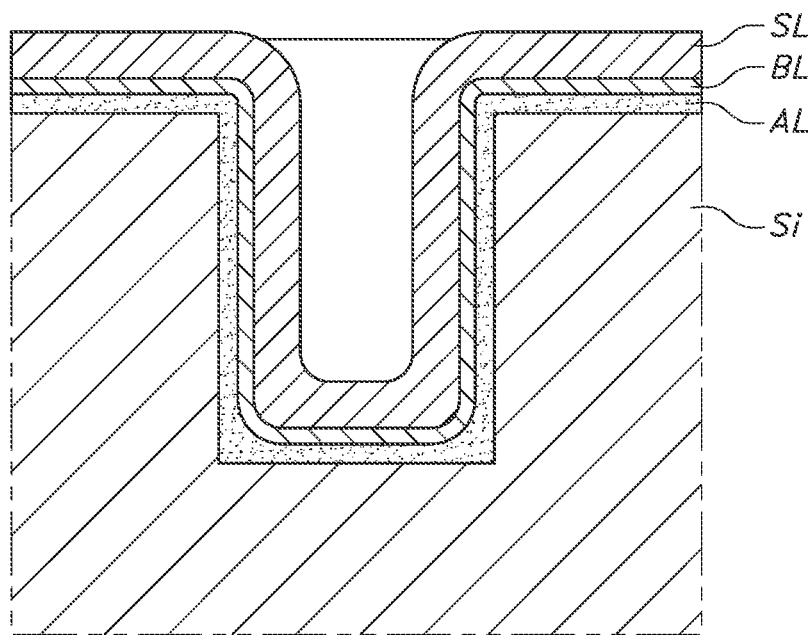

The hollow cathode magnetron 101 from the magnetically and electrically enhanced HEDP sputtering source 100 is mounted inside a vacuum chamber 401 to construct the magnetically and electrically enhanced HEDP sputtering apparatus 400 shown in FIG. 5 (*a*). The vacuum chamber 401 contains feed gas and plasma and is coupled to the ground. The vacuum chamber 401 is positioned in fluid communication with a vacuum pump 402, which can evacuate the feed gas from the vacuum chamber 401. Typical baseline pressure in the vacuum chamber 401 is in a range of $10^{-6}$ to $10^{-9}$ Torr.

A feed gas is introduced into the vacuum chamber 401 through a gas inlet 404 from feed gas sources. A mass flow controller 404 controls gas flow to the vacuum chamber 401. In an embodiment, the vacuum chamber 401 has a plurality of gas inlets and mass flow controllers. The gas flow is in a range of 1 to 100000 SCCM depending on plasma operating conditions, pumping speed of a vacuum pump 403, process conditions, and the like. Typical gas pressure in the vacuum chamber 401 during a sputtering process is in a range of 0.5 to 50 mTorr. In some embodiments, a plurality of gas inlets and a plurality of mass flow controllers sustain a desired gas pressure during the sputtering process. The plurality of gas inlets and a plurality of mass flow controllers may be positioned in the vacuum chamber 401 at different locations. The feed gas can be a noble gas, such as Ar, Ne, Kr, Xe; a reactive gas, such as $N_2$, $O_2$; or any other gas suitable for sputtering or reactive sputtering processes. The feed gas can also be a mixture of noble and reactive gases.

The magnetically enhanced HEDP sputtering apparatus 400 includes a substrate support 408 that holds a substrate 407 or other workpiece for plasma processing. The substrate support 408 is electrically connected to a bias voltage power supply 409. The bias voltage power supply 409 can include a radio frequency (RF) power supply, alternating current (AC) power supply, very high frequency (VHF) power supply, and/or direct current (DC) power supply. The bias power supply 409 can operate in continuous mode or pulsed mode. The bias power supply 409 can be a combination of different power supplies that can provide different frequencies. The negative bias voltage on the substrate is in a range of 0 to −2000 V. In some embodiments, the bias power supply generates a pulse bias with different voltage pulse frequency, amplitude, and shape, as shown in FIG. 4 (b). In some embodiments, the voltage is a pulse voltage. The negative substrate bias voltage can attract positive ions to the substrate. The substrate support 408 can include a heater 414 that is connected to a temperature controller 421. The temperature controller 421 regulates the temperature of the substrate 407. In an embodiment, the temperature controller 420 controls the temperature of the substrate 407 to be in a range of −100 C to (+1000) C.

In some embodiments, the hollow cathode target material is copper, and the substrate is a semiconductor wafer with at least one via or trench. The semiconductor wafer diameter is in the range of 25 to 450 mm. The depth of the via can be between 100 A and 400 μm. The via can have an adhesion layer, barrier layer, and seed layer. Typically, the seed layer is a copper layer. The copper layer can be sputtered with the HEDP magnetron discharge as shown in FIG. 5 (c).

A method of sputtering films, such as hard carbon, includes the following conditions. The feed gas pressure can be in the range of 0.5 to 50 mTorr. The substrate bias can be between 0 V and −120 V. The substrate bias voltage can be continuous or pulsed. The frequency of the pulsed bias can be in the range of 1 Hz and 400 kHz. The substrate bias can be generated by the RF power supply and matching network. The RF frequency can be in the range of 500 kHz and 27 MHz. The RF bias can be continuous or pulsed. In an embodiment, during the deposition, the substrate can have a floating potential or be grounded. The high-power pulsed power supply 120 generates a train of negative unipolar voltage pulses with frequency and amplitude that provide a resonance mode in the second tunable PFN or PCN 124. In this case, second tunable PFN or PCN 124 generates the high voltage asymmetrical AC waveform and, therefore, generates HEDP discharge. The negative AC voltage can be in the range of −1000 to −10000 V. The duration of the high pulse voltage asymmetrical AC waveforms can be in the range of 1 to 20 msec. The substrate temperature during the sputtering process can be in the range of −100 C and +200 C. The hardness of the diamond-like coating formed on the substrate can be in the range of 5 to 70 GPa. The concentration of sp3 bonds in the carbon film can be in the range of 10-80%. In some embodiments, the concentration of sp2 bonds in the carbon film can be in the range of 80 and 100%. In some embodiments, the feed gas is a noble gas such as Ar, He, Ne, and Kr. In some embodiments, the feed gas is a mixture of a noble gas and hydrogen. In some embodiments, the feed gas is a mixture of a noble gas and a gas that contains carbon atoms. In some embodiments, the feed gas is a mixture of a noble gas and oxygen in order to sputter oxygenated carbon films $CO_x$ for non-volatile memory devices or any other devices. The oxygen gas flow can be in the range of 1-10000 sccm. The discharge current density during the sputtering process can be 0.2-20 A/cm². In some embodiments, the amorphous carbon films are sputtered for non-volatile memory semiconductor-based devices, for any other semiconductor-based devices, or for tribological applications to reduce friction between two moving surfaces, such as on piston rings for automotive applications, or medical implants, such as hips, screws, and stents, or cutting objects, such as scalpels, scissors, or hair removal blades.

In some embodiments, the HEDP source with an asymmetric AC discharge can be used to deposit thin-film materials for the manufacturing of phase-change random-access memory (PCRAM) and resistive random-access memory (ReRAM) devices. PCRAM and ReRAM can improve speed, power efficiency, and reliability of storage and retrieval as software and data are retained even when power is absent. In some embodiments, it can be used to form thin film gate wires with extremely low switching losses in picojoules at higher switching frequencies.

In some embodiments, the hollow cathode target material is aluminum. The feed gas can also be a mixture of argon and oxygen, or argon and nitrogen. The feed gases pass through a gas activation source. In some embodiments, feed gasses pass directly to the vacuum chamber. PFN or PCN 124 generates the asymmetrical high voltage AC waveform to provide HEDP magnetron discharge to sputter hard α-$Al_2O_3$ or γ-$Al_2O_3$ coating on the substrate. The substrate temperature during the sputtering process is in the range of 350 to 800 C.

HEDP magnetron discharge can be used for sputter etching the substrate with ions from sputtering target material atoms and gas atoms. A method of sputter etch processing with argon ions and sputtered target material ions uses high negative substrate bias voltage in the range of −900 to −1200 V. The gas pressure can be in the range of 1 to 50 mTorr. The pulse power supply generates a train of negative unipolar voltage pulses with frequency and amplitude that provide resonance mode in the second tunable PFN or PCN 124. In this case, the PFN or PCN 124 generates the high voltage asymmetrical AC voltage waveform that provides HEDP discharge. For example, a sputter etch process can be used to sharpen or form an edge on a substrate for cutting applications, such as surgical tools, knives, inserts for cutting tools, or razor blades for hair removal applications, or for cleaning a substrate by removing impurities to enhance adhesion. HEDP magnetron discharge also can be used for ion implantation of ions from sputtered target material atoms into a substrate. For ion implantation, the negative bias voltage on the substrate can be in the range of −900-15000 V. An ion implantation example includes the doping of a silicon-based device or ion implantation to enhance thin film adhesion to the substrate where the layer is forming.

In some embodiments, the electrically enhanced HEDP magnetron sputtering source can be used for chemically enhanced I-PVD deposition (CE-IPVD) of metal containing or non-metal films. For example, in order to sputter carbon films with different concentrations of sp3 bonds in the film, the cathode target may be made from carbon material. The feed gas can be a noble gas and carbon atoms containing gas, such as $C_2H_2$, $CH_4$, or any other gases. The feed gas can also contain $H_2$. Carbon films on the substrate are formed by carbon atoms from the feed gas and from carbon atoms from the cathode target. The carbon films on the substrate are formed by carbon atoms from the feed gas.

The advanced thin films, such as but not limited to carbon films, sputtered with the electrically enhanced HEDP magnetron sputtering source with noble gas, such as Argon, Neon, Helium and the like, or reactive gas, such as Hydrogen, Nitrogen, Oxygen, and the like can be used for hard mask applications in etch processes, such as 3D NAND; for protectively coating parts, such as bearings, camshafts, gears, fuel injectors, cutting tools, inserts for cutting tools, carbide inserts, drill bits, broaches, reamers, razor blades for surgical applications and hair removal, hard drives, solar panels, optical filters, flat panel displays, thin film batteries, batteries for storage, hydrogen fuel cell, cutleries, jewelry, wrist watch cases and parts, coating metal on plastic parts such as lamps, air vents in cars, aerospace applications, such as turbine blades and jet engine parts, jewelry, plumbing parts, pipes, and tubes; medical implants, such as stents, joints, cell phone, mobile phone, iPhone, iPod, touch screen, hand held computing devices, application specific integration circuits and the like.

The carbon films sputtered with the electrically enhanced HEDP magnetron sputtering source can be used to sputter thin ta-C and $CO_x$ films for carbon-based resistive memory devices or as transistor gate wires.

In some embodiments, the HEDP magnetron discharge with a carbon target is used to grow carbon nanotubes. In some embodiments, these nanotubes are used to build memory devices, cosmetics, transistors and switching device gate wires, and/or power electronics.

Figure 6A:
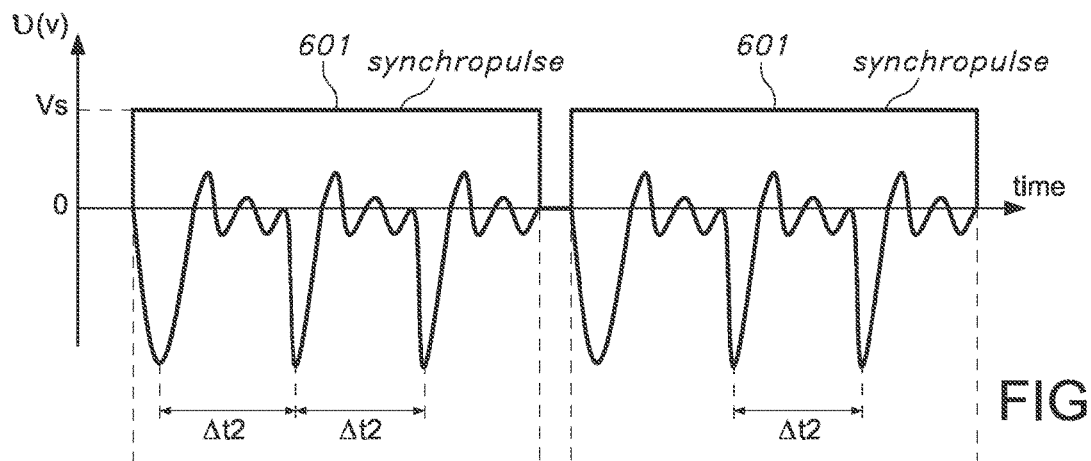
FIG. 6 (*a*) shows a train of resonance asymmetrical AC voltage waveforms.
Figure 6B:
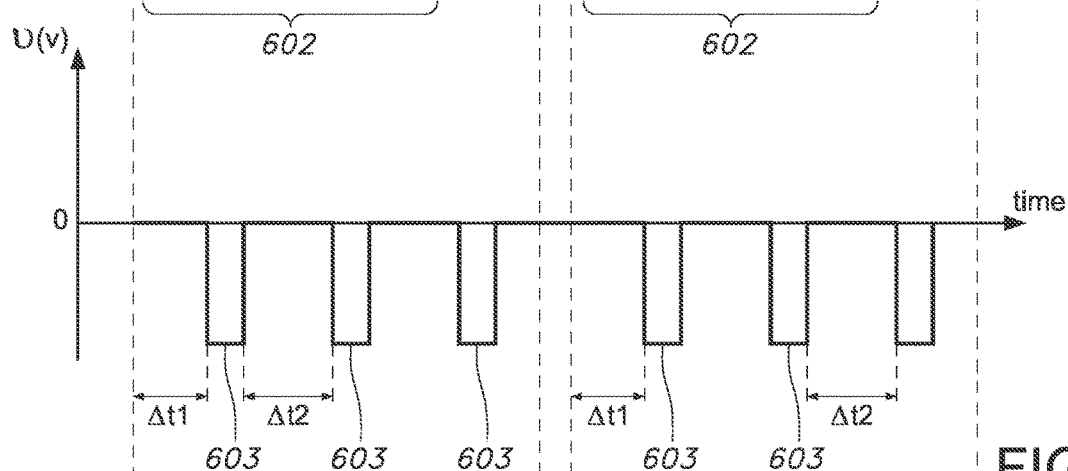
Figure 6C:
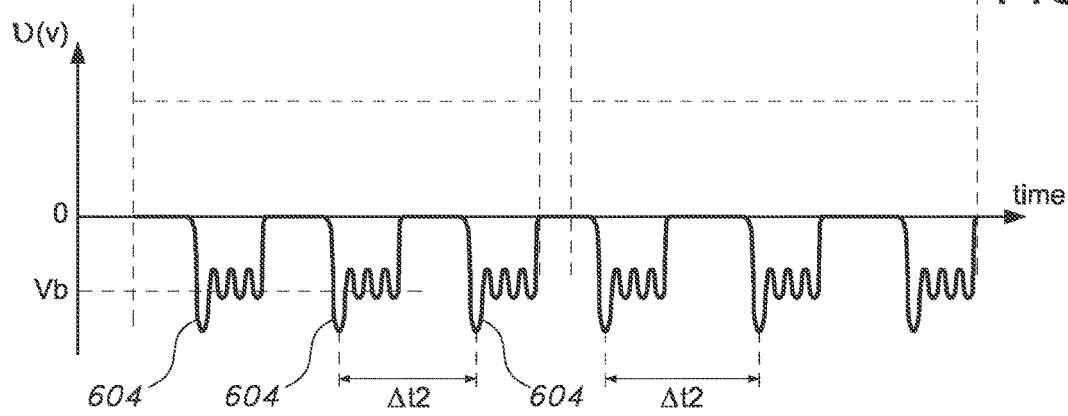

During the HEDP sputtering process, when the high-power pulse asymmetric AC voltage waveform is applied to the magnetically enhanced sputtering source, a pulse bias voltage can be applied to the substrate to control ion bombardment of the growing film. In some embodiments, during the HEDP sputtering process, when the high-power pulse asymmetric AC voltage waveform is applied to the magnetically enhanced sputtering source, a pulse bias voltage can be applied to the substrate to control ion bombardment of the growing film. The amplitude of the negative voltage can be in the range of −10 V and −200 V. Trains of asymmetrical AC voltage waveforms 602 are shown in FIG. 6 (a). Trains of negative voltage DC pulses 603 applied to the substrate are shown in FIG. 6 (b). In order to control time t1 when bias voltage pulse is applied to the substrate, the high-power pulse resonance AC power supply and bias power supply are synchronized. In this case, the controller from the high-power pulse resonance AC power supply sends synchronization pulses that correspond to the trains of asymmetrical AC voltage waveforms to the controller from the bias power supply. The bias power supply controller can set time AO in the range of 0-1000 μs.

In some embodiments, the bias power supply includes an RF power supply. FIG. 6 (c) shows a train of RF pulses 604 generated by the RF bias power supply.

The method of generating resonance AC voltage waveforms for the magnetically enhanced sputtering source can also be used to generate resonance AC waveforms for the cathodic arc evaporation sources that have widespread applications in the coating industry. Resonance AC voltage wave waveforms, when connected with a magnetically enhanced sputtering source, generate volume discharge. Resonance AC voltage waveforms, when connected with an arc evaporation source, generate point arc discharge. DC power supplies generate and sustain continuous arc discharge on an arc evaporation source with a carbon target. The arc current can be in the range of 40-100 A. The arc discharge voltage can be in the range of 20-120 V. A regulated voltage with a variable power source feeds the high-power pulse programmable power supply. Specifically, the high-power pulse asymmetric AC voltage waveform is generated by having the regulated voltage source with variable power feeding a regulated voltage to the high-power pulse supply with programmable pulse voltage duration and pulse voltage frequency producing at its output a train of regulated amplitude unipolar negative voltage DC pulses with programmed pulse frequency and duration, and supplying these pulses to a second tunable pulse forming network (PFN) or pulse converting network (PCN) including a plurality of specialized inductors and capacitors designed for pulse applications connected in a specific configuration coupled to an arc evaporation source. The resonance occurs in the PFN or PCN and in the already existing arc discharge generated by the DC power supply. By adjusting the pulse voltage amplitude, duration, and frequency of the unipolar negative voltage DC pulses and tuning the values of the inductors and capacitors in the second PFN or PCN coupled to an arc evaporation source, a resonance pulsed asymmetric AC arc discharge can be achieved.

Another method of producing a resonance pulsed asymmetric AC arc discharge is to have fixed unipolar pulse power supply parameters (amplitude, frequency, and duration) feeding a pulse forming network, in which the numerical values of the inductors and capacitors, as well as their configurations, are tuned to achieve the desired resonance values on the arc evaporation source to form a layer on the substrate. The tuning of the second PFN or PCN can be performed manually with test equipment, such as an oscilloscope, voltmeter, and current meter or other analytical equipment; or electronically with a built-in software algorithm, variable inductors, variable capacitors, and data acquisition circuitry. The negative voltage from the pulse asymmetric AC voltage waveform generates high-density plasma from the evaporated target material atoms between the cathode target and the anode of the arc evaporation source. The positive voltage from the pulse asymmetrical AC voltage waveform attracts plasma electrons to the cathode area and generates positive plasma potential. The positive plasma potential accelerates evaporated target material ions from the cathode target area towards the substrate that improves deposition rate and ion bombardment on the substrate. The reverse electron current can be up to 50% from the discharge current during the negative voltage. In some embodiments, the arc evaporation source may have one of a rotatable magnetic field, movable magnetic field, or stationary magnetic field. The second tunable PFN or PCN includes a plurality of capacitors and inductors. The resonance mode associated with the second tunable PFN or PCN is a function of the input unipolar voltage pulse amplitude, duration, and frequency generated by the high-power pulse power supply; inductance, resistance, and capacitance of the arc evaporation source, or any other magnetically enhanced arc evaporation source; the inductance, capacitance, and resistance of the cables between the second tunable PFN or PCN and arc evaporation source; and a plasma impedance of the arc evaporation source itself as well as the evaporated material. In the resonance mode, the output negative voltage amplitude of the high-power pulse voltage mode asymmetrical AC waveform on the arc evaporation source exceeds the negative voltage amplitude of the input unipolar voltage pulses into the second tunable PFN or PCN by 1.1-5 times. The unipolar negative high-power voltage output can be in the range of 400V-5000V. In the resonance mode, the absolute value of the negative voltage amplitude of the asymmetrical AC waveform can be in the range of 750-5000 V. In the resonance mode, the output positive voltage amplitude of the asymmetrical AC waveform can be in the range of 100-2500 V.

Figure 13:
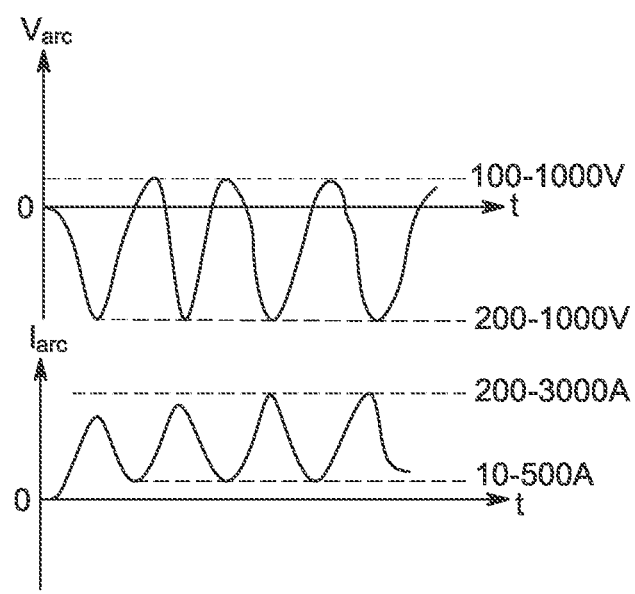
FIG. 13 shows arc resonance AC discharge current and arc resonance AC discharge voltage waveforms.

In the resonance mode, the negative voltage amplitude of the output AC waveform can reach a maximum absolute value at which point a further increase of the input voltage to the second tunable PFN or PCN will not result in a voltage amplitude increase, but rather an increase in the duration of the negative pulse in the asymmetric AC waveform. In some embodiments, in the resonance mode, the negative voltage amplitude of the output AC waveform can reach a maximum absolute value, at which point a further increase of the input voltage to the second tunable PFN or PCN will result in a positive voltage amplitude increase. In some embodiments, the frequency of the unipolar voltage pulses is in the range of 1 kHz and 10 kHz. In some embodiments, the duration of the unipolar voltage pulses is in the range of 3-20 μs. In some embodiments, the duration of the unipolar voltage pulses is in the range of 0.01-2.9 μs. In some embodiments, the duration of the unipolar voltage pulses is in the range of 20-2000 μs. Asymmetrical AC voltage waveforms significantly influence the size of the cathode arc spot and velocity. In some embodiments, the generation of the resonance AC voltage waveforms reduces the formation of macro-particles from the evaporated cathode target material. The arc discharge current during the negative portion of the AC voltage can be in the range of 200-3000 A. The arc discharge current during the positive portion of the AC voltage has a lower value and can be in the range of 10-500 A. The arc AC discharge current and arc discharge AC voltage waveforms are shown in FIG. 13.

Figure 1E:
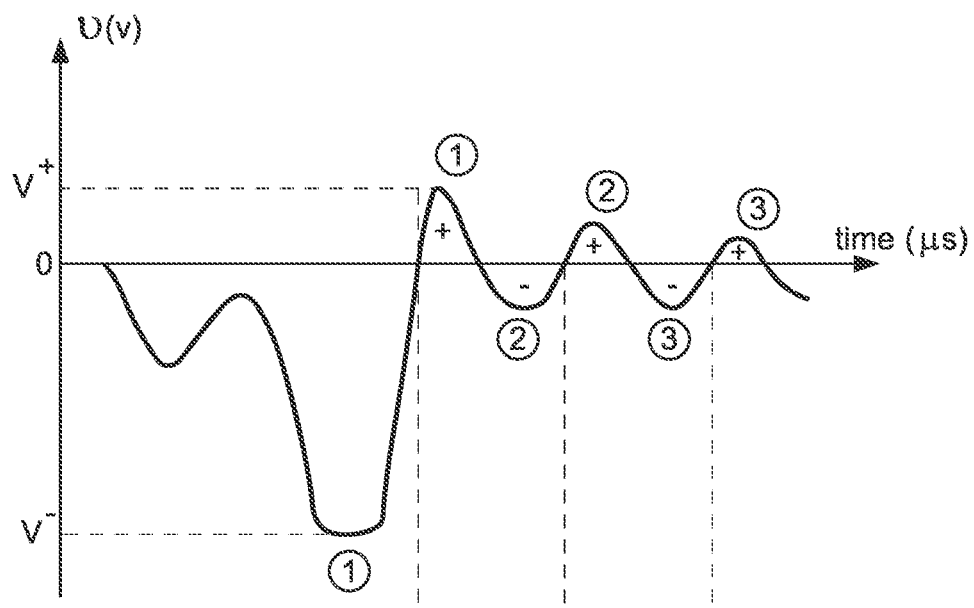
FIG. 1 (*a*) shows an illustrative view of a train of output negative unipolar voltage pulses with amplitude V1 and frequency f1 from a high-power pulse supply with programmable pulse voltage duration and pulse voltage frequency.
Figure 1F:
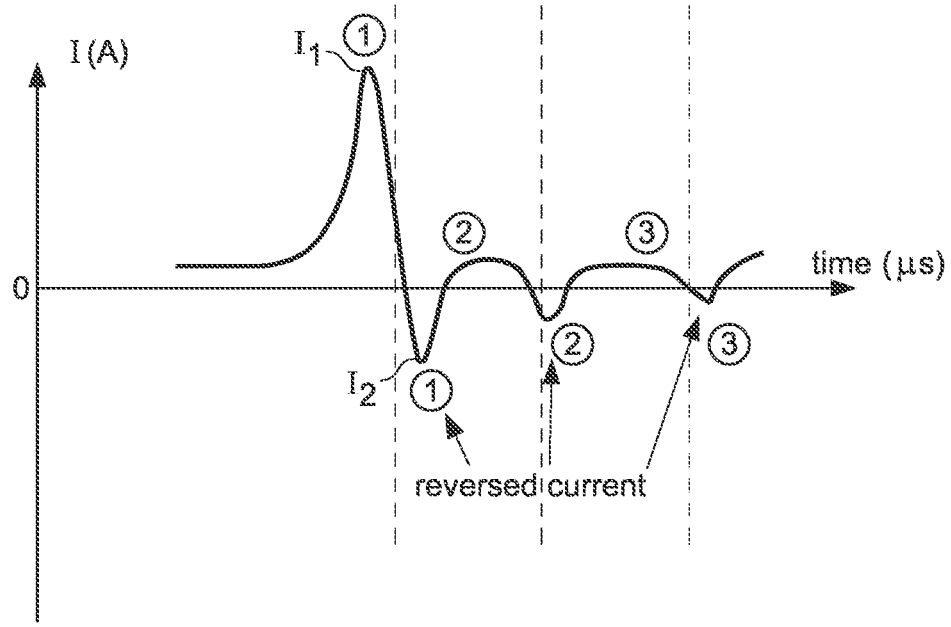
Figure 1G:
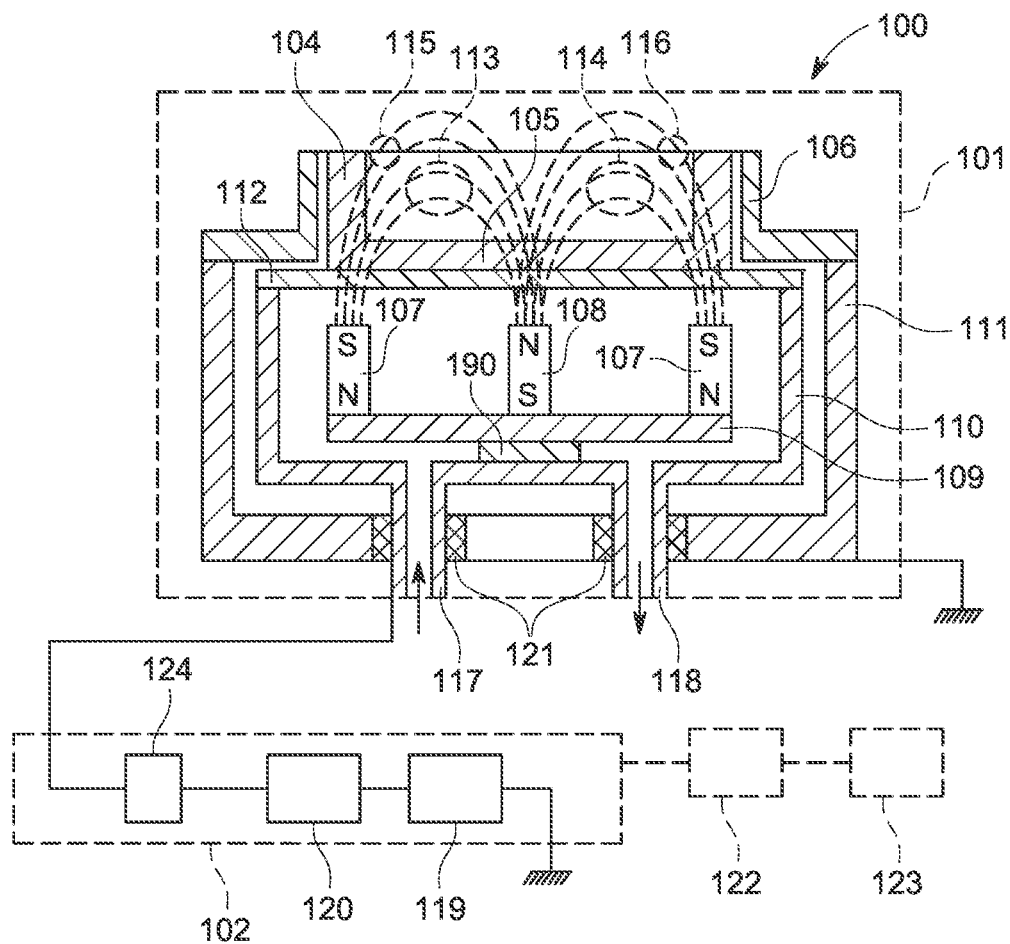
Figure 1H:
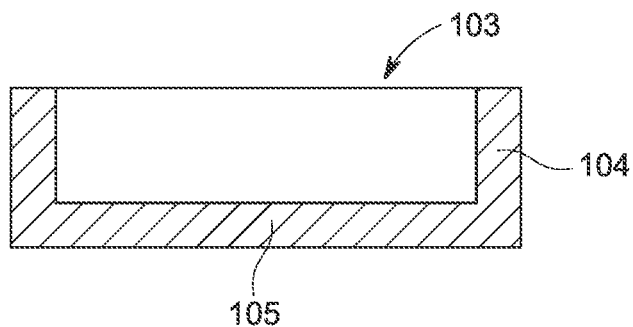
Figure 2A:
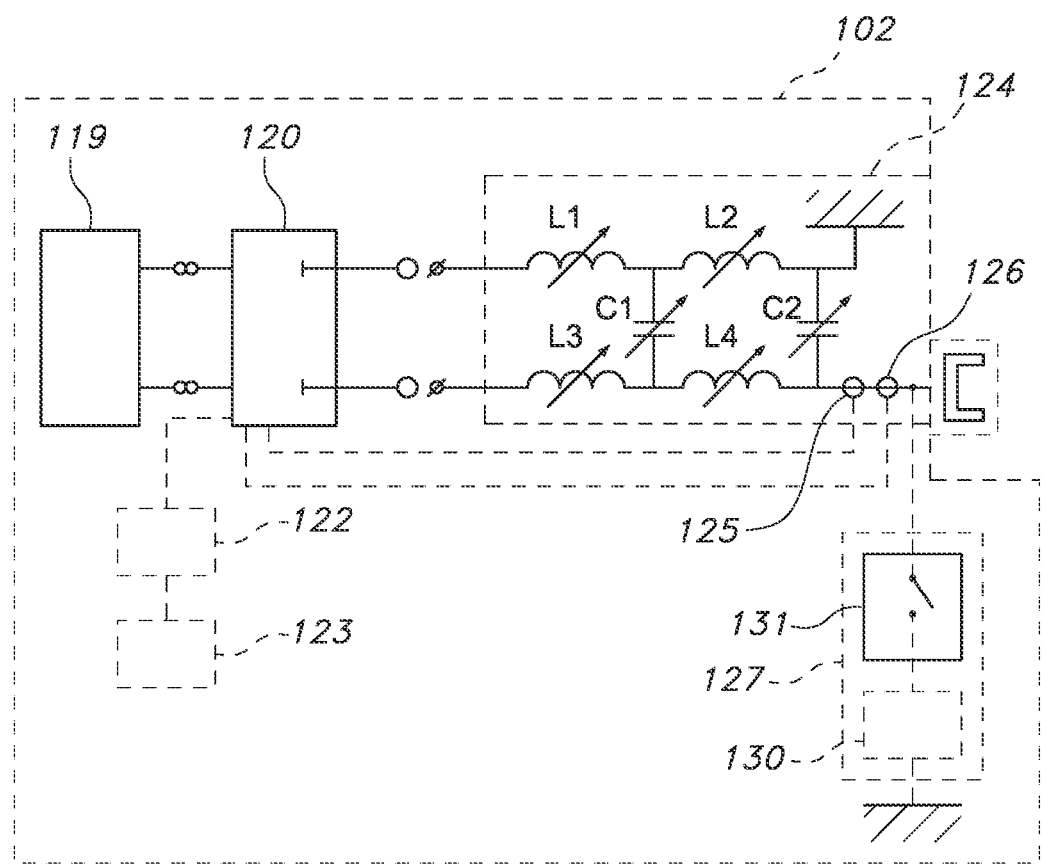
FIG. 2 (*a*) shows an illustrative circuit diagram of the high-power pulse supply connect to a second PFN or PCN to form a resonance AC power supply connected to an HEDP source.
Figure 2B:
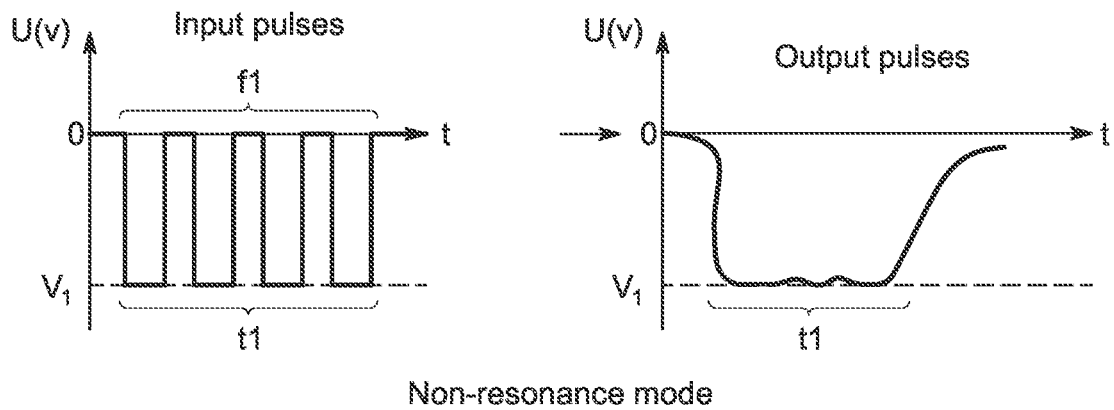
Figure 2C:
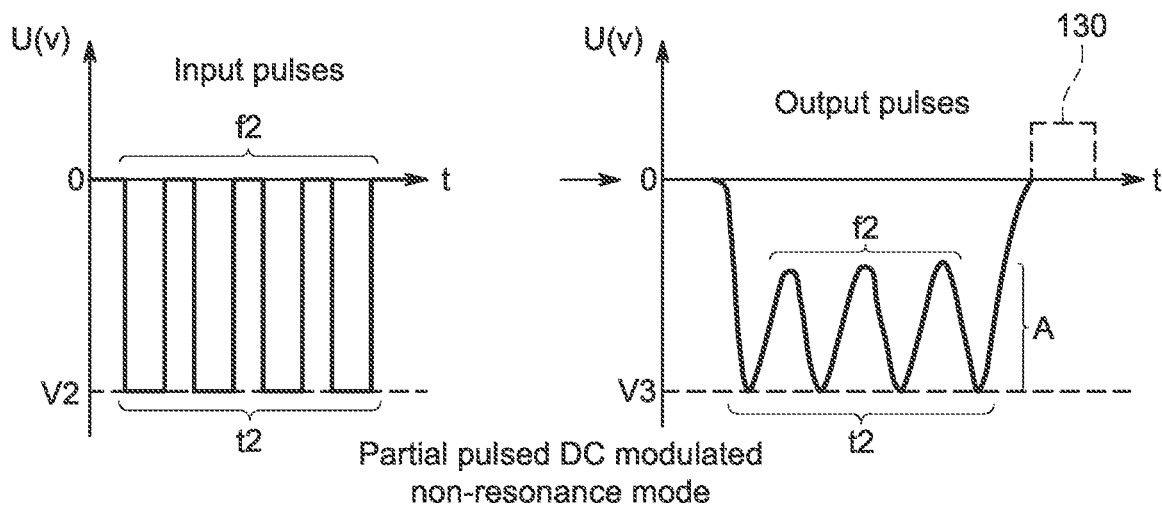
Figure 2D:
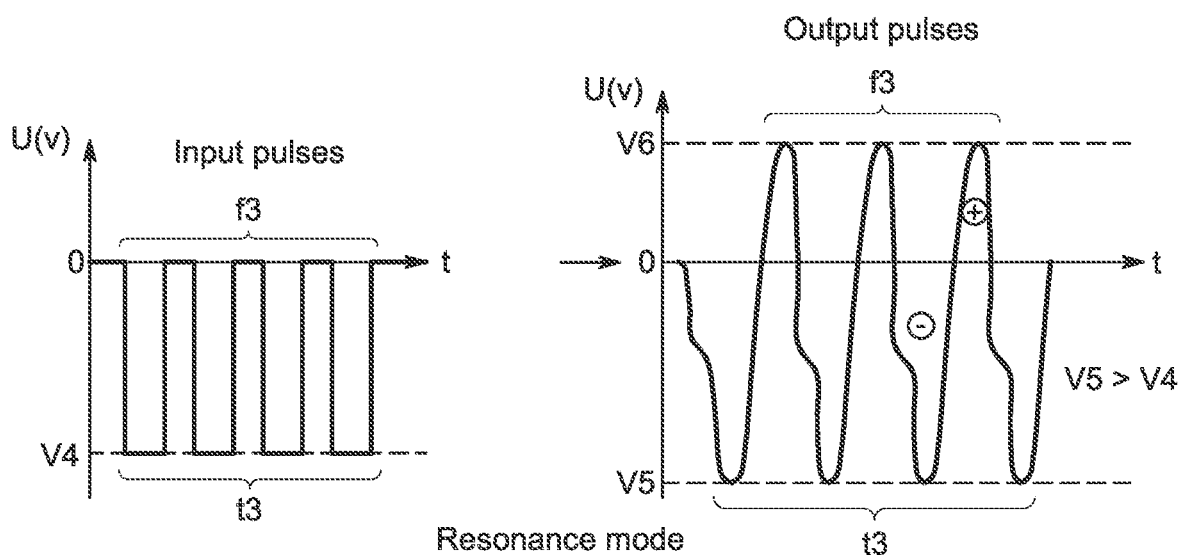
Figure 2E:
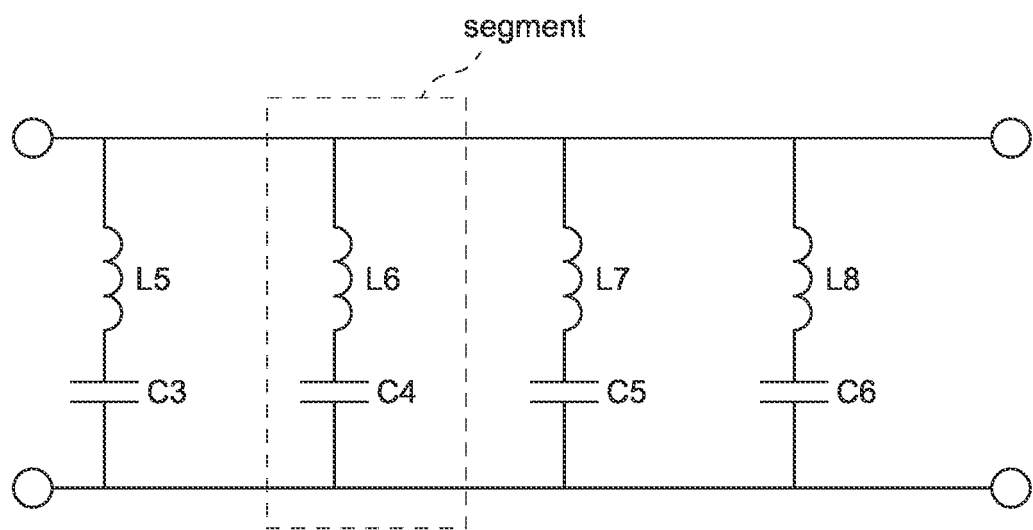
Figure 2F:
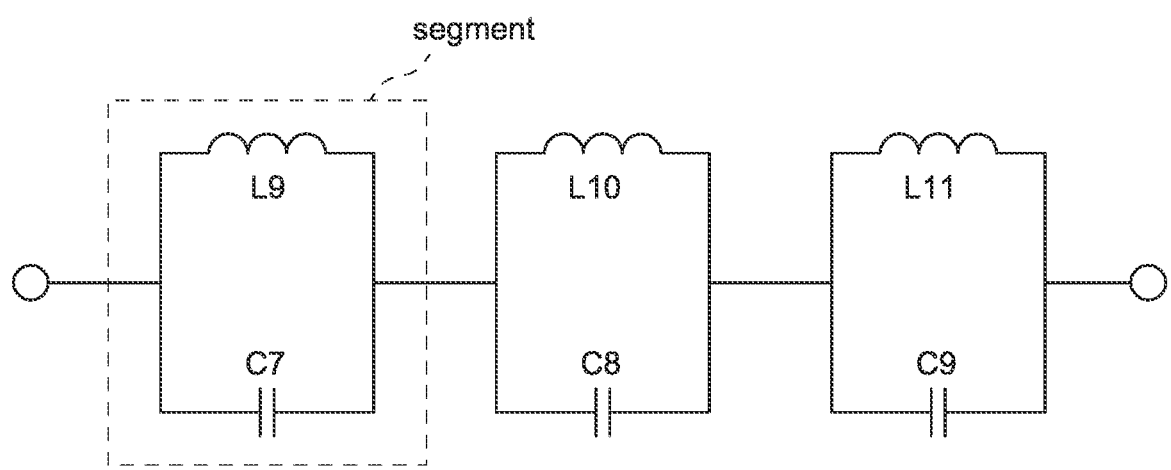

In an embodiment, a high-power pulse resonance AC power supply 700, as compared with the high-power pulse resonance AC power supply 102 shown in FIG. 1(g), includes a high-frequency high-power pulsed power supply 701 with a programmable voltage pulse frequency and amplitude as shown in FIG. 8 (a). The high frequency high-power pulsed power supply 701 generates pulse negative, unipolar oscillatory voltage waveforms with a frequency in the range of 100 KHz to 5 MHz and a duration t1 in a range of 0.05 μs to 200 μs. The absolute value of the voltage of these waveforms is in a range of 500 V to 5000 V. The frequency of these pulses with negative unipolar voltage waveforms is in a range of 5 Hz to 200 KHz.

Pulse negative unipolar oscillatory voltage waveforms 800 are shown in FIG. 8 (c). The second tunable PFN or PCN 124, which is in resonance mode for these pulses, generates a high-power resonance asymmetrical AC waveform. The resonance mode can be achieved by adjusting the values of inductors L1, L2, L3, and L4, and by adjusting the values of capacitors C1 and C2 for a particular shape of the pulse negative unipolar oscillatory voltage waveforms, their frequency, type of process gas, target material, and magnetic field strength of the hollow cathode sputtering source 702. The resonance mode is defined as the prevailing conditions when the adjustment of the frequency and amplitude of the plurality of negative unipolar oscillatory voltage waveforms 800 generate the plurality of asymmetrical AC voltage waveforms 801 with positive V+ and negative V− voltages shown in FIGS. 8 (c, d). Further increase of the oscillatory voltage waveform amplitude causes an increase in the value of the positive portion of the AC voltage waveform. By adjusting time t1, r t2, or both t1 and t2, double negative peak asymmetrical AC voltage waveforms 802 can be achieved as shown in FIG. 8 (d). FIG. 8 (b) shows a partial modulated pulsed dc non-resonance pulse discharge.

Figure 9A:
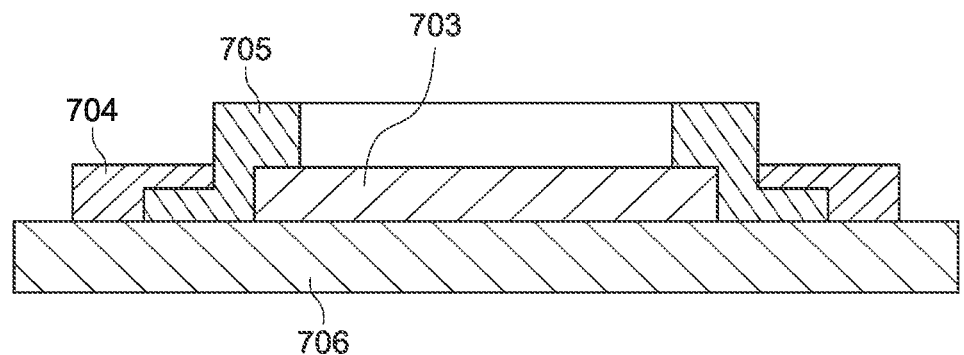
FIGS. 9 (*a, b*) show a hollow cathode target combined from two pieces.
Figure 9B:
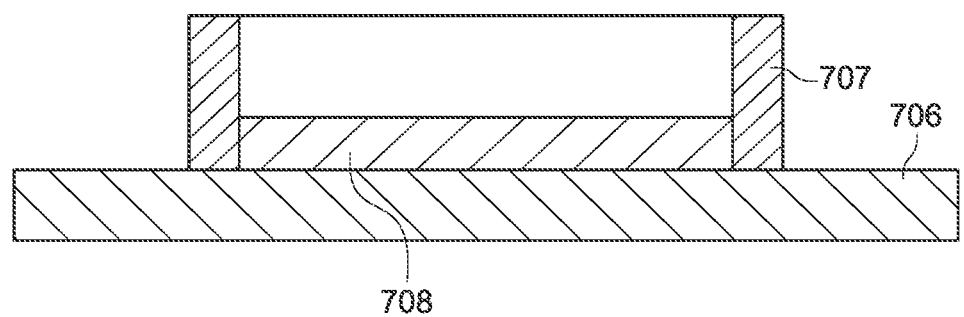

In an embodiment, a magnetically and electrically enhanced HEDP sputtering source 100 shown in FIG. 1(g) has a hollow cathode target 103 that includes two parts as shown in FIG. 9 (a) and FIG. 9 (b). FIG. 9 (a) shows the hollow cathode target 103 that includes pieces 703 and 705. These two pieces are attached to a copper backing plate by a clamp 704. FIG. 9 (b) shows the hollow cathode target that includes pieces 707 and 708. These two pieces are bonded to a copper backing plate 706. The magnetically and electrically enhanced HEDP sputtering source can have a diameter in the range of 1 cm to 100 cm. The peak power density can be in the range of 100 W/cm$^2$ to 20 kW/cm$^2$. The average power density can be in the range of 50 W/cm$^2$ to 150 W/cm$^2$.

Figure 10A:
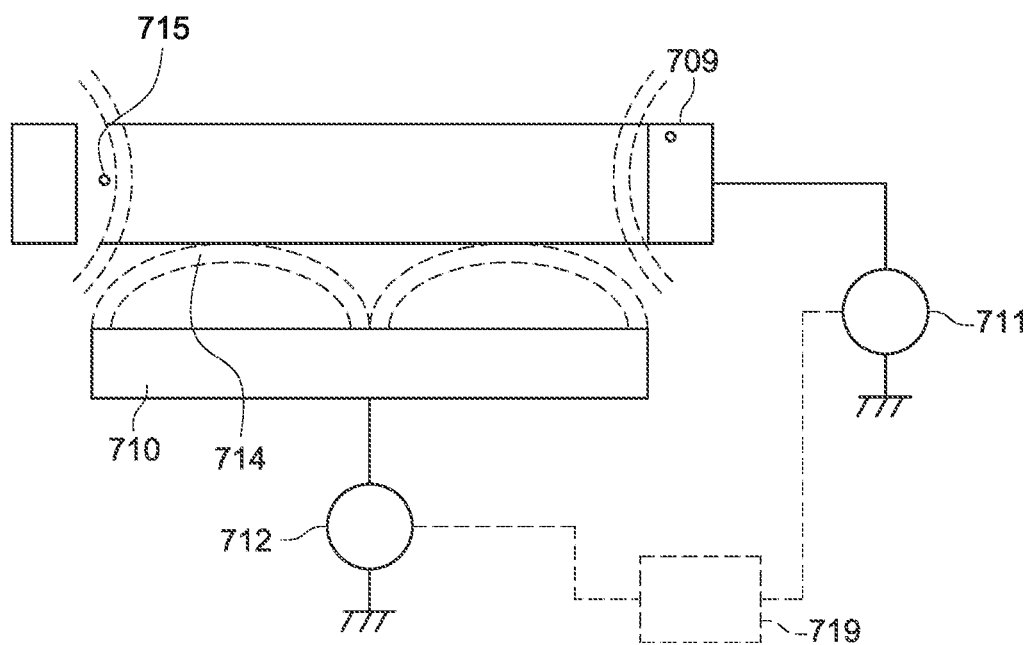
FIG. 10 (*a*) shows a hollow cathode target combined from two pieces and connected to two different power supplies.
Figure 10B:
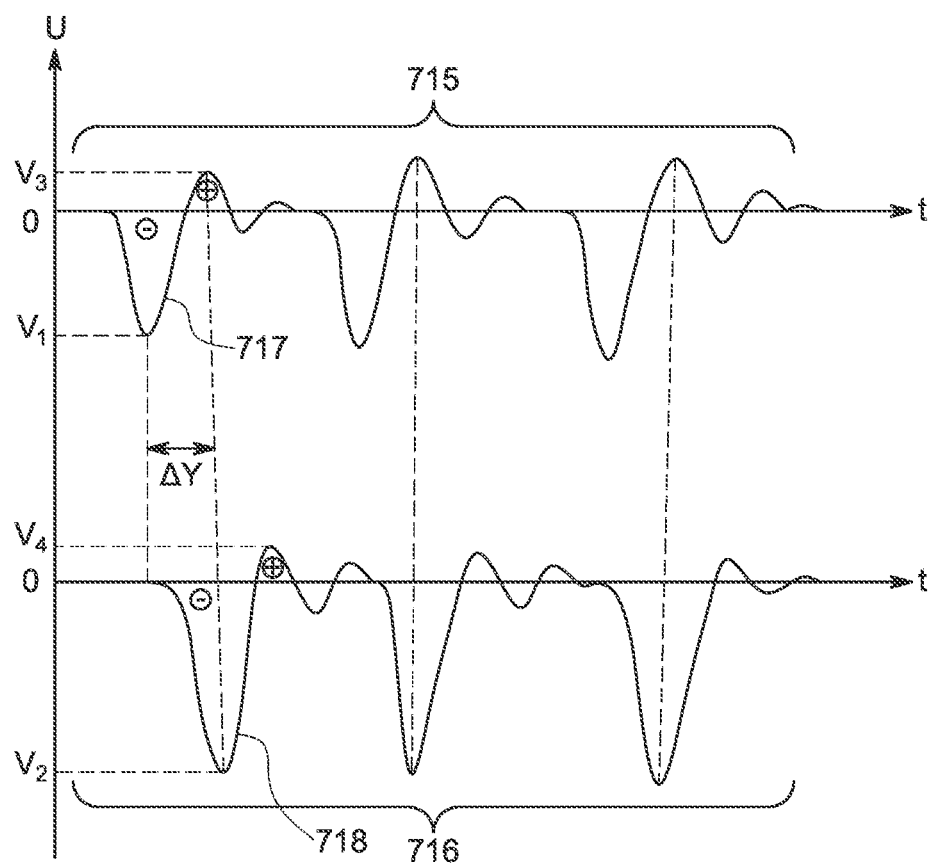

In an embodiment, the hollow cathode target 103 includes two pieces 710 and 709 as shown in FIG. 10 (a). The piece 709 has magnetic field lines 715 and the piece 710 has magnetic field lines 714. Each of these pieces is connected to different high-power pulse resonance AC power supplies 711 and 712. The block diagram of these high-power pulse resonance AC power supplies is shown in FIG. 8 (a). The high-power pulse resonance AC power supplies 711 and 712 generate AC voltage waveforms 715 and 716 shown in FIGS. 10 (a) and 10 (b). A time shift between negative voltage peaks 717 and 718 is controlled by controller 719. In an embodiment, the power supply 711 sends a synchro pulse to power supply 712 to initiate the start of power supply 712. In an embodiment, the power supply 712 sends a synchro pulse to power supply 711 to initiate the start of power supply 711.

In an embodiment, a magnetically enhanced HEDP sputtering source that is shown in FIG. 1 (g) includes an additional magnetic assembly positioned adjacent to the side walls 104 as shown in FIG. 1 (h). The magnetic assembly may have permanent magnets, electromagnets, or a combination of permanent magnets and electromagnetics.

The method of generating resonance AC voltage waveforms for the magnetically enhanced sputtering source and high-power pulse resonance AC power supply 700 can also be used to generate resonance AC waveforms for cathodic arc evaporation sources. High-power pulse resonance AC power supply 700 can be used for all applications in which the high-power pulse resonance AC power supply 102 can be used.

Figure 11:
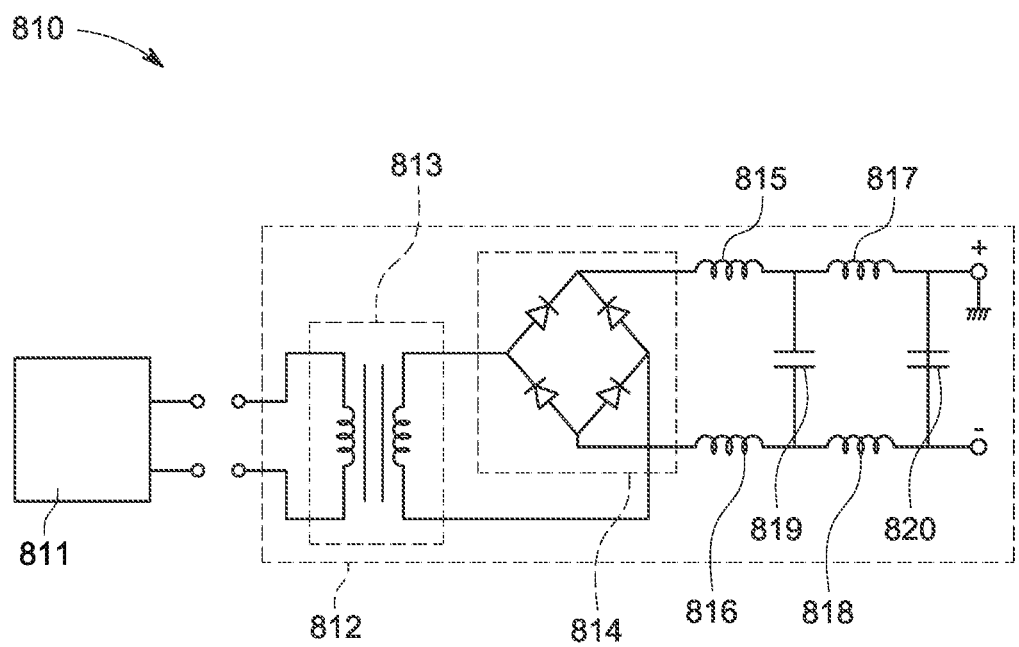
FIG. 11 shows an illustrative circuit diagram of the high-power resonance pulse forming network (PFN) or PCN including a transformer and diodes.
Figure 12A:
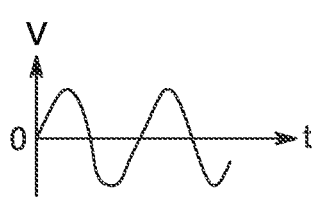
FIGS. 12 (*a*)-(*g*) show different AC voltage waveforms.
Figure 12B:
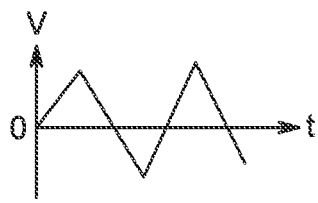
Figure 12C:
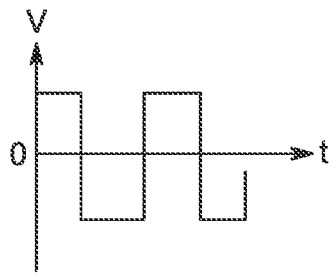
Figure 12D:
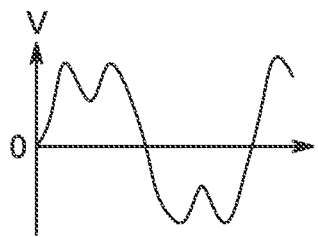
Figure 12E:
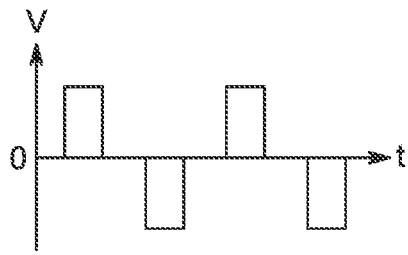
Figure 12F:
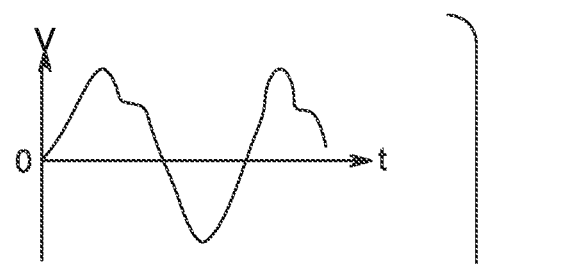
Figure 12G:
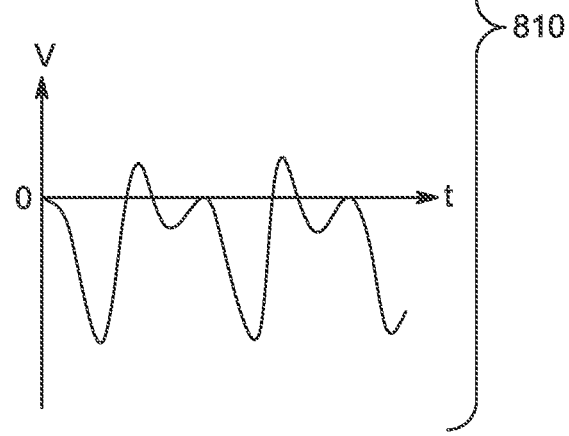

In an embodiment, a high-power pulse resonance AC power supply 810 includes an AC power supply 811 and PFN 812 as shown in FIG. 11. High-power AC power supply 811 can generate different AC voltage waveforms at the output as shown in FIGS. 12 (a, b, c, d, e, f). The frequency of these voltage waveforms can be in the range of 3 KHz to 100 KHz. The peak voltage amplitude can be in the range of 100 V to 1000 V. The PFN includes a step-up transformer 813, a diode bridge 814, a plurality of inductors 815, 816, 817, 818 and a plurality of capacitors 819 and 820. This PFN converts AC voltage waveforms to an asymmetrical complex AC voltage waveform during the resonance mode as shown in FIG. 11. AC voltage waveforms and frequencies that correspond to this particular AC voltage waveform are associated with specific values of inductors (815, 816, 817 and 818) and capacitors (819, 820) in order to generate the resonance mode and form, at the output, the asymmetrical AC voltage waveform. In an embodiment, the PFN does not have a diode bridge.

In an embodiment, the high-power pulse resonance AC power supply can be connected to the HEDP magnetron sputtering source and RF power supply simultaneously. The frequency of the RF power supply can be in the range of 500 kHz to 30 MHz. The RF power supply can operate in continuous mode or pulsed mode. In an embodiment, the RF power supply turns on before the high-power pulse resonance AC power supply turns on in order to provide stable plasma ignition for plasma that will be generated with the high-power pulse resonance AC power supply. The RF power supply can be turned off after the high-density plasma is generated. In an embodiment, the RF power supply operates in continuous mode together with the high-power pulse resonance AC power supply. This operation reduces parasitic arcs during the reactive sputtering process. This operation is beneficial for sputtering ceramic target materials and target materials with low electrical conductivity, such as those containing B, Si, and the like.

Figure 14A:
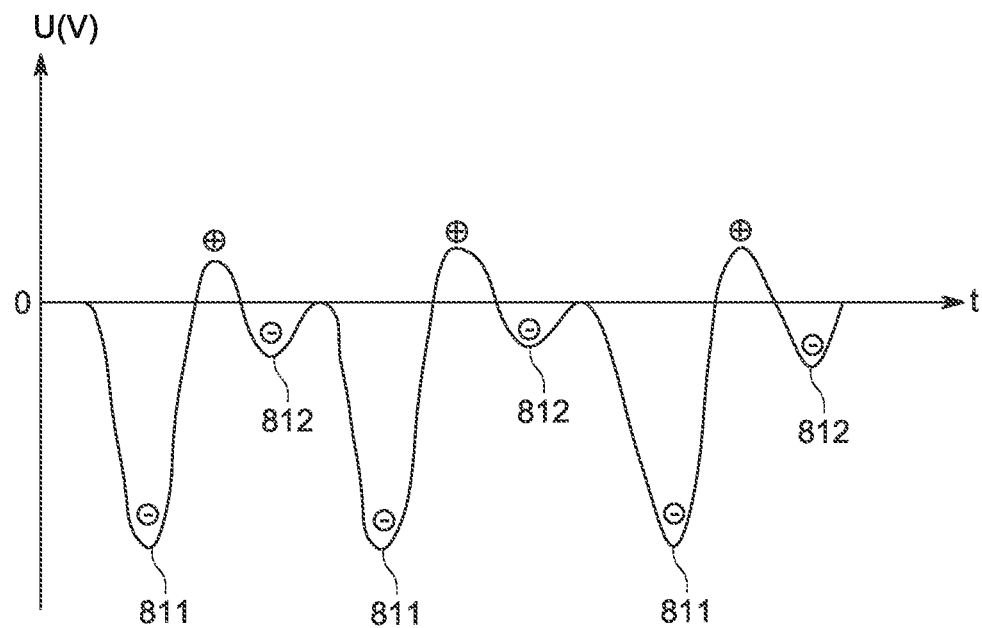
FIGS. 14 (*a, b*) show output voltage waveforms from the high-power resonance pulse forming network (PFN) when connected to the HEDP magnetron and generating HEDP discharge.
Figure 14B:
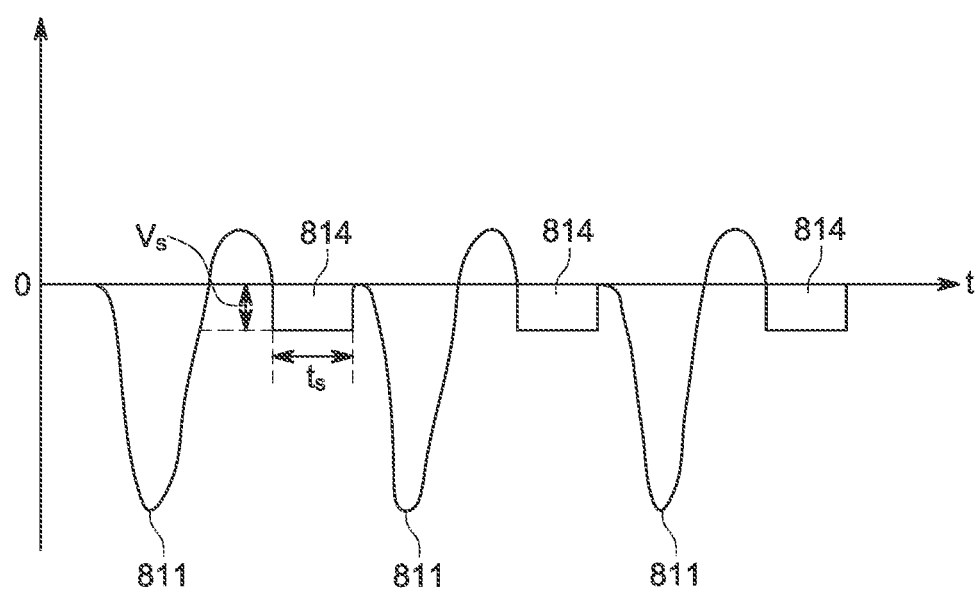

The output voltage waveforms from the high-power pulse resonance AC power supply are shown in FIG. 14 (a, b). The second negative peak 812 can be generated by controlling parameters of the PFN, such as inductors, capacitors and the transformer (if applicable) as shown in FIG. 14 (a). The peak 812 has a significant influence on the probability of generating arcs during reactive sputtering. The plasma that is generated during this peak helps to ignite high-density plasma during the first negative peak 811. The second peak 812 may be triangular, sinusoidal or rectangular in shape. The rectangular shape of the second negative peak 814 is shown in FIG. 14 (b). The value and duration of the peak 812 helps to control the energy of ions coming to the substrate. The duration $t_s$ can be in the range of 2 μs to 50 μs. The amplitude $V_s$ can be in the range of 200 V to 1000 V. The greater the amplitude and/or duration of the second peak is, the less the ion energy will be. This arrangement is of particular importance for sputtering ta-C films when high ion energy can affect the structure of the growing film.

A high-power pulse resonance AC power source 500 is shown in FIG. 15 (a), and includes a HIPMIS power supply 540, which includes a regulated voltage source with variable power feeding 511, a high-power pulsed power supply 512 with built-in PFN 502 and programmable voltage pulse frequency and amplitude, and a second tunable PFN or pulse converter network (PCN) 510. The high-power pulsed power supply with programmable voltage pulse frequency and amplitude 540 includes a computer 509 and controller 508. The regulated voltage source with variable power feeding 511 supplies voltage in the range of 400-5000 V to the high-power pulsed power supply 512 with built-in PFN 502 with programmable voltage pulse frequency and amplitude. The high-power pulsed power supply with programmable voltage pulse frequency and amplitude 540 generates and provides a train of unipolar negative voltage DC pulses to the tunable PCN 510. The amplitude of the unipolar negative voltage DC pulses is in the range of 400 to 5000 V, and the duration of each of the voltage pulses is in the range of 1 to 100 μs. The distance between voltages pulses is in the range of 0.4 to 1000 μs, thus controlling the frequency to be between 0.1 to 400 kHz. In some embodiments, there is a step-up or a step-down transformer (not shown) between the high-power pulsed power supply 512 with the built in PFN 502 with programmable voltage pulse frequency and amplitude and the tunable PCN 510 to achieve a desired pulsed resonance AC asymmetric discharge on an HEDP source 100. The tunable PCN 510 includes a plurality of specialized variable inductors L1-Ln and a plurality of specialized variable capacitors C1-Cn 503 for high-power pulse applications. The value of these inductors and capacitors 503 can be controlled by a central processing unit (CPU) 507. In some embodiments, at least one inductor and/or at least one capacitor 503 is variable, and their values are computer controlled. The values of inductors L1-Ln are in the range of about 0 to 1000 μH each. Capacitors C1-Cn have values in the range of 0 to 1000 μF each. The high-power pulse programmable power supply 540 is connected to controller 508 and/or computer 509. Controller 508 and/or computer 509 control output values and timing of the power supply 540. The power supply 540 can also operate as a standalone unit without connection to the controller 508 and/or computer 509.

The high energy density plasma (HEDP) magnetically enhanced sputtering source 100, which generates a pulse resonance asymmetric AC plasma discharge 545, is also shown in FIG. 15 (a) and includes output current and voltage monitors 542, 543, respectively. The current and voltage monitors 542, 543 are connected to an arc suppression circuit 127. If the current monitor 542 detects a high current and the voltage monitor 543 detects a low voltage, the arc suppression circuit 127 is activated. It is to be noted that the voltage monitor 543 is connected to an output of the tunable PCN 510. The arc suppression circuit 127 provides a signal to stop generating incoming voltage pulses from the power supply 540 to the tunable PCN 510, and connects the output of the tunable PCN 510 through switch 131 to ground or to a positive electrical potential generated by a power supply 130 to eliminate arcing as shown in FIG. 15 (a). The hollow cathode is shown as a C-shaped structure 514 coupled to the output of the tunable PCN 510.

In FIGS. 15 (b),(c), the unipolar negative pulsed DC output from power supply 540 is programmed to produce a plurality of pulses with two different voltage levels V7, V8, and defined pulse width and frequency in two defined timed pulse bursts B1, B2 that are fed to the tunable PCN 510 causing a pulsed resonance AC asymmetric discharge on the HEDP source 100. In resonance, V7<V9, V8<V10, and the value of the resonance positive voltage on the output of the tunable PCN 510 is directly correlated to the pulsed resonance current during the negative cycle.

In FIGS. 15 (d),(e), the unipolar negative pulsed DC output from power supply 540 is programmed to produce a plurality of pulses with controlled voltage rise-time and fall-time with two different voltage levels V7, V8 and defined pulse width and frequency in two defined timed pulse bursts B3, B4 feeding the tunable PCN 510 and causing a pulsed resonance AC asymmetric discharge on the HEDP source 100. In resonance, V7<V9, V8<V10, and the value of the resonance positive voltage on the output of the tunable PCN 510 is directly correlated to the pulsed resonance current during the negative cycle.

In FIG. 15 (f), the unipolar negative pulsed DC output from power supply 540 is programmed to produce a plurality of pulses with voltage level Vim and defined pulse width and frequency in defined timed pulse bursts B5 feeding the tunable PCN 510, and causing a non-resonance discharge on the HEDP source 100. In this case, the voltage input to the tunable PFN 510 V1 is equal to voltage output $V1_{out}$.

Figure 15A:
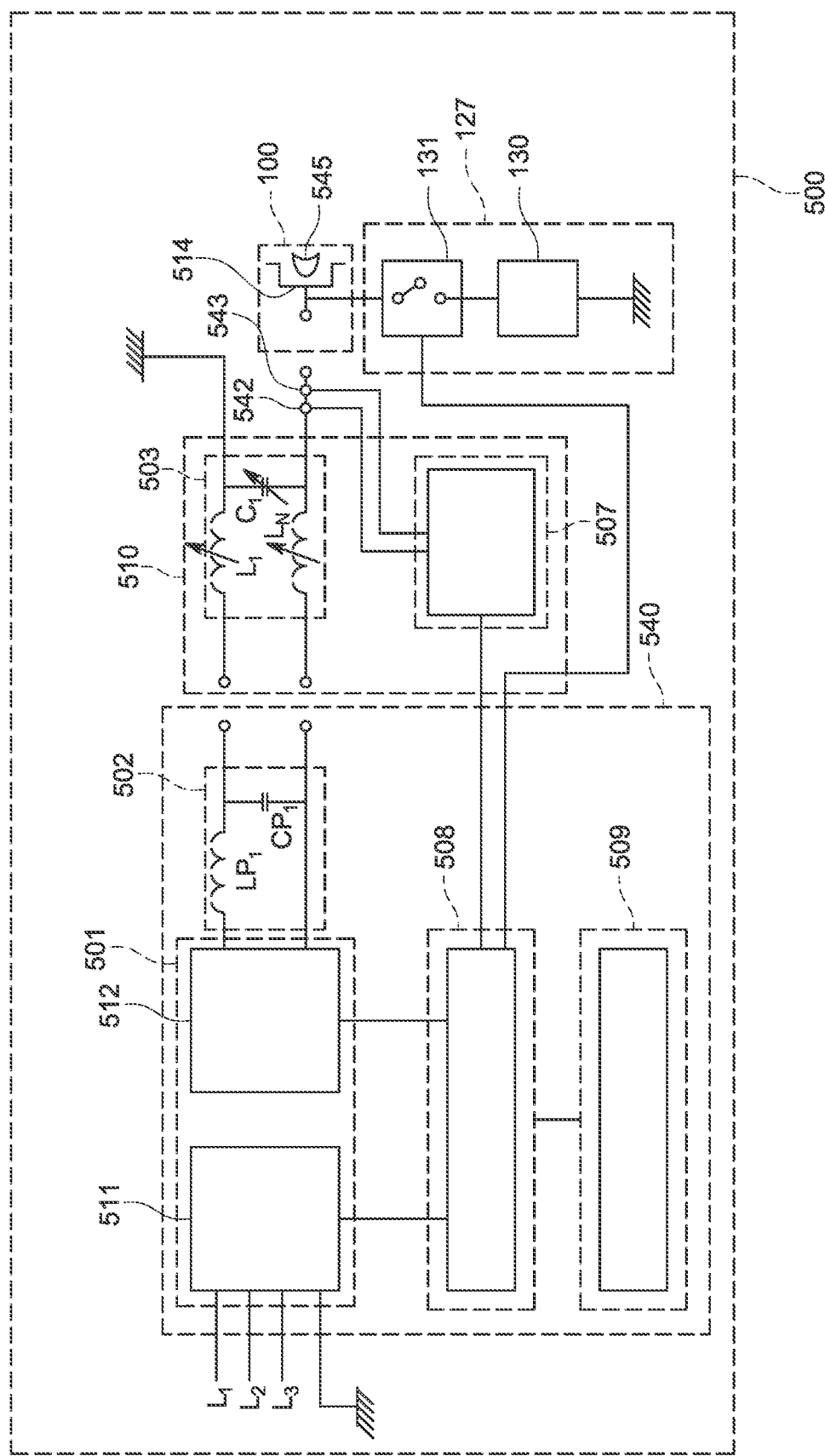
FIG. 15 (*a*) shows an illustrative circuit diagram of the high-power pulse generator with built-in PFN connected to a second tunable PFN or pulse converter network (PCN), which is connected to an HEDP magnetron source producing a pulsed resonance AC discharge to form a thin film layer on a substrate.
Figure 15B:
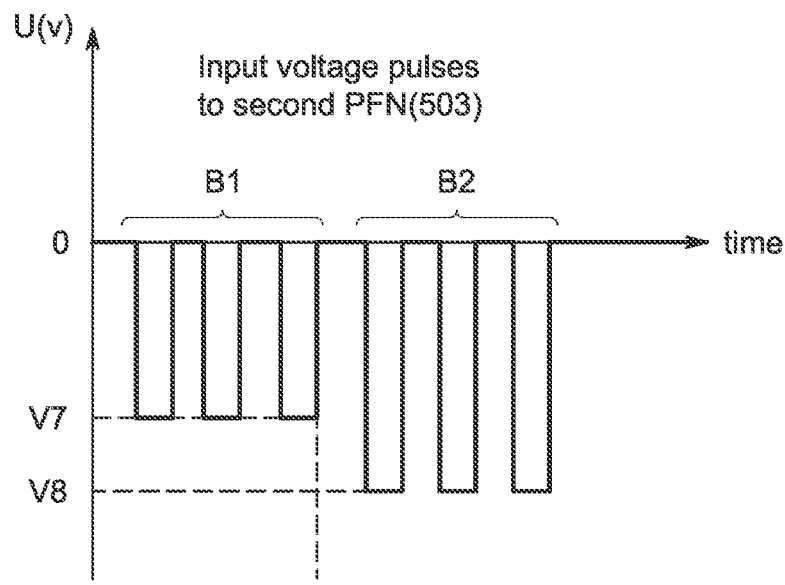
Figure 15C:
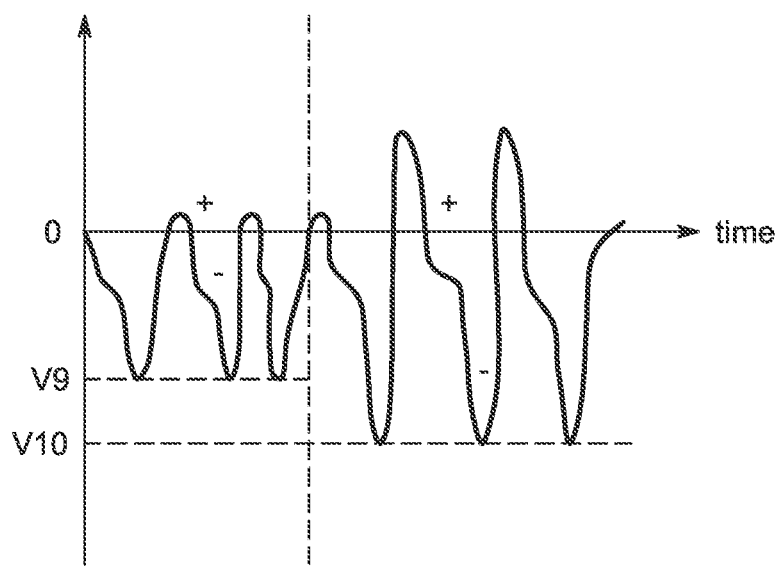
Figure 15D:
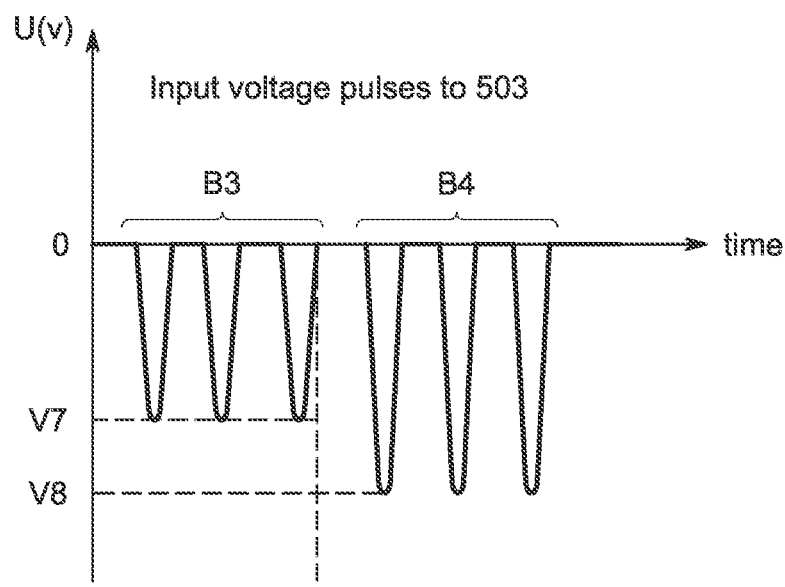
Figure 15E:
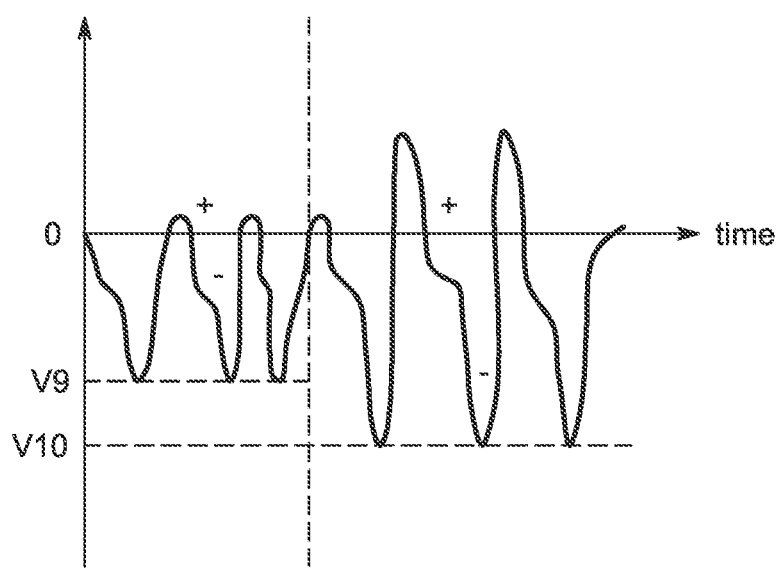
Figure 15F:
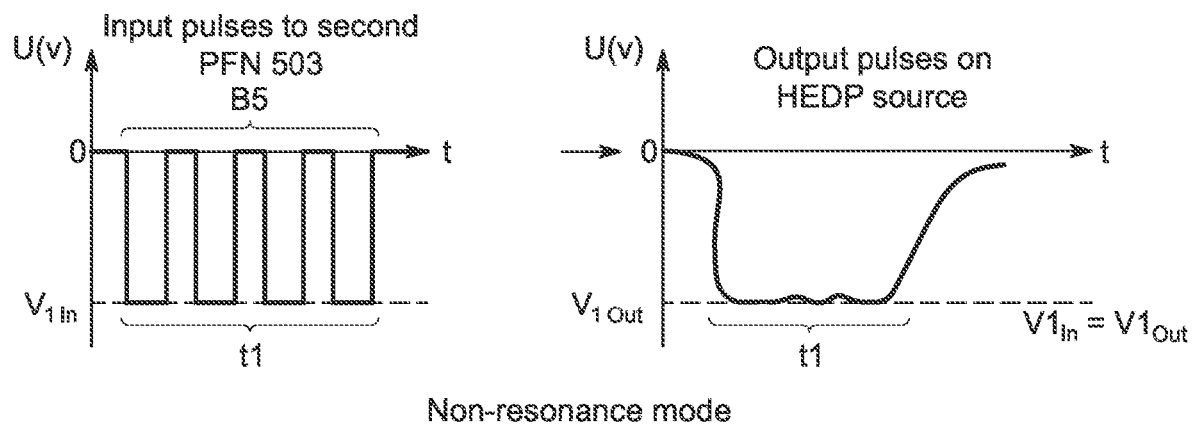
Figure 15G:
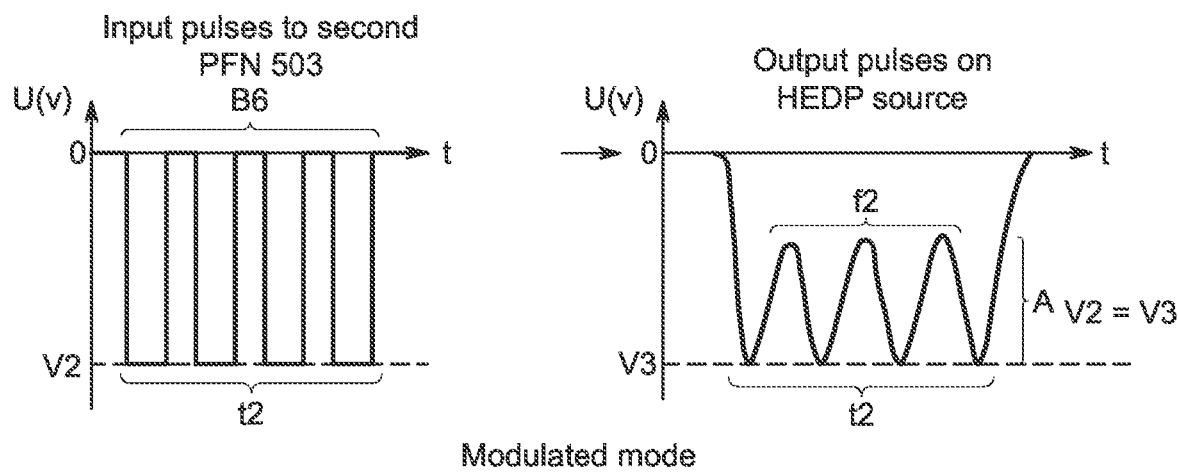

In FIG. 15(g), the unipolar negative pulsed DC output from power supply 540 is programmed to produce a plurality of pulses with voltage level V2 and defined pulse width and frequency in defined timed pulse bursts B6 feeding the second PFN or PCN 510, and causing a non-resonance pulsed DC modulated discharge on the HEDP source 100. In this case, the voltage input V2 to the tunable PCN 510 is equal to voltage output V3.

Figure 15H:
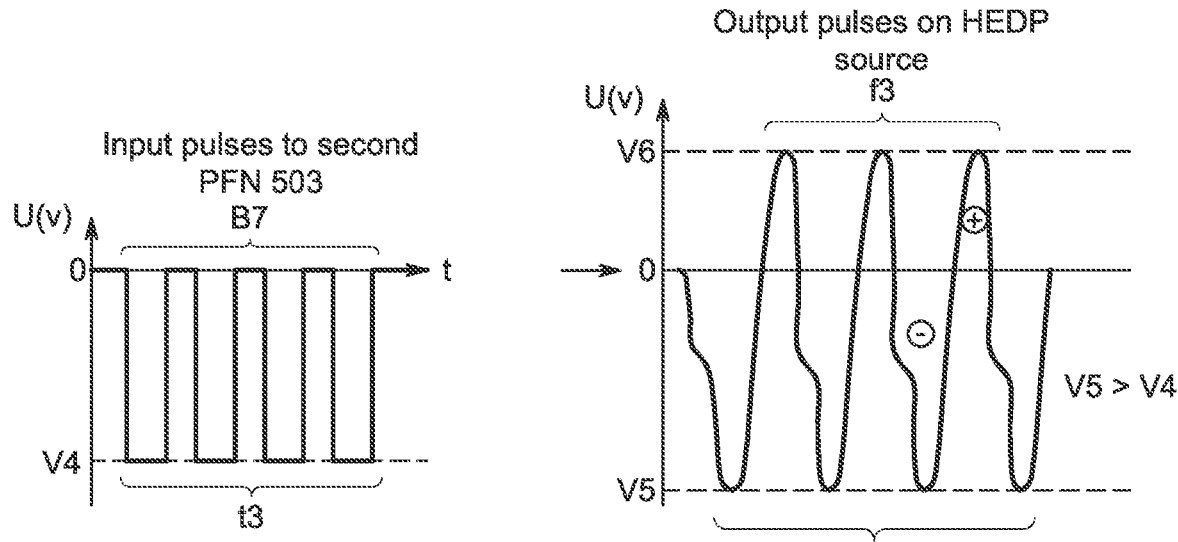

In FIG. 15(h), the unipolar negative pulsed DC output from power supply 540 is programmed to produce a plurality of pulses with voltage level V4 and defined pulse width and frequency in defined timed pulse bursts B7 feeding the tunable PCN 510, and causing a resonance pulsed AC modulated discharge on the HEDP source 100. In this case, the voltage input to the tunable PCN 510 is V4<V5 when in resonance mode. The value of voltage V6 is directly correlated to the peak pulsed resonance current during the negative cycle and the pulse switching frequency from power supply 540.

Figure 15I:
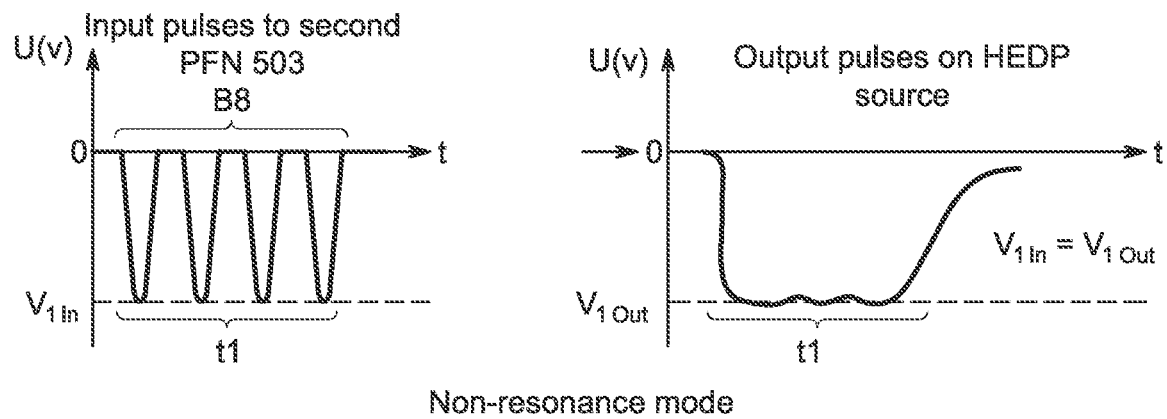

In FIG. 15(i), the unipolar negative pulsed DC output from power supply 540 with defined pulse voltage rise-time and fall-time is programmed to produce a plurality of pulses with voltage level V1 and defined pulse width and frequency in defined timed pulse bursts B8 feeding the tunable PCN 510, and causing a non-resonance discharge on the HEDP source 100. In this case, the voltage input to the tunable PCN 510 V1 is equal to voltage output V1 out.

Figure 15J:
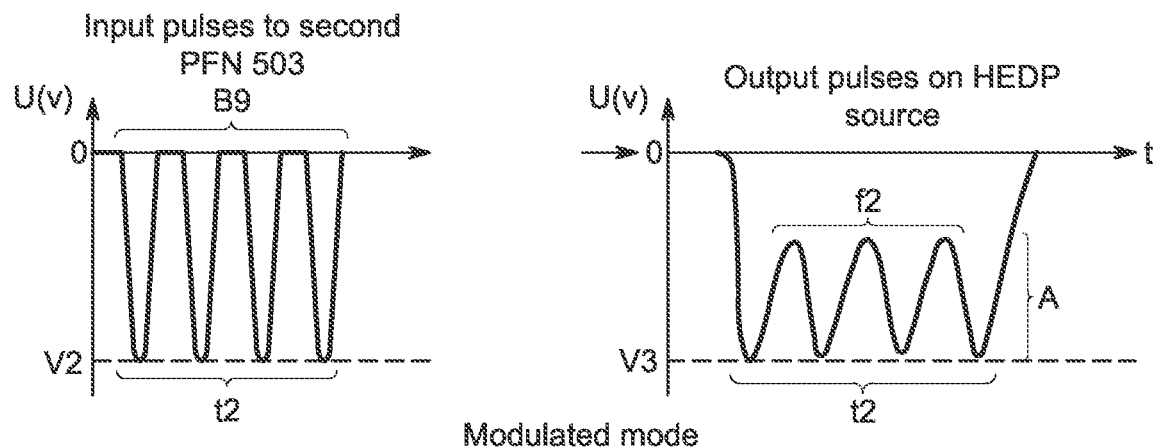

In FIG. 15(j), the unipolar negative pulsed DC output from power supply 540 with defined pulse voltage rise-time and fall-time is programmed to produce a plurality of pulses with voltage level V2 with defined pulse width and frequency in defined timed pulse bursts B9 feeding the tunable PCN 510 causing a non-resonance pulsed DC modulated discharge on the HEDP source 100. In this case, the voltage input V2 to the tunable PCN 510 is equal to the voltage output V3.

Figure 15K:
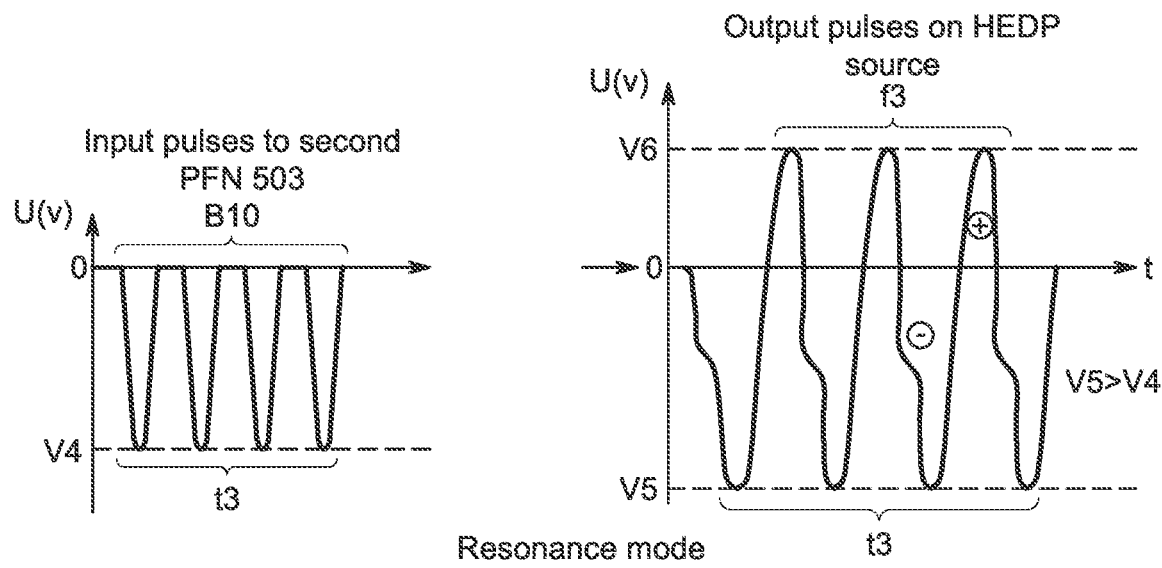
Figure 15L:
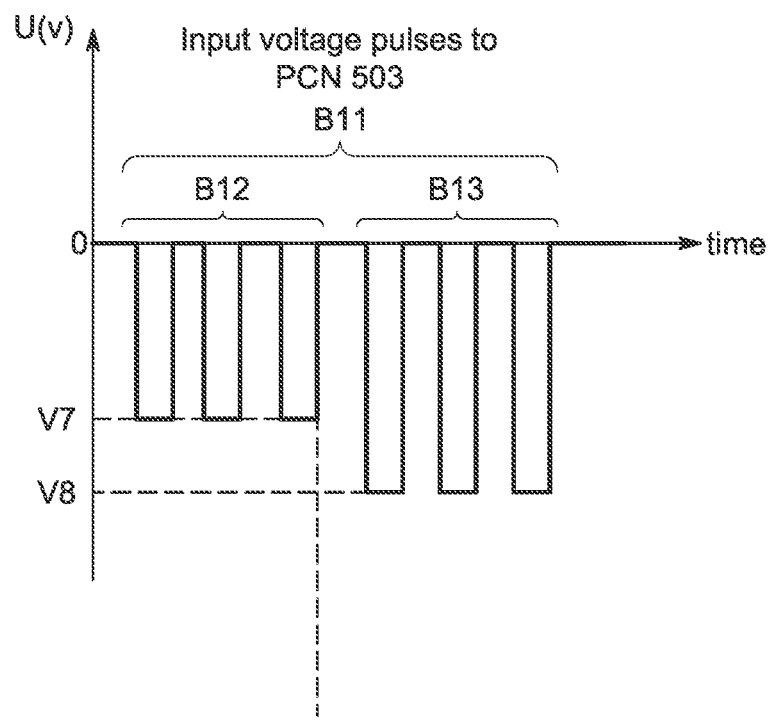
Figure 15M:
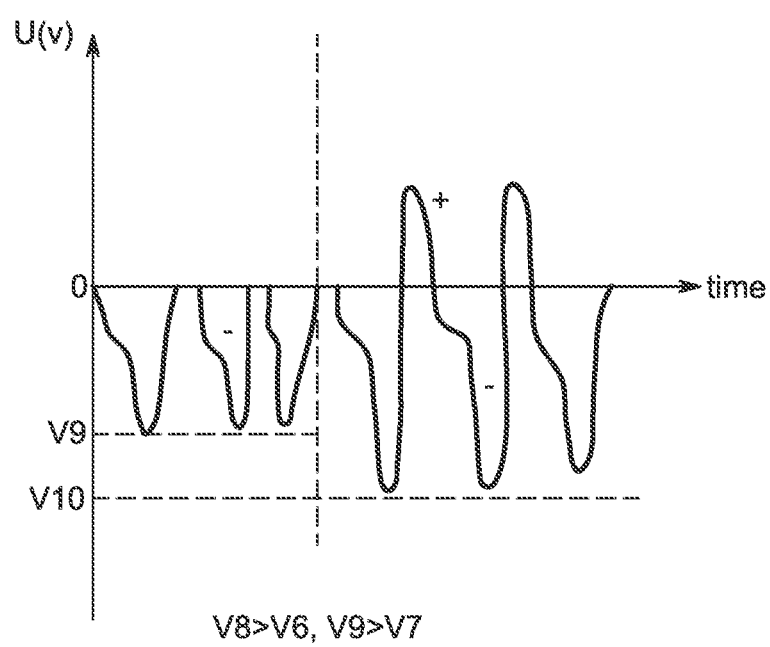

In FIG. 15(k), the unipolar negative pulsed DC output from power supply 540 with defined pulse voltage rise-time and fall-time is programmed to produce a plurality of pulses with voltage level V4 and defined pulse width and frequency in defined timed pulse bursts B10 feeding the tunable PCN 510 causing a resonance pulsed AC modulated discharge on the HEDP source 100. In this case, the voltage input to the tunable PCN 510 is V4<V5 when in resonance mode. The value of voltage V6 is directly correlated to the peak pulsed resonance current during the negative cycle and the pulse switching frequency from power supply 540.

In FIGS. 15 (l),(m), the unipolar negative pulsed DC output from power supply 540 is programmed to produce a plurality of pulses with two different controlled voltage levels V7, V8 and defined pulse width and frequency in two defined timed pulse bursts B12, B13, in which B11 is the sum of B12 and B13, feeding the tunable PCN 510, and causing a mixed discharge with pulsed non-resonance and pulsed resonance AC asymmetric discharge on the HEDP source 100. In resonance, V7=V9, V8<V10, and the value of the resonance positive voltage on the output of the tunable PCN 510 is directly correlated to the peak pulsed resonance current during the negative cycle and the pulse switching frequency from power supply 540.

A magnetically and electrically enhanced HEDP sputtering source 100 shown in FIG. 16 (a) includes a hollow cathode magnetron 101 and the high-power pulse power supply 540, which includes the high-power AC/DC convertor and cap charger source 508, 509, the high-power pulsed power supply with programmable voltage pulse frequency and amplitude 512 with built-in PFN 502, and the tunable PCN 503, which in resonance mode, generates a high-power resonance asymmetrical AC waveform.

The hollow cathode magnetron 101 includes a hollow cathode target 103. The hollow cathode target 103 has side walls 104 and a bottom part 105 as shown in FIGS. 16 (a), (b). An anode 106 is positioned around the side walls 104. Magnets 107, 108 and magnetic pole piece 109 are positioned inside a water jacket 110. The water jacket 110 is positioned inside a housing 111. The hollow cathode target 103 is bonded to a copper backing plate 112. Magnets 107, 108 and magnetic pole piece 109 generate magnetic field lines 113, 114 that terminate on the bottom part 105 and form a magnetron configuration and some of the magnetic field 113, 114 terminates on the side wall. Magnetic pole piece 109 is positioned on a supporter 124. Magnetic field lines 115, 116 terminate on the side walls 104. Water jacket 110 has a water inlet 117 and a water outlet 118. The water inlet 117 and water outlet 118 are isolated from housing 111 by isolators 121. Water jacket 110 and, therefore, hollow cathode target 101 are connected to the tunable PCN 510 and the PCN 510 generates the resonance asymmetric AC discharge on the hollow cathode, which is connected to the high-power pulse power supply 540. The following chemical elements, or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases O2, N2, F, Cl, and/or H2 can also be used as the cathode material.

A magnetically and electrically enhanced HEDP sputtering source 100 shown in FIG. 17 (a) includes a hollow cathode magnetron 101 and the high-power pulse power supply 540, which includes the high-power AC/DC convertor and cap charger source 508,509, the high-power pulsed power supply with programmable voltage pulse frequency and amplitude 512, and built-in PFN 502, and the tunable PCN 503, and voltage and current monitor 504, which in resonance mode, generates a high-power resonance asymmetrical AC waveform.

The hollow cathode magnetron 101 includes a hollow cathode target 516. The hollow cathode target 516 has side walls 515 machined on an angle with a range of about 1-75 degrees, a bottom part 514, and a center post 541 that can be shaped as a straight cylinder, which is hollow or solid. The walls of the cylinder 541 can be machined on an angle with a range of about 1-75 degrees, as shown in FIGS. 17 (a), (b). An anode 106 is positioned around the side walls 515. Magnets 107, 108, and magnetic pole piece 109 are positioned inside a water jacket 110. The water jacket 110 is positioned inside a housing 111. The hollow cathode target 516 is bonded to a copper backing plate 112. Magnets 107, 108 and magnetic pole piece 109 generate magnetic field lines 113, 114 that terminate on the bottom part 514 and form a magnetron configuration. Some of the magnetic fields 113, 114 terminate on the side wall 516 and center pole 541. Magnetic pole piece 109 is positioned on a supporter 124. Magnetic field lines 115, 116 terminate on the side walls 515 and center pole 541. Water jacket 110 has a water inlet 117 and a water outlet 118. The water inlet 117 and water outlet 118 are isolated from housing 111 by isolators 121. Water jacket 110 and, therefore, hollow cathode target 101 are connected to a PCN 503, and the PCN 503 produces the resonance asymmetric AC discharge on the hollow cathode that is connected to the high-power pulse power supply 540 producing unipolar negative voltage pulses. The following chemical elements, or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases O2, N2, F, Cl, and/or H2 can also be used as the cathode material.

A magnetically and electrically enhanced HEDP sputtering source 100 shown in FIG. 18 (*a*) includes the hollow cathode magnetron 101 and the high-power pulse power supply 540, which includes the high-power AC/DC convertor and cap charger source 508,509, the high-power pulsed power supply with programmable voltage pulse frequency and amplitude 512 with built-in PFN 502, tunable PFN or PCN 503, which in resonance mode, generates a high-power resonance asymmetrical AC waveform, and a high frequency generator 518 operating in continuous or pulsed mode at 100 kHz to 60 MHz with a matching network. The output frequency can be a mixed frequency from high frequency generator 518. The high frequency generator 518 output and the PCN 503 can be synchronized to be pulsed in-phase or out-of-phase with the output of the PCN 503.

The hollow cathode magnetron 101 includes a hollow cathode target 103. The hollow cathode target 103 has side walls 104 and a bottom part 105 as shown in FIGS. 18 (*a*), (*b*). An anode 106 is positioned around the side walls 104. Magnets 107, 108, and magnetic pole piece 109 are positioned inside a water jacket 110. The water jacket 110 is positioned inside a housing 111. The hollow cathode target 103 is bonded to a copper backing plate 112. Magnets 107, 108 and magnetic pole piece 109 generate magnetic field lines 113, 114 that terminate on the bottom part 105 and form a magnetron configuration and some of the magnetic field 113, 114 terminates on the side wall. Magnetic pole piece 109 is positioned on a supporter 124. Magnetic field lines 115, 116 terminate on the side walls 104. Water jacket 110 has a water inlet 117 and a water outlet 118. The water inlet 117 and water outlet 118 are isolated from housing 111 by isolators 121. Water jacket 110 and, therefore, hollow cathode target 101 are connected to a high frequency generator 518 and a PFN or PCN 503, and the PFN or PCN 503 provides the resonance asymmetric AC discharge on the hollow cathode connected to a high-power pulse power supply 540 producing unipolar negative voltage pulses. The following chemical elements, or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases O2, N2, F, Cl, and/or H2 can also be used as the cathode material.

The hollow cathode magnetron 101 from the magnetically and electrically enhanced HEDP sputtering source 100 is mounted inside a vacuum chamber 401 to construct the magnetically and electrically enhanced HEDP sputtering apparatus 519 shown in FIG. 19 (*a*). The vacuum chamber 401 contains feed gas and plasma, and is coupled to ground. The vacuum chamber 401 is positioned in fluid communication with a vacuum pump 402, which can evacuate the feed gas from the vacuum chamber 401. Typical baseline pressure in the vacuum chamber 401 is in a range of 10-6 to 10-9 Torr. The vacuum chamber contains a ring RF HDP gas source or magnetically enhanced chemical vapor deposition (CVD) source 520 connected to an RF power supply 524 in the range of about 1-60 Mhz, and typically 13.56 MHz, and a matching network and an inductor grounding the cathode part of the RF source or magnetically enhanced chemical vapor deposition (CVD) source. In some embodiments, the gas source 520 can be magnetically coupled to the hollow cathode magnetron 101 or the substrate support 408 or both. The gas source 520 improves gas dissociation and plasma ignition voltage on the hollow cathode 101. The gas source 520 can be fed gas through a mass flow controller 404. The gas flow is in a range of about 1 to 100000 SCCM depending on plasma operating conditions, pumping speed of a vacuum pump 403, process conditions, and the like. Typical gas pressure in the vacuum chamber 401 during a sputtering process is in a range of about 0.5 to 1000 mTorr. In some embodiments, a plurality of gas inlets and a plurality of mass flow controllers sustain a desired gas pressure during the sputtering process. The plurality of gas inlets and plurality of mass flow controllers may be positioned in the vacuum chamber 401 at different locations. The feed gas can be a noble gas, such as Ar, Ne, Kr, Xe, a reactive gas, such as $N_2$, $O_2$, or any other gas suitable for sputtering or reactive sputtering processes. The feed gas can also be a mixture of noble and reactive gases fed through the gas source 520 or fed directly into the chamber.

The magnetically enhanced HEDP sputtering apparatus 400 includes a substrate support 408 that holds a substrate 407 or other work piece for plasma processing. The substrate support 408 is electrically connected to a bias voltage power supply 409 or multiple bias voltage power supply 409. The bias voltage power supply 409 can include a radio frequency (RF) power supply, alternating current (AC) power supply, very high frequency (VHF) power supply, and/or direct current (DC) power supply. The bias power supply 409 can operate in continuous mode or pulsed mode. The bias power supply 409 can be a combination of two different RF power supplies that can provide different frequencies. In some embodiment, a common exciter (CEX) phase controller can be used to eliminate unwanted beat frequencies if two RF generators are used as a bias supply 409. In some embodiments, a common exciter (CEX) phase controller can be used to eliminate unwanted beat frequencies between the bias RF generator 409 and the RF power supply of the gas ring source 520. In this way, two RF generators can be phase-locked together so that the RF generators run at the same frequency with a fixed phase relationship between their outputs, thereby preventing unwanted beat frequencies. The negative bias voltage on the substrate is in a range of about 0 to −2000 V. In some embodiments, the bias power supply generates a pulse bias with different voltage pulse frequency, amplitude, and shape as shown in FIG. 19 (*b*). In some embodiments, the voltage is a pulse voltage. The negative substrate bias voltage can attract positive ions to the substrate. The substrate support 408 can include a heater 414 that is connected to a temperature controller 421. The temperature controller 421 regulates the temperature of the substrate 407. In an embodiment, the temperature controller 420 controls the temperature of the substrate 407 to be in a range of about −100 C to (+1000) C.

A multiple hollow cathode magnetron 101 from the magnetically and electrically enhanced HEDP sputtering source 100 connected to a PCN 503 is mounted inside a vacuum chamber 401 to construct the magnetically and electrically enhanced HEDP sputtering apparatus 582 shown in FIG. 20 (*a*). The vacuum chamber 401 contains feed gas and plasma, and is coupled to ground. The vacuum chamber 401 is positioned in fluid communication with a vacuum pump 402, which can evacuate the feed gas from the vacuum chamber 401. Typical baseline pressure in the vacuum chamber 401 is in a range of about 10-6 to 10-9 Torr. The vacuum chamber contains a remote or ring RF HDP gas source 571 connected to an RF power supply 524 in the range of about 1-60 Mhz, and typically 13.56 MHz, and a matching network 546 and an inductor grounding the cathode part of the gas source 520. In some embodiments, the gas source can be magnetically coupled to the hollow cathode magnetron 10, the substrate support 408, or both. In this embodiment, the substrate 408 can be a single object, such as a metal block or multiple components mounted on a substrate holder moving in rotary motion in front of the HEDP sputtering source or sources 100. The gas source 520 improves gas dissociation and plasma ignition voltage on the hollow cathode 101. The gas source 520 can be fed gas through a mass flow controller 404. The gas flow is in a range of about 1 to 100000 SCCM depending on plasma operating conditions, pumping speed of a vacuum pump 403, process conditions, and the like. Typical gas pressure in the vacuum chamber 401 during a sputtering process is in a range of about 0.5 to 50 mTorr. The feed gas can be a noble gas, such as Ar, Ne, Kr, Xe, a reactive gas, such as $N_2$, $O_2$, or any other gas suitable for sputtering or reactive sputtering processes. The feed gas can also be a mixture of noble and reactive gases through the gas source 520 or fed directly into the chamber.

The magnetically enhanced HEDP sputtering apparatus 582 includes a substrate support 408 that holds a substrate 407 or other work piece for plasma processing. The substrate support 408 can be stationary or rotating at about 1-200 rpm. The substrate support 408 is electrically connected to a bias voltage power supply 409 or multiple bias voltage power supplies 409. The bias voltage power supply 409 can include a radio frequency (RF) power supply, alternating current (AC) power supply, very high frequency (VHF) power supply, and/or direct current (DC) power supply. The bias power supply 409 can operate in continuous mode or pulsed mode. The bias power supply 409 can be a combination of two different RF power supplies that can provide different frequencies. The negative bias voltage on the substrate is in a range of about 0 to −2000 V. In some embodiments, the bias power supply generates a pulse bias with different voltage pulse frequency, amplitude, and shape as shown in FIG. 20 (b). In some embodiments, the bias power supply generates an AC bias with different voltage pulse frequency, amplitude, and shape as shown in FIG. 20 (C). In some embodiments, the voltage is a pulse voltage. The negative substrate bias voltage can attract positive ions to the substrate. The substrate support 408 can include a heater 414 that is connected to a temperature controller 421. The temperature controller 421 regulates the temperature of the substrate 407. In an embodiment, the temperature controller 420 controls the temperature of the substrate 407 to be in a range of about −100 C to (+1000) C.

The hollow cathode magnetron 101 from the magnetically and electrically enhanced HEDP sputtering source 100 is mounted inside a vacuum chamber 401 to construct the magnetically and electrically enhanced HEDP sputtering apparatus 570 shown in FIG. 21 (a). The vacuum chamber 401 contains feed gas and plasma, and is coupled to ground. The vacuum chamber 401 is positioned in fluid communication with a vacuum pump 402, which can evacuate the feed gas from the vacuum chamber 401. Typical baseline pressure in the vacuum chamber 401 is in a range of 10-6 to 10-9 Torr. The vacuum chamber contains a remote RF HDP gas source 571 connected to an RF power supply 524 in the range of about 1-60 Mhz, and typically 13.56 MHz, a matching network 546, and an inductor grounding the cathode part of the RF source. In some embodiments, the gas RF source can be magnetically coupled to the hollow cathode magnetron 101, or the substrate support 408, or both. The gas source 571 improves gas dissociation and plasma ignition voltage on the hollow cathode 101. The gas source 571 can be fed gas through a mass flow controller 404. The gas flow is in a range of about 1 to 100000 SCCM depending on plasma operating conditions, pumping speed of a vacuum pump 403, process conditions, and the like. Typical gas pressure in the vacuum chamber 401 during a sputtering process is in a range of about 0.5 to 50 mTorr. The feed gas can be a noble gas, such as Ar, Ne, Kr, Xe, a reactive gas, such as $N_2$, $O_2$, or any other gas suitable for sputtering or reactive sputtering processes. The feed gas can also be a mixture of noble and reactive gases through the RF source 571 or fed directly into the chamber.

The magnetically enhanced HEDP sputtering apparatus 570 shown in FIG. 21 (a) includes a substrate support 408 that holds a substrate 407 or other work piece for plasma processing. The substrate support 408 is electrically connected to a bias voltage power supply 409 or multiple bias voltage power supply 409. The bias voltage power supply 409 can include a radio frequency (RF) power supply, alternating current (AC) power supply, very high frequency (VHF) power supply, and/or direct current (DC) power supply. The bias power supply 409 can operate in continuous mode or pulsed mode. The bias power supply 409 can be a combination of two different RF power supplies that can provide different frequencies. The negative bias voltage on the substrate is in a range of about 0 to −2000 V. In some embodiments, the bias power supply generates a pulse bias with different voltage pulse frequency, amplitude, and shape as shown in FIG. 21 (b). In some embodiments, the voltage is a pulse voltage. The negative substrate bias voltage can attract positive ions to the substrate. The substrate support 408 can include a heater 414 that is connected to a temperature controller 421. The temperature controller 421 regulates the temperature of the substrate 407. In an embodiment, the temperature controller 420 controls the temperature of the substrate 407 to be in a range of about −100 C to (+1000) C.

An embodiment of a magnetically enhanced CVD deposition source magnetic field geometry is shown in FIG. 22 (a). This geometry, on one side, forms a cusp magnetic field in a gap between an anode and a hollow cathode target and, on another side, forms magnetic field lines that cross a surface of the cathode substantially perpendicular to the cathode surface. Therefore, magnetic field lines from one side terminate on the cathode target surface, and from another side the magnetic field lines terminate in the gap on the pole piece that does not has the same potential as a cathode target, and the pole piece is not a cathode target. This magnetic field geometry does not confine secondary electrons near the cathode target surface, as in conventional magnetron sputtering sources. Instead, this magnetic field geometry allows secondary electrons to move from the target surface toward the gap between the cathode and the anode.

In the case of chemically enhanced ionized physical vapor deposition (CE-IPVD) when negative voltage pulses are applied to the cathode target, plasma is ignited and sustained in a reactive gas atmosphere during the voltage pulse, the magnetic field lines guide secondary electrons emitted by the cathode target surface away from the cathode surface towards the gap between the hollow cathode and anode. During this movement, the electrons dissociate the feed gas molecules and ionize atoms. By the time these electrons come in contact with the pole piece in the gap that concentrates the cusp magnetic field in the gap, the electrons have lost a portion of their initial energy. A portion of the secondary electrons will drift back to the hollow cathode target surface due to magnetic mirror effect or the presence of negative potential on the pole piece. If these electrons reach the hollow cathode surface during the time between voltage pulses, when the hollow cathode target voltage is equal to zero, these electrons discharge a positive charge on top of the cathode surface and significantly reduce or eliminate the probability of arcing on the cathode target surface during the CE-IPVD. The amount of electrons returning to the hollow cathode surface can be controlled by selecting the magnetic field geometry, gas pressure, amplitude, duration, the distance between applied voltage pulses, and duration and value of negative potential on the pole piece. The positive charge on the hollow cathode target surface can be formed due to the generation of low electrical conductivity films during the CVD process.

A magnetically enhanced CVD source has a hollow cathode target and at least two rows of magnets 1101 and 1102 as shown in FIG. 22 (a). The two rows of magnets face each other and provide a magnetic field in the same direction (south-south or north-north) and, therefore, generate cusp magnetic field geometry 1103 in the gap 1113 between the hollow cathode target 1104 and the anode 105 where the anode is positioned on top of the hollow cathode target 1104. A pole piece 1106 is disposed between two rows of the magnets 1101, 1102. This pole piece 1106 can be made from a magnetic or nonmagnetic material. If the pole piece 1106 is made from magnetic material, the pole piece 1106 concentrates the cusp magnetic field which can increase a magnetic mirror effect for the electrons drifting from the cathode target surface towards the gap. There is another pole piece 1109 positioned on top of the top row of magnets 1101. This pole piece 1109 is made from a magnetic material. The pole piece 1109 is exposed to plasma through the gap 1110 positioned in the anode 1105. The pole pieces 1109 and 1106 can be connected to power supply 1107 or can be grounded or isolated from the ground.

In some embodiments, power supply 1107 is an RF power supply. In some embodiments, pole piece 1106 is grounded through inductor 1127 to eliminate the DC bias. Pole piece 1109 can be connected to a different power supply and can have a different potential than pole piece 1106. Pole pieces are isolated from the anode 1106 and magnets 1101 and 1102 by isolators 1108. Magnetic field lines from the bottom row of the magnets 1102 penetrate the top surface of the hollow cathode target 1104 at a substantially 90 degree angle. Magnetic field lines 1112 from the top row of the magnets terminate on the magnetic pole piece 1106 and 1109. Magnetic field lines 1111 from the bottom row of magnet 102 crosses over the magnetic pole pieces 1114, 115, magnet 1116, and cathode target 104. Pole pieces 1114, 1115 are made from magnetic material. Magnet 1116 enhances the magnetic field near the cathode target surface. The cathode target 1104 is connected to power supply 1117. The cathode target 1104 can be also connected to power supply 1118 through switch 1119. In some embodiments, power supply 1118 is an RF power supply and power supply 1117 is a DC power supply. These two power supplies 1117, 1118 generate an RF DC superimposed discharge. In some embodiments only RF power supply 1118 is connected to the cathode target 1104. In this case, a ground 1125 can be connected to the cathode target 1104 through inductor 1124 and switch 1126 to eliminate the DC bias. If the cathode target 1104 is inductively grounded, the RF discharge cannot generate a constant negative DC voltage bias. In this case, there is no sputtering from the cathode target 1104. In some embodiments, only one power supply 1117 is connected to the cathode target 1104 and generates negative voltage pulses.

Magnetic field 1111 lines that penetrate the hollow cathode surface guide the emitted electrons from the hollow cathode target surface 1104 to the gap between the anode and the hollow cathode 1104 as shown in FIG. 22 (b) by arrow 1120. By the time the emitted electrons arrive at the gap, a portion of their initial energy has been lost due to dissociation, ionization, and/or elastic and/or non-elastic collisions with neutral atoms, ions, and/or other electrons. One portion of the electrons reflect from point "A" due to a magnetic mirror effect and another portion of the electrons reflect from point "B" due to the presence of a negative potential on pole piece 1106. The electrons drift back from the gap towards the hollow cathode surface as shown by arrow 1121. Another portion of the electrons drift towards the anode gap as shown by arrow 1122. These electrons reflect back from point "C" due to the magnetic mirror effect, and from point "D" due to a negative electric potential on the pole piece as shown by arrow 1123. If pole piece 1109 is hidden under grounded anode 1105, the portion of the electrons that were not reflected by the magnetic mirror effect are absorbed by grounded anode 1110. Preferably, a negative voltage on the pole pieces 106 is less than −50 V in order to prevent possible sputtering from the pole piece. In some embodiments, short negative voltage pulses with durations in the range of 5-100 µs and amplitudes in the range of 100-2000 V with a frequency of up to about 100 kHz are applied to the pole piece 1106. Voltage pulse can be triangle, rectangular, trapezoidal or have any shape. Voltage pulse can be negative, bipolar, or positive. Application of the negative high voltage pulses increase the energy of the electrons reflected from the gap 1113 and, therefore, the plasma density.

FIG. 22 (c) shows negative voltage pulses generated by power supply 1107 when the cathode target 1104 from the CVD source is connected to the RF power supply. Pulsed negative voltage increases electron energy in RF discharge and, therefore, increases plasma density. As a result, in some embodiments, the negative voltage bias generated by RF power supply 1117 is reduced during the pulse from UD2 to UD1 as shown in FIG. 22 (d). FIG. 22 (e) shows negative voltage pulses with different amplitude U1-U3 generated by power supply 1107. Pulse voltage increases the amount of electrons and, therefore, increases the plasma density. A greater negative pulse voltage amplitude U3 generates greater plasma density and, therefore, there is a less negative voltage bias UD1 generated by the RF power supply. As a result, in some embodiments, the discharge voltage generated by RF power supply 1117 is reduced during the pulse as shown in FIG. 22 (f). The influences of the frequency of the negative voltage pulses generated by power supply 1107 on discharge voltage generated by power supply 1117 or 1118 are shown in FIG. 221 (g, h). FIG. 22 (i) shows negative voltage pulses generated by power supply 1107. As a result, in some embodiments, the peak-to-peak voltage Upp1 generated by RF power supply 117 connected to the inductively grounded cathode target 1104 is reduced during the pulse Upp2 as shown in FIG. 22 (j). Depending on the voltage amplitude, duration, and shape of the voltage pulses applied to the cathode, the voltage applied to the pole piece 1106, 1109, and gas pressure, the electrons will move back and forth between the cathode target and the gaps.

FIG. 23 (a) shows a cross-sectional view of an embodiment of the magnetically enhanced CVD deposition source 1200. The magnetically enhanced CVD deposition source 1200 includes a base plate 1201. The base plate has an electrical ground potential. The cathode assembly includes a water jacket 1202 and a hollow cathode target 1207. The water jacket 1202 is electrically isolated from the base plate 1201 with isolators 1205 and 1206. Water or another fluid for cooling can move inside the water jacket 1202 through inlet 1203 and can move outside the water jacket 1202 through outlet 1204. The hollow cathode target 1207 is positioned on top of water jacket 1202. The hollow cathode target 1207 is electrically connected to a negative terminal of a power supply 1227 through a water inlet 1203, transmission line 1230, and switch 1243. The power supply 1227 can include a direct current (DC) power supply, a pulsed DC power supply that generates unipolar negative voltage pulses, a pulsed DC power supply that generates an asymmetrical bipolar voltage pulses, a pulsed DC power supply that generates symmetrical bipolar voltage pulses, an RF power supply, and/or a high power pulsed power supply. Any of these pulsed power supplies can generate different shapes, frequencies, and amplitudes of the voltage pulses. These power supplies can work in power control mode, voltage control mode, or in current control mode. The water inlet 1204 is electrically connected to a negative terminal of a power supply 1229 through a transmission line 1230, matching network 1228, and switch 1242. A power supply 1229 can include a radio frequency (RF) power supply, pulsed RF power supply, high frequency (HF) power supply, pulsed HF power supply, or any combination of these power supplies. The frequency of the applied power can be in the range of 100 kHz-100 MHz. Power supply 1227 can operate together with power supply 1229 or can operate alone without connecting power supply 1229 to the cathode assembly. Power supply 1229 can operate together with power supply 1227 or can operate alone without connecting power supply 1227 to the cathode assembly. The cathode 1207 can be powered with any combination of the power supplies mentioned above. All of the above-mentioned power supplies can operate in current control mode, voltage control mode, and/or power control mode. Power supply 1227 and power supply 1229 can be connected to the same water inlet 1203. The cathode target 1207 is formed in the shape of a round hollow shape, but can be formed in other shapes, such as a rectangular hollow shape, disc, and the like. The cathode target 1207 material can be conductive, semi-conductive, and/or non-conductive. The following chemical elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases O2, N2, F, Cl, and/or H2 can also be used as a cathode material. Power supplies 1227, 1228, and switches 1243, 1242 are connected to the controller 1280 and computer 1281. Controller 1280 and/or computer 1281 control the output voltage values and timing of the power supplies 1227 and 1229. The power supplies 1227 and 1229 can be synchronized.

The cathode assembly includes a stationary cathode magnetic assembly 1222 positioned inside the water jacket 1202. The cathode magnetic assembly 1222 in an embodiment includes a disc-shaped magnetic pole piece made from magnetic material, such as iron. The magnetic assembly 1222 is mounted on the plate 1223 that is made from non-magnetic material. The presence of the magnetic pole piece 1222 provides for a perpendicular direction of the magnetic field lines to the surface of the cathode. In an embodiment, the cathode magnetic assembly (stationary or rotatable) includes a plurality of permanent magnets and magnetic pole pieces. The shape of the magnetic assembly 1222 determines the angle between the magnetic field lines and a surface of the cathode. In an embodiment, the magnetic assembly 1222 is rotatable. In an embodiment, the magnetic assembly 1105 is kidney-shaped. The magnetic assembly 1222 can rotate with a speed in the range of 1-500 revolutions per minute.

A ring-shaped anode 1208 is positioned proximate to the cathode target 1207. The anode 1208 and a hollow cathode target 1207 form a circular gap 1226. The electric field lines are perpendicular to the magnetic field lines in the gap. Magnetic field lines 1270 are substantially perpendicular to the cathode target surface. In some embodiments, a top part of the anode 208 has a feed gas chamber and a gas outlet. In some embodiments, a feed gas is fed through the gas pipe to the chamber and is uniformly applied through the holes in the feed gas chamber. In some embodiments, a feed gas is fed through the gap between the hollow cathode target and the anode.

A magnet assembly that generates a cusp magnetic field 1225 has a round shape and is positioned behind the ring-shaped anode 1208 and hollow cathode target 1207. The magnetic assembly includes magnetic ring-shaped pole pieces 1216, 1214, 1215 and a plurality of permanents magnets 1213, 1212. The magnets 1213, 1212 are positioned inside the magnet housing (not shown in FIG. 23 (*a*)). The magnets 1212, 1213 face each other in the same direction in order to generate a cusp magnetic field 1225 in the gap 1226. The value of the magnetic field caused by the permanent magnets 1212, 1213 is in a range of 100-10000 G. Magnetic pole pieces 1216, 1214, 1215, and 1222 with magnets 1213, 1212 generate cusp magnetic field 1225. The pole piece 1216 is mounted on top of the support 1217.

Power supplies 1227, 1229 are connected to the controller 1280. Controller 1280 can be connected to a computer 1281. Controller 1280, 1281 control the output voltage signals from the power supplies 1227, 1229.

The pole piece 1214 is electrically isolated from the magnet 1212 by isolator 1218. The pole piece 1214 is electrically isolated from the magnet 1213 by isolator 1219. The pole piece 1215 is electrically isolated from the magnet 1213 by isolator 1220. The pole piece 1215 is electrically isolated from the anode 1208 by isolator 1221.

The magnetic fields 1225 are shaped to provide electron movement between the cathode target 1207 and pole pieces 1214, 1215. During this movement, electrons ionize feed gas molecules and/or atoms and sputtered target material atoms. Electrons that are generated through ionization of the feed gas are trapped in the magnetic fields 1225.

The pole pieces 1215, 1214 may have a different design. The portion of the pole piece that is exposed to the gap 1226 has a cut 1233 in the middle as shown in FIG. 23 (*b*). The pole piece 1232 is made from non-magnetic material. The shape and material of the pole piece has an effect on point of reflections "B" and "A" as shown in FIG. 22 (*b*).

Pole piece 1214 is connected to voltage control mode power supply 1210 through electrode 1211. Electrode 1211 is isolated from the base plate 1201 with isolator 1209. In some embodiments, power supply 1210 is an RF power supply. In some embodiments, pole piece 1219 is grounded through an inductor.

In an embodiment, the magnets 1213, 1212 are electromagnets as shown in FIG. 23 (*c*). Rather than using permanent magnets 213, 212 to generate magnetic field 1225, 1270, coils 1151, 1152 can be used to generate cusp magnetic field 1225 and magnetic field 1270. Electric current in the coils 1151, 1152 has a different direction in order to form a cusp magnetic field. The value of the magnetic field 1225 will depend on the electrical current value from the power supplies 1155, 1156 and the quantity of wire turns 1153, 1154 in the coils. The power supplies 1155, 1156 can release pulsed electrical current or continuous electrical current. Pulsed electrical currents generate a pulsed magnetic field 1225, and a continuous electrical current generates a continuous magnetic field 1225. The magnetic field value 1225 can be in the range of 500-10000 G. Power supplies 1156, 1155 can be connected to controller 1280 and computer 1281.

FIG. 24 shows voltage pulse shapes that can be generated by power supply 1210. The amplitude of negative voltage pulses can be in the range of 100 and 2500 V. The pulse duration can be in the range of 1-50 μs.

FIGS. 25 (*a, b, c, d*) show different voltage pulse shapes, amplitudes, and frequencies that power supply 1227 can provide. Typically, in order to generate and sustain volume discharge, the power supply 1227 operates in power control mode or in voltage control mode. FIG. 25 (*a*) shows a continuous train of triangular negative voltage pulses. The amplitude can be in the range of 100-3000 V. FIG. 25 (*b*) shows a train of negative voltage pulses that has different voltage amplitudes. The voltage pulses with amplitude V1 can be optimized to increase the dissociation rate of feed gas molecules, and voltage pulses with amplitude V2 can be optimized to increase the ionization rate of the target material atoms and particular carbon atoms. The pulse voltage provides energy to the electrons in the plasma discharge. For example, voltage V1 is optimized to increase a dissociation rate of gas molecules containing carbon atoms such as C2H2, CH4, CO, CO2, C3H8, CH3OH, C2H5OH, CH3Cl, and the like. Also, it is important to increase the dissociation rate of H2 (H2+e→H2*+e→H+H+e). The high-voltage pulse amplitude V2 provides more energy to the electrons. Electrons collide with gas molecules, gas atoms, and target material atoms. Typically, gas atoms need more energy in order to be ionized and molecules need less energy to dissociate. That is, if the voltage amplitude is high then the probability of ionization of atoms will be high. The pulse duration can be in the range of 1 microsecond-1 millisecond. FIG. 25 (*c*) shows a pulse train of triangular negative voltage pulses. The duration of the train of negative voltage pulses can be in the range of 100 microseconds-10 milliseconds. The frequency of the train of negative voltage pulses can be in the range of 100 Hz and 20 KHz. FIG. 25 (*d*) shows a continuous voltage that can be in the range of −100 and −2000 V.

FIG. 26 (*a*) and FIG. 26 (*b*) show continuous and pulsed RF voltages, respectively, that can be provided by power supply 1228. The RF power can be in the range of 100 W-10 kW. The RF frequency can be in the range of 100 kHz-100 MHz. The frequency of RF pulses can be in the range of 100 Hz-100 kHz. FIG. 26 (*c*) shows voltage on the cathode when power supply 1227 provides a continuous train of triangle voltage pulses and power supply 1228 simultaneously provides continuous RF voltage. FIG. 26(*d*) shows voltage on the cathode when power supply 1227 provides a pulse train of triangular voltage pulses and power supply 1228 simultaneously provides pulse RF voltage. Power supply 1227 can generate a continuous train of rectangular negative voltage pulses as shown in FIG. 27 (*a*). Power supply 1227 can generate a pulse train of rectangular negative voltage pulses as shown in FIG. 27 (*b*). FIG. 27 (*c*) shows different voltage pulse shapes in one pulse train. FIG. 27 (*d*) shows a train of asymmetric bi-polar voltage pulses when the negative pulse voltage has triangular shape. FIG. 27 (*e*) shows continuous and pulsed RF voltages that can be provided by power supply 1228 or 1227 to the inductively grounded cathode target 1207.

The magnetically enhanced CVD deposition source 1200 can be mounted inside the vacuum chamber 1270 in order to construct the magnetically enhanced HDP-PVD deposition apparatus 1291 as shown in FIG. 28. The vacuum chamber 1270 contains feed gas and plasma. The vacuum chamber 1270 is coupled to ground 1288. The vacuum chamber 1270 is positioned in fluid communication with a vacuum pump 1287, which can evacuate the feed gas from the vacuum chamber 1270. Typical baseline pressure in the vacuum chamber 1270 is in a range of $10^{-5}$-$10^{-9}$ Torr.

A feed gas is introduced into the vacuum chamber 1270 through a gas inlet 1289 from feed gas sources. A mass flow controller 1280 controls gas flow to the vacuum chamber 1270. In an embodiment, vacuum chamber 1270 has many gas inlets and mass flow controllers. The gas flow can be in a range of 1-100000 SCCM depending on plasma operating conditions, pumping speed of the vacuum pump 1287, process conditions, and the like. In some embodiments, the feed gas is introduced through the gap 1226 from the magnetically enhanced CVD source. Typical gas pressure in the vacuum chamber 1201 during a CVD process is in a range of 0.1 mTorr-50 Torr. In an embodiment, a plurality of gas inlets and a plurality of mass flow controllers sustain a desired gas pressure during the CVD process. The plurality of gas inlets and plurality of mass flow controllers may be positioned in the vacuum chamber 1270 at different locations. The feed gas can be a noble gas, such as Ar, Ne, Kr, Xe; a reactive gas, such as $N_2$, $O_2$; any other gas that is suitable for CVD processes. For depositing DLC or diamond films, the feed gas contains atoms of carbon. For example, the cathode target material is carbon. The feed gas can be C2H2, or CH4 or any other gases/vapors contains carbon atoms, such as CO, CO2, C3H8, CH3OH, C2H5OH, and/or CH3Cl. Feed gas can also be a mixture of different of gases. In some embodiments, the cathode target material is not a carbon. The CVD source is connected to power supply 2127 through water inlet 1203, and power supply 1229 is connected to water outlet 1204. In some embodiments, only power supply 1227 is connected to the CVD source. In some embodiments, only power supply 1228 is connected to the CVD source.

The magnetically enhanced CVD apparatus 1291 includes a substrate holder 1292 that holds a substrate 1283 or other work piece for plasma processing. The substrate support 1284 is electrically connected to bias voltage power supply 1290 through the connector 1285. The bias voltage power supply 1290 can include a radio frequency (RF) power supply, alternating current (AC) power supply, very high frequency (VHF) power supply, and/or direct current (DC) power supply. The bias power supply 1290 can operate in continuous mode or in pulse mode. Pulse substrate bias voltage can be synchronized with pulse voltage applied to the cathode target. The bias power supply 1290 can be a combination of different power supplies that can provide different frequencies. The negative bias voltage on the substrate can be in a range of −1 and −2000 V. The negative substrate bias voltage can attract positive ions to the substrate. In some embodiments, substrate holder 1285 is inductively grounded to eliminate the DC bias and connected to RF power supply. During the operation, there is no negative constant bias. There are only RF voltage oscillations on the surface of the substrate that promote dissociation of the carbon containing gas. The substrate support 1284 can include a heater 1284 connected to a temperature controller 1286 (exact connection is not shown). The temperature controller 1284 regulates the temperature of the substrate 1283. In an embodiment, the temperature controller 1286 controls the temperature of the substrate 1283 to be in a range of −20 C to +1500 C.

An additional magnet assembly between the CVD source and substrate 1283 can be positioned inside the vacuum chamber 1270 or outside the vacuum chamber 1270 in order to increase plasma density near the substrate and, therefore, increase the dissociation rate of the gas molecules and improve film uniformity on the substrate.

The magnetically enhanced CVD source can be positioned in the vacuum chamber 301 as shown in FIG. 29. Two rectangular magnetically enhanced CVD sources 1304, 1305 are positioned inside the vacuum chamber 1301. Vacuum pump 1302 can provide base pressure up to 10-8 Torr. Two heaters 1308, 1309 control temperature of the sample 1307. Two rectangular magnetically enhanced CVD sources 1304, 1305 are connected to the power supply 1312, 1315. The magnetically enhanced CVD source 1305 is connected to RF power supply 1318 through the switch 1319 and is connected to ground through inductor 321 and switch 1320. The pole piece 1214 from the magnetically enhanced CVD source 3105 is connected to power supply 324 through switch 1325. The pole piece 1214 from the CVD source 1304 is connected to power supply 1323 through switch 1322. Substrate holder 1306 is connected to bias power supply 1313. Bias power supply 1313, power supplies 1312, 1315, and switches 1316, 1310, 1318 are connected with controller 1314. Power supplies 1316, 1312 can provide any voltage pulses in any order as shown in FIGS. 25 (a, b, c, d), FIGS. 26 (a, b, c, d), and FIGS. 27 (a, b, c, d, e). Bias power supply 1313 can be RF power supply with frequency is in the range of 500 kHz and 30 MHz. Bias power supply 1313 can be DC power supply or pulse DC power supply.

The substrate support1 1306 can provide for rotation of the substrate 1307. The substrate support 1306 can have different parts that rotate at different speeds. The substrate support 1306 can hold one or more substrates 1130 or work pieces.

In an embodiment, the substrate 1307 is a part of automobile engine and the coating is a hydrogenated diamond-like coating (DLC). The DLC coating reduces the coefficient of friction of moving parts in the automobile engine. The thickness of the DLC coating is in a range of 0.1-50 microns depending on the particular engine part. The parts that can be coated include the turbocharger, valve, piston, piston ring, piston pin, heat exchanger, connecting rod, crank end bearing, bearing, ball from any bearing, after cooler, intercooler, rocker arm, injector, valve guide, push rod, camshaft, fuel injection pump, oil pump, or any other part associated with the automobile engine.

The method of CVD depositing a film on the substrate includes the following steps. A first step is cleaning the surface of the substrate by a sputter etch process with a noble gas. In this step, the feed gas will be a noble gas, such as Ar. The gas pressure can be in the range of 1-20 mTorr. The substrate bias can be between −300 V and −1000 V. Magnetically enhanced CVD source 1305 operates in sputter etch mode. In this mode, only RF power supply 1318 is connected to the cathode target from magnetically enhanced CVD source 1305. The cathode target of the CVD source 1305 is inductively grounded in order to prevent sputtering from the cathode target. Power supply 1324 generates voltage pulses with amplitude, duration, and frequency to provide optimum energy in the range of 150 eV to the electrons to generate Ar ions. In an embodiment, power supply 1313 is RF power supply. In an embodiment, power supply 1324 is not connected with pole piece 1214. In this case, the RF power supply 1315 generates enough power to generate significant amount of Ar ions. In some embodiments, power supply 1324 is an RF power supply. In some embodiments, pole piece 1214 is grounded through an inductor.

A second step is RIE (reactive ion etch cleaning) cleaning the surface of the substrate by a reactive gas, such as O2, H2. In some embodiments, the cleaning is made using H2. In this step, the feed gas is a reactive gas. The gas pressure can be in the range of 1 mTorr-100 mTorr. The substrate bias can be between −100 V and −1000 V. Magnetically enhanced CVD sources 1305 operate in RIE mode. In this mode, only RF power supply1 1318 is connected to CVD source 1305. The cathode target from the magnetically enhanced CVD source 1305 is inductively grounded. Power supply 1312 generates RF discharge. Power supply 1324 generates voltage pulses with amplitude, duration, and frequency to provide optimum energy in the range of 150 eV to the electrons to generate reactive gas ions. In an embodiment, the bias power supply 1313 is an RF power supply. The voltage oscillation duration can be in the range of 3-50 μs. For example, the amplitude of the voltage oscillations in order to increase the ionization rate of gas atoms can be in the range of 300 to 1000 V. The voltage oscillation duration can be in the range of 3-8 microseconds. In an embodiment, only the RF power supply 1312 operates and the RF power level is optimized by adjusting output power to provide an optimum amount of energy for the electrons in order to provide a maximum probability to generate atomic hydrogen when electrons collide with hydrogen molecules. In an embodiment, power supplies 1312, 1313 operate simultaneously to generate atomic hydrogen. The third step is the CVD film deposition. In this case, any gas that includes carbon atoms, such as acetylene, methane, and the like can be used. The substrate temperature is in the range of 400 C.

In an embodiment, the workpiece is a part of a jet engine, and the coating can be hydrogenated DLC, or hydrogenated metal-doped DLC or Alpha Alumina.

In an embodiment, the magnetically enhanced CVD source can be used to form hard DLC coating on the tip of the razor blade, as shown in FIG. 30. A blade 1403 and magnetically enhanced CVD source 1401 are positioned inside the vacuum chamber 1406. A feed gas, such as Ar, C2H2, CH4, or any other gas that contains carbon atoms is used for the CVD process. Power supplies 1402 and/or 1407 release negative voltage pulses on the cathode target 1207 from the magnetically enhanced CVD source. Power supply 1402 and/or 1407 control voltage amplitude, pulse duration, and frequency. The parameters of the voltage pulses are shown in FIGS. 25 (a, b, c, d), FIGS. 26 (a, b, c, d), FIGS. 27 (a, b, c, d). Power supply 1404 provides negative bias voltage on the blade in the range of −20 V to −200V. Power supply 1408 is connected to pole piece 1214. Power supply provides voltage pulses in order to increase electron energy and increase ionization degree of carbon atoms. The voltage pulse shapes and frequency are optimized in order to get DLC film with a hardness in the range of 20-50 GPa. Typical voltage pulse amplitude will be in the range of 1000-2000 V in order to obtain film hardness in the range of 30 GPa. In some embodiments, cathode target 1207 is inductively grounded. In some embodiments, pole piece 1214 is inductively grounded.

The magnetically enhanced CVD source can be used for many different applications. The application of diamond and DLC coatings deposited with the CVD source includes but is not limited to smart phones, tablets, flat panel displays, hard drives, read/write heads, hair removal, optical filters, watches, valves, facets, thin film batteries, disks, microelectronics, hard masks, transistors, and/or manufacturing mono and polycrystalline substrates.

The magnetically enhanced CVD source can be used for sputtering applications and can be used for chemically enhanced ionized vapor deposition. The magnetically enhanced CVD source can be configured as an Arc source.

A magnetically enhanced HDP-CVD plasma source includes a hollow cathode target and an anode. The anode and cathode form a gap. A cathode target magnet assembly forms magnetic field lines that are substantially perpendicular to a cathode target surface. The gap magnet assembly forms a cusp magnetic field in the gap that is coupled with the cathode target magnetic field. The magnetic field lines cross a pole piece and are shielded by a shield from the plasma positioned between the poles and the gap. This pole piece can be connected with a voltage power supply. The shield piece can have a negative, positive, or floating electric potential. The plasma source can be configured to generate volume discharge. The gap size prohibits generation of plasma discharge in the gap. By controlling the duration, value and a sign of the electric potential on the pole piece, the plasma ionization can be controlled. The magnetically enhanced HDP-CVD source can also be used for chemically enhanced ionized physical vapor deposition (CE-IPVD), plasma enhanced tomic layer deposition (PE-ALD) and reactive ion etch (RIE) and plasma thrusters or pulsed plasma thrusters (PPT). Gas flows through the gap between hollow cathode and anode. The cathode target is inductively grounded, and the substrate is periodically inductively grounded.

An embodiment of a magnetically enhanced CVD deposition source magnetic field geometry is shown in FIGS. 31-32, and 36. This geometry, on one side, forms a cusp magnetic field in a gap between an anode and a hollow cathode target and, on another side, forms magnetic field lines that cross a surface of the cathode substantially perpendicular to the cathode surface. Therefore, magnetic field lines from one side terminate on the cathode target surface, and from another side the magnetic field lines terminate in the gap on the shield 1131 that does not have the same potential as a cathode target, and the shield piece 1131 is shielding the pole piece 1106, 1109 from the plasma. This magnetic field geometry does not confine secondary electrons near the cathode target surface, as in conventional magnetron sputtering sources. Rather, this magnetic field geometry allows secondary electrons to move from the target surface toward the gap between the cathode and the anode.

A magnetically enhanced CVD source includes a hollow cathode target and at least two rows of magnets 1101, 1102, as shown in FIGS. 31, 32, 36. The two rows of magnets face each other and provide a magnetic field in the same direction (i.e., south-south or north-north) and, therefore, generate cusp magnetic field geometry 1103 in the gap 1113 between the hollow cathode target 104 and the anode 11105 where the anode is positioned on top of the hollow cathode target 1104. A pole piece 1106 is disposed between two rows of the magnets 1101, 1102. This pole piece 1106 can be made from magnetic or nonmagnetic material. If the pole piece 1106 is made from magnetic material, the pole piece 1106 concentrates the cusp magnetic field, which can increase a magnetic mirror effect for the electrons drifting from the cathode target surface towards the gap. There is another pole piece 1109 positioned on top of the top row of magnets 1101. This pole piece 1109 is made from magnetic material. The pole piece 1109 is not exposed to plasma through the gap 1110 positioned in the anode 1105 because shield 1131 is protecting all the poles. The shield can be connected to power supply 1107 or can be grounded or isolated from ground.

In some embodiments, power supply 1107 is an RF power supply. In some embodiments, shield piece 1131 is grounded through inductor 1127 to eliminate the DC bias. Magnetic field lines from the bottom row of the magnets 1102 penetrate the top surface of the hollow cathode target 1104 at a substantially 90-degree angle. Magnetic field lines 1112 from the top row of the magnets terminate on the magnetic shield piece 1131. Magnetic field lines 1111 from the bottom row of magnet 1102 crosses over the magnetic pole pieces 1114, 1115, magnet 1116, and cathode target 1104. Pole pieces 114, 115 are made from magnetic material. Magnet 116 enhances the magnetic field near the cathode target surface. The cathode target 104 is connected to multiple RF power supplies 118 with matching network 1128 and optional common exciter 1140. The cathode target 1104 can be also connected to a regulated high power unipolar voltage pulse power supply 1130 and pulse forming network (PFN) 1129 to produce a resonance asymmetric pulse AC discharge superimposed over RF discharge. In some embodiments only two RF power supplies 1118 are connected to the cathode target 1104 as seen in FIG. 32. The power supplies 1118 can run in pulsed mode or continuous mode. The power supplies 1118 can be at the same frequency or different frequencies. Each frequency is chosen carefully to optimize the ionization process for each element. For example, a carbon atom has a different ionization potential than a metal atom. The same applies to the ionization of gas molecules as well.

In some embodiments, only a regulated high-power unipolar voltage pulse power supply 1130 and pulse forming network (PFN) 1129 are used to produce a resonance asymmetric pulse AC discharge when connected to the cathode target 1104 as shown in FIG. 36. In some embodiments, an accelerating grid 1132 is positioned parallel to the surface of the hollow cathode target, and a power supply 1133 is connected to the accelerating grid providing voltage for ion acceleration from the magnetically enhanced chemical vapor deposition (CVD) plasma source. In some embodiments, the power supply 1133 can be operated in continuous or pulsed mode. In some embodiments, the accelerating grid can be grounded. In some embodiments, the shield 1131 can be grounded. In some embodiments, a ground 1125 can be connected to the cathode target 1104 through inductor 1124 and switch 1126. If the cathode target 1104 is inductively grounded, the RF discharge cannot generate a constant negative voltage bias. In this case, there is no sputtering from the cathode target 1104. The switch 1126 can be synchronized in pulse mode to turn on only when at least one RF generator is pulsing and off when it is not. The switching frequency 1126 can be synchronized with the pulsing of the power supply 1130, 1129.

An embodiment of a magnetically enhanced CVD deposition source magnetic field geometry is shown in FIGS. 31, 32, 36. This geometry, on one side, forms a cusp magnetic field in a gap between an anode and a hollow cathode target and, on another side, forms magnetic field lines that cross a surface of the cathode substantially perpendicular to the cathode surface. Therefore, magnetic field lines from one side terminate on the cathode target surface, and from another side, the magnetic field lines terminate in the gap on the shield 1131 that does not have the same potential as a cathode target, and the shield piece 1131 shields the pole piece 1106, 1109 from the plasma. This magnetic field geometry does not confine secondary electrons near the cathode target surface, as in conventional magnetron sputtering sources. Rather, this magnetic field geometry allows secondary electrons to move from the target surface toward the gap between the cathode and the anode.

A magnetically enhanced CVD source has a hollow cathode target and at least two rows of magnets 1101 and 1102 as shown in FIGS. 31, 32, and 36. The two rows of magnets face each other and provide a magnetic field in the same direction (i.e., south-south or north-north) and, therefore, generate cusp magnetic field geometry 1103 in the gap 1113 between the hollow cathode target 1104 and the anode 1105 where the anode is positioned on top of the hollow cathode target 1104. A pole piece 1106 is disposed between two rows of the magnets 1101, 1102. This pole piece 1106 can be made from magnetic or nonmagnetic material. If the pole piece 1106 is made from magnetic material, the pole piece 1106 concentrates the cusp magnetic field, which can increase a magnetic mirror effect for the electrons drifting from the cathode target surface towards the gap. There is another pole piece 1109 positioned on top of the top row of magnets 1101. This pole piece 1109 is made from magnetic material. The pole piece 1109 is not exposed to plasma through the gap 1110 positioned in the anode 1105 because shield 1131 protects all the poles pieces 1106, 1109 and magnets 1101, 1102. The shield can be connected to power supply 107 or can be grounded or isolated from ground.

In some embodiments, power supply 1107 is an RF power supply. In some embodiments, shield piece 1131 is grounded through inductor 1127 to eliminate the DC bias. Magnetic field lines from the bottom row of the magnets 1102 penetrate the top surface of the hollow cathode target 1104 at a substantially 90-degree angle. Magnetic field lines 1112 from the top row of the magnets terminate on the magnetic shield piece 1131. Magnetic field lines 1111 from the bottom row of magnet 1102 crosses over the magnetic pole pieces 1114, 1115, ring magnet 1116, and cathode target 1104. Another magnetic assembly 1134, 1135 is positioned concentrically to the ring magnet 1116 in a magnetron configuration on the cathode target 1104. Pole pieces 1114, 1115 are made from magnetic material. Magnet 1116 enhances the magnetic field near the cathode target surface. The cathode target 1104 is connected to multiple RF power supplies 1118 with matching network 1128 and optional common exciter 1140. The cathode target 1104 can be also connected to a regulated high-power unipolar voltage pulse power supply 1130 and pulse forming network (PFN) 1129 to produce a resonance asymmetric pulse AC discharge superimposed over RF discharge as shown in FIG. 34. In some embodiments, only two RF power supplies 1118 are connected to the cathode target 1104 as shown in FIG. 33. The power supplies 1118 can run in pulsed mode or continuous mode. The power supplies 1118 can be set to the same frequency or different frequencies. Each frequency is chosen carefully to optimize the ionization process for each element. For example, a carbon atom has a different ionization potential than a metal atom. The same applies to the ionization of gas molecules as well. In some embodiments, a regulated high power unipolar voltage pulse power supply 130 and pulse forming network (PFN) 1129 are used to produce a resonance asymmetric pulse AC discharge when connected to the cathode target 1104 as shown in FIG. 35. In some embodiments, an accelerating grid 1132 positioned parallel to the surface of the hollow cathode target and a power supply 1133 are connected to the accelerating grid providing voltage for ion acceleration from the magnetically enhanced chemical vapor deposition (CVD) plasma source as shown in FIGS. 31, 32, 36. In some embodiments, the voltage power supply 1133 can be operated in continuous or pulsed mode. In some embodiments, the accelerating grid can be grounded. In some embodiments, the shield 1131 can be grounded. In some embodiments, a ground 1125 can be connected to the cathode target 1104 through inductor 1124 and switch 1126. If the cathode target 1104 is inductively grounded, the RF discharge cannot generate a constant negative voltage bias. In this case, there is no sputtering from the cathode target 1104. The switch 1126 can be synchronized in pulse mode to turn on only when at least one RF generator is pulsing and off when it is not. The switching frequency 1126 can be synchronized with the pulsing of the power supply 1130, 1129.

An embodiment of a magnetically enhanced CVD deposition source with hybrid magnetic field geometry is shown in FIGS. 33, 34, 35. This geometry, on one side, forms a cusp magnetic field in a gap between an anode and a hollow cathode target and, on another side, forms magnetic field lines that cross a surface of the cathode substantially perpendicular to the cathode surface. Therefore, magnetic field lines from one side terminate on the cathode target surface, and from another side, the magnetic field lines terminate in the gap on the shield 1131 that does not have the same potential as a cathode target, and the shield piece 1131 shields the pole piece 1106, 1109 from the plasma. Adding a magnetic assembly 1134, 1135 forms a magnetron configuration concentric to pole piece 1115 and magnet 1116 that forms a closed magnetic field on the surface of the cathode target 1104. Some of the magnetic field on magnet 1134 couples to pole piece 1115 and some of the magnetic field on magnet 1135 couples to the cusp field on pole piece 1106. This hybrid magnetic field geometry does not confine secondary electrons near the cathode target surface, as in conventional magnetron sputtering sources, through the gap allowing secondary electrons to move from the target surface toward the gap between the cathode and the anode to break down the gas and improve the ionization of the sputtered material from the inner concentric magnetic field, which forms a magnetron configuration on the surface of the target 1104 to cause sputtering from the cathode target 1104 forming a layer of the substrate.

A magnetically enhanced CVD source includes a hollow cathode target and at least two rows of magnets 1101, 1102 as shown in FIGS. 34, 35, 36. The two rows of magnets face each other and provide a magnetic field in the same direction (i.e., south-south or north-north) and, therefore, generate cusp magnetic field geometry 1103 in the gap 1113 between the hollow cathode target 1104 and the anode 1105, wherein the anode is positioned on top of the hollow cathode target 1104. A pole piece 1106 is disposed between two rows of the magnets 1101, 1102. This pole piece 1106 can be made from magnetic or nonmagnetic material. If the pole piece 1106 is made from magnetic material, the pole piece 1106 concentrates the cusp magnetic field, which can increase a magnetic mirror effect for the electrons drifting from the cathode target surface towards the gap. There is another pole piece 1109 positioned on top of the top row of magnets 1101. This pole piece 1109 is made from magnetic material. The pole piece 1109 is not exposed to plasma through the gap 1110 positioned in the anode 1105 because shield 1131 protects the poles pieces 1106, 1109 and magnets 1101, 1102. The shield is connected to power supply 107, grounded, or isolated from ground.

In some embodiments, power supply 1107 is an RF power supply. In some embodiments, shield piece 1131 is grounded through inductor 1127 to eliminate the DC bias. Magnetic field lines from the bottom row of the magnets 1102 penetrate the top surface of the hollow cathode target 1104 at a substantially 90-degree angle. Magnetic field lines 1112 from the top row of the magnets terminate on the magnetic shield piece 1131. Magnetic field lines 1111 from the bottom row of magnet 1102 cross over the magnetic pole pieces 1114, 1115, ring magnet 1116, and cathode target 1104. Another magnetic assembly 1134, 1135 is positioned concentrically to the ring magnet 1116 in a magnetron configuration on the cathode target 1104. Some of the magnetic field on magnet 1134 couples to pole piece 1115 and some of the magnetic field on magnet 1135 couples to the cusp field on pole piece 1106. In some embodiments, magnet 1134 includes a one-ring magnet, wherein multiple shaped magnets form a ring magnet, or an electromagnet ring. In some embodiments, magnet 1135 includes a single cylindrical magnet, wherein multiple shaped ring magnets form a cylinder or an electromagnet. The concentric magnetic assembly can be stationary or rotating. Pole pieces 1114, 1115 are made from magnetic material. Magnet 1116 enhances the magnetic field near the cathode target surface. The cathode target 1104 is connected to multiple RF power supplies 1118 with matching network 1128 and optional common exciter 1140. The cathode target 1104 can be also connected to a regulated high-power unipolar voltage pulse power supply 1130 and pulse forming network (PFN) 1129 to produce a resonance asymmetric pulse AC discharge superimposed over RF discharge as shown in FIG. 34. In some embodiments, only two RF power supplies 1118 are connected to the cathode target 1104, as shown in FIG. 33. The power supplies 1118 can run in pulsed mode or continuous mode. The power supplies 1118 can be set to the same frequency or different frequencies. Each frequency is selected to optimize the ionization process for each element. For example, a carbon atom has a different ionization potential than a metal atom. The same applies to the ionization of gas molecules as well. In some embodiments, a regulated high-power unipolar voltage pulse power supply 130 and pulse forming network (PFN) 1129 are used to produce a resonance asymmetric pulse AC discharge when connected to the cathode target 1104 as shown in FIG. 35. In some embodiments, an accelerating grid 1132 positioned parallel to the surface of the hollow cathode target and a power supply 1133 are connected to the accelerating grid providing voltage for ion acceleration from the magnetically enhanced chemical vapor deposition (CVD) plasma source, as shown in FIGS. 33, 34, 35. In some embodiments, the voltage power supply 1133 can be operated in continuous or pulsed mode. In some embodiments, the accelerating grid can be grounded. In some embodiments, the shield 1131 can be grounded. In some embodiments, a ground 1125 can be connected to the cathode target 1104 through inductor 1124 and switch 1126. If the cathode target 1104 is inductively grounded, the RF discharge cannot generate a constant negative voltage bias. In this case, there is no sputtering from the cathode target 1104. The switch 1126 can be synchronized in pulse mode to turn on only when at least one RF generator is pulsing and off when at least one RF generator is not pulsing. The switching frequency 1126 can be synchronized with the pulsing of the power supply 1130, 1129.

FIG. 37 shows continuous and pulsed RF voltages with varying pulsed power, respectively, that can be provided by two power supplies 1118. The RF power can be in the range of 100 W-50 kW. The RF frequency can be in the range of 100 kHz-100 MHz. The frequency of RF pulses can be in the range of 100 Hz-100 kHz.

FIG. 38 shows continuous and pulsed RF voltages with pulsed power, respectively, that can be provided by two power supplies 1118. The RF power can be in the range of 100 W-50 kW. The RF frequency can be in the range of 100 kHz-100 MHz. The frequency of RF pulses can be in the range of 100 Hz-100 kHz.

FIG. 39 shows continuous and pulsed RF voltages with varying pulsed power, respectively, that can be provided by two power supplies 1118 superimposed with resonance asymmetric varying AC pulse from a high-power pulse generator feeding a PFN connected to the magnetically enhanced source. The RF power can be in the range of 100 W-50 kW. The RF frequency can be in the range of 100 kHz-100 MHz. The frequency of RF pulses can be in the range of 100 Hz-100 kHz. The resonance asymmetric varying AC pulse is generated by a high-power regulated unipolar negative voltage pulse generator 1130 feeding a PFN 1129 with a plurality of inductors and capacitors tuned to generate a resonance effect on the magnetically enhanced source as shown in FIGS. 31, 34. The resonance asymmetric varying AC pulse can be synchronized with the pulsed RF generator 1118 or not. The resonance asymmetric varying AC pulse can be in the range of 0.1-20 KW/cm2, the frequency can be in the range of 1 Hz-100 KHz, the negative voltage can be in the range of −50 to −5000V and the positive voltage can be in the range of 10 to 5000V. The pulse width of the unipolar voltage pulse feeding the PFN can be in the range of 0.1-1000 microseconds. The arc suppression can be triggered by either generators 1118 or 130 as the master trigger and the other supply can be in slave mode until the arc is cleared.

FIG. 40 shows pulsed RF voltages with varying pulsed power on a magnetically enhanced device as shown in FIGS. 32, 33, that can be provided by one power supply 118. The RF power can be in the range of 100 W-50 kW. The RF frequency can be in the range of 100 kHz-100 MHz. The frequency of RF pulses can be in the range of 100 Hz-100 kHz. Either source can have the cathode target 104 connected to an inductor 1124 to ground 1125 through a switch. When connected to ground, the RF generator 1118 cannot generate a DC voltage bias on the target.

FIG. 41 shows pulsed RF voltages with varying pulsed power on a magnetically enhanced device as shown in FIGS. 32, 33 that can be provided by multiple power supplies 1118. The RF power can be in the range of 100 W-50 kW. The RF frequency can be in the range of 100 kHz-100 MHz. The frequency of RF pulses can be in the range of 100 Hz-100 kHz. Either source can have the cathode target 1104 connected to an inductor 1124 to ground 1125 through a switch. When connected to ground, the RF generator 1118 cannot generate a DC voltage bias on the target.

FIG. 42 shows continuous and pulsed RF voltages with varying pulsed power, respectively, that can be provided by two power supplies 1118 superimposed with resonance asymmetric varying AC pulses from a high-power pulse generator feeding a PFN connected to the magnetically enhanced source. The RF power can be in the range of 100 W-50 kW. The RF frequency can be in the range of 100 kHz-100 MHz. The frequency of RF pulses can be in the range of 100 Hz-100 kHz. The resonance asymmetric AC pulse is generated by a high-power regulated unipolar negative voltage pulse generator 1130 feeding a PFN 1129 with a plurality of inductors and capacitors tuned to generate a resonance effect on the magnetically enhanced source as shown in FIGS. 32, 34. The resonance asymmetric AC pulse can be synchronized with the pulsed RF generator 1118 or not. The resonance asymmetric varying AC pulse can be in the range of 0.1-20 KW/cm2, the frequency can be in the range of 1 Hz-100 KHz, the negative voltage can be in the range of −50 to −5000V, and the positive voltage can be in the range of 10-5000V. The pulse width of the unipolar voltage pulse feeding the PFN can be in the range of 0.1-1000 microseconds. The arc suppression can be triggered by either generators 1118, 1130 as the master trigger, and the other supply will be in slave mode until the arc is cleared. In some embodiments, the superimposed resonance asymmetric AC pulse can be a resonance symmetric AC pulse.

FIG. 43 shows continuous RF voltages with varying power on a magnetically enhanced device as shown in FIGS. 32, 33, respectively, which can be provided by two power supplies 118. The RF power can be in the range of 100 W-50 kW. The RF frequency can be in the range of 100 kHz-100 MHz. The frequency of RF pulses can be in the range of 100 Hz-100 kHz. The generators can run at different frequencies from each other. In some embodiments, the common exciter (CEX) 1140 is used to prevent unwanted beat frequencies. Two RF generators can be phase-locked together so that the generators run at the same frequency and with a fixed phase relationship between their outputs. This locking ensures repeatable RF characteristics within the plasma.

FIG. 44 shows continuous and pulsed resonance asymmetric AC pulses generated by a high-power regulated unipolar negative voltage pulse generator 1130 feeding a PFN 1129 with a plurality of inductors and capacitors tuned to generate a resonance effect on the magnetically enhanced source as shown in FIGS. 35, 36. The resonance asymmetric varying AC pulse can be in the range of 0.1-20 KW/cm2, the frequency is in the range of 1 Hz-100 KHz, the negative voltage is in the range of −50 to −5000V, and the positive voltage is in the range of 10 to 5000V. The pulse width of the unipolar voltage pulse feeding the PFN can be in the range of 0.1-1000 microseconds. In some embodiments, the superimposed resonance asymmetric AC pulse can be resonance symmetric AC pulse.

FIG. 45 show continuous and pulsed resonance asymmetric AC pulses with multiple voltage peaks generated by a high-power regulated unipolar negative voltage pulse generator 1130 feeding a PFN 1129 with a plurality of inductors and capacitors tuned to generate a resonance effect on the magnetically enhanced source as shown in FIGS. 35, 36. The resonance asymmetric varying AC pulse can be in the range of 0.1-20 KW/cm2, the frequency in the range of 1 Hz-100 KHz, the negative voltage can be in the range of −50 to −5000V, and the positive voltage can be in the range of 10 to 5000V. The pulse width of the unipolar voltage pulse feeding the PFN can be in the range of 0.1-1000 microseconds. In some embodiments, the superimposed resonance asymmetric AC pulse can be resonance symmetric AC pulses.

FIG. 46 show continuous and pulsed RF voltages with varying pulsed power, respectively, that can be provided by two power supplies 1118 superimposed with resonance asymmetric varying AC pulses from a high-power pulse generator feeding a PFN connected to the magnetically enhanced source. The RF power can be in the range of 100 W-50 kW. The RF frequency can be in the range of 100 kHz-100 MHz. The frequency of RF pulses can be in the range of 100 Hz-100 kHz. The resonance asymmetric AC pulse is being generated by a high power regulated unipolar negative voltage pulse generator 1130 feeding a PFN 1129 with a plurality of inductors and capacitors tuned to generate a resonance effect on the magnetically enhanced source as shown in FIGS. 31, 34 be have a single voltage and multiple voltage peaks on the negative part of the AC cycle. The resonance asymmetric AC pulse can be synchronized with the pulsed RF generator 1118 or not. The resonance asymmetric varying AC pulse can be in the range of 0.1-20 KW/cm2, the frequency in the range of 1 Hz-100 KHz, the negative voltage range can be in the range of 50 to 5000V, and the positive voltage can be in the range of 10 to 5000V. The pulse width of the unipolar voltage pulse feeding the PFN can be in the range of 0.1-1000 microseconds. The arc suppression can be triggered by either generators 1118, 1130 as the master trigger and the other supply will be in slave mode until the arc is cleared. In some embodiments, the superimposed resonance asymmetric AC pulse can be resonance symmetric AC pulse.

FIG. 47 (a) shows input unipolar negative pulses applied to a PFN 1129 connected to the magnetically enhanced source as shown in FIGS. 35, 36 and the output high-power negative DC pulse of the PFN 1129 on the magnetically enhanced source as shown in FIGS. 35, 36. The high-power negative DC pulse is generated by a multiple high-power regulated unipolar negative voltage pulse generator 130 feeding a PFN 1129 with a plurality of inductors and capacitors tuned to generate a DC voltage output. The DC pulse can be in the range of 0.1-20 KW/cm2, the frequency in the range of 1 Hz-100 KHz, and the negative voltage in the range of −50 to −5000V. The pulse width of the unipolar voltage pulse feeding the PFN can be in the range of 0.1-1000 microseconds and the output pulse of the PFN 1129 can be in the range 50 to 50000 microseconds.

FIG. 47 (b) shows input unipolar negative pulses to a PFN or PCN 1129 connected to the magnetically enhanced source as shown in FIGS. 35, 36 and output high-power oscillatory negative DC pulses of the PFN or PCN 1129 on the magnetically enhanced source as shown in FIGS. 35, 36. The high-power oscillatory negative DC pulse is generated by a multiple high-power regulated unipolar negative voltage pulse generator 1130 feeding a PFN or PCN 1129 with a plurality of inductors and capacitors tuned to generate a DC voltage output. The oscillatory DC pulse can be in the range of 0.1-20 KW/cm2, the frequency in the range of 1 Hz-100 KHz, and the negative voltage in the range of −50 to 5000V. The pulse width of the unipolar voltage pulse feeding the PFN can be in the range of 0.1-1000 microseconds and the output pulse of the PFN or PCN can be in the range 50-50000 microseconds. The oscillation on the oscillatory DC pulse can be +/−99% of the input unipolar negative pulse values.

FIG. 47 (c) shows input unipolar negative pulses to a PFN or PCN 1129 connected to the magnetically enhanced source as shown in FIGS. 35, 36 and the output pulsed resonance asymmetric AC pulse generated by a high-power regulated unipolar negative voltage pulse generator 1130 feeding a PFN or PCN 1129 with a plurality of inductors and capacitors tuned to generate a resonance effect on the magnetically enhanced source as shown in FIGS. 35, 36. The resonance asymmetric varying AC pulse can be in the range of 0.1-20 KW/cm2, the frequency in the range of 1 Hz-100 KHz, the negative voltage can be in the range of 50-5000V, and the positive voltage can be in the range of 10-5000V. The pulse width of the unipolar voltage pulse feeding the PFN or PCN 1129 can be in the range of 0.1-1000 microseconds. In some embodiments, the superimposed resonance asymmetric AC pulse can be a resonance symmetric AC pulse.

FIG. 48 (*a*) show the components of a high-power pulse generator 1130, which utilizes high-power regulated voltage source 1135 charging a pulse generator 1136 with programmable pulse frequency, pulse width, and voltage level. The pulse generator 1136 produces negative unipolar voltage pulses feeding a second PFN or pulse converter network (PCN) 1129 with a plurality of inductors and capacitors arranged in a configuration with values to produce a desired pulsed output on the magnetically enhanced source 1137. In some embodiments, the pulse generator 1136 can have an isolated output utilizing a transformer and a full-wave diode bridge feeding a built in PFN to adjust voltage rise-time and fall-time. The output from the isolated pulse voltage generator feeds the second PFN or PCN 1129, which is connected to the magnetically enhanced source 1137. In some embodiments, the magnetically enhanced source 1137 can be configured as shown in FIG. 36, in which the magnetic field directly coupled to the cusp field through the gap 1103, or FIG. 35, in which the magnetic field is directly coupled to the cusp field through the gap 1103 and an inner magnetic assembly forming a magnetron configuration on the cathode target 1104. In some embodiments, a portion of the magnetic field 1111 can couple with the magnetic field 1112. In some embodiments, an arc suppression circuit 1134 can be included. A voltage probe 1138 and current sensor 1141 are coupled between the second PFN or PCN 1129 and the magnetically enhanced source 1137 to measure voltage and current on the magnetically enhanced source 1137. These measurement signals are ultimately fed to the microcontroller circuit 1139, which is controlled by a computer 1140. The data from these sensors can be used to determine peak pulse values and average value of either voltage or current. Peak power and average power can be calculated. The sensors can be used for over-voltage and over-current protection. The high-power pulse generator 1130 can be programmed to run in continuous mode or pulsed burst mode to prevent the cathode 1104 from thermal damage. The pulsed burst mode can be programmed to have a varying unipolar voltage level forcing the second PFN or PCN 1129 to produce a varying resonance pulse output on the magnetically enhanced source 1137, thereby generating high density plasma that is inductively current driven. The resonance asymmetric varying AC pulse can be in the range of about 0.1-20 KW/cm2, the frequency in the range of about 1 Hz-100 KHz, the negative voltage in the range of about −50 to −5000V, and the positive voltage in the range of about 10 to 5000V. The pulse width of the unipolar voltage pulse feeding the PFN can be in the range of about 0.1-1000 microseconds, and the unipolar voltage pulse level can be in the range of about −50 to 4000V. In some embodiments, the superimposed resonance asymmetric AC pulse can be a resonance symmetric AC pulse with variable peak voltage levels.

FIG. 48 (*b, c*) show the input unipolar negative voltage pulses to a PFN 1129 connected to the magnetically enhanced source as shown in FIGS. 35, 36 with variable voltage levels in two different bursts f4 and f5. V7<V8 and the output pulsed resonance asymmetric AC pulse is generated by a high-power regulated unipolar negative voltage pulse generator 1130 feeding the PFN 1129 with a plurality of inductors and capacitors tuned to generate a resonance effect on the magnetically enhanced source as shown in FIGS. 35, 36 with variable peak voltage levels. The resonance asymmetric varying AC pulse can be in the range of 0.1-20 KW/cm2, the frequency in the range of 1 Hz-100 KHz, the negative voltage in the range of −50 to −5000V, and the positive voltage in the range of 10 to 5000V. The pulse width of the unipolar voltage pulse feeding the PFN can be in the range of 0.1-1000 microseconds and the unipolar voltage pulse level can be in the range of −50 to −4000V. In some embodiments, the superimposed resonance asymmetric AC pulse can be a resonance symmetric AC pulse with variable peak voltage levels.

FIG. 49 shows an illustrative view of a magnetically enhanced HEDP sputtering apparatus, which includes a single magnetically and electrically enhanced HEDP source connected to a high-power pulse generator with multiple output options that provides an asymmetric resonance AC discharge on the target or non-resonance high-power pulse DC discharge coupled with a programmable positive pulse generator. The apparatus 2000 also includes a substrate holder configured to provide heating and cooling capability, as well as different biasing options. The apparatus 2000 also provides a discharge that forms a layer on the substrate that can be biased in a variety of ways by a passive device, such as a fast switching diode, or actively, such as by using a bias power supply.

Figure 20B:
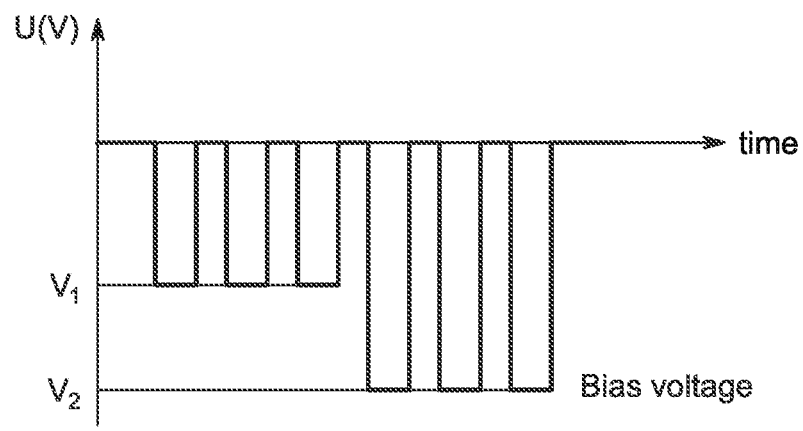
Figure 20C:
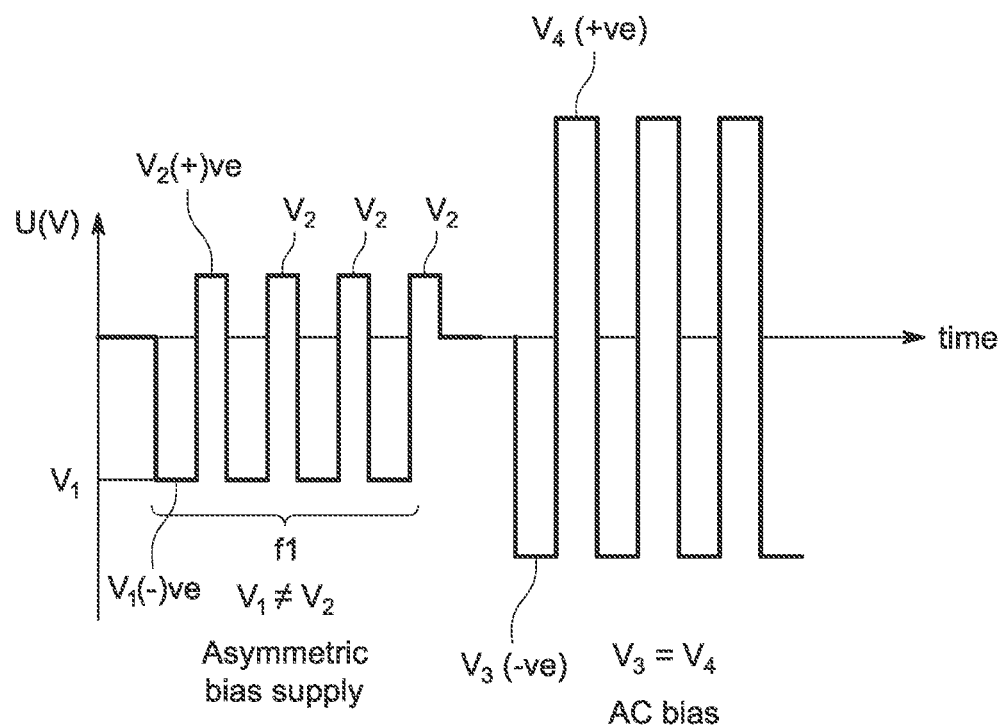

In some embodiments, the magnetically enhanced HEDP sputtering apparatus 2000 includes a substrate support 2038 that holds a substrate 2034 or other work piece for plasma processing. The substrate support 2038 can be stationary, scanning, and/or rotating at about 1-200 rpm. In some embodiments, the substrate support 2038 can be electrically connected to a bias voltage power supply 2032 or multiple bias voltage power supplies 2032 through a switch 2031. The switch 2031 can be mechanical or electronic, which includes for example, an insulated-gate bipolar transistor (IGBT), high-voltage fast-switching NPN power transistor, MOSFET, and/or discrete silicon carbide MOSFETs with multiple contactors to actively select part of the bias circuitry, as needed by the process to produce desired and improved film properties, including but not limited to film hardness, smoothness, stress, electrical, adhesion, and/or grain size structure. Specifically, four contactors enable the user to select an appropriate mode of substrate 2034 biasing. The bias voltage power supply 2032 can include a radio frequency (RF) power supply, alternating current (AC) power supply, very high frequency (VHF) power supply, and/or direct current (DC) power supply. The bias power supply 2032 can operate in continuous mode or pulsed mode. The bias power supply 2032 can be a combination of two different RF power supplies that can provide different frequencies. The negative bias voltage on the substrate is in a range of about 0 to −2000 V. In some embodiments, the bias power supply can be connected in series with a fast-switching-recovery diode or fast recovery epitaxial diode (FRED) 2048 and the substrate 2034 to select whether or not an electronic component or ionic component of the plasma on the substrate 2034 is biased. If the cathode junction of the fast-switching-recovery diode or fast recovery epitaxial diode (FRED) 2048 is grounded, then the energetic positive ions in the plasma can be accelerated towards the substrate 2034 to form a layer with the desired and improved film properties, such as film hardness, smoothness, stress, electrical, adhesion, and/or grain size structure. This selective biasing enables control of the temperature of the substrate 2034. For example, harder, smoother, lower stress amorphous hydrogen-free diamond-like carbon (DLC) films can form on the substrate 2034 if the substrate holder is connected to a fast-switching recovery diode or fast recovery epitaxial diode (FRED) 2048 with the cathode junction connected to earth ground. In some embodiments, the bias power supply generates a pulse bias with different voltage pulse frequencies, amplitudes, and/or shapes as shown in FIG. 20B. In some embodiments, the bias power supply generates an AC bias with different voltage pulse frequencies, amplitudes, and/or shapes as shown in FIG. 20C. In some embodiments, the bias voltage is a pulse voltage. The negative substrate bias voltage can attract positive ions to the substrate 2034. In some embodiments, the bias power supply 2032 is connected in series with switch 2047 and a series diode 2048 to selectively bias the desired electrical components, by either electronic current or ionic current, on the substrate holder 2038. The substrate support 2038 can include a heater 2035 that is connected to a temperature controller 2033. The substrate support 2038 can be electrically connected to earth ground 2020 through a switch 2047. The switch 2047 can be mechanical or electronic, including an IGBT, high-voltage fast-switching NPN power transistor, MOSFET, and/or discrete silicon carbide MOSFET, which can be accurately timed to turn on or synchronized as soon as the substrate holder 2038 is detected as being positively charged to +0.1V or more. The substrate support 2038 can be electrically connected in series to the fast-switching, fast-recovery diode or fast recovery epitaxial diode (FRED) 2048, and the other end of the fast-switching, fast-recovery diode or fast recovery epitaxial diode (FRED) 2048 can be connected to earth ground 2020 through an optional switch 2031. The switch 2031 can be mechanical or electronic, which includes an IGBT, high-voltage fast-switching NPN power transistor, MOSFET, and/or discrete silicon carbide MOSFET, which can be accurately timed to turn on or synchronized as soon as the substrate holder 2038 is positively charged. The direction of the fast-switching, fast-recovery diode or fast recovery epitaxial diode (FRED) 2048 allows either the positive charge or the negative charge to be selectively grounded on the substrate support 2038 by grounding either the cathode or the anode junction of the fast-switching, fast-recovery diode or fast recovery epitaxial diode (FRED) 2048. By grounding the cathode junction of the fast-switching, fast-recovery diode or fast recovery epitaxial diode (FRED) 2048, positive ions in the plasma inside the sputtering apparatus 2000 are attracted towards the substrate 2034 to form a layer with the desired film properties. The temperature controller 2033 regulates the temperature of the substrate 2034. In an embodiment, the temperature controller 2033 controls the temperature of the substrate 2034 to be in a range of about 20° C. to (+1000°) C. The substrate support 2038 can include the ability to cool the substrate 2034 in a range of about −300° C. to 20° C. by passing coolant through the cooling ports 2036, 2037 on the substrate support 2038. The substrate support 2038 can be electrically connected to earth ground 2020 through a switch 2031.

The magnetically enhanced HEDP sputtering apparatus 2000 includes a magnetically and electrically enhanced HEDP source 2005. The magnetically and electrically enhanced HEDP source 2005 is mounted inside a vacuum chamber 2001. The magnetically and electrically enhanced HEDP source or magnetron 2005 has a magnetic assembly 2019 forming an outer magnet 2016 and an inner magnet 2017 enclosing the magnetic field 2012. The field can be balanced or unbalanced towards the substrate 2034. The unbalanced magnetic field can increase the plasma ionization at the substrate 2034 by up to 100 times. The magnets in the magnetic assembly 2019 can be permanent magnets or electromagnets with fields ranging from 100 to 10000 G at the surface of the target 2010. The magnetic assembly can be stationary or rotating from 1 to 600 rpm. The magnetron 2005 has a target 2010 that is either bonded or clamped to a backing plate 2011. The target 2010 material can be a single element or a compound material. The target 2010 geometry can be flat round, cylindrical, rectangular and/or cup-shaped. The target 2010 material can be a single element or compound material with at least two elements. The vacuum chamber 2001 contains a feed gas system 2004, pressure gauge 2003, and plasma, and is coupled to ground. The vacuum chamber 2001 is positioned in fluid communication with a vacuum pump 2002 that can evacuate the feed gas from the vacuum chamber 2001. Typical baseline pressure in the vacuum chamber 2001 is in a range of $10^{-5}$ to $10^{-9}$ Torr. The feed gas through 2004 can include a noble gas, such as Ar, Ne, Kr, Xe; a reactive gas, such as $N_2$, $O_2$; and/or any other gas that is suitable for sputtering processes. For depositing DLC or diamond films, the feed gas contains atoms of carbon. For example, the cathode target material is carbon. The feed gas can be $C_2H_2$, or $CH_4$ or any other gases/vapors that contain carbon atoms, such as CO, $CO_2$, $C_3H_8$, $CH_3OH$, $C_2H_5OH$, and/or $CH_3Cl$. The feed gas can also include a mixture of different of gases. The feed gas can be a combination of nobles gases, such Ar and Ne. In some embodiments, the cathode target material does not include carbon. The target 2010 can include the following chemical elements, or a combination of any two or more of these elements can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases, such as $O_2$, $N_2$, F, Cl, and/or $H_2$, can also be used as the cathode material. The magnetron 2005 includes cooling medium passing through 2014, 2013 to cool the target 2010 during the sputtering process.

The magnetically and electrically enhanced HEDP source 2005 includes an anode 2006 that can be grounded to earth ground 2020, either directly or through a switch 2047. The switch 2047 can be mechanical or electronic, which includes an insulated-gate bipolar transistor (IGBT), high-voltage fast-switching NPN power transistor, MOSFET, and/or discrete silicon carbide MOSFET that can be accurately timed to turn on or synchronized based on the process. The anode 2006 can be floating. The anode 2006 can be biased using a bias power supply 2029. The bias voltage power supply 2032 can include a radio frequency (RF) power supply, alternating current (AC) power supply, very high frequency (VHF) power supply, and/or direct current (DC) power supply. The bias power supply 2032 can operate in continuous mode or pulsed mode. The bias power supply 2032 can be a combination of two different RF power supplies that can provide different frequencies. The negative bias voltage on the substrate is in a range of about 0 to −2000 V. In some embodiments, the bias power supply generates a pulse bias with different voltage pulse frequencies, amplitudes, and/or shapes as shown in FIG. 20B. In some embodiments, the bias power supply generates an AC bias with different voltage pulse frequencies, amplitudes, and shapes as shown in FIG. 20C. In some embodiments, the voltage is a pulse voltage. The anode 2006 can be made of the same material as the target 2010. The anode 2006 can be biased negatively in a continuous or pulsed manner synchronously or asynchronously with respect to the main asymmetric AC discharge on the target 2010. The negative voltage can be −[10, 10,000] V. By biasing the anode negatively, the anode acts as an electrostatic reflector that can increase the ionization of the sputtered material from the target 2010. In some embodiments, the anode can be biased with a positive voltage, which can aid in accelerating ions towards the substrate 2034. The positive voltage can be +[10, 10,000] V. In some embodiments, the anode 2006 can be coupled directly or by a switch 2047 to the high-power pulse resonance AC power supply 2040. The switch 2047 can be mechanical or electronic, which includes an insulated-gate bipolar transistor (IGBT) or high-voltage fast-switching NPN power transistor, MOSFET, and/or discrete silicon carbide MOSFET that can be accurately timed to turn on or externally synchronized with the main high-power pulse resonance AC power supply 2040. In some embodiments, the anode 2006 material can be made of the same material as the target 2010.

The high-power pulse resonance AC power supply 2040 includes a regulated voltage source with variable power feeding 2023, a high-power pulsed power supply with programmable voltage pulse frequency and amplitude 2022, and a second tunable PFN 2021 as shown in FIG. 49. A high-power pulsed power supply with programmable voltage pulse frequency, width, amplitude, and burst length 2022 includes a computer 2026 and controller 2025. A regulated voltage source with variable power feeding 2023 supplies voltage in the range of 100 to 5000 V to the high-power pulsed power supply with programmable voltage pulse frequency, width, and amplitude, and burst length 2022. The high-power pulsed power supply with programmable voltage pulse frequency, width, amplitude, and burst length 2022 generates a train of unipolar negative voltage DC pulses to the tunable PFN 2021. The amplitude of the unipolar negative voltage pulses is in the range of 100 to 5000 V, and the duration of each of the voltage pulses is in the range of 1 to 100 µs. The distance between voltages pulses can be in the range of 0.4 to 1000 µs, thereby controlling the frequency to be between 0.1 to 400 kHz. In some embodiments, there is a step-up transformer coupled between the high-power pulsed power supply with programmable voltage pulse frequency, width, amplitude, and burst length 2022 and the second tunable PFN 2021. In this case, the high-power pulsed power supply with programmable voltage pulse frequency, width, and burst length 2022 generates a train of AC voltage waveforms that is provided to the step-up transformer. In some embodiments, a diode bridge is coupled between the step-up transformer and tunable PFN 2021. The tunable PFN 2021 includes a plurality of specialized variable inductors L1-L4 and a plurality of specialized variable capacitors C1-C2 for high-power pulse applications. The value of the inductors and capacitors can be controlled by computer 2026 and/or controller 2025. In some embodiments, at least one inductor and/or one capacitor is variable, and its value can be computer controlled. Values of each of the inductors L1-L4 can be in the range of 0 to 1000 µH. Values of each of capacitors C1-C4 can be in the range of 0 to 1000 µF. The high-power pulse programmable power supply 2040 is connected to controller 2025 and/or computer 2026. Controller 2025 and/or computer 2026 control output values and timing of the power supply 2040. Power supply 2040 can operate as a stand-alone unit without connection to the controller 2025 and/or computer 2026. The high-power pulse resonance AC power supply 2040 generates an asymmetric high power AC pulse on the target 2010 that forms a layer on the substrate 2034 inside the HEDP sputtering apparatus 2000. The high-power pulse resonance AC discharge can have a high-power negative pulse followed by a positive pulse and a second negative pulse that acts as a glow discharge for the new asymmetric AC cycle as shown in FIG. 51 The high-power pulse resonance AC power supply 2040 can be programmed to generate a negative unipolar programmable pulse amplitude and duration before the burst of the main high-power pulse resonance pulses that can be used as the ignition pulse or a glow discharge as shown in FIGS. 51 and 52. The negative unipolar pulse can be programmed to start before each burst of the high-power pulse resonance pulses. The ignition pulse can be in the range of −[100, 5000]V and have a duration in the range of [1-1000] microseconds, as shown in FIGS. 1E, 51, and 52. In some embodiments, the PFN 2021 can be connected in series with a switch 2047 to send pulses from the high-power pulse generator through the PFN 2021. In some embodiments, the PFN 2021 is bypassed and high-power non resonance unipolar pulses are sent directly from the high-power pulsed power supply with programmable voltage pulse frequency, width, amplitude, and burst length 2022 to the HEDP source 2005 high-power pulsed DC discharge on the target. Each negative high power unipolar pulse can be followed by a synchronized positive pulse from the programmable amplitude, pulse width, and frequency positive pulser 2028 and the DC power supply 2024. The negative pulses from the high-power pulsed power supply with programmable voltage pulse frequency, width, amplitude, and burst length 2022 can be in the range of −[100-5000]V, [1 Hz-400 kHz] and [1-10,000] microseconds, and positive pulses from the positive pulser can be in the range of +[100-5000]V, [1 Hz-400 kHz] and [1-10,000] microseconds. The positive pulses can aid in reducing arcing on the target and repelling ions away from the target 2010 to the substrate 2034. In some embodiments, high-power unipolar negative pules are sent directly from the high-power pulsed power supply with programmable voltage pulse frequency, width, amplitude, and burst length 2022 to the HEDP source 2005. The negative pulses from the high-power pulsed power supply with programmable voltage pulse frequency, width, amplitude, and burst length 2022 can be in the range of −[100-5000]V, [1 Hz-400 kHz], and [1-10,000] microseconds.

The magnetically enhanced HEDP sputtering apparatus 2000 may include a magnetically and electrically enhanced shield 2030. The magnetically and electrically enhanced shield 2030 includes a set of shields that can either be grounded through switch 2047 or electrically biased through a bias power supply 2041. The bias voltage power supply 2041 can include a radio frequency (RF) power supply, alternating current (AC) power supply, very high frequency (VHF) power supply, and/or direct current (DC) power supply. The bias power supply 2041 can operate in continuous mode or pulsed mode. The bias power supply 2041 can be a combination of two different RF power supplies that can provide different frequencies. The negative bias voltage on the substrate is in a range of about 0 to −2000 V. The magnetically and electrically enhanced shield 2030 can include a magnetic assembly 2042. The magnetic assembly 2042 includes two sets of magnets 2044,2045 forming a closed field 2043 that can be balanced or unbalanced. The magnets 2044, 2045 can be permanent magnet or electromagnets. If the magnets 2044, 2045 are electromagnets, then the magnets 2044, 2045 can run in either continuous or pulsed mode and be synchronized with main pulsing on the HEDP source 2005.

FIG. 50 shows an illustrative view of a magnetically enhanced HEDP sputtering apparatus with multiple magnetically and electrically enhanced HEDP sources connected to a high-power pulse generator with multiple output options that provides an asymmetric resonance AC discharge on the target or non-resonance high-power pulse DC discharge coupled with a programmable positive pulse generator. The apparatus 2400 also includes a substrate holder configured to provide heating and cooling capability, as well as different biasing options. The apparatus 2400 provides a high power asymmetric AC discharge on the target that forms a layer on the substrate that can be biased in a variety of ways by a passive device, such as fast switching diode, or actively, by using a bias power supply.

The magnetically enhanced HEDP sputtering apparatus 2400 includes a substrate support 2409 that holds a substrate 2408 or other work piece for plasma processing. The substrate support 2409 can be stationary or rotating at about 1-200 rpm. The substrate support 2409 can be electrically connected to a bias voltage power supply 2032 or multiple bias voltage power supplies 2445 through a switch 2450. The switch 2450 can be mechanical or electronic, which includes an insulated-gate bipolar transistor (IGBT) or high-voltage fast-switching NPN power transistor, MOSFET, and/or discrete silicon carbide MOSFETs that can be accurately timed to turn on or synchronized with multiple contactors to actively select part of the bias circuitry as needed by the process to produce the desired film properties, such as film hardness, smoothness, stress, electrical, adhesion, and/or grain size structure. In this embodiment, four contactors are used to enable the user to select an appropriate mode of substrate 2408 biasing. The bias voltage power supply 2445 can include a radio frequency (RF) power supply, alternating current (AC) power supply, very high frequency (VHF) power supply, and/or direct current (DC) power supply. The bias power supply 2445 can operate in continuous mode or pulsed mode. The bias power supply 2445 can be a combination of two different RF power supplies that can provide different frequencies. A negative bias voltage on the substrate is in a range of about 0 to −2000 V. In some embodiments, the bias power supply can be connected in series with a fast-switching-recovery diode or fast recovery epitaxial diode (FRED) 2446 and the substrate 2408 to select whether or not to bias the electronic component or the ionic component on the substrate 2408. In some embodiments, the bias power supply can be connected in series with a fast-switching-recovery diode or fast recovery epitaxial diode (FRED) 2446 and the substrate 2408 to select whether or not an electronic component or ionic component of the plasma on the substrate 2408 is biased. If the cathode junction of the fast-switching-recovery diode or fast recovery epitaxial diode (FRED) 2446 is grounded, then the energetic positive ions in the plasma can be accelerated towards the substrate 2408 to form a layer with the desired and improved film properties, such as film hardness, smoothness, stress, electrical, adhesion, and/or grain size structure. This selective biasing enables control of the temperature of the substrate 2408. For example, harder, smoother, lower stress amorphous hydrogen-free diamond-like carbon (DLC) films with the desired SP2 & SP3 bond ratio in the film can form on the substrate 2408 if the substrate holder is connected to a fast-switching recovery diode or fast recovery epitaxial diode (FRED) 2446 with the cathode junction connected to earth ground. In some embodiments, the bias power supply generates a pulse bias with different voltage pulse frequencies, amplitudes, and/or shapes as shown in FIG. 20B. In some embodiments, the bias power supply generates an AC bias with different voltage pulse frequencies, amplitudes, and/or shapes as shown in FIG. 20C. In some embodiments, the voltage is a pulse voltage. The negative substrate bias voltage can attract positive ions to the substrate 2408. In some embodiments, the bias power supply 2445 is connected in series with switch 2440 and a series diode 2446 to selectively bias the desired electrical components, by either electronic current or ionic current, on the substrate 2408. The substrate support 2409 can include a heater 2406 connected to a temperature controller 2407. The substrate support 22409 can be electrically connected to earth ground 2401 through a switch 2450. The switch 2450 can be mechanical or electronic, which includes an IGBT, high-voltage fast-switching NPN power transistor, MOSFET, and/or discrete silicon carbide MOSFET that can be accurately timed to turn on or synchronized as soon as the substrate holder 2409 is positively charged at +0.1V. The substrate support 2409 can be electrically connected in series to a fast-switching, fast-recovery diode and/or fast recovery epitaxial diode (FRED) 2446, and the other end of the fast-switching, fast-recovery diode or Fast recovery epitaxial diode (FRED) 2446 can be connected to earth ground 2401. The switch 2446 can be mechanical or electronic, which includes an IGBT, high-voltage fast-switching NPN power transistor, MOSFET, and/or discrete silicon carbide MOSFET which can be accurately timed to turn on and/or synchronized. The connection direction of the fast-switching, fast-recovery diode or fast recovery epitaxial diode (FRED) 2446 enables selective grounding of the positive charge or the negative charge on the substrate support 2408 by grounding either the cathode or the anode junction of the fast-switching, fast-recovery diode, or fast recovery epitaxial diode (FRED) 2446. By grounding the cathode junction of the fast-switching, fast-recovery diode, or Fast recovery epitaxial diode (FRED) 2446, the positive ions in the plasma inside the sputtering apparatus 2400 are attracted towards the substrate 2408 to form a layer. By grounding the cathode junction of the fast recovery epitaxial diode (FRED) 2446, the substrate support 2409 is shorted if voltage on the substrate support 2409 is positive. The temperature controller 2407 regulates temperature of the substrate 2408. In an embodiment, the temperature controller 2407 controls temperature of the substrate 2408 to be in a range of about 20° C. to 1000° C. The substrate support 2409 can cool the substrate 2408 in a range of about −300° C. to 20° C. by passing coolant through the cooling ports 2411, 2412 through the substrate support 2409. The substrate support 2409 can be electrically connected to earth ground 2401 through a switch 2450.

The magnetically enhanced HEDP sputtering apparatus 2400 includes at least two magnetically and electrically enhanced HEDP source 2414. The magnetically and electrically enhanced HEDP source 2414 is mounted inside a vacuum chamber 2405. The magnetically and electrically enhanced HEDP source 2414 includes a magnetic assembly 2423 forming an outer magnet 2422 and inner magnet 2421 enclosing the magnetic field 2418. The field can be balanced or unbalanced towards the substrate 2408. The unbalanced magnetic field can increase the plasma ionization at the substrate 2408 by up to 100 times. The magnets in the magnetic assembly 2423 can be permanent magnets or electromagnets with fields ranging from 100-10000 G at the surface of the target 2419. The magnetic assembly can be stationary or rotating from 1-600 rpm. The outer magnetic field 2422 from one magnetron 2414 can couple with the outer magnetic field 2422 of the second cathode surrounding the substrate 2408 over 360 degrees, thereby confining the plasma around the substrate to increase ionization at the substrate 2408. The magnetron 2414 includes a target 2419 that is either bonded or clamped to a backing plate 2425. The target 2419 material can be a single element or compound material. The target geometry can be flat, round, cylindrical, rectangular, and/or cup-shaped. The vacuum chamber 2405 contains a feed gas system 2404, pressure gauge 2403, and plasma, and is coupled to ground. The vacuum chamber 2405 is positioned in fluid communication with a vacuum pump 2402, which can evacuate the feed gas from the vacuum chamber 2405. Typical baseline pressure in the vacuum chamber 2405 is in a range of $10^{-5}$ to $10^{-9}$ Torr. The feed gas through the feed gas system 2404 can include a noble gas, such as Ar, Ne, Kr, and/or Xe; a reactive gas, such as $N_2$ and/or $O_2$; and/or any other gas that is suitable for sputtering processes. For depositing DLC or diamond films, the feed gas contains atoms of carbon. For example, the cathode target material is carbon. The feed gas can be $C_2H_2$, $CH_4$ or any other gases/vapors contains carbon atoms, such as CO, $CO_2$, $C_3H_8$, $CH_3OH$, $C_2H_5OH$, and/or $CH_3Cl$. The feed gas can also be a mixture of different of gases. The feed gas can be a combination of nobles gases, such Ar and/or Ne. In some embodiments, the cathode target material is not a carbon. The target 2419 can include the following chemical elements, and/or a combination of any two or more of these elements, which can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases, such as $O_2$, $N_2$, F, Cl, and/or $H_2$ can also be used as the cathode material. The magnetron 2414 has cooling medium passing through channels 2416, 2415 to cool the target 2419 during the sputtering process.

The magnetically and electrically enhanced HEDP source 2414 includes an anode 2428 that can be grounded to earth ground 2401, either directly or through a switch 2440. The switch 2440 can be mechanical or electronic, which includes an IGBT, high-voltage fast-switching NPN power transistor, MOSFET, and/or discrete silicon carbide MOSFET that can be accurately timed to turn on and/or synchronized with the high-power pulse power supply 2434. The anode 2428 can be floating. The anode 2428 can be biased using a bias power supply 2439. The bias voltage power supply 2439 can include a radio frequency (RF) power supply, alternating current (AC) power supply, very high frequency (VHF) power supply, and/or direct current (DC) power supply. The bias power supply 2439 can operate in continuous mode or pulsed mode. The bias power supply 2439 can be a combination of two different RF power supplies that can provide different frequencies. The negative bias voltage on the substrate is in a range of about 0 to −2000 V. In some embodiments, the bias power supply 2439 generates a pulse bias with different voltage pulse frequencies, amplitudes, and/or shapes as shown in FIG. 20B. In some embodiments, the bias power supply generates an AC bias with different voltage pulse frequencies, amplitudes, and shapes as shown in FIG. 20C. In some embodiments, the voltage is a pulse voltage. The anode 2428 can be made of the same material as the target 2419. The anode 2428 can be biased negative continuously or pulsed in synchronous or asynchronous mode with the main pulse on the target 2419. The negative voltage can be in the range of −[10-10,000] V. By biasing the anode negatively, the anode acts as an electrostatic reflector that can increase ionization of the sputtered material from the target 2419. The anode can be biased with a positive voltage that can aid in accelerating ions towards the substrate 2408. The positive voltage can be in the range of +[10-10,000] V. The anode 22428 can be coupled directly or by a switch 2440 to the high-power pulse resonance AC power supply 2434. The switch 2440 can be mechanical or electronic, which includes an IGBT, high-voltage fast-switching NPN power transistor, MOSFET, and/or discrete silicon carbide MOSFET that can be accurately timed to turn on or synchronized to the desired timing. In some embodiments, the anode 2428 material can be made of the same material as the target 2419.

The high-power pulse resonance AC power supply 2434 includes a regulated voltage source with variable power feeding 2441, a high-power pulsed power supply with programmable voltage pulse frequency and/or amplitude 2447, and a tunable PFN (pulse forming network) and/or PCN (pulse converting network) 2430 as shown in FIG. 50. A high-power pulsed power supply with programmable voltage pulse frequencies, widths, amplitudes, and/or burst lengths 2447 includes a computer 2448 and controller 2444. A regulated voltage source with variable power feeding 2441 supplies voltage in the range of 100-5000 V to the high-power pulsed power supply with programmable voltage pulse frequency, width, amplitude, and burst length 2447. The high-power pulsed power supply with programmable voltage pulse frequency, width, amplitude, and burst length 2447 generates a train of unipolar negative voltage DC pulses to the tunable PFN 2430. The amplitude of the unipolar negative voltage pulses is in the range of 100 to 5000 V, and the duration of each of the voltage pulses is in the range of 1 to 100 μs. The distance between voltages pulses can be in the range of 0.4 to 1000 μs, thereby controlling the frequency to be between 0.1 to 400 kHz. In some embodiments, there is a step-up transformer between the high-power pulsed power supply with programmable voltage pulse frequency, width, amplitude, and burst length 2022 and the second tunable PFN 2430. In this case, the high-power pulsed power supply with programmable voltage pulse frequency, width, amplitude, and burst length 2447 generates a train of AC voltage waveforms to the step-up transformer. In some embodiments, a diode bridge is coupled between the step-up transformer and tunable PFN 2430. The tunable PFN 2430 includes a plurality of specialized variable inductors L1-L4 and a plurality of specialized variable capacitors C1-C2 for high-power pulse applications. The value of the inductors and capacitors can be controlled by computer 2448 and/or controller 2444. In some embodiments, at least one inductor and/or at least one capacitor are variable and their values can be computer controlled. The value of inductors L1-L4 can be in the range of 0 to 1000 μH each. Capacitors C1-C4 have values in the range of 0 to 1000 μF each. The high-power pulse programmable power supply 2040 is connected to controller 2448 and/or computer 2444. Controller 2448 and/or computer 2444 control output values and timing of the power supply 2434. Power supply 2434 can operate as a standalone unit without connection to the controller 122 and/or computer 123. The high-power pulse resonance AC power supply 2434 generates an asymmetric high-power AC pulse on the target 2419 forming a layer on the substrate 2408 inside the HEDP sputtering apparatus 2400. The high-power pulse resonance AC power supply 2434 can be programmed to generate a negative unipolar programmable pulse amplitude and/or duration before the burst of the high-power pulse AC resonance pulses that can be used as the ignition pulse or a glow discharge. The negative unipolar pulse can be programmed to start before each burst of the high-power pulse resonance pulses. The ignition pulse can be in the range of −[100, 5000] V and the duration can be in the range of [1-1000] microseconds as shown in FIG. 1E. In some embodiments, the PFN 2430 can be connected in series with a switch 2440 to send the pulses from the high-power pulse generator through the PFN 2430 to the HEDP source 2414. In some embodiments, the PFN is bypassed and non-resonance high-power DC pulses are sent directly from the high-power pulsed power supply 2447 with programmable voltage pulse frequency, width, amplitude, and burst length to the HEDP source 2414 to generate a high-power pulsed DC discharge on the target. Each negative high power unipolar pulse can be followed by a synchronized positive pulse from the programmable amplitude, pulse width, and frequency positive pulser 2437 and the DC supply 2438. The positive pulses from the positive pulser can be in the range of +[100-5000] V, [1 Hz-400 kHz], and [1-1000] microseconds. In some embodiments, only high-power unipolar negative pulses are sent directly from the high-power pulsed power supply with programmable voltage pulse frequency, width, amplitude, and burst length 2447 to the HEDP source 2414. The negative pulses from the high-power pulsed power supply with programmable voltage pulse frequency, width, amplitude, and/or burst length 2022 can be in the range of −[100-5000] V, [1 Hz-400 kHz], and [1-10,000] microseconds.

The magnetically enhanced HEDP sputtering apparatus 2400 may include an electrically enhanced shield 2413. The electrically enhanced shield 2413 includes a set of shields surrounding the substrate. The shields can be either grounded or electrically biased through a bias power supply 2451. The bias voltage power supply 2451 can include a radio frequency (RF) power supply, alternating current (AC) power supply, very high frequency (VHF) power supply, and/or direct current (DC) power supply. The bias power supply 2451 can operate in continuous mode or pulsed mode. The bias power supply 2439 can be a combination of two different RF power supplies that can provide different frequencies. The negative bias voltage on the substrate is in a range of about 0 to −2000 V.

A method of sputtering films, inside either of the magnetically enhanced HEDP sputtering apparatuses 2400, 2000, such as hard carbon, includes the following conditions. The feed gas pressure can be in the range of 0.1 to 50 mTorr. The substrate can be either grounded with a fast switching diode having its cathode connected to earth ground, or biased to be between 0 to −500 V using a fast-switching diode connected in series between the substrate and the bias power supply. The substrate bias voltage can be continuous or pulsed. The frequency of the pulsed bias can be in the range of 1 Hz to 400 kHz. The substrate bias can be generated by an RF power supply and matching network. The RF frequency can be in the range of 500 kHz to 27 MHz. The RF bias can be continuous or pulsed. In some embodiments, during deposition, the substrate can have a floating potential. The high-power pulse resonance AC power supplies 2434, 2040 generate an asymmetric AC resonance discharge, and the negative AC voltage can be in the range of −500 to −10000 V. The positive AC voltage can be in the range+[100-9000] V, thereby pushing ions away from the target and forming a layer of amorphous hard carbon on the substrate. The duration of the pulsed high-voltage asymmetrical AC waveforms can be in the range of 1 to 5000 microseconds. The substrate temperature during the sputtering process can be in the range of −100 to +200° C. The hardness of the diamond like coating formed on the substrate can be in the range of 5 to 70 GPa. The concentration of sp3 bonds in the carbon film can be in the range of 10 to 80%. In some embodiments, the concentration of sp2 bonds in the carbon film can be in the range of 80 to 100%. In some embodiments, the feed gas includes a noble gas, such as Ar, He, Ne, and/or Kr. In some embodiments, the feed gas is a mixture of a noble gas and hydrogen. In some embodiments, the feed gas is a mixture of a noble gas and a gas that contains carbon atoms. In some embodiments, the feed gas is a mixture of a noble gas and oxygen in order to sputter oxygenated carbon films COx for microelectronic devices or any other devices. The oxygen gas flow can be in the range of 1 to 100 sccm. The discharge current density during the sputtering process can be in the range of 0.2 to 20 A/cm2. In some embodiments, amorphous carbon films are sputtered for non-volatile memory semiconductor-based devices or for any other semiconductor-based devices. The process can also be used for hard mask processes in etching applications.

In some embodiments, the magnetically enhanced HEDP sputtering apparatus 2400, 2000 can be used to deposit thin film materials for manufacturing phase-change random-access memory (PCRAM) and/or resistive random-access memory (ReRAM) devices. PCRAM and ReRAM can improve speed, power efficiency, and reliability of storage and retrieval as software and data are retained even when power is absent.

In some embodiments, the magnetically enhanced HEDP sputtering apparatuses 2400, 2000 can be used to deposit thin film materials, such as metal nitride, DLC, ceramic film, and/or metal borides, for manufacturing razor blades for hair removal or surgical blades, and/or scissors by forming hard thin film layers on the tip of the blade.

In some embodiments, the magnetically enhanced HEDP sputtering apparatuses 2400, 2000 can be used to deposit thin film material, such as DLC, ceramics, such as Alumina, and metals, such as Titanium, for manufacturing artificial hip prostheses, joints, orthopedic implants, and/or medical stents.

In some embodiments, the magnetically enhanced HEDP sputtering apparatuses 2400, 2000 can be used to deposit amorphous thin film materials, such silicon, DLC, and/or the like.

In some embodiments, the magnetically enhanced HEDP sputtering apparatuses 2400, 2000 can be used to deposit active electrode materials with different crystalline structures for solid state batteries, such as but not limited to LiPON, Si, lithium-rich garnets, LiLaTiO, LiLaZrO, Sn, Ge, and/or Si.

In some embodiments, the magnetically enhanced HEDP sputtering apparatuses 2400, 2000 can be used to deposit thin films with nano-crystalline structure, such as but not limited to TiN, TiAlN, Ti, Cu, Si, Sn, Ge, TiAl, LiPON, Si, lithium-rich garnets, LiLaTiO, and/or LiLaZrO.

In some embodiments, the magnetically enhanced HEDP sputtering apparatuses 2400, 2000 can be used to deposit thin film materials, such as hard α-$Al_2O_3$ or γ-$Al_2O_3$ coatings on substrates. The substrate temperature during the sputtering process is in the range of 350° to 800° C.

In some embodiments, the substrate 2034 is a part of an automobile engine and the coating is a hydrogenated or non-hydrogenated diamond-like coating (DLC). The DLC coating reduces the coefficient of friction of moving parts in the automobile engine. The thickness of the DLC coating is in a range of 0.1 to 10 mkm depending on the particular engine part. The parts that can be coated include a turbocharger, valve, piston, piston ring, piston pin, heat exchanger, connecting rod, crank end bearing, bearing, ball from any bearing, after cooler, intercooler, rocker arm, injector, valve guide, push rod, camshaft, fuel injection pump, oil pump, and/or any other part associated with the automobile engine.

In some embodiments, the magnetically enhanced HEDP sputtering apparatuses 2400, 2000 can be used for chemically enhanced I-PVD deposition (CE-IPVD) of metal containing or non-metallic films. For example, in order to sputter carbon films with different concentrations of sp3 bonds in the film, the cathode target may be made from carbon material. The feed gas can include a noble gas and carbon atoms containing gas, such as $C_2H_2$, $CH_4$, and/or any other gas. The feed gas can also contain $H_2$. Carbon films on the substrate are formed by carbon atoms from the feed gas and from carbon atoms from the cathode target. The carbon films on the substrate are formed by carbon atoms from the feed gas.

Advanced thin films, such as but not limited to, carbon films, sputtered inside the magnetically enhanced HEDP sputtering apparatuses 2400, 2000 with noble gases, such as argon, neon, helium and/or the like, or reactive gases, such as hydrogen, nitrogen, oxygen, and/or the like can be used for hard mask applications in etch processes, such as three-dimensional NAND gates; for protectively coating parts, such as bearings, camshafts, gears, fuel injectors, cutting tools, inserts for cutting tools, carbide inserts, drill bits, broaches, reamers, razor blades for surgical applications and hair removal, hard drives, solar panels, optical filters, flat panel displays, thin film batteries, batteries for storage, hydrogen fuel cell, solid state batteries, cutleries, jewelry, wrist watch cases and parts, coating metal on plastic parts, such as lamps, air vents in cars, aerospace applications, such as turbine blades and jet engine parts, jewelry, plumbing parts, pipes, and tubes; medical implants, such as stents, joints, cell phone, mobile phone, iPhone, iPod, touch screen, hand held computing devices, application specific integration circuits, and/or the like.

FIG. 51 shows a timing diagram of output negative unipolar voltage pulses with a different amplitude V1, pulse width W1, and frequency F1 for an ignition pulse P1, and amplitude V2, pulse width W2, and defined frequencies F2 for a main high-power pulse P2 from a high-power pulse supply with programmable pulse voltage duration and pulse voltage frequency feeding a pulse forming network to form an asymmetric voltage discharge on the target of the HEDP source. The unipolar negative pulse P2 is converted by the pulse forming network to an asymmetric AC resonance pulse with a negative pulse, followed by a positive pulse, and a second negative pulse. The pulse forming network is connected to a magnetically and electrically enhanced HEDP source causing negative unipolar DC pulses to convert to AC asymmetric resonance discharge pulses on the target. Simultaneously, the timing diagram illustrates electrical parameters at the substrate holder during the AC asymmetric resonance discharge at the target of the HEDP source FIG. 52 shows a timing diagram of output negative unipolar voltage pulses with different amplitude V1, pulse width W1, and frequency F1 for an ignition pulse P1, and amplitude V2, pulse width W2, and defined frequency F2 for a main high-power pulse P2 from a high-power pulse supply with programmable pulse voltage duration and pulse voltage frequency feeding a pulse forming network to form an asymmetric voltage discharge on the target of the HEDP source. The unipolar negative pulse P2 is converted by the pulse forming network to an asymmetric AC resonance pulse with one negative pulse, followed by a first positive pulse and a second negative pulse, followed by a third negative pulse, followed by a second positive pulse and fourth negative pulse.

FIG. 53 shows a timing diagram of output negative unipolar voltage pulses with different amplitude V1, pulse width W1, and frequency F1 for an ignition pulse P1 followed by a positive unipolar pulse P3 at the end of the pulse duration of the ignition pulse P1 with amplitude V3, pulse width W3, and frequency F3, and main high-power pulses P2 with amplitude V2, pulse width W2, and defined frequency F2; followed by positive unipolar pulses P4 at the end of the pulse duration of main high-power pulses P2 with amplitude V4, pulse width W4, and frequency F4 feeding a pulse forming network. The pulse forming network is connected to a magnetically and electrically enhanced HEDP source causing the negative unipolar DC pulses to generate high-power pulsed DC discharge pulses on the target with negative and positive peaks. Simultaneously, the timing diagram illustrates electrical parameters at the substrate holder during the high-power pulsed DC discharge with programmable positive voltages that are reversible at the target of the HEDP source.

Figure 7:
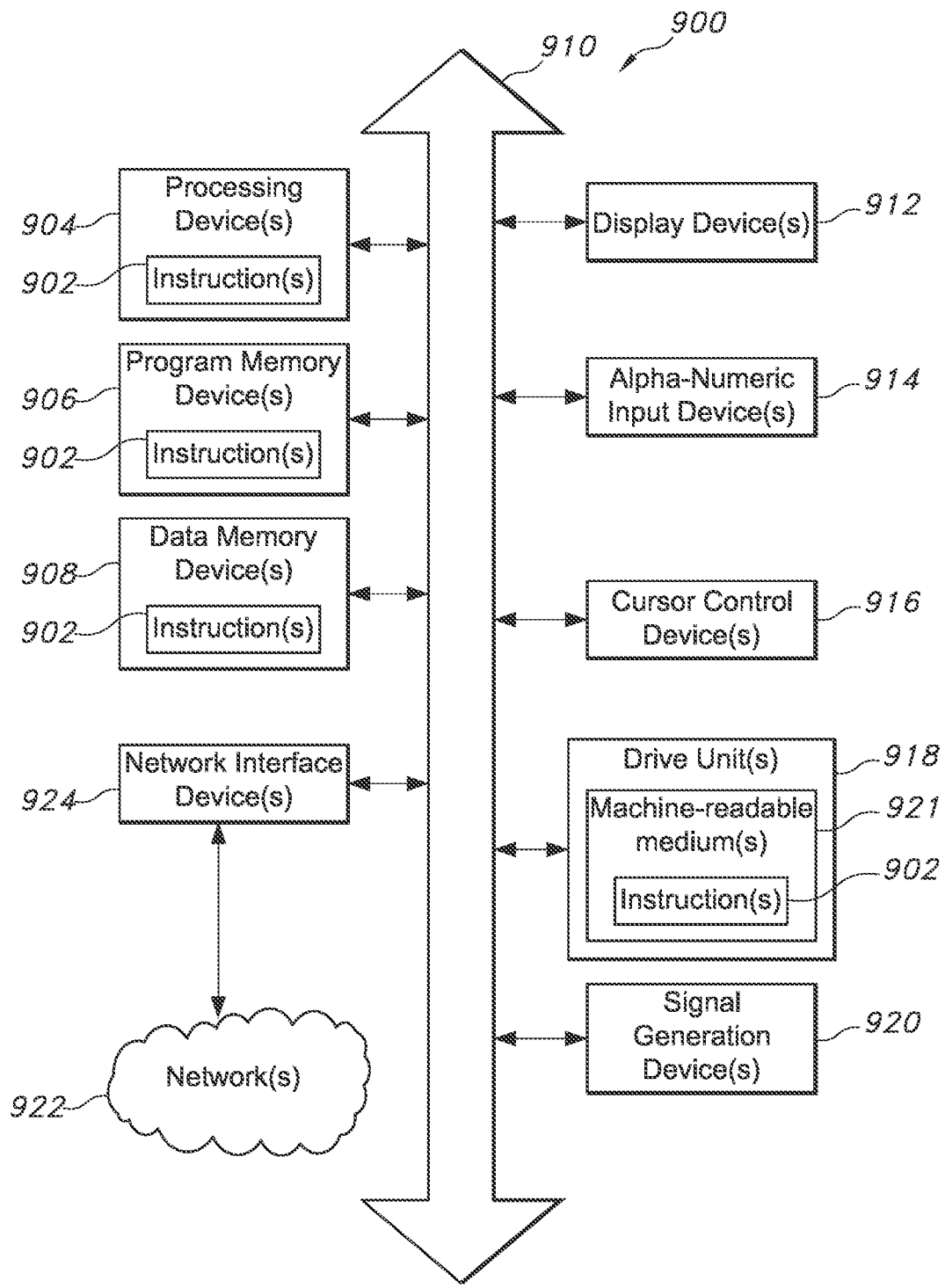
FIG. 7 shows a block diagram of at least a portion of an exemplary machine in the form of a computing system that performs methods according to one or more embodiments disclosed herein.
Figure 8A:
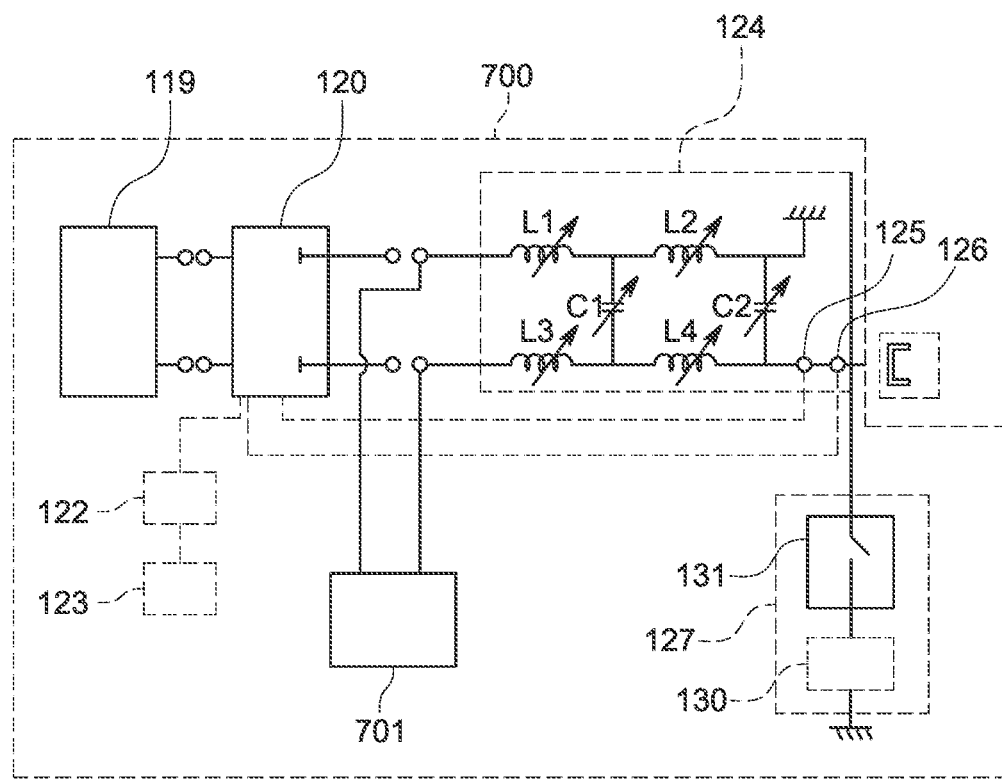
FIG. 8 (*a*) shows an illustrative circuit diagram of a high-power resonance pulse forming network (PFN) or pulse converting network (PCN) coupled to a high-frequency unipolar pulse generator.
Figure 8B:
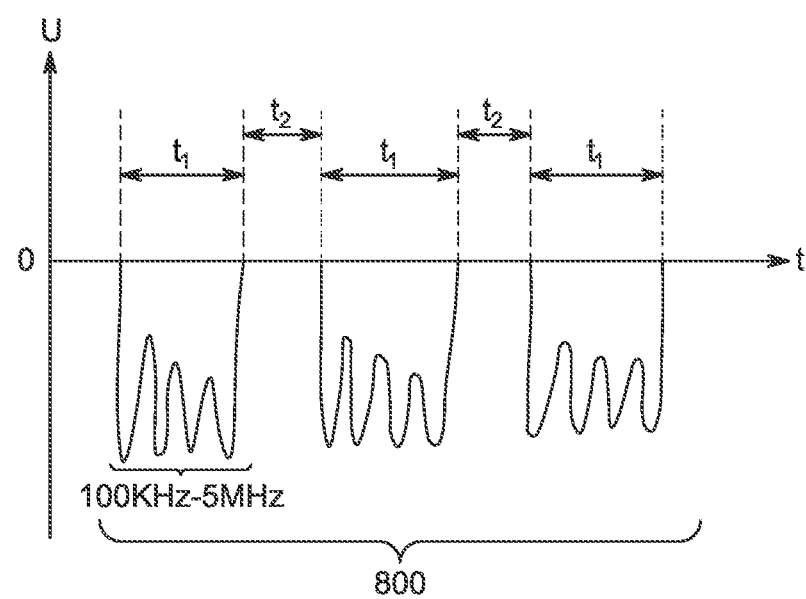
Figure 8C:
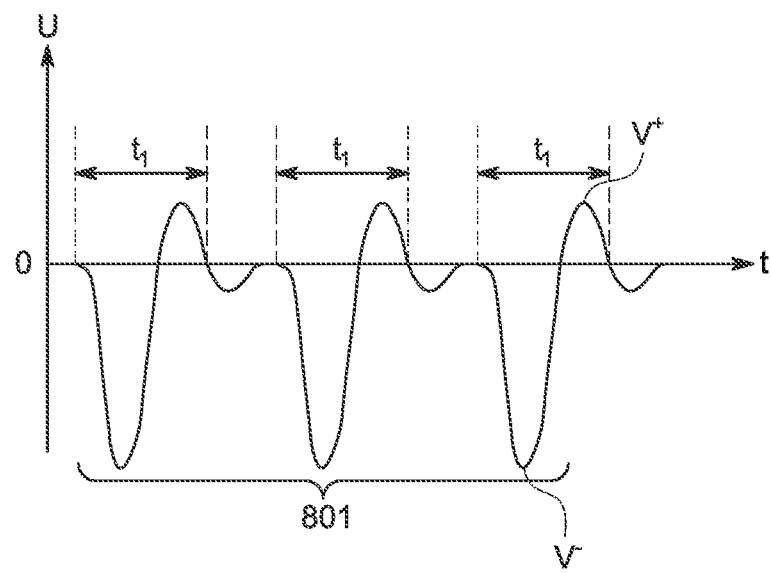
Figure 8D:
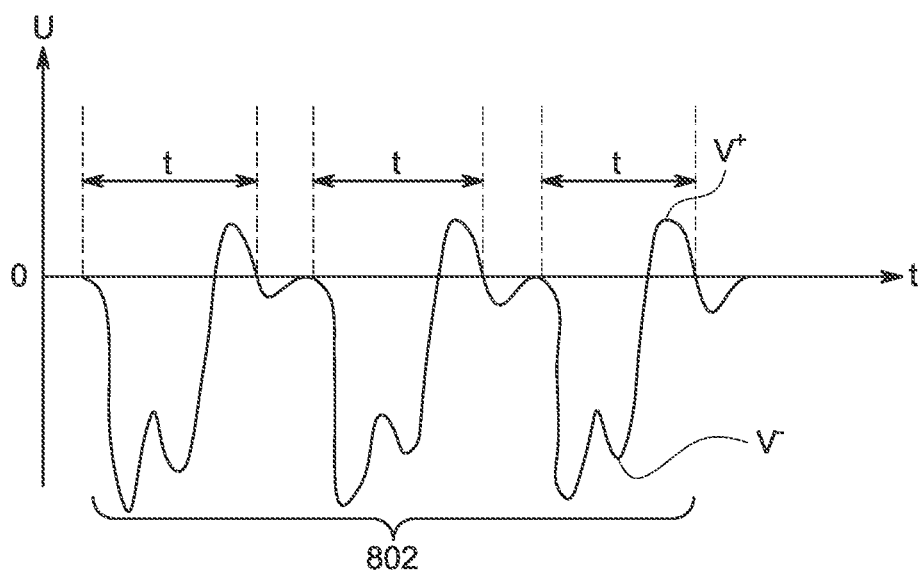

One or more embodiments disclosed herein, or a portion thereof, may make use of software running on a computer or workstation. By way of example, only and without limitation, FIG. 7 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited to, personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid-state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiments are not limited to such standards and protocols.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus, the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. A method of sputtering a layer on a substrate, the method comprising:
    positioning a HEDP magnetron in a vacuum with an anode, a cathode target, a magnet assembly, the substrate, and a feed gas;
    applying a plurality of unipolar negative direct current (DC) voltage pulses from a pulse power supply to a pulse converting network (PCN), the PCN comprising at least one inductor, a transformer, a full-wave diode bridge, and at least one capacitor; and
    adjusting an amplitude, pulse duration, and frequency associated with the plurality of unipolar negative DC voltage pulses and adjusting a value of at least one of the at least one inductor and the at least one capacitor using the PCN configured to cause said adjusting, thereby causing a resonance mode associated with the PCN, the PCN being configured to convert the unipolar negative DC voltage pulses to an asymmetric alternating current (AC) signal that generates a high-density plasma discharge on the HTEDP magnetron with pulse current densities in a range of about 0.1 to 20 A/cm$^2$, the asymmetric AC signal operatively coupled to the cathode target, the PCN being configured to convert the unipolar negative DC voltage pulses to the asymmetric AC signal comprising a first negative voltage and a first positive voltage followed by a second negative voltage generating plasma for use during a subsequent negative voltage, the PCN being configured to cause an increase in amplitude of at least one of the negative voltage pules of the asymmetric AC signal in response to an increase in amplitude or pulse duration of the plurality of unipolar negative DC voltage pulses and the PCN being in the resonance mode, thereby causing sputtering discharge associated with the H-EDP magnetron to form the layer from the cathode target on the substrate, the substrate being connected to ground by a first diode, thereby attracting positively charged ions sputtered from the cathode target and the plasma to the substrate.

2. The method, as defined by claim 1, further comprising applying a negative bias voltage to a second diode operatively coupled to the substrate, thereby attracting positively charged ions sputtered from the cathode target and the plasma to the substrate, a value of the negative bias voltage being in a range of about 10 to 500 V.

3. The method, as defined by claim 1, wherein the cathode target comprises at least one of a hollow shape and flat shape.

4. The method, as defined by claim 1, wherein a value of a magnetic field associated with the HEDP magnetron and disposed parallel to a surface of the cathode target is in a range of about 150 to 1000 G.

5. The method, as defined by claim 1, wherein the feed gas comprises a noble gas, the noble gas comprising at least one of Ar, Ne, Kr, Xe, He.

6. The method, as defined by claim 1, wherein the feed gas comprises a mixture of a noble gas and a reactive gas, the reactive gas being reactive with atoms from the cathode target.

7. The method, as defined by claim 1, wherein the feed gas comprises a mixture of a noble gas and a gas comprising atoms from the cathode target.

8. The method, as defined by claim 1, further comprising rotating the magnet assembly at a speed in a range of about 1 to 400 revolutions per minute.

9. The method, as defined by claim 1, wherein the cathode target comprises at least one of the following elements: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba.

10. The method, as defined by claim 1, wherein the substrate comprises at least a portion of at least one of an automotive engine, valve, injector head, crank shaft, bushing, bearing, sprocket, cell phone, mobile phone, iPhone, iPod, touch screen, cutting tool, drill bit, insert for cutting tool, semiconductor wafer with a diameter in a range of about 25 to 450 mm, razor blade, film used to manufacture an electronic memory device, RAM, PCRAM, ReRam, solid state battery, and DLC hard mask.

11. The method, as defined by claim 1, wherein the first negative voltage comprises a first amplitude and the second negative voltage comprises a second amplitude, the second amplitude being less than the first amplitude.

12. The method, as defined by claim 1, wherein the magnet assembly comprises at least one of an unbalanced magnetic field and balanced magnetic field.

13. The method, as defined by claim 1, wherein the first diode comprises at least one of a fast switching, fast recovery diode, and fast recovery epitaxial diode (FRED).

14. The method, as defined by claim 1, wherein the asymmetric AC signal comprises a third negative pulse following the second negative pulse, a second positive pulse following the third negative pulse, and a fourth negative pulse following the second positive pulse.

15. The method, as defined by claim 1, wherein the asymmetric AC signal comprises an ignition negative pulse followed by negative voltage glow discharge prior to the first negative pulse.

16. An apparatus that sputters a layer on a substrate, the apparatus comprising:
a high-energy density plasma (HEDP) magnetron configured to be positioned in a vacuum with an anode, a cathode target, a magnet assembly, the substrate, and a feed gas;
a pulse power supply, the pulse power supply providing a plurality of unipolar negative direct current (DC) voltage pulses; and
a pulse converting network (PCN) comprising at least one inductor, a transformer, a full-wave diode bridge, and at least one capacitor, the PCN being configured to convert the unipolar negative DC voltage pulses to an asymmetric alternating current (AC) signal that generates a high-density plasma discharge on the HEDP magnetron with pulse current densities in a range of about 0.1 to 20 A/cm$^2$, the PCN being configured to adjust an amplitude, pulse duration, and frequency of the plurality of unipolar negative DC voltage pulses and a value of at least one of the at least one inductor and the at least one capacitor to cause a resonance mode associated with the PCN, the asymmetric AC signal operatively coupled to the cathode target, the PCN being configured to convert the unipolar negative DC voltage pulses to the asymmetric AC signal comprising a first negative voltage and a first positive voltage followed by a second negative voltage-generating plasma for use during a subsequent negative voltage, the PCN being configured to cause an increase in amplitude of at least one of the negative voltage pules of the asymmetric AC signal in response to an increase in amplitude or pulse duration of the plurality of unipolar negative DC voltage pulses and the PCN being in the resonance mode, thereby causing sputtering discharge associated with the HEDP magnetron to form the layer from the cathode target on the substrate, the substrate being connected to ground by a first diode, thereby attracting positively charged ions sputtered from the cathode target and the plasma to the substrate.

17. The apparatus, as defined by claim 16, further comprising a negative bias voltage power supply, the negative bias voltage power supply operatively coupling a negative bias voltage to the substrate using a second diode, thereby attracting positively charged ions sputtered from the cathode target and the plasma to the substrate, a value of the negative bias voltage being in a range of about 10 to 500 V.

18. The apparatus, as defined by claim 16, wherein the cathode target comprises at least one of a hollow shape and a flat shape.

19. The apparatus, as defined by claim 16, wherein a value of a magnetic field associated with the HEDP magnetron and disposed parallel to a surface of the cathode target is in a range of about 150 to 1000 G.

20. The apparatus, as defined by claim 16, wherein the feed gas comprises a noble gas, the noble gas comprising at least one of He, Ar, Kr, Xe, Ne.

21. The apparatus, as defined by claim 16, wherein the feed gas comprises a mixture of a noble gas and a reactive gas, the reactive gas being reactive with atoms from the cathode target.

22. The apparatus, as defined by claim 16, wherein the feed gas comprises a mixture of a noble gas and a gas comprising atoms from the cathode target.

23. The apparatus, as defined by claim 16, wherein the magnet assembly rotates at a speed in a range of about 1 to 400 revolutions per minute.

24. The apparatus, as defined by claim 16, wherein the cathode target comprises at least one of the following elements: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, Ba.

25. The apparatus, as defined by claim 16, wherein the substrate comprises at least a portion of at least one of an automotive engine, valve, injector head, crank shaft, bushing, bearing, sprocket, cell phone, mobile phone, iPhone, iPod, touch screen, cutting tool, drill bit, insert for cutting tool, semiconductor wafer with a diameter in a range of about 25 to 450 mm, razor blade, film used to manufacture an electronic memory device, RAM, PCRAM, ReRam, solid state battery, and DLC hard mask.

26. The apparatus, as defined by claim 16, wherein the PCN is configured to convert the unipolar negative DC voltage pulses to the asymmetric alternating current signal that comprises the first negative voltage that comprises a first amplitude and the second negative voltage that comprises a second amplitude, the second amplitude being less than the first amplitude.

27. The apparatus, as defined by claim 16, wherein the magnet assembly comprises at least one of an unbalanced magnetic field and a balanced magnetic field.

28. The apparatus, as defined by claim 16, wherein the first diode comprises at least one of a fast switching, fast recovery diode, and fast recovery epitaxial diode (FRED).

29. The apparatus, as defined by claim 16, wherein the PCN is configured to convert the unipolar negative DC voltage pulses to the asymmetric AC signal that comprises a third negative pulse following the second negative pulse, a second positive pulse following the third negative pulse, and a fourth negative pulse following the second positive pulse.

30. The apparatus, as defined by claim 16, wherein the PCN is configured to convert the unipolar negative DC voltage pulses to the asymmetric AC signal that comprises an ignition negative pulse followed by negative voltage glow discharge prior to the first negative pulse.

31. An electrically and magnetically enhanced ionized physical vapor deposition (I-PVD) sputtering apparatus, the apparatus comprising:
  a magnetron, the magnetron positioned in a vacuum with an anode, a cathode target, a magnetic assembly, the substrate, and a feed gas;
  a pulse forming network (PFN) receiving a plurality of unipolar negative direct current (DC) voltage pulses from a pulse power supply, the PFN comprising at least one inductor, a transformer, a full-wave diode bridge, and at least one capacitor,
  the PFN being configured to adjust at least one of an amplitude, pulse duration, and frequency associated with the plurality of unipolar negative DC voltage pulses and a value of at least one of the at least one inductor and the at least one capacitor to cause a resonance mode associated with the PFN, the PFN being configured to convert the unipolar negative DC voltage pulses to an asymmetric alternating current (AC) signal that generates an asymmetric AC discharge on the magnetron with pulse current densities in a range of about 0.1 to 20 $A/cm^2$, the asymmetric AC signal operatively coupled to the cathode target, the PFN being configured to convert the unipolar negative DC voltage pulses to the asymmetric AC signal comprising a first negative voltage and a first positive voltage followed by a second negative voltage generating plasma for use during a subsequent negative voltage associated with the asymmetric AC signal, thereby increasing ionization of sputtered target material on the substrate during sputtering, the substrate being connected to ground by a first diode, thereby attracting positively charged ions sputtered from the cathode target and the plasma to the substrate.

* * * * *